(12) United States Patent
Kim et al.

(10) Patent No.: US 12,428,596 B2
(45) Date of Patent: Sep. 30, 2025

(54) ORGANIC LIGHT EMITTING DEVICE

(71) Applicant: LG DISPLAY CO., LTD., Seoul (KR)

(72) Inventors: Sang-Beom Kim, Paju-si (KR); Seung-Hee Yoon, Paju-si (KR); In-Bum Song, Paju-si (KR); Shiren Kazushi, Paju-si (KR); Sasada Yasuyuki, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1078 days.

(21) Appl. No.: 17/329,506

(22) Filed: May 25, 2021

(65) Prior Publication Data
US 2021/0384437 A1  Dec. 9, 2021

(30) Foreign Application Priority Data

May 29, 2020 (KR) .................. 10-2020-0065125
May 17, 2021 (KR) .................. 10-2021-0063694

(51) Int. Cl.
*C09K 11/06* (2006.01)
*H10K 50/13* (2023.01)
(Continued)

(52) U.S. Cl.
CPC ............ *C09K 11/06* (2013.01); *H10K 85/626* (2023.02); *H10K 85/631* (2023.02);
(Continued)

(58) Field of Classification Search
None
See application file for complete search history.

(56) References Cited

U.S. PATENT DOCUMENTS 10,056,560 B2   8/2018 Lee et al.
2017/0244047 A1*  8/2017 Lee .................. C09K 11/06
(Continued)

FOREIGN PATENT DOCUMENTS

CN  109314189 A  2/2019
CN  110050357 A  7/2019
(Continued)

OTHER PUBLICATIONS

Office Action issued Aug. 11, 2023 for corresponding Chinese Patent Application No. 202110591695.5 (See English Translation).
(Continued)

*Primary Examiner* — Jeffrey D Washville
(74) *Attorney, Agent, or Firm* — Morgan, Lewis & Bockius LLP

(57) ABSTRACT

The present disclosure relates to an organic light emitting device. In particular, the present disclosure relates to an organic light emitting diode and an organic light emitting device each of which includes at least one emitting material layer comprising an anthracene-based host substituted with at least one deuterium and a boron-based dopant, at least one electron blocking layer comprising an aryl-substituted amine-based compound, and optionally at least one hole blocking layer comprising at least one of an azine-based compound and a benzimidazole-based compound. The organic light emitting diode and the organic light emitting device has improved luminous efficiency and enhanced luminous lifespan.

19 Claims, 8 Drawing Sheets

(51) Int. Cl.
  *H10K 50/18* (2023.01)
  *H10K 59/12* (2023.01)
  *H10K 59/38* (2023.01)
  *H10K 85/60* (2023.01)

(52) U.S. Cl.
  CPC ......... *H10K 85/633* (2023.02); *H10K 85/654* (2023.02); *H10K 85/6572* (2023.02); *H10K 85/658* (2023.02); *C09K 2211/1007* (2013.01); *H10K 50/131* (2023.02); *H10K 50/18* (2023.02); *H10K 59/12* (2023.02); *H10K 59/38* (2023.02)

(56) References Cited

U.S. PATENT DOCUMENTS

| | | |
|---|---|---|
| 2019/0237668 A1 | 8/2019 | Miyake et al. |
| 2019/0296238 A1 | 9/2019 | Cha et al. |
| 2019/0378981 A1 | 12/2019 | Yoo et al. |
| 2021/0053998 A1* | 2/2021 | Kim .................. H10K 85/322 |

FOREIGN PATENT DOCUMENTS

| | | |
|---|---|---|
| CN | 110078631 A | 8/2019 |
| CN | 110577471 A | 12/2019 |
| CN | 110857296 A | 3/2020 |
| KR | 10-1493482 B | 2/2015 |
| KR | 10-2017-0130434 A | 11/2017 |
| KR | 10-2018-0067321 A | 6/2018 |
| KR | 10-2020-0019272 A | 2/2020 |
| WO | 2020/022751 A1 | 1/2020 |

OTHER PUBLICATIONS

Office Action issued in related Korean Patent Application No. 10-2021-0063694 dated May 29, 2025.

* cited by examiner

ORGANIC LIGHT EMITTING DEVICE

CROSS-REFERENCE TO RELATED APPLICATIONS

This application claims the priority benefit under 35 U.S.C. § 119(a) of Korean Patent Application No. 10-2020-0065125, filed in the Republic of Korea on May 29, 2020, and Korean Patent Application No. 10-2021-0063694, filed in the Republic of Korea on May 17, 2021, the entire contents of which are expressly incorporated herein by reference in its entirety into the present application.

BACKGROUND

Technical Field

The present disclosure relates to anorganic light emitting device, and more specifically, to an organic light emitting device having excellent luminous efficiency and luminous lifespan.

Discussion of the Related Art

An organic light emitting diode (OLED) among a flat display device used widely has come into the spotlight as a display device replacing rapidly a liquid crystal display device (LCD). The OLED can be formed as a thin organic film less than 2000 A and can implement unidirectional or bidirectional images by electrode configurations. Also, the OLED can be formed even on a flexible transparent substrate such as a plastic substrate so that a flexible or a foldable display device can be realized with ease using the OLED. In addition, the OLED can be driven at a lower voltage and the OLED has excellent high color purity compared to the LCD.

Since fluorescent material uses only singlet exciton energy in the luminous process, the related art fluorescent material shows low luminous efficiency. On the contrary, phosphorescent material can show high luminous efficiency since it uses triplet exciton energy as well as singlet exciton energy in the luminous process. However, metal complex, representative phosphorescent material, has short luminous lifespan for commercial use. Particularly, blue luminous materials has not showed satisfactory luminous efficiency and luminous lifespan compared to other color luminous materials. Therefore, there is a need to develop a new compound or a device structure that can enhance luminous efficiency and luminous lifespan of the organic light emitting diode.

SUMMARY

Accordingly, embodiments of the present disclosure are directed to an organic light emitting device that substantially obviates one or more of the problems due to the limitations and disadvantages of the related art.

An aspect of the present disclosure is to provide an organiclight emitting device with improved luminous efficiency and luminous lifespan.

Additional features and aspects will be set forth in the description that follows, and in part will be apparent from the description, or can be learned by practice of the inventive concepts provided herein. Other features and aspects of the inventive concept can be realized and attained by the structure particularly pointed out in the written description, or derivable therefrom, and the claims hereof as well as the appended drawings.

To achieve these and other aspects of the inventive concepts, as embodied and broadly described, an organic light emitting device comprises: a substrate; and an organic light emitting diode over the substrate, the organic light emitting diode including a first electrode, a second electrode facing the first electrode and an emissive layer disposed between the first electrode and the second electrode, wherein the emissive layer comprises at least one emitting material layer disposed between the first electrode and the second electrode and at least one electron blocking layer disposed between the first electrode and the at least one emitting material layer, wherein the at least one emitting material layer includes a first host of an anthracene-based compound and a first dopant of a boron-based compound, wherein an anthracene core of the first host is deuterated and the first dopant has the following structure of Formula 3, and wherein the at least one electron blocking layer includes an amine-based compound having the following structure of Formula 5:

[Formula 3]

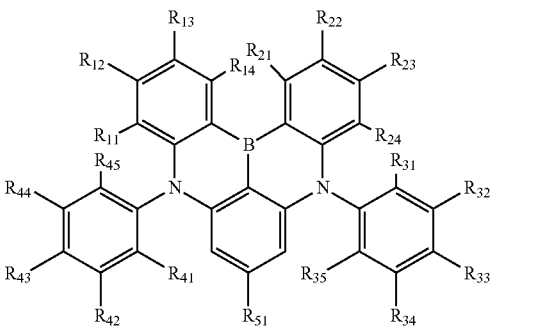

wherein each of $R_{11}$ to $R_{14}$, each of $R_{21}$ to $R_{24}$, each of $R_{31}$ to $R_{35}$ and each of $R_{41}$ to $R_{45}$ is independently selected from the group consisting of protium, deuterium, $C_1$-$C_{10}$ alkyl, $C_6$-$C_{30}$ aryl, $C_6$-$C_{30}$ aryl amino and $C_5$-$C_{30}$ hetero aryl, $R_{11}$ to $R_{14}$, $R_{21}$ to $R_{24}$, $R_{31}$ to $R_{35}$ and $R_{41}$ to $R_{45}$ may be identical to or different from each other; and $R_{51}$ is selected from the group consisting of protium, deuterium, $C_1$-$C_{10}$ alkyl and $C_3$-$C_{15}$ cyclo-alkyl, wherein the $C_6$-$C_{30}$ aryl is optionally substituted with $C_1$-$C_{10}$ alkyl;

[Formula 5]

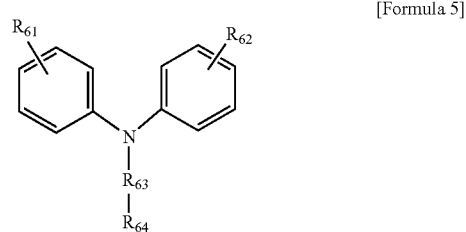

wherein each of $R_{61}$ to $R_{62}$ and $R_{64}$ is independently monocyclic aryl or polycyclic aryl, $R_{63}$ is monocyclic arylene or polycyclic arylene, wherein at least one of $R_{61}$ to $R_{64}$ is polycyclic.

As an example, the anthracene-based compound may have the following Formula 1:

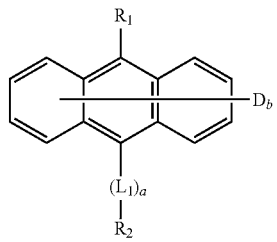

[Formula 1]

wherein each of $R_1$ and $R_2$ is independently $C_6$-$C_{30}$ aryl or $C_5$-$C_{30}$ hetero aryl; $L_1$ is $C_6$-$C_{30}$ arylene; a is 0 or 1; and b is an integer of 1 to 8.

The emissive layer may further comprise an electron transport layer or at least one hole blocking layer comprising at least one of an azine-based compound and a benzimidazole-based compound.

The emissive layer may include a single emitting part or comprise multiple emitting parts to form a tandem structure.

The emissive layer may include a first emitting part disposed between the first and second electrodes, a second emitting part disposed between the first emitting part and the second electrode and a first charge generation layer disposed between the first emitting part and the second emitting part, wherein the first emitting part includes a first emitting material layer and a first electron blocking layer disposed between the first electrode and the first emitting material layer, wherein the second emitting part includes a second emitting material layer, wherein at least one of the first emitting material layer and the second emitting material layer may include the first host and the first dopant.

Such an organic light emitting diode having the tandem structure may emit blue light, or white light.

The substrate may define a red pixel, a green pixel and a blue pixel and the organic light emitting diode may be located correspondingly to the red pixel, the green pixel and the blue pixel, and the organic light emitting device may further comprise a color conversion layer disposed between the substrate and the organic light emitting diode or over the organic light emitting diode correspondingly to the red pixel and the green pixel.

The substrate may define a red pixel, a green pixel and a blue pixel and the organic light emitting diode may be located correspondingly to the red pixel, the green pixel and the blue pixel, and the organic light emitting device may further comprise a color filter layer disposed between the substrate and the organic light emitting diode or over the organic light emitting diode correspondingly to the red pixel, the green pixel and the blue pixel.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure, are incorporated in and constitute a part of this application, illustrate embodiments of the disclosure and together with the description serve to explain principles of the disclosure.

DETAILED DESCRIPTION

Reference will now be made in detail to aspects of the disclosure, examples of which are illustrated in the accompanying drawings.

The organic light emitting diode of the present disclosure can enhance its luminous efficiency and its luminous lifespan by applying particular organic compounds into at least one emitting part. The organic light emitting diode can be applied into an organic light emitting device such as an organic light emitting display device or an organic light emitting illumination device.

Figure 1:
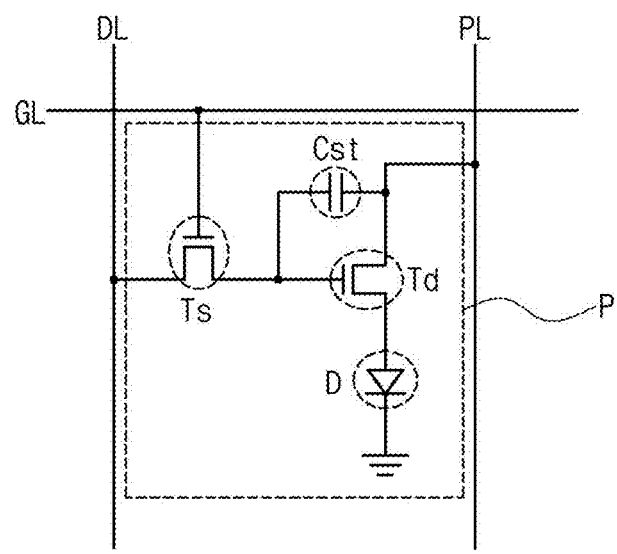
FIG. 1 is a schematic circuit diagram illustrating an organic light emitting display device in accordance with the present disclosure.

FIG. 1 is a schematic circuit diagram illustrating an organic light emitting display device of the present disclosure. As illustrated in FIG. 1, a gate line GL, a data line DL and power line PL, each of which cross each other to define a pixel region P, in the organic light emitting display device. A switching thin film transistor Ts, a driving thin film transistor Td, a storage capacitor Cst and an organic light emitting diode D are formed within the pixel region P. The pixel region P may include a red (R) pixel region, a green (G) pixel region and a blue (B) pixel region.

The switching thin film transistor Ts is connected to the gate line GL and the data line DL, and the driving thin film transistor Td and the storage capacitor Cst are connected between the switching thin film transistor Ts and the power line PL. The organic light emitting diode D is connected to the driving thin film transistor Td. When the switching thin film transistor Ts is turned on by a gate signal applied into the gate line GL, a data signal applied into the data line DL is applied into a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the organic light emitting diode D through the driving thin film transistor Td. And then, the organic light emitting diode D emits light having a luminance proportional to the current flowing through the driving thin film transistor Td. In this case, the storage capacitor Cst is charge with a voltage proportional to the data signal so that the voltage of the gate electrode in the driving thin film transistor Td is kept constant during one frame. Therefore, the organic light emitting display device can display a desired image.

Figure 2:
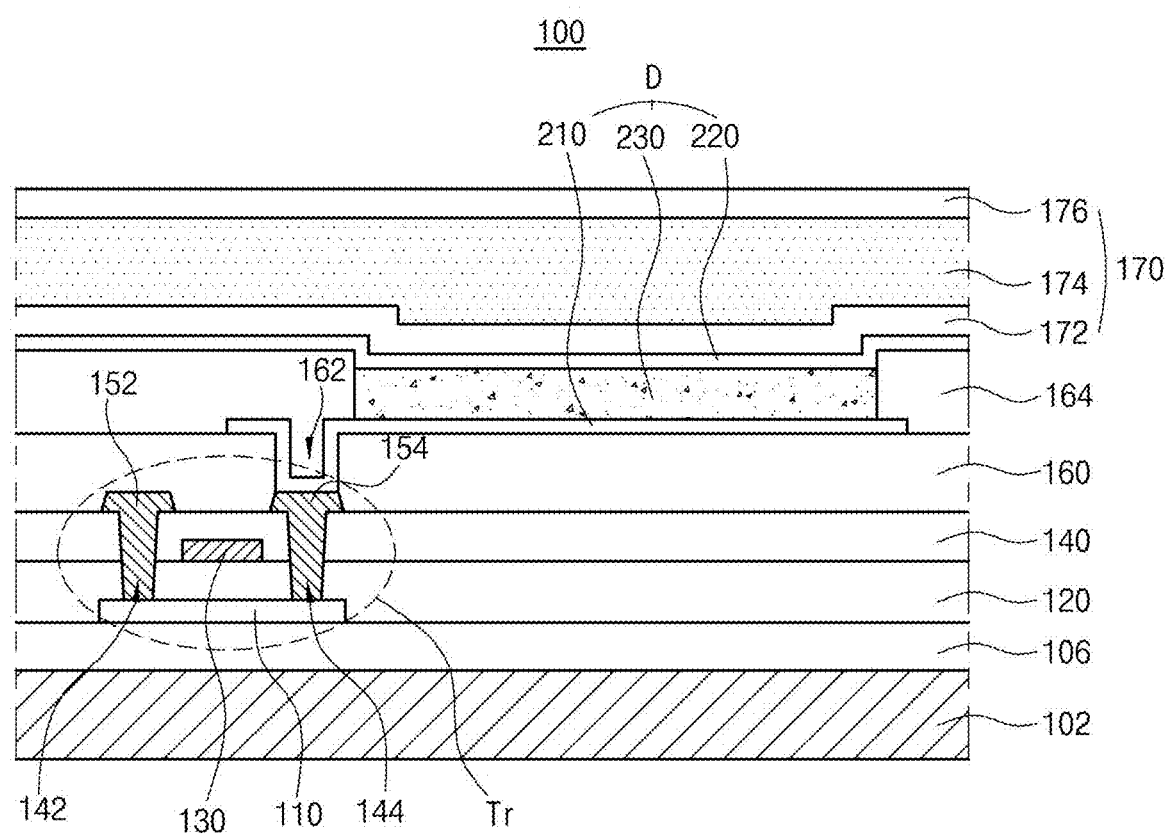
FIG. 2 is a cross-sectional view illustrating an organic light emitting display device as an example of an organic light emitting device in accordance with one exemplary aspect of the present disclosure.

FIG. 2 is a schematic cross-sectional view illustrating an organic light emitting display device in accordance with an exemplary aspect of the present disclosure. As illustrated in FIG. 2, the organic light emitting display device 100 comprises a substrate 102, a thin-film transistor Tr over the substrate 102, and an organic light emitting diode D connected to the thin film transistor Tr. As an example, the substrate 102 defines a red pixel, a green pixel and a blue pixel and the organic light emitting diode D is located in each pixel. In other words, the organic light emitting diode D, each of which emits red, green or blue light, is located correspondingly in the red pixel, the green pixel and the blue pixel.

The substrate 102 may include, but is not limited to, glass, thin flexible material and/or polymer plastics. For example, the flexible material may be selected from the group, but is not limited to, polyimide (PI), polyethersulfone (PES), polyethylenenaphthalate (PEN), polyethylene terephthalate (PET), polycarbonate (PC) and combination thereof. The substrate 102, over which the thin film transistor Tr and the organic light emitting diode D are arranged, forms an array substrate.

A buffer layer 106 may be disposed over the substrate 102, and the thin film transistor Tr is disposed over the buffer layer 106. The buffer layer 106 may be omitted.

A semiconductor layer 110 is disposed over the buffer layer 106. In one exemplary aspect, the semiconductor layer 110 may include, but is not limited to, oxide semiconductor materials. In this case, a light-shield pattern may be disposed under the semiconductor layer 110, and the light-shield pattern can prevent light from being incident toward the semiconductor layer 110, and thereby, preventing the semiconductor layer 110 from being deteriorated by the light. Alternatively, the semiconductor layer 110 may include polycrystalline silicon. In this case, opposite edges of the semiconductor layer 110 may be doped with impurities.

A gate insulating layer 120 including an insulating material is disposed on the semiconductor layer 110. The gate insulating layer 120 may include, but is not limited to, an inorganic insulating material such as silicon oxide ($SiO_x$) or silicon nitride ($SiN_x$).

A gate electrode 130 made of a conductive material such as a metal is disposed over the gate insulating layer 120 so as to correspond to a center of the semiconductor layer 110. While the gate insulating layer 120 is disposed over a whole area of the substrate 102 in FIG. 2, the gate insulating layer 120 may be patterned identically as the gate electrode 130.

An interlayer insulating layer 140 including an insulating material is disposed on the gate electrode 130 with covering over an entire surface of the substrate 102. The interlayer insulating layer 140 may include an inorganic insulating material such as silicon oxide ($SiO_x$) or silicon nitride ($SiN_x$), or an organic insulating material such as benzocyclobutene or photo-acryl.

The interlayer insulating layer 140 has first and second semiconductor layer contact holes 142 and 144 that expose both sides of the semiconductor layer 110. The first and second semiconductor layer contact holes 142 and 144 are disposed over opposite sides of the gate electrode 130 with spacing apart from the gate electrode 130. The first and second semiconductor layer contact holes 142 and 144 are formed within the gate insulating layer 120 in FIG. 2. Alternatively, the first and second semiconductor layer contact holes 142 and 144 are formed only within the interlayer insulating layer 140 when the gate insulating layer 120 is patterned identically as the gate electrode 130.

A source electrode 152 and a drain electrode 154, which are made of conductive material such as a metal, are disposed on the interlayer insulating layer 140. The source electrode 152 and the drain electrode 154 are spaced apart from each other with respect to the gate electrode 130, and contact both sides of the semiconductor layer 110 through the first and second semiconductor layer contact holes 142 and 144, respectively.

The semiconductor layer 110, the gate electrode 130, the source electrode 152 and the drain electrode 154 constitute the thin film transistor Tr, which acts as a driving element. The thin film transistor Tr in FIG. 2 has a coplanar structure in which the gate electrode 130, the source electrode 152 and the drain electrode 154 are disposed over the semiconductor layer 110. Alternatively, the thin film transistor Tr may have an inverted staggered structure in which a gate electrode is disposed under a semiconductor layer and a source and drain electrodes are disposed over the semiconductor layer. In this case, the semiconductor layer may include amorphous silicon.

Although not shown in FIG. 2, a gate line and a data line, which cross each other to define a pixel region, and a switching element, which is connected to the gate line and the data line, is may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 160 is disposed on the source and drain electrodes 152 and 154 with covering the thin film transistor Tr over the whole substrate 102. The passivation layer 160 has a flat top surface and a drain contact hole 162 that exposes the drain electrode 154 of the thin film transistor Tr. While the drain contact hole 162 is disposed on the second semiconductor layer contact hole 144, it may be spaced apart from the second semiconductor layer contact hole 144.

The organic light emitting diode (OLED) D includes a first electrode 210 that is disposed on the passivation layer 160 and connected to the drain electrode 154 of the thin film transistor Tr. The organic light emitting diode D further includes an emissive layer 230 and a second electrode 220 each of which is disposed sequentially on the first electrode 210.

The first electrode 210 is disposed in each pixel region. The first electrode 210 may be an anode and include conductive material having relatively high work function value. For example, the first electrode 210 may include, but is not limited to, a transparent conductive material such as indium tin oxide (ITO), indium zinc oxide (IZO), indium tin zinc oxide (ITZO), SnO, ZnO, indium cerium oxide (ICO), aluminum doped zinc oxide (AZO), and the like.

In one exemplary aspect, when the organic light emitting display device 100 is a top-emission type, a reflective electrode or a reflective layer may be disposed under the first electrode 210. For example, the reflective electrode or the reflective layer may include, but is not limited to, aluminum-palladium-copper (APC) alloy.

In addition, a bank layer 164 is disposed on the passivation layer 160 in order to cover edges of the first electrode 210. The bank layer 164 exposes a center of the first electrode 210. The bank layer 164 may be omitted.

Figure 3:
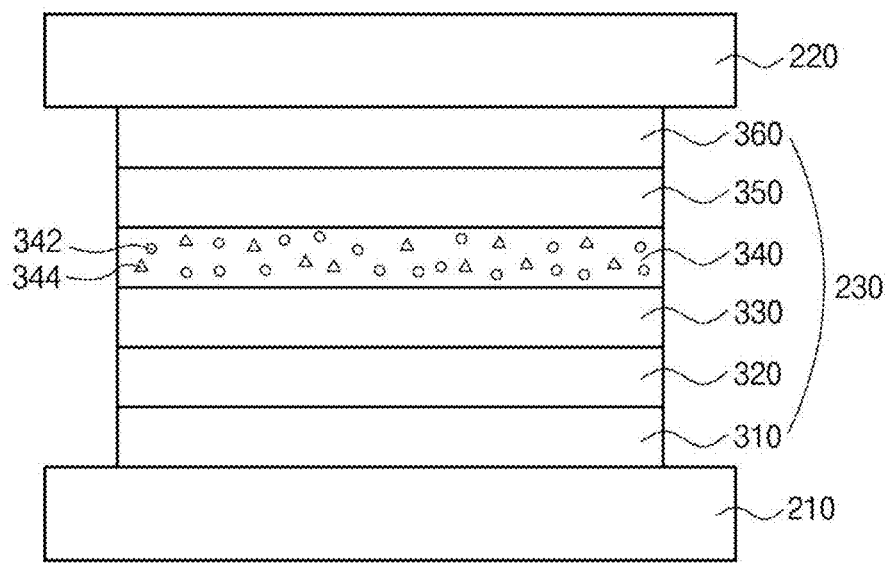
FIG. 3 is a cross-sectional view illustrating an organic light emitting diode having single emitting part in accordance with an exemplary aspect of the present disclosure.
Figure 4:
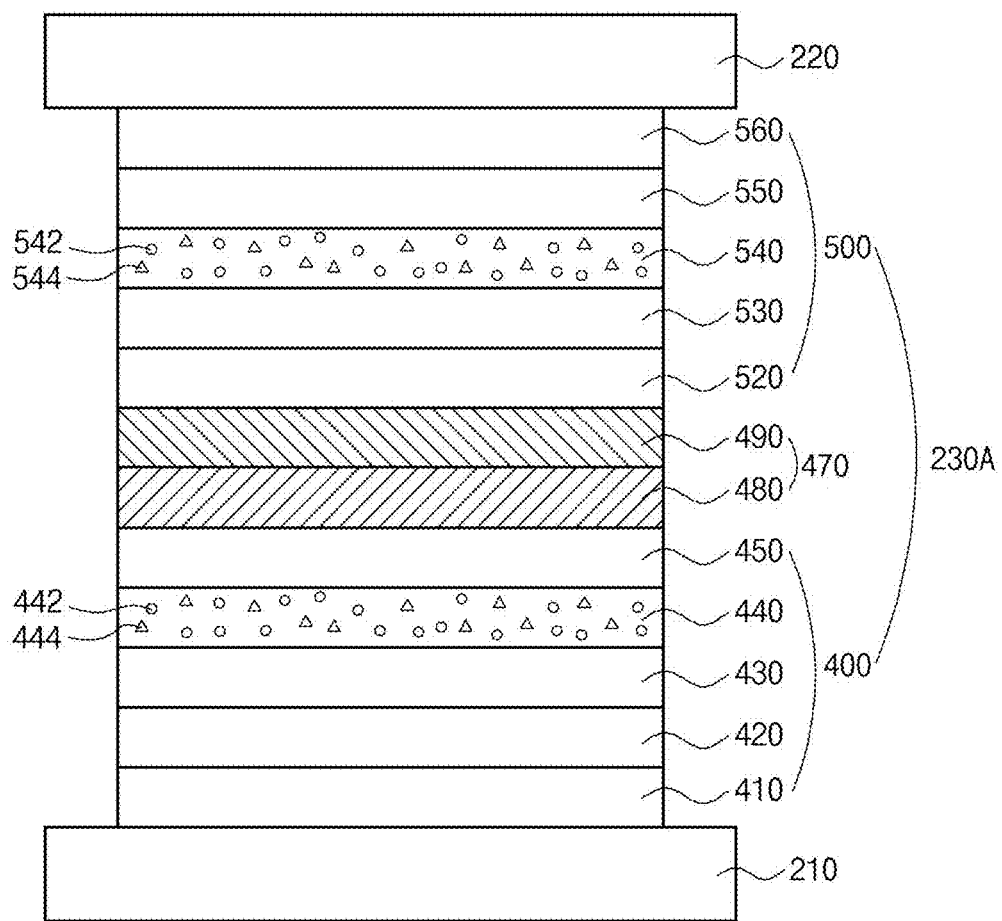
FIG. 4 is a cross-sectional view illustrating an organic light emitting diode having double stack structures in accordance with another exemplary aspect of the present disclosure.

An emissive layer 230 is disposed on the first electrode 210. In one exemplary embodiment, the emissive layer 230 may have a mono-layered structure of an emitting material layer. Alternatively, the emissive layer 230 may have a multiple-layered structure of a hole injection layer, a hole transport layer, an electron blocking layer, an emitting material layer, a hole blocking layer, an electron transport layer and/or an electron injection layer, as illustrated in FIGS. 3 and 4. The emissive layer 230 may have a single emitting part or may have multiple emitting parts to form a tandem structure.

The emissive layer 230 may include at least one emitting material layer including an anthracene-based host and a boron-based dopant and at least one electron blocking layer including an aryl amine-based compound. Alternatively, the emissive layer 230 may further comprise at least one hole blocking layer including at least one of an azine-based compound and a benzimidazole-based compound. The emissive layer 230 enables the OLED D and the organic light emitting display device 100 to improve their luminous efficiency and luminous lifespan considerably.

The second electrode 220 is disposed over the substrate 102 above which the emissive layer 230 is disposed. The second electrode 220 may be disposed over a whole display area, and may include a conductive material with a relatively low work function value compared to the first electrode 210, and may be a cathode. For example, the second electrode 220 may include, but is not limited to, aluminum (Al), magnesium (Mg), calcium (Ca), silver (Ag), alloy thereof or combination thereof such as aluminum-magnesium alloy (Al-Mg).

In addition, an encapsulation film 170 may be disposed over the second electrode 220 in order to prevent outer moisture from penetrating into the organic light emitting diodeD. The encapsulation film 170 may have, but is not limited to, a laminated structure of a first inorganic insulating film 172, an organic insulating film 174 and a second inorganic insulating film 176. The encapsulation film 170 may be omitted.

A polarizing plate may be attached onto the encapsulation film to reduce reflection of external light. For example, the polarizing plate may be a circular polarizing plate. Further, a cover window may be attached onto the encapsulation film 170 or the polarizing plate. In this case, the substrate 102 and the cover window have flexible properties so that a flexible display device can be constructed.

As described above, the emissive layer 230 in the organic light emitting diode D includes particular compound so that the organic light emitting diode D can enhance its luminous efficiency and its luminous lifespan. FIG. 3 is a schematic cross-sectional view illustrating an organic light emitting diode having a single emitting part in accordance with an exemplary embodiment of the present disclosure.

As illustrated in FIG. 3, the organic light emitting diode (OLED) D1 in accordance with the first embodiment of the present disclosure includes first and second electrodes 210 and 220 facing each other and an emissive layer 230 disposed between the first and second electrodes 210 and 220. In an exemplary embodiment, the emissive layer 230 includes an emitting material layer (EML) 340, which may be a first EML, disposed between the first and second electrodes 210 and 220 and an electron blocking layer (EBL) 330, which may be a first EBL, as a first exciton blocking layer disposed between the first electrode 210 and the EML 340. Alternatively, the emissive layer 230 may further include a hole blocking layer (HBL) 350, which may be a first HBL, as a second exciton blocking layer disposed between the EML 340 and the second electrode 220.

In addition, the emissive layer 230 may further include a hole injection layer (HIL) 310 disposed between the first electrode 210 and the EBL 330 and a hole transport layer (HTL) 320 disposed between the HIL 310 and the EBL 330. In addition, the emissive layer 230 may further include an electron injection layer (EIL) 360 disposed between the HBL 350 and the second electrode 220. In an alternative embodiment, the emissive layer 230 may further include an electron transport layer (ETL) disposed between the HBL 350 and the EIL 360.

The first electrode 210 may be an anode that provides a hole into the EML 340. The first electrode 210 may include a conductive material having a relatively high work function value, for example, a transparent conductive oxide (TCO). In an exemplary embodiment, the first electrode 210 may include, but is not limited to, indium tin oxide (ITO), indium zinc oxide (IZO), indium tin zinc oxide (ITZO), SnO, ZnO, indium cerium oxide (ICO), aluminum doped zinc oxide (AZO), and the like. 1561 The second electrode 220 may be a cathode that provides an electron into the EML 340. The second electrode 220 may include a conductive material having a relatively low work function values, i.e., a highly reflective material such as aluminum (Al), magnesium (Mg), calcium (Ca), silver (Ag), alloy thereof or combination thereof such as aluminum-magnesium alloy (Al-Mg). For example, each of the first and second electrodes 210 and 220 may be laminated with a thickness of, but is not limited to, about 30 nm to about 300 nm.

The EML 340 includes a host342, which may be a first host, of an anthracene-based compound and a dopant 344, which may be a first dopant, of a boron-based compound so that the EML 340 emits blue light. In this case, a core of the host 342 is deuterated. For example, the anthracene-core may be partially or fully deuterated. Also, a part or all of the hydrogens in the boron-based compound may be deuterated. Namely, the anthracene core of the host 342 is deuterated and the dopant 344 may not be deuterated or may be partially or fully deuterated. As an example, the host 342 of the anthracene-based compound having the partially or fully deuterated anthracene core may have the following structure of Formula 1:

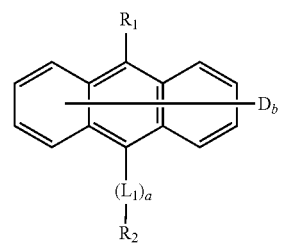

[Formula 1]

In Formula 1, each of $R_1$ and $R_2$ is independently $C_6$-$C_{30}$ aryl or $C_5$-$C_{30}$ hetero aryl; $L_1$ is $C_6$-$C_{30}$ arylene; a is 0 or 1; and b is an integer of 1 to 8.

Namely, the anthracene moiety as a core of the host 342 is substituted by deuterium (D), and the substituent except the anthracene moiety is not deuterated. As an example, each of $R_1$ and $R_2$ may be independently selected from the group, but is not limited to, consisting of phenyl, naphthyl, fluorenyl, dibenzofuranyl, dibenzothiophenyl, phenanthrenyl, carbazolyl and carbolinyl, for example, phenyl or naphthyl (e.g. 1-naphtyl or 2-naphthyl). $L_l$ may be phenylene or naphthylene and b may be 8.

In one exemplary embodiment, the host 342 may be selected from anyone having the following structure of Formula 2:

[Formula 2]

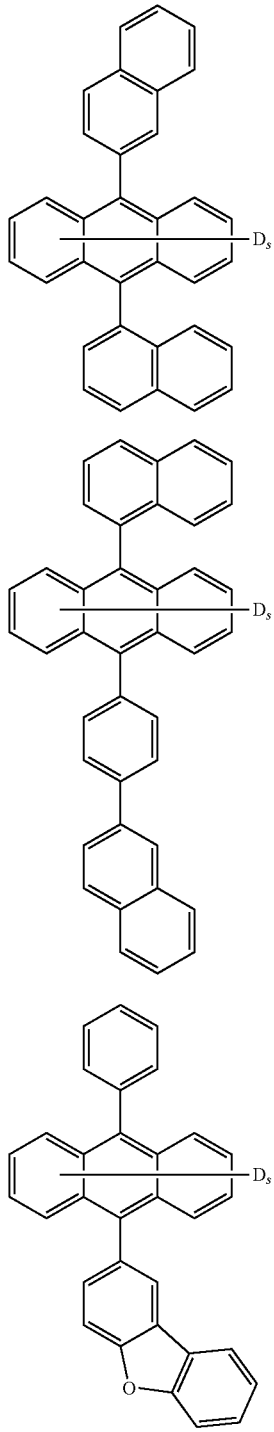

Host 1

Host 2

Host 3

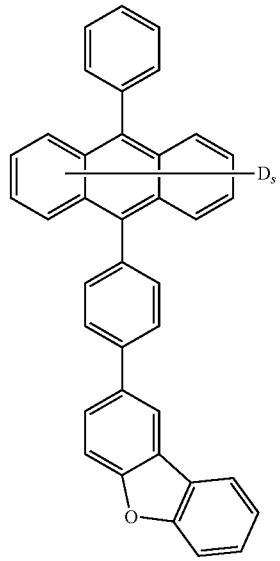

Host 4

The first dopant 344 of the boron-based compound emitting blue light may have the following structure of Formula 3:

[Formula 3]

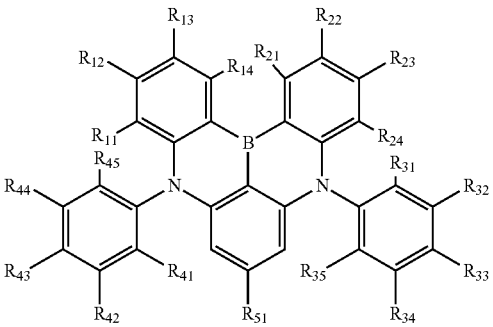

In Formula 3, each of $R_1$ to $R_{14}$, each of $R_{21}$ to $R_{24}$, each of $R_{31}$ to $R_{35}$ and each of $R_{41}$ to $R_{45}$ is independently selected from the group consisting of protium, deuterium, $C_1$-$C_{10}$ alkyl, $C_6$-$C_{30}$ aryl, $C_6$-$C_{30}$ aryl amino and $C_5$-$C_{30}$ hetero aryl, $R_1$ to $R_{14}$, $R_{21}$ to $R_{24}$, $R_{31}$ to $R_{35}$ and $R_{41}$ to $R_{45}$ may be identical to or different from each other; and $R_{51}$ is selected from the group consisting of protium, deuterium, $C_1$-$C_{10}$ alkyl and $C_3$-$C_{15}$ cyclo-alky, wherein the $C_6$-$C_{30}$ aryl is optionally substituted with $C_1$-$C_{10}$ alkyl.

When the aryl or aryl amino, which may be each of $R_1$ to $R_{14}$, each of $R_{21}$ to $R_{24}$, each of $R_{31}$ to $R_{35}$ and each of $R_{41}$ to $R_{45}$, is substituted, the substituent may be, but is not limited to, $C_1$-$C_{10}$ alkyl such as tert-butyl.

In the boron-based compound as the dopant 344, the benzene ring, which is linked to the boron atom and two nitrogen atoms, is substituted by at least one of deuterium (D), $C_1$-$C_{10}$ alkyl, $C_6$-$C_{30}$ aryl and $C_6$-$C_{30}$ aryl amino such that the OLED D1 including the dopant 344 has improved luminous properties.

For example, the arylamino, which may be each of $R_1$ to $R_{14}$, each of $R_{21}$ to $R_{24}$, each of $R_{31}$ to $R_{35}$ and each of $R_{41}$ to $R_{45}$, may be diphenylamine or phenyl-naphthylamine, and the aryl, which may be each of RI to $R_{14}$, each of $R_{21}$ to $R_{24}$, each of $R_{31}$ to $R_{35}$ and each of $R_{41}$ to $R_{45}$, may be phenyl or naphthyl which is unsubstituted or substituted with at least one, for example 1-2, alkyl group. The alkyl, which may be each of $R_1$ to $R_{14}$, each of $R_21$ to $R_24$, each of $R_31$ to $R_{35}$ and each of $R_{41}$ to $R_{45}$, may be $C_1$-$C_5$ alkyl such as methyl, ethyl, propyl, butyl (e.g. tert-butyl) and pentyl, and the heteroaryl, which may be each of Ru to $R_{14}$, each of $R_21$ to $R_24$, each of $R_31$ to $R_{35}$ and each of $R_{41}$ to $R_{45}$, may be one of pyridyl, quinolinyl, carbazolyl, dibenzofuranyl and dibenzothiophenyl. In this instance, each of the arylamino, the aryl, the alkyl and the heteroaryl may be deuterated In addition, $R_{51}$ may be selected from the group consisting of protium, deuterium, $C_1$-$C_{10}$ alkyl (e.g. methyl, ethyl, propyl, butyl or pentyl) and adamantyl.

In one exemplary embodiment, each of one of $R_1$ to $R_{14}$, one of $R_{21}$ to $R_{24}$, one of $R_{31}$ to $R_{35}$ and one of $R_{41}$ to $R_{45}$ may be tert-butyl, respectively, and each of the rest of $R_1$ to $R_{14}$, the rest of $R_{21}$ to $R_{24}$, the rest of $R_{31}$ to $R_{35}$ and the rest of $R_{41}$ to $R_{45}$ may be protium or deuterium, and $R_{51}$ may be protium, deuterium or methyl.

In another exemplary embodiment, each of one of $R_1$ to $R_{14}$, one of $R_{21}$ to $R_{24}$, one of $R_{31}$ to $R_{35}$ and one of $R_{41}$ to $R_{45}$ may be tert-butyl, respectively, another one of $R_{31}$ to $R_{35}$ may be tert-butyl phenyl, and the rest of $R_1$ to $R_{14}$, the rest of $R_{21}$ to $R_{24}$, the rest of $R_{31}$ to $R_{35}$ and the rest of $R_{41}$ to $R_{45}$ may be protium or deuterium, and $R_{51}$ may be protium, deuterium or methyl.

As an example, the dopant 344 of the boron-based compound may be selected from anyone having the following structure of Formula 4:

[Formula 4]

Dopant 1-1

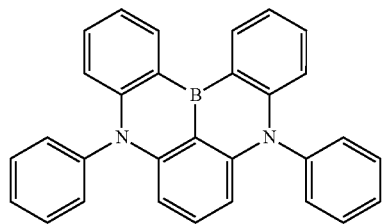

Dopant 1-2

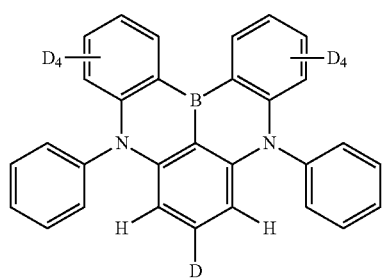

Dopant 1-3

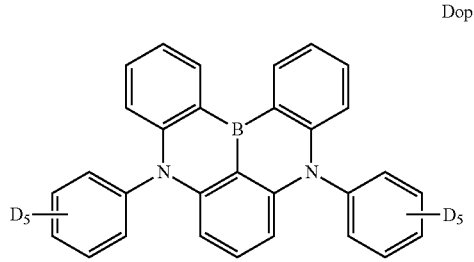

Dopant 1-4

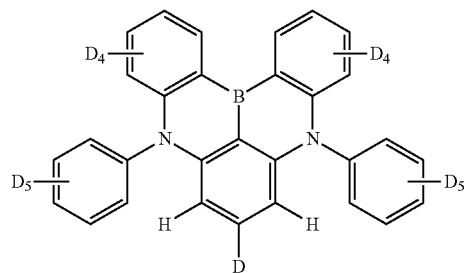

Dopant 2-1

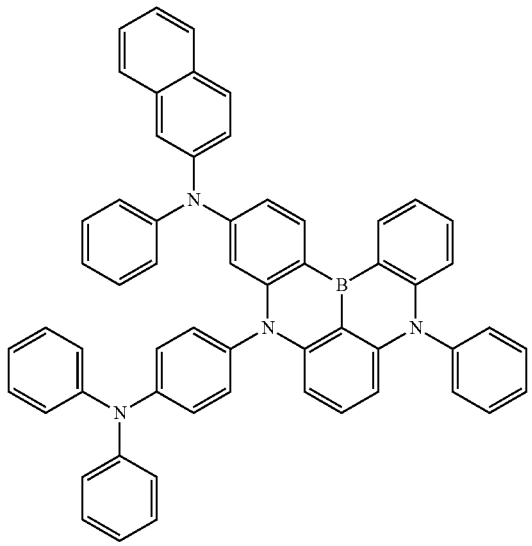

Dopant 2-2

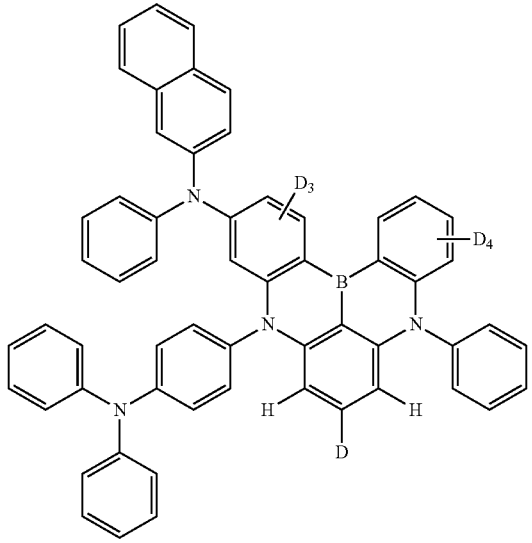

-continued
Dopant 2-3
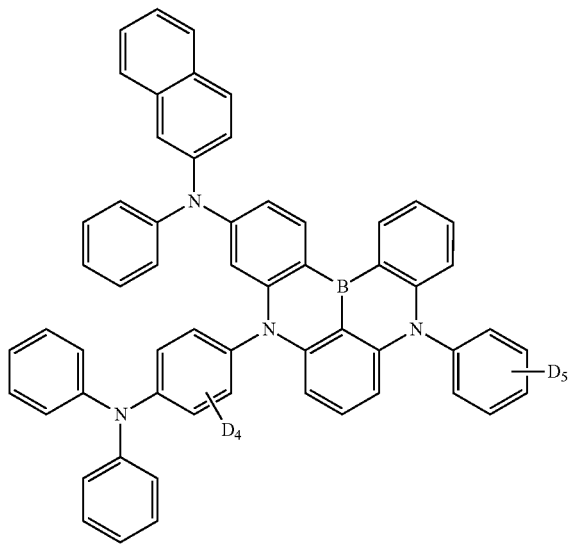
Dopant 2-4
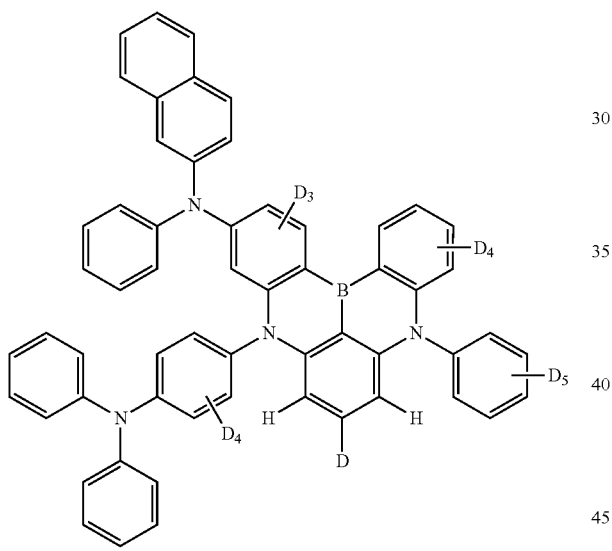
Dopant 3-1
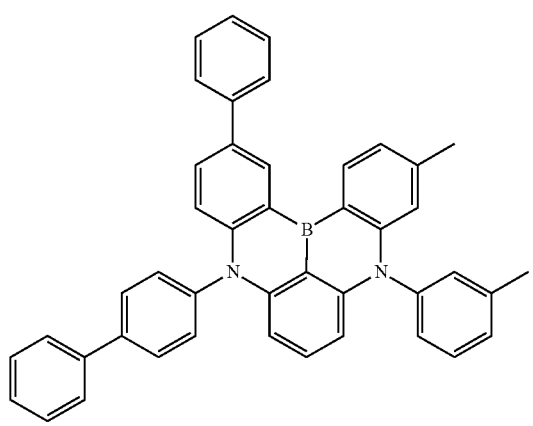
-continued
Dopant 3-2
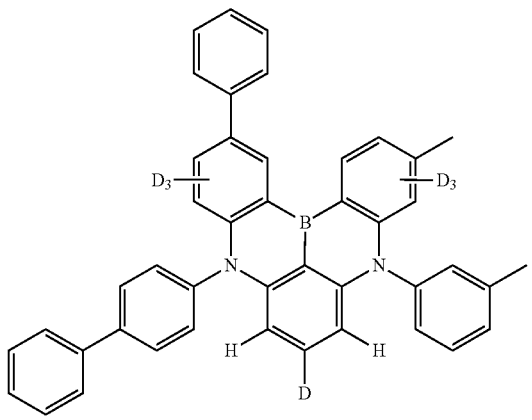
Dopant 3-3
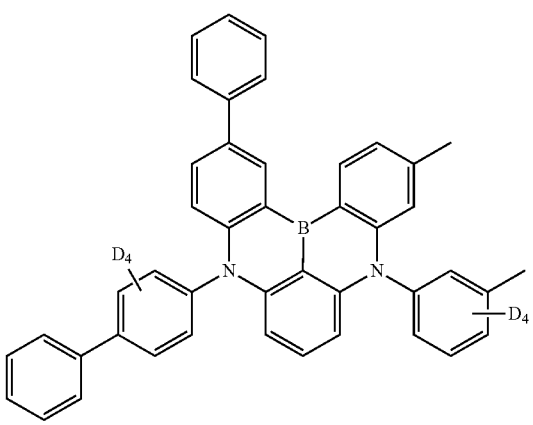
Dopant 3-4
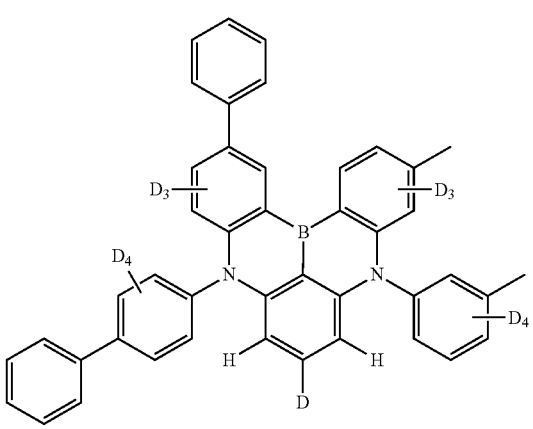

Dopant 4-1
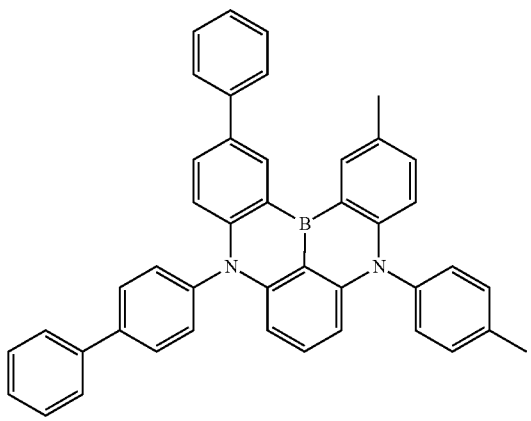
Dopant 4-2
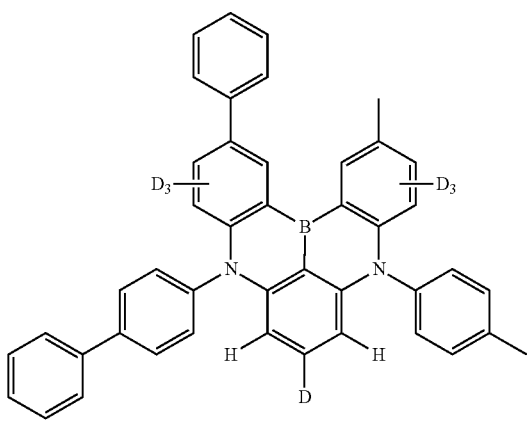
Dopnat 4-3
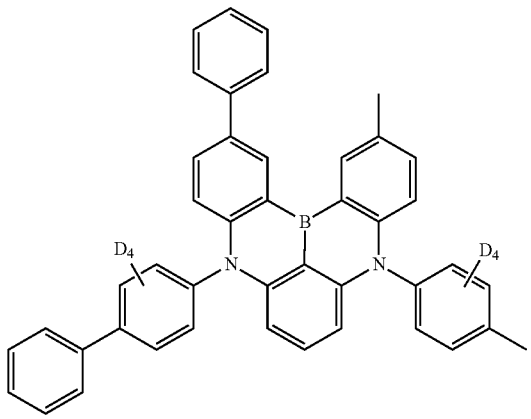
Dopant 4-4
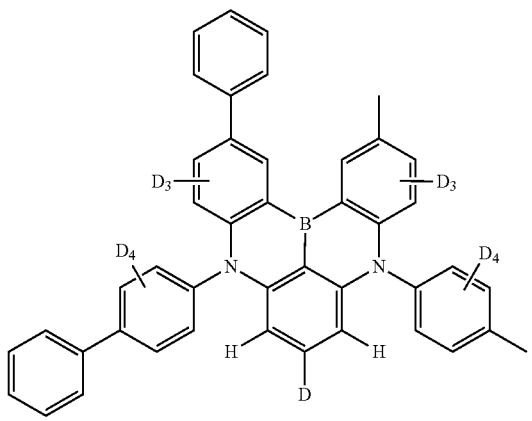
Dopant 5-1
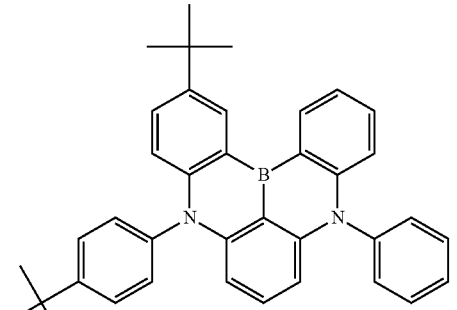
Dopant 5-2
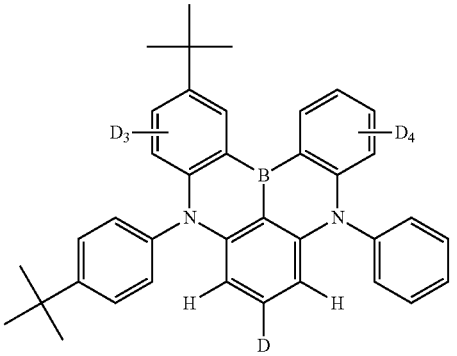
Dopant 5-3
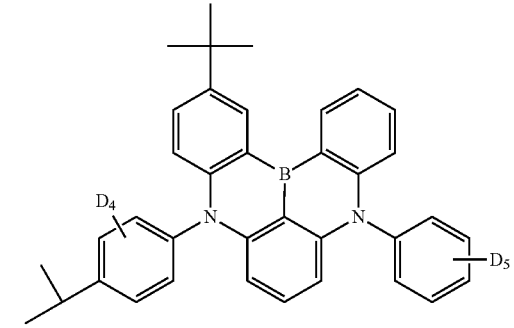

-continued
Dopant 5-4
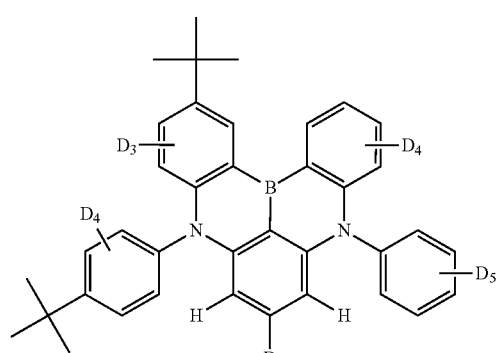
Dopant 6-1
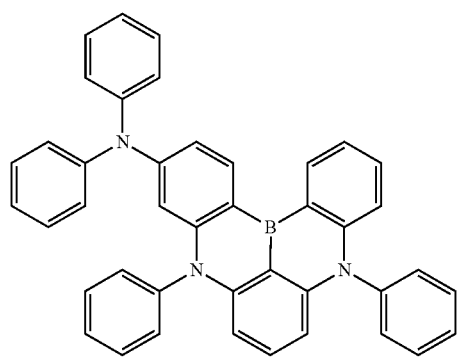
Dopant 6-2
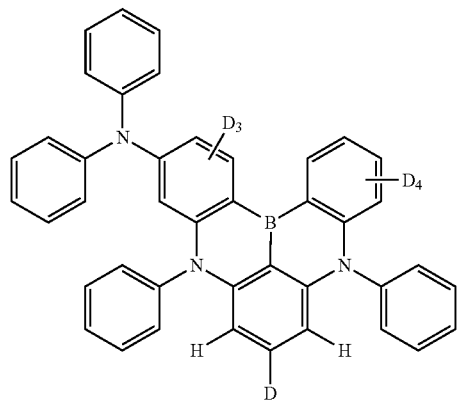
Dopant 6-3
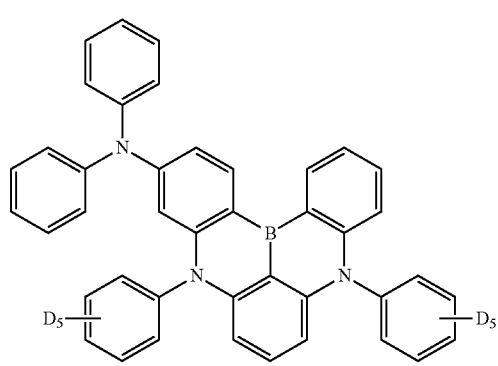
-continued
Dopant 6-4
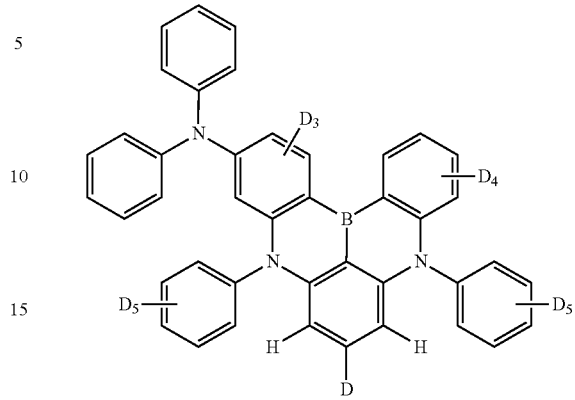
Dopant 7-1
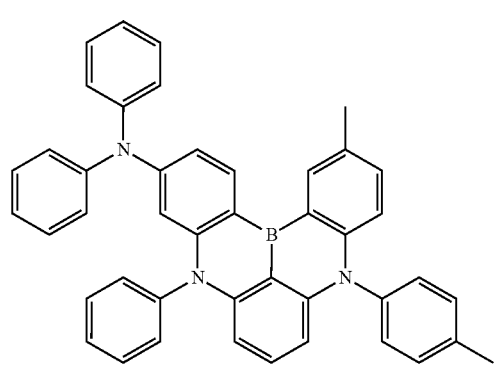
Dopant 7-2
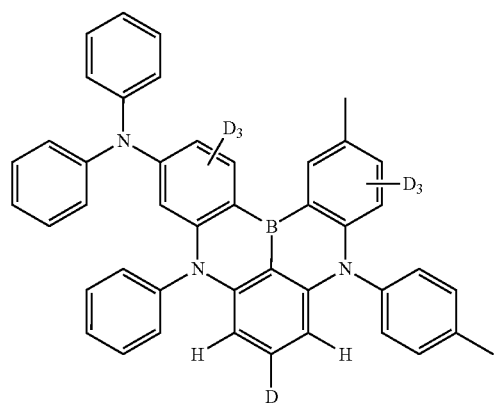
Dopant 7-3
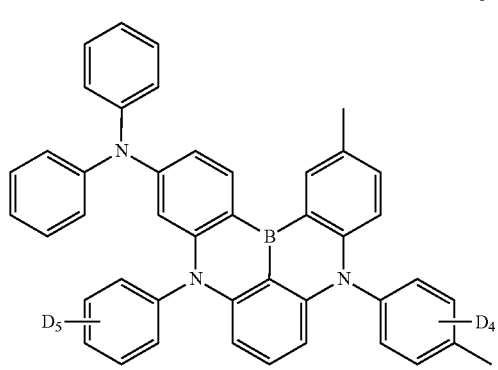

Dopant 7-4
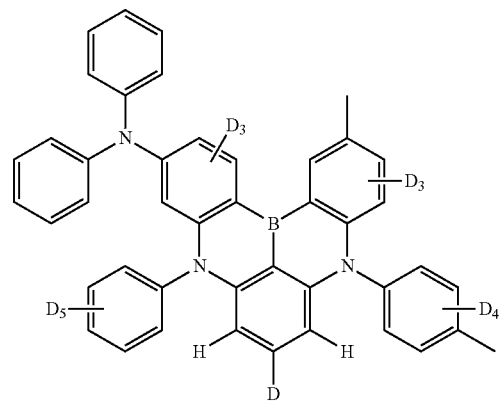
Dopant 8-1
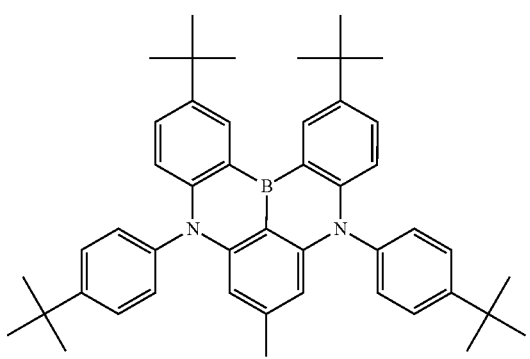
Dopant 8-2
Dopant 8-3
Dopant 8-4
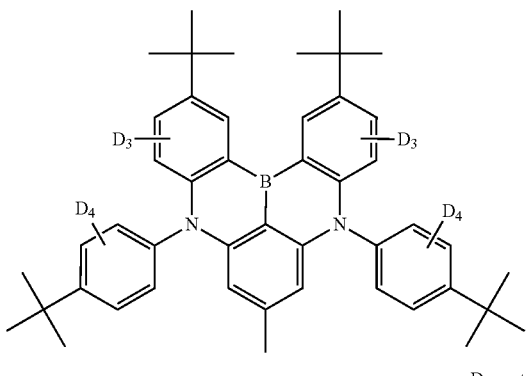
Dopant 9-1
Dopant 9-2
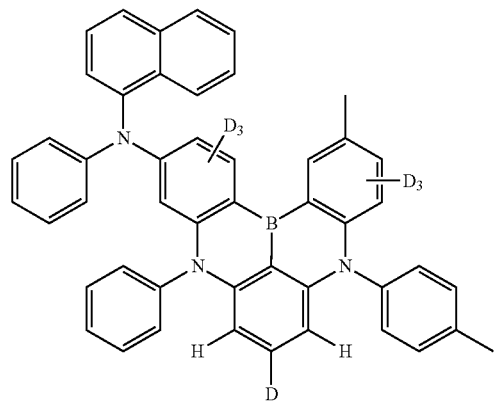
Dopant 9-3
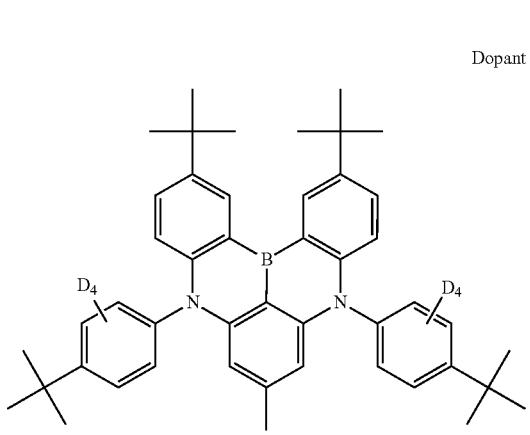
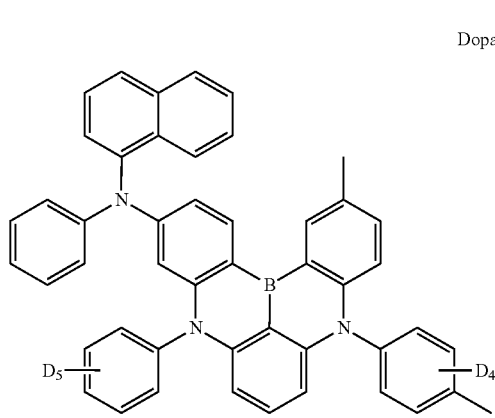

Dopant 9-4
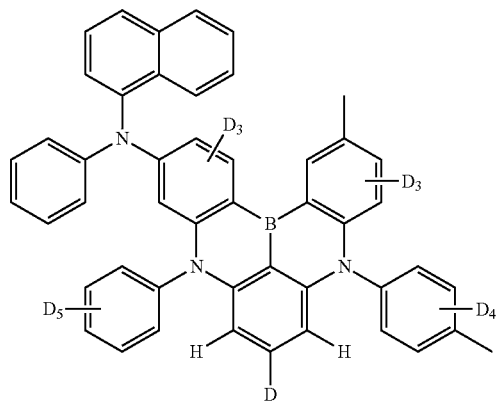
Dopant 10-1
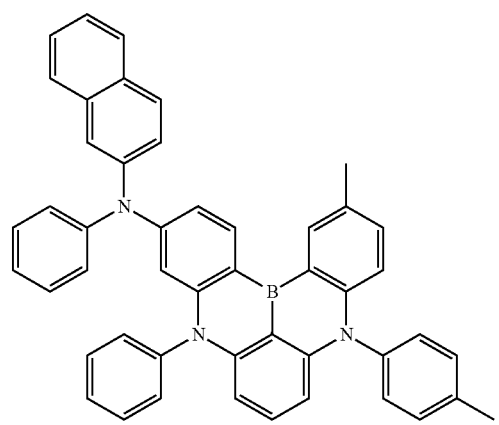
Dopant 10-2
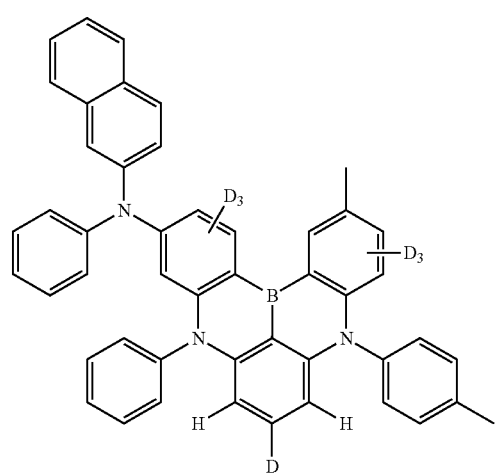
Dopant 10-3
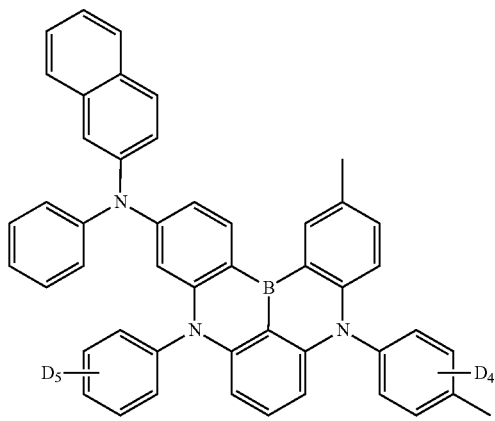
Dopant 10-4
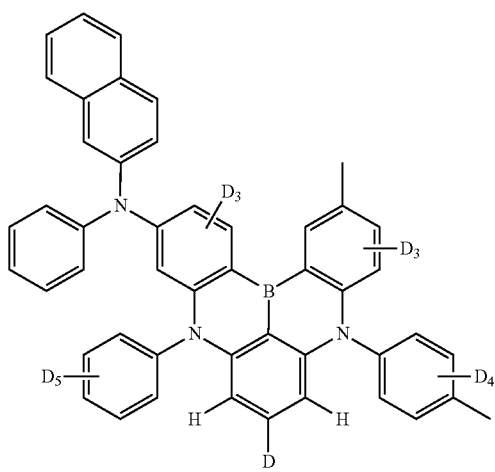
Dopant 11-1
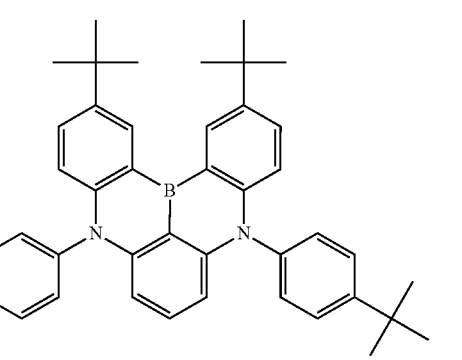

Dopant 11-2
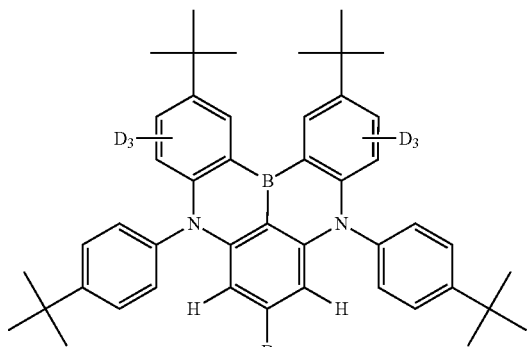
Dopant 11-3
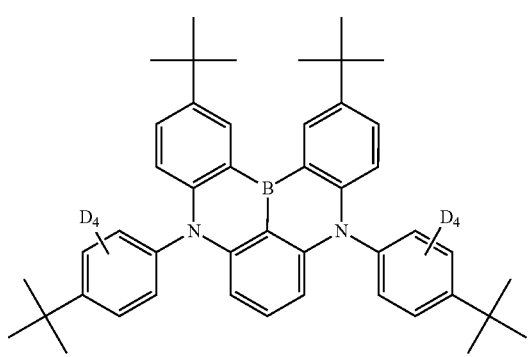
Dopant 11-4
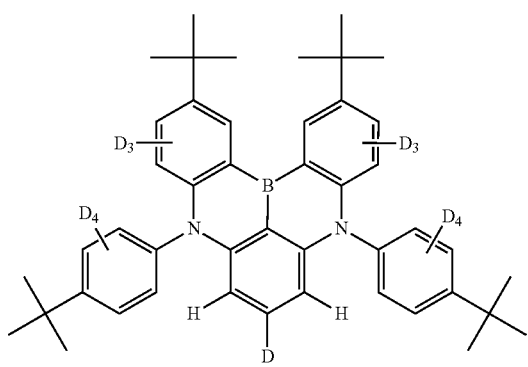
Dopant 12-1
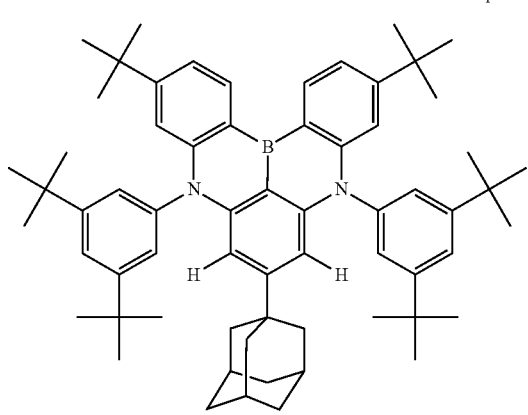
Dopant 12-2
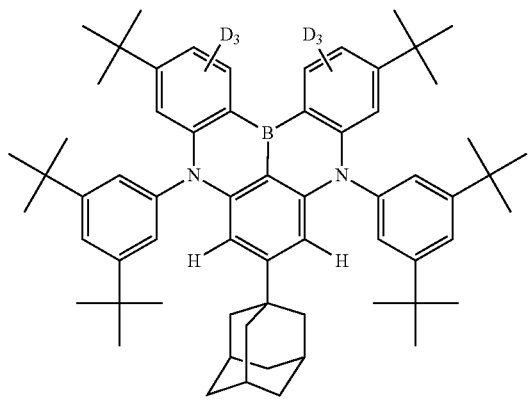
Dopant 12-3
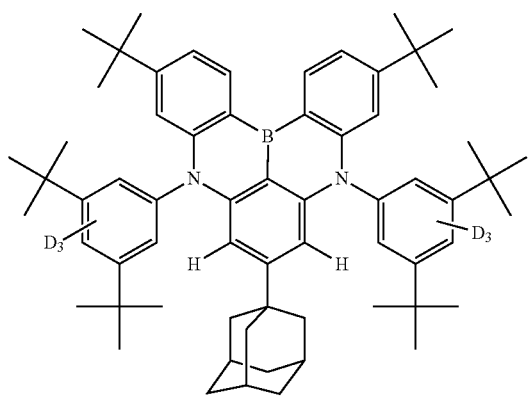
Dopant 12-4
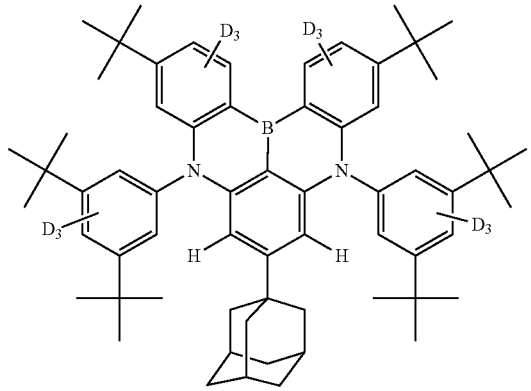

Dopant 13-1
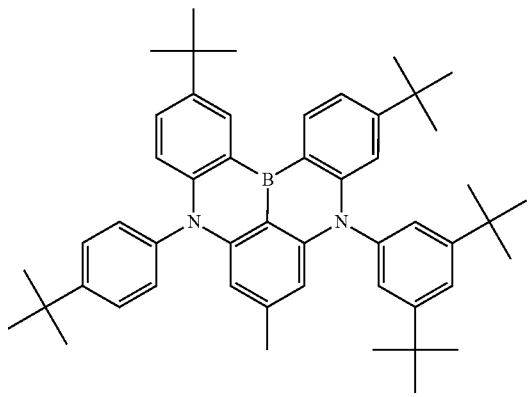
Dopant 13-2
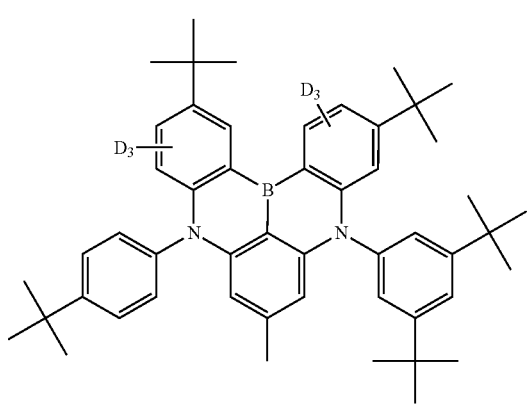
Dopant 13-3
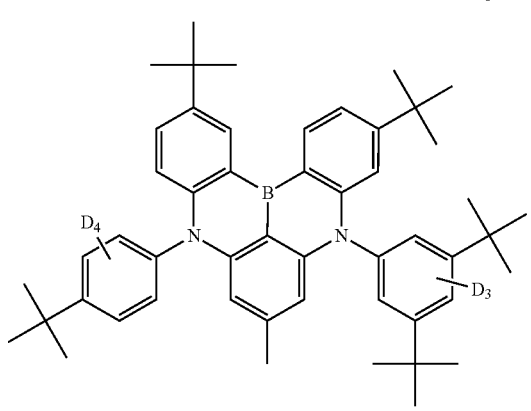
Dopant 13-4
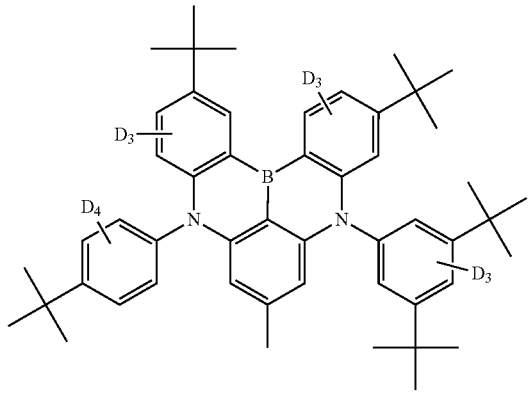
Dopant 14-1
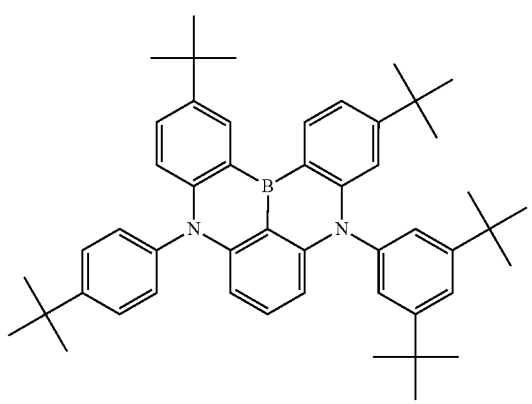
Dopant 14-2
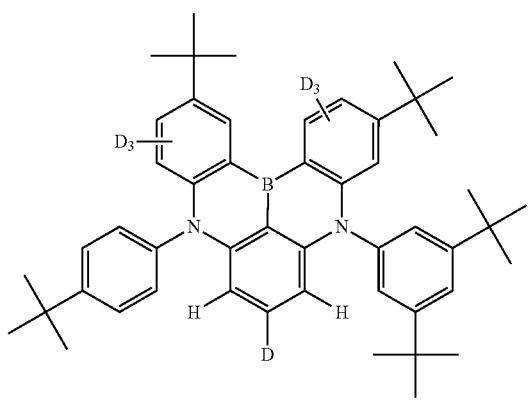
Dopant 14-3
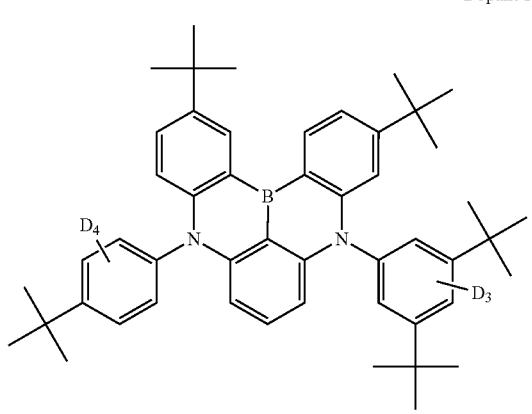

Dopant 14-4
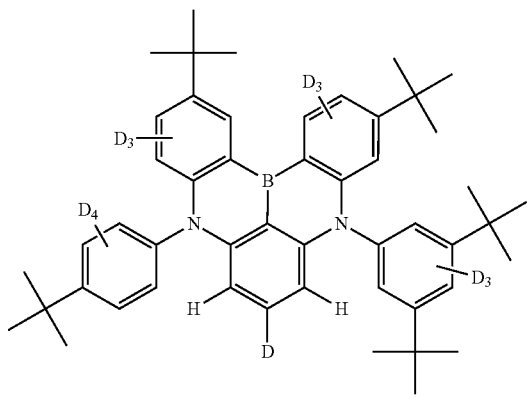
Dopant 15-1
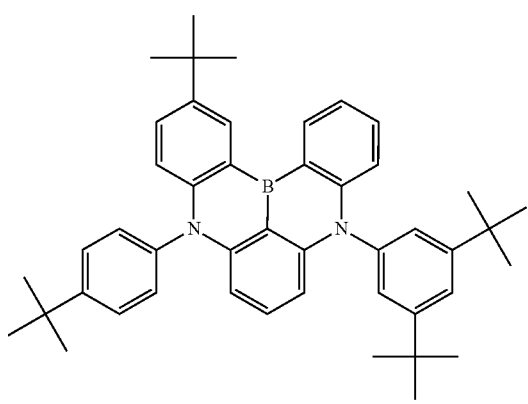
Dopant 15-2
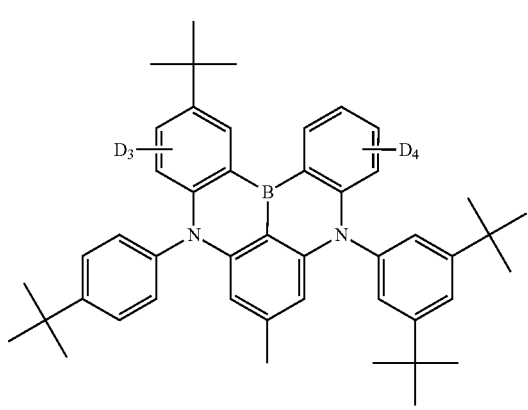
Dopant 15-3
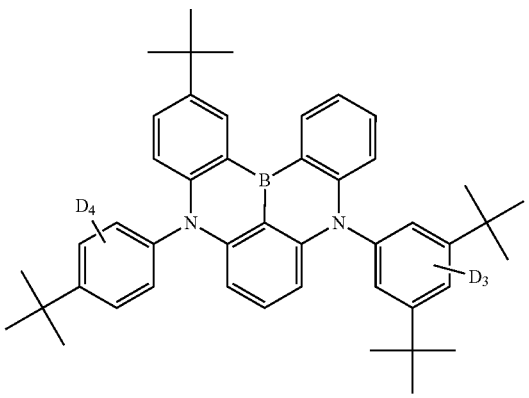
Dopant 15-4
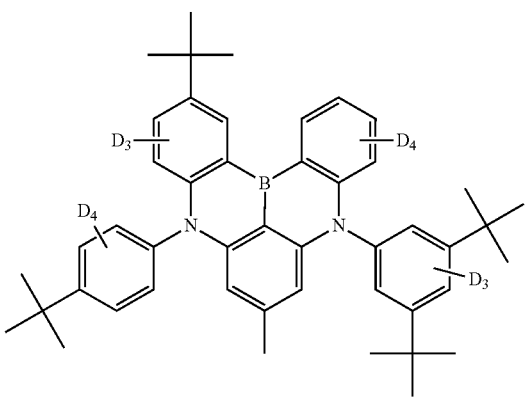
Dopant 16-1
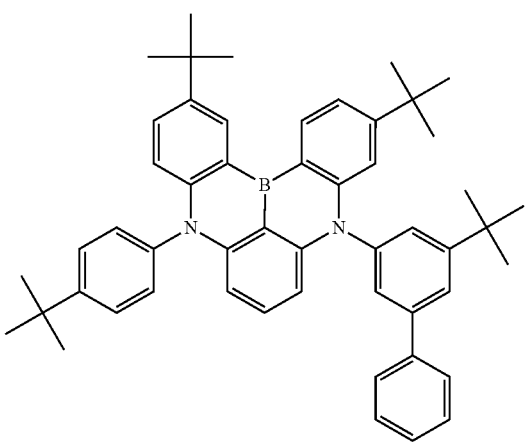

Dopant 16-2
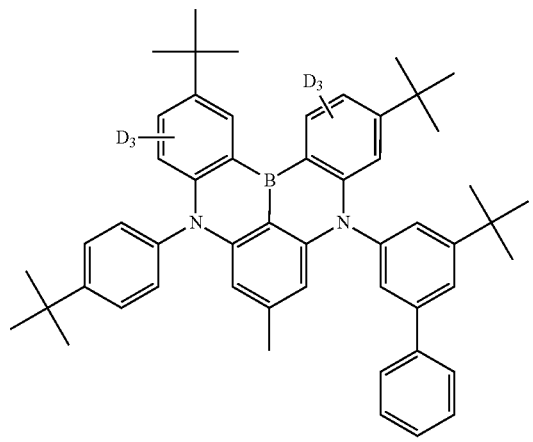
Dopant 17-1
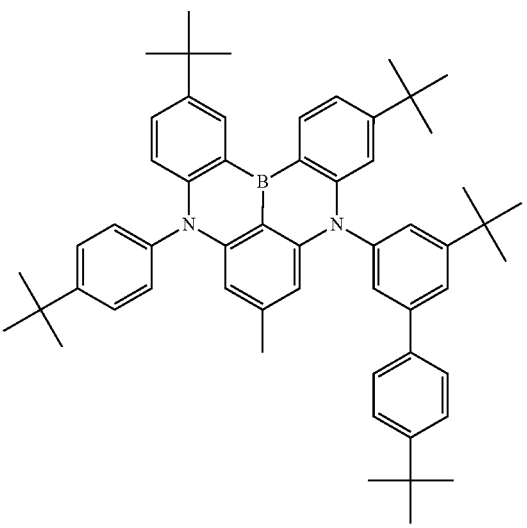
Dopant 16-3
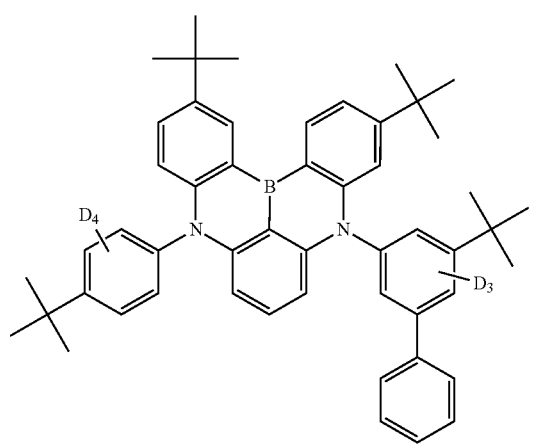
Dopant 17-2
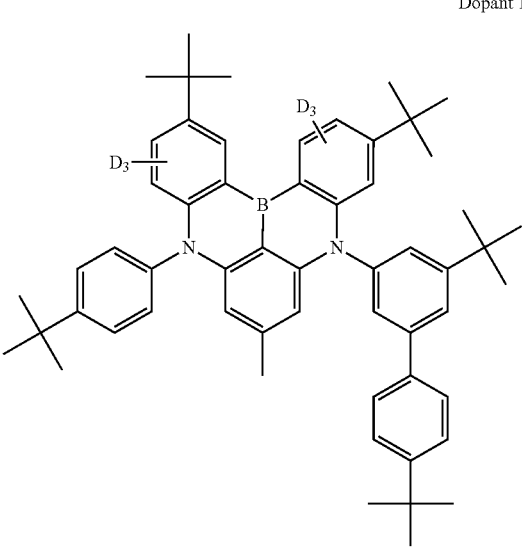
Dopant 16-4
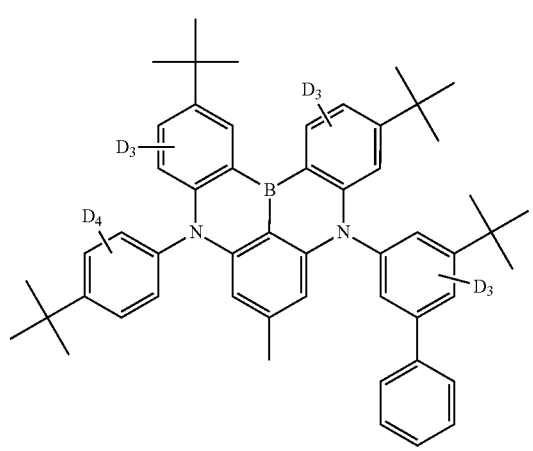
Dopant 17-3
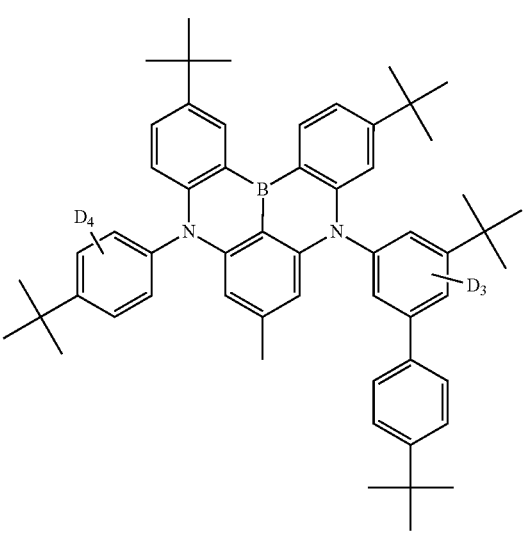

Dopant 17-4
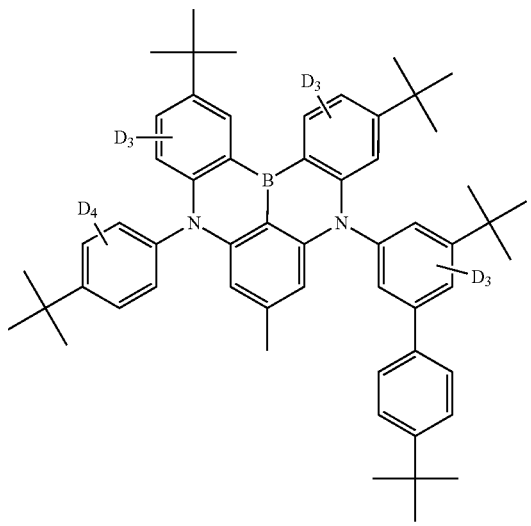
Dopant 18-1
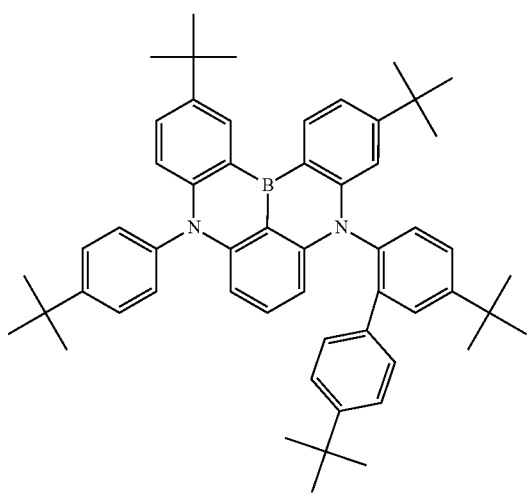
Dopant 18-2
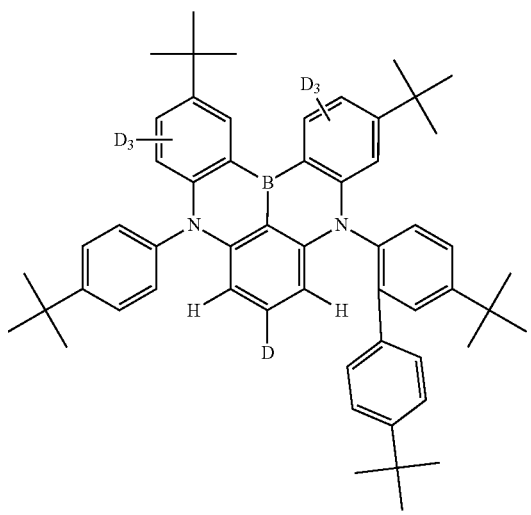
Dopant 18-3
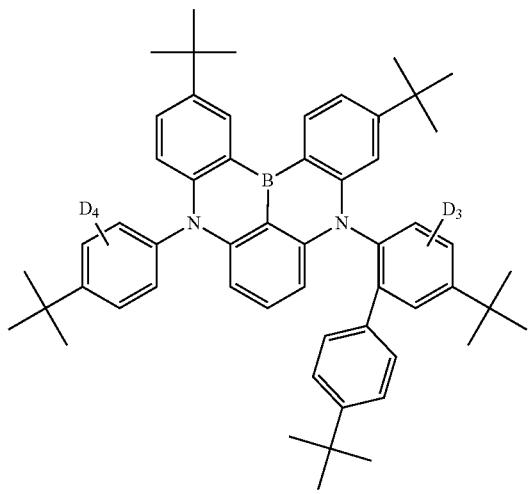
Dopant 18-4
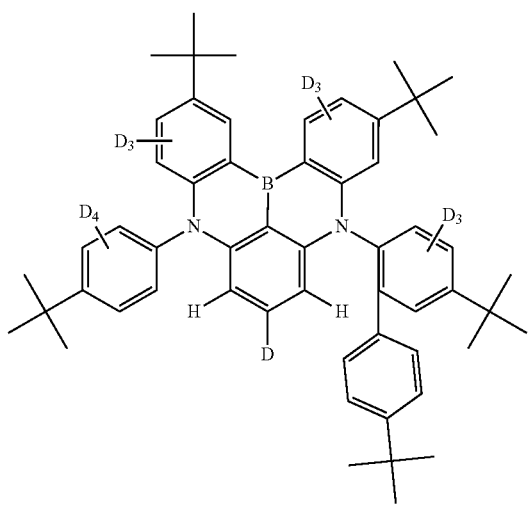
Dopant 19-1
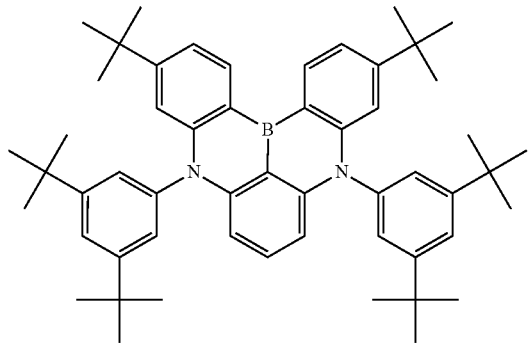

Dopant 19-2
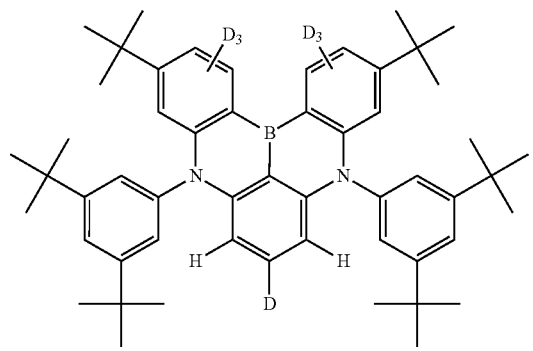
Dopant 19-3
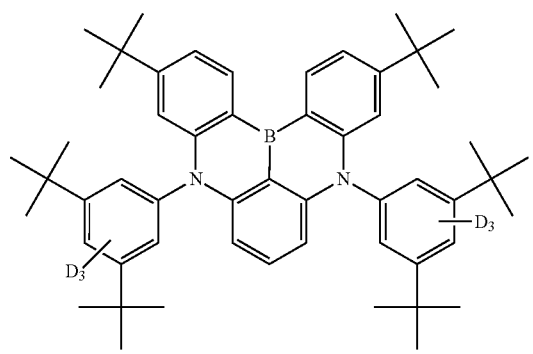
Dopant 19-4
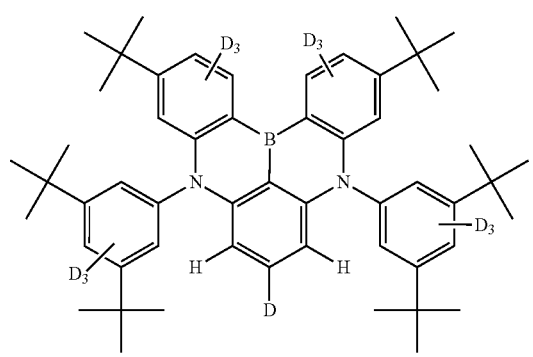
Dopant 20-1
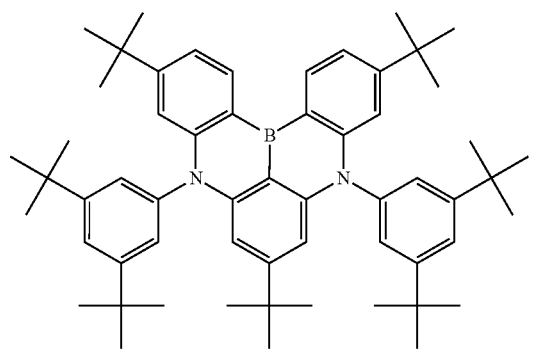
Dopant 20-2
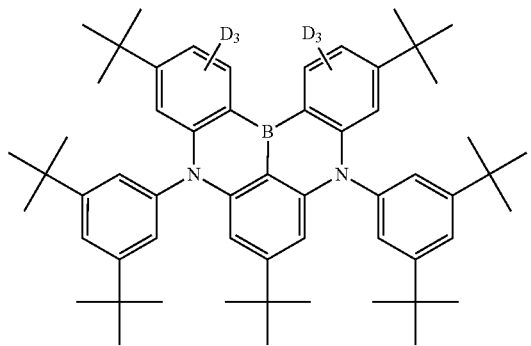
Dopant 20-3
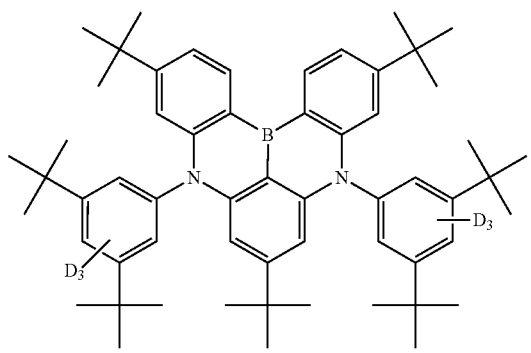
Dopant 20-4
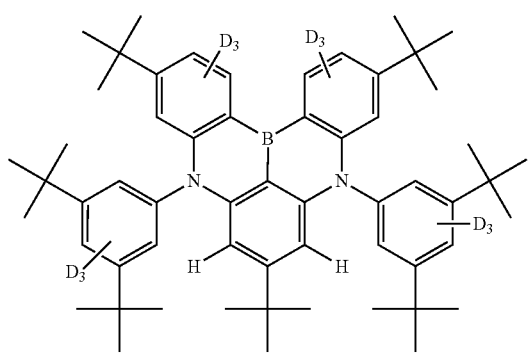
Dopant 21-1
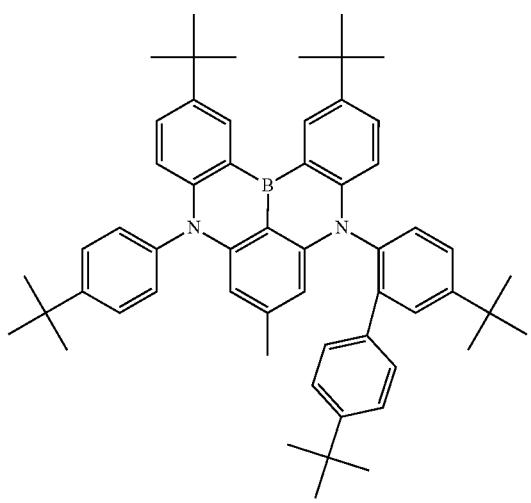

-continued
Dopant 21-2
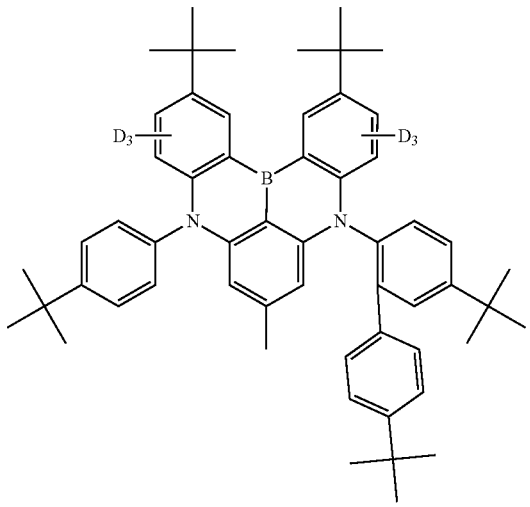
Dopant 21-3
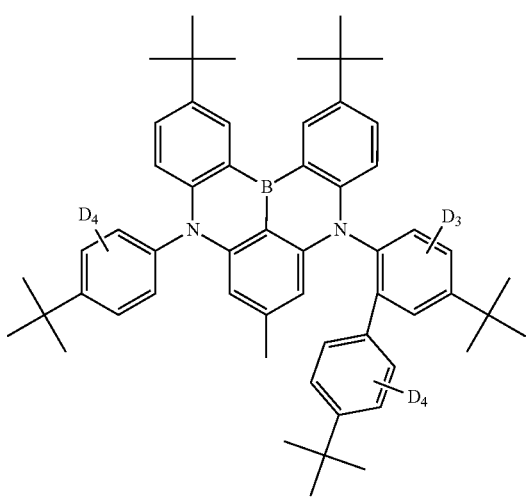
Dopant 21-4
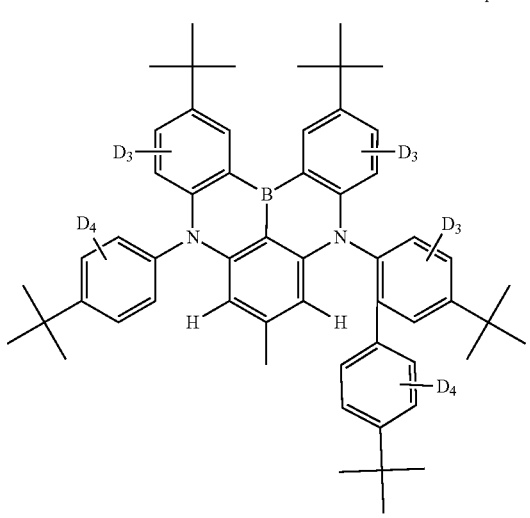
Dopant 22-1
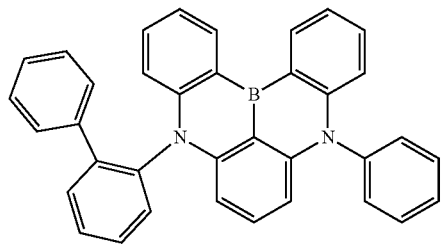
Dopant 22-2
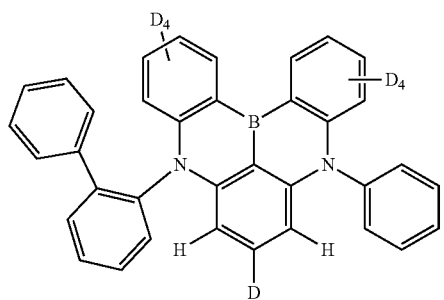
Dopant 22-3
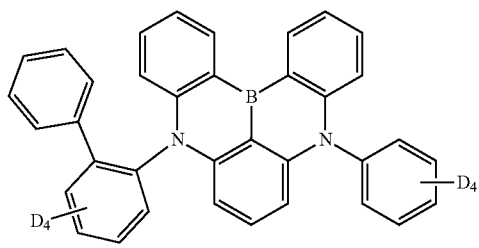
Dopant 22-4
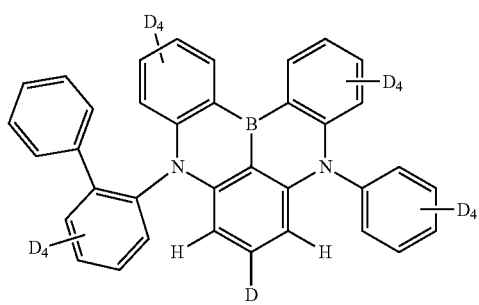
Dopant 23-1
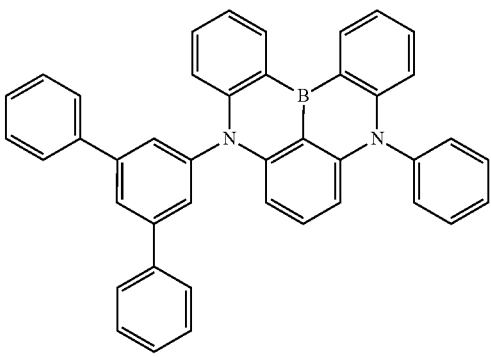

Dopant 23-2
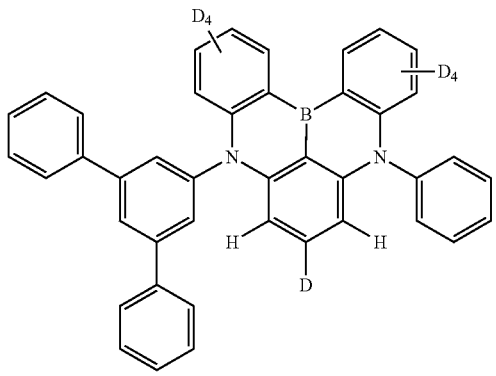
Dopant 23-3
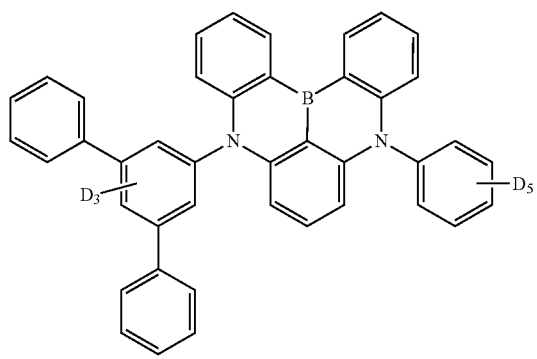
Dopant 23-4
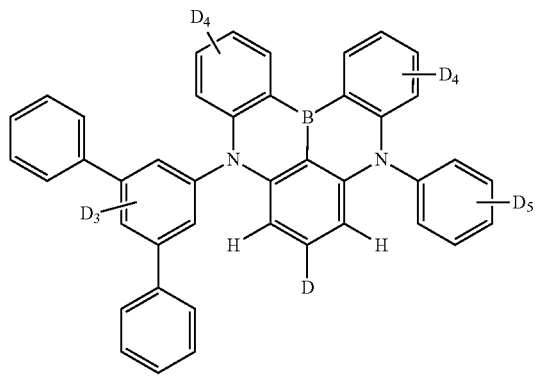
Dopant 24-1
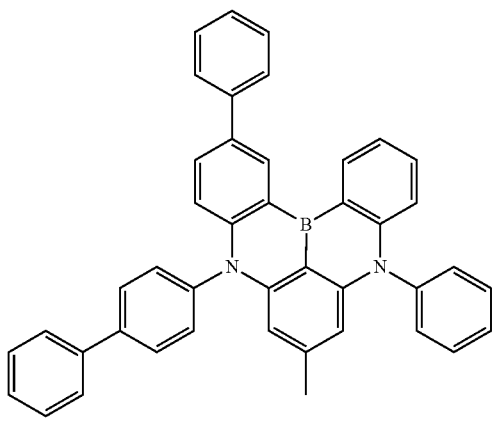
Dopant 24-2
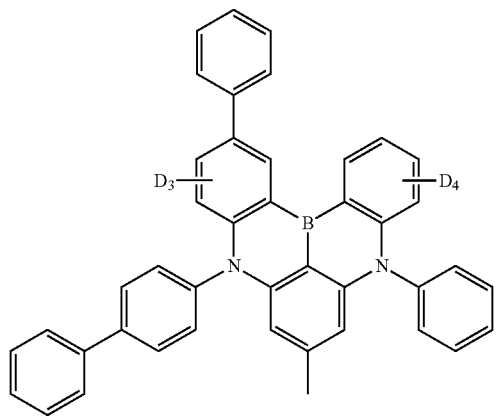
Dopant 24-3
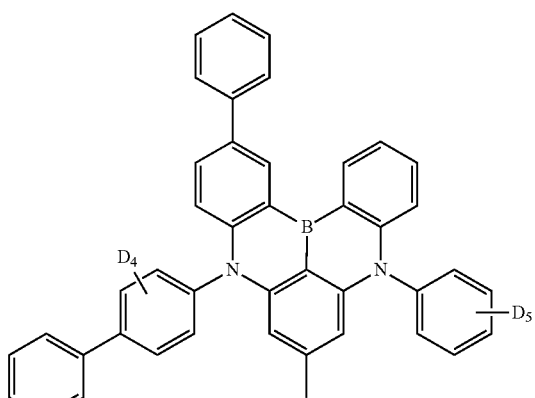
Dopant 24-4
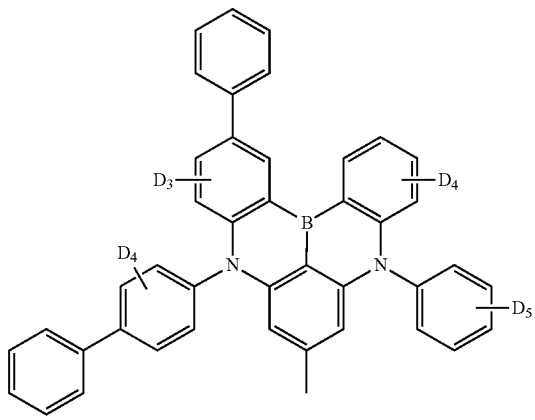

Dopant 25-1
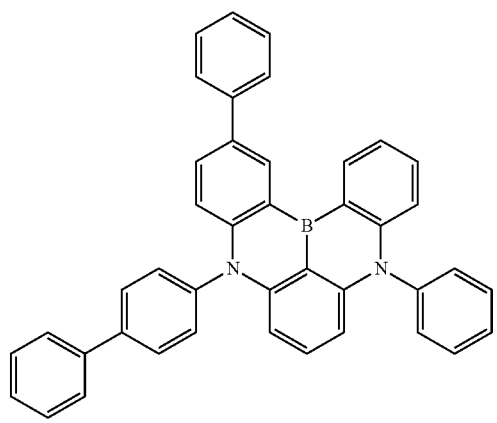
Dopant 25-2
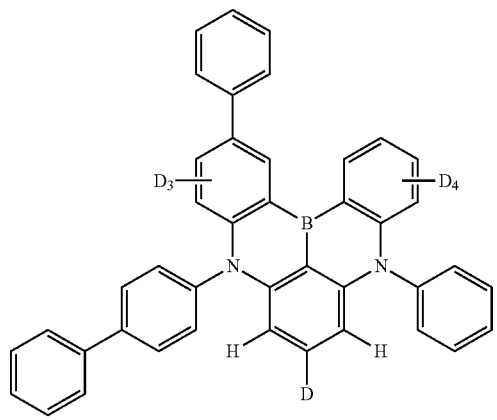
Dopant 25-3
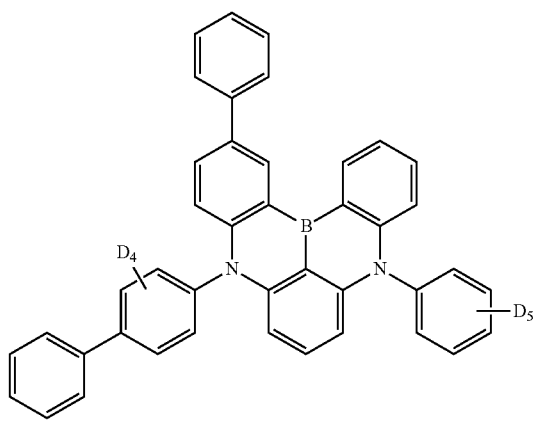
Dopant 25-4
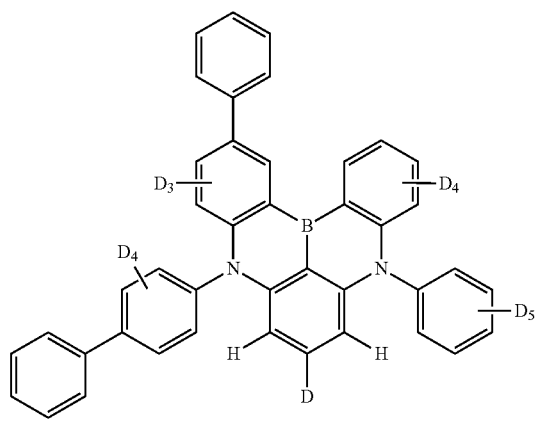
Dopant 26-1
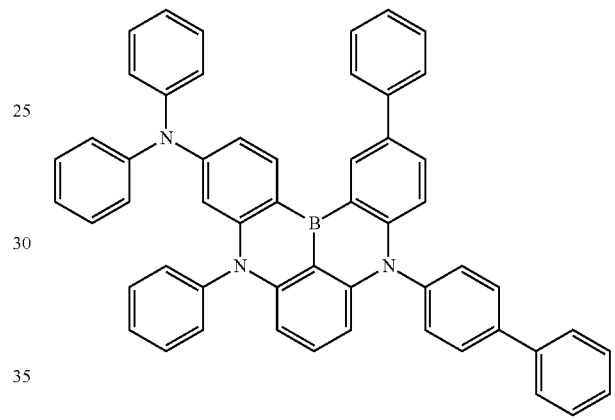
Dopant 26-2
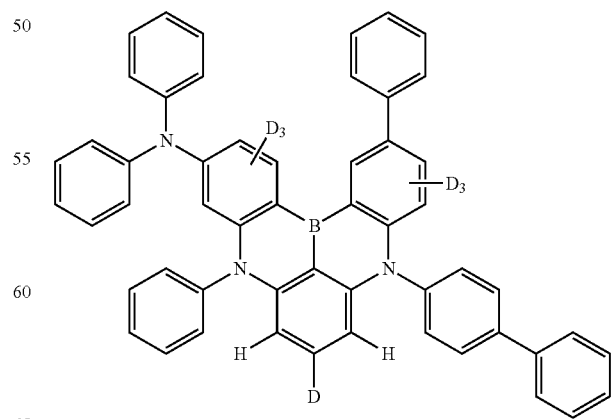

Dopant 26-3

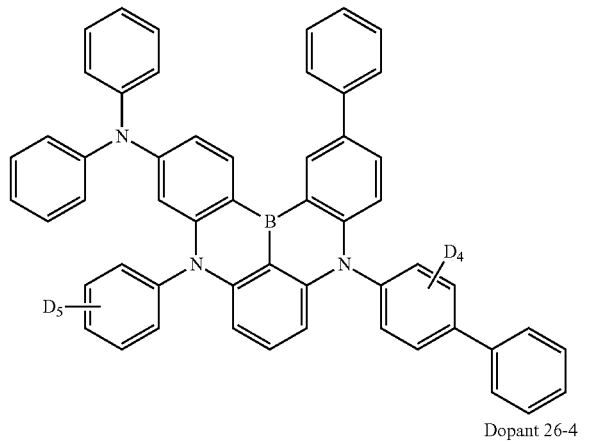

[Formula 12]

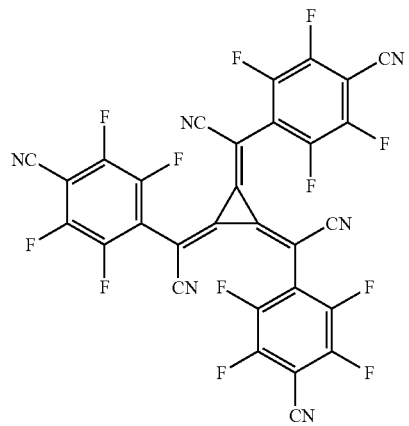

Dopant 26-4

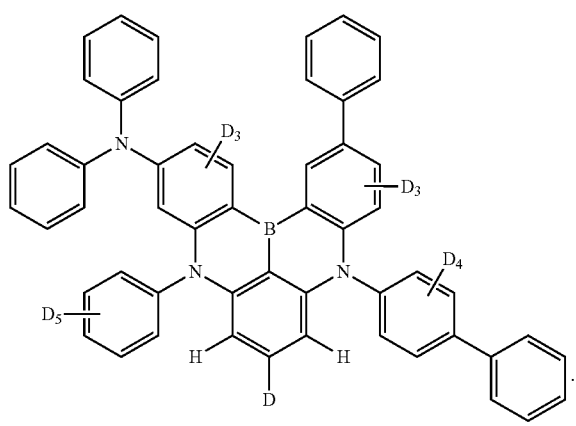

In one exemplary embodiment, the dopant 344 of the boron-based compound may be doped with a ratio of about 1 to about 50% by weight, for example, about 1 to about 30% by weight in the EML 340. The EML 340 may be laminated with a thickness of, but is not limited to, about 10 nm to about 200 nm, preferably about 20 nm to about 100 nm, and more preferably about 20 nm to about 50 nm.

The HIL 310 is disposed between the first electrode 210 and the HTL 320 and improves an interface property between the inorganic first electrode 210 and the organic HTL 320. In one exemplary embodiment, the HIL 310 may include a hole injection material selected from, but is not limited to, the group consisting of 4,4'4''-Tris(3-methylphenylamino)triphenylamine (MTDATA), 4,4',4''-Tris(N,N-diphenyl-amino)triphenylamine (NATA), 4,4',4''-Tris(N-(naphthalene-1I-yl)-N-phenyl-amino)triphenylamine (1T-NATA), 4,4',4''-Tris(N-(naphthalene-2-yl)-N-phenyl-amino) triphenylamine (2T-NATA), Copper phthalocyanine (CuPc), Tris(4-carbazoyl-9-yl-phenyl)amine (TCTA), N,N'-Diphenyl-N,N'-bis(1-naphthyl)-1,1'-biphenyl-4,4''-diamine (NPB; NPD), 1,4,5,8,9,11-Hexaazatriphenylenehexacarbonitrile (Dipyrazino[2,3-f:2'3'-h]quinoxaline-2,3,6,7,10,11-hexacarbonitrile; HAT-CN), 1,3,5-tris[4-(diphenylamino)phenyl] benzene (TDAPB), poly(3,4-ethylenedioxythiphene)polystyrene sulfonate (PEDOT/PSS), 2,3,5,6-tetrafluoro-7,7,8,8-tetracyanoquinodimethane (F4TCNQ), N-(biphenyl-4-yl)-9,9-dimethyl-N-(4-(9-phenyl-9H-carbazol-3-yl)phenyl)-9H-fluoren-2-amine and/or the compound having the following structure of Formula 12:

In an alternative embodiment, the HIL 310 may include a hole transport material, which will be described, doped with the hole injection material. In this case, the hole injection material may be doped with a ratio of about 1 to about 50% by weight, for example, about 1 to about 30% by weight in the HIL 310. The HIL 310 may be omitted in compliance of the OLED D1 property.

The HTL 320 is disposed adjacently to the EBL 330 between the first electrode 210 and the EBL 330. In one exemplary embodiment, the HTL 320 may include a hole transport material selected from, but is not limited to, N,N'-Diphenyl-N,N'-bis(3-methylphenyl-1,1'-biphenyl-4,4'-diamine (TPD), NPB (NPD), N,N'-bis[4-[bis(3-methylphenyl)amino]phenyl]-N,N'-diphenyl-[1,1'-Biphenyl]-4,4'-diamine (DNTPD), 4,4'-bis(N-carbazolyl)-1,1'-biphenyl (CBP), Poly[N,N'-bis(4-butylphenyl)-N,N'-bis(phenyl)-benzidine](Poly-TPD), Poly[(9,9-dioctylfluorenyl-2,7-diyl)-co-(4,4'-(N-(4-sec-butylphenyl)diphenylamine))] (TFB), 1,1-bis(4-(N,N'-di(p-tolyl)amino)phenyl) cyclohexane (TAPC), 3,5-Di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenl-9H-carbazol-3-yl)phenyl)-9H-fluoren-2-amine, N4,N4,N4',N4'-tetrakis([1,1'-biphenyl]-4-yl)-[1,1'-biphenyl]-4,4'-diamine and/or the compound having the following structure of Formula 11:

[Formula 11]

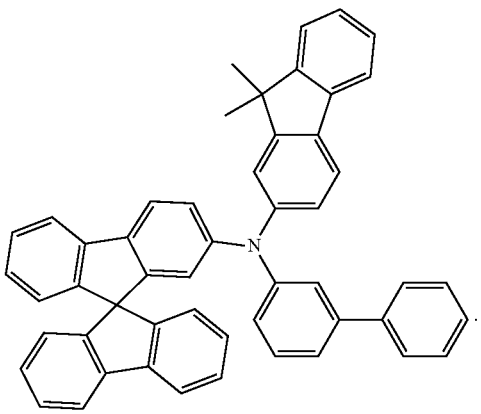

In an exemplary embodiment, each of the HIL 310 and the HTL 320 may be laminated with a thickness of, but is not limited to, about 5 nm to about 200 nm, for example, about 5 nm to about 100 nm.

The EBL 330 prevents electrons from transporting from the EML 340 to the first electrode 210. The EBL 330 may include an amine-based compound having the following structure of Formula 5:

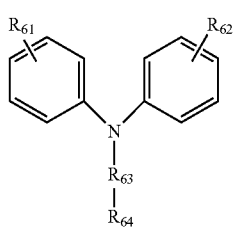

[Formula 5]

In Formula 5, each of $R_{61}$ to $R_{62}$ and $R_{64}$ is independently monocyclic aryl or polycyclic aryl, $R_{63}$ is monocyclic arylene or polycyclic arylene, wherein at least one of $R_{61}$ to $R_{64}$ is polycyclic.

As an example, at least two of $R_{61}$ to $R_{64}$ may be polycyclic. In this case, the monocyclic aryl may be phenyl, the monocyclic arylene may be phenylene, the polycyclic aryl may be $C_{10}$-$C_{20}$ fused aryl such as naphthyl, anthracenyl, phenanthrenyl or pyrenyl, and the polycyclic arylene may be $C_{10}$-$C_{20}$ fused arylene such as naphthylene, anthracenylene, phenanthrenylene or pyrenylene.

For example, the EBL 330 may be selected from any aryl-amine based compound having the following structure of Formula 6:

[Formula 6]

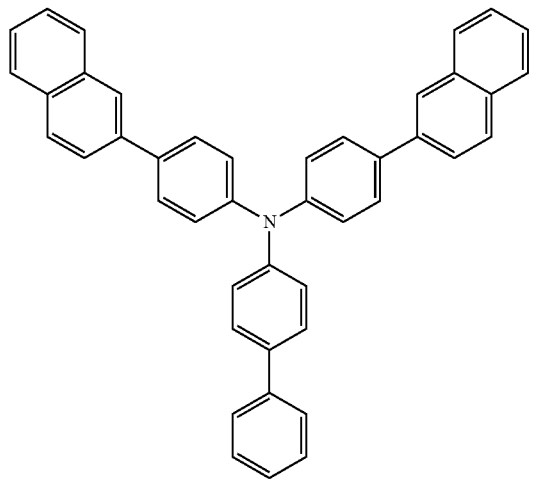

E1

-continued

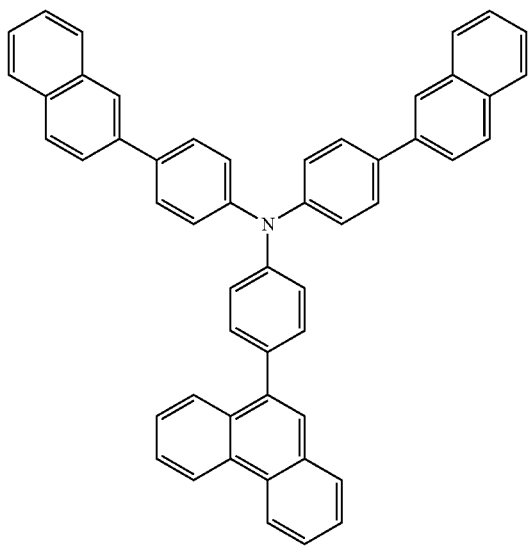

E2

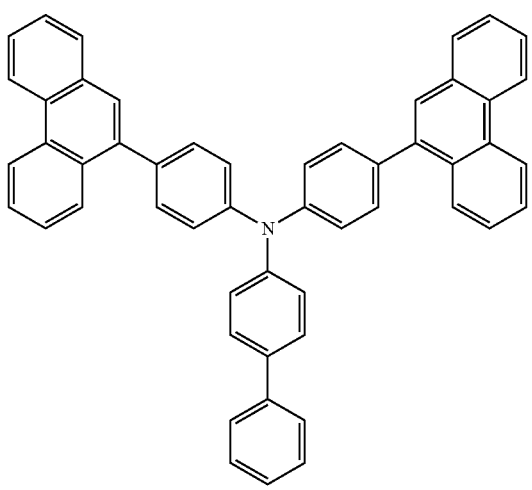

E3

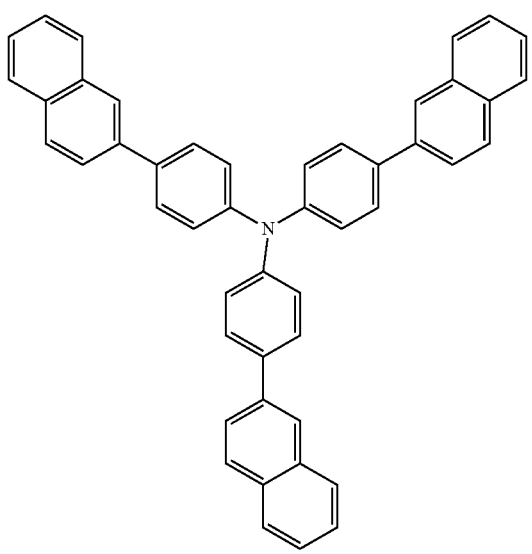

E4

-continued
E5
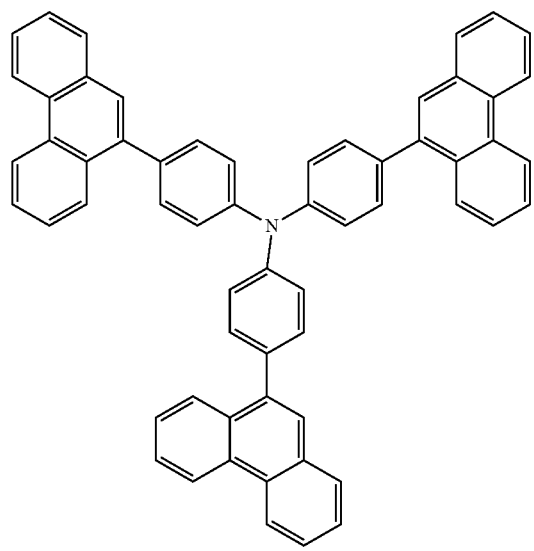
E6
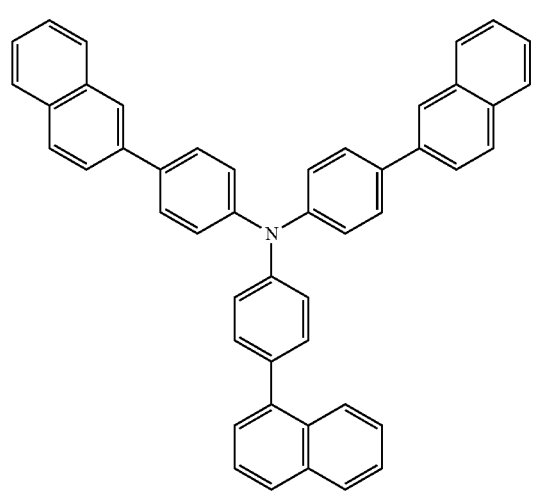
E8
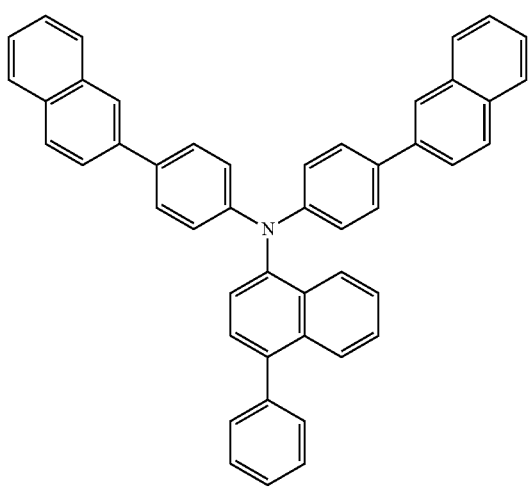
E9
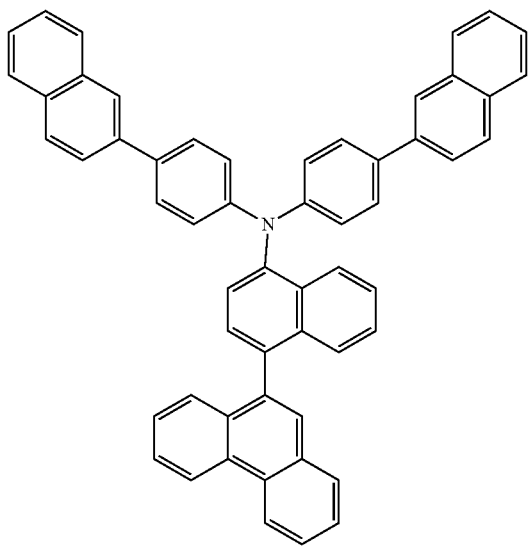
E7
E10

E11
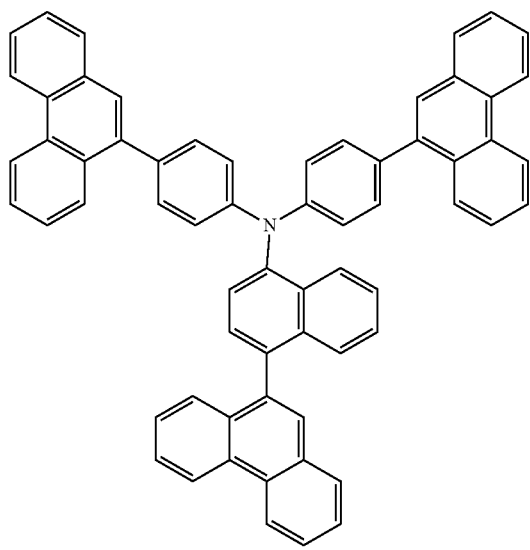
E14
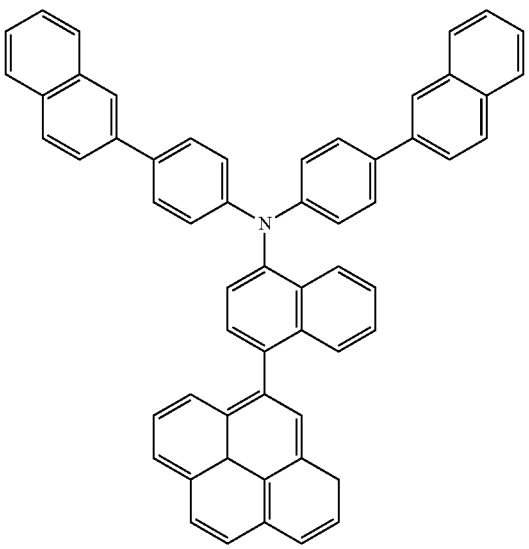
E12
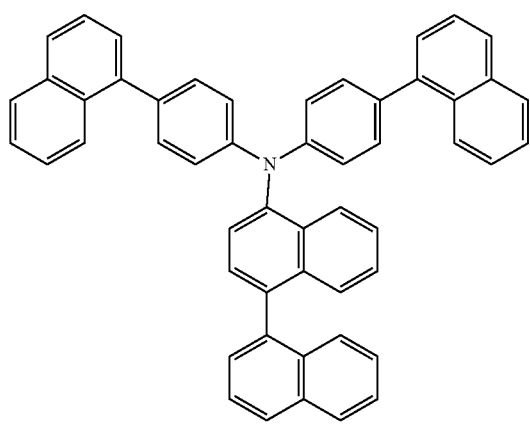
E15
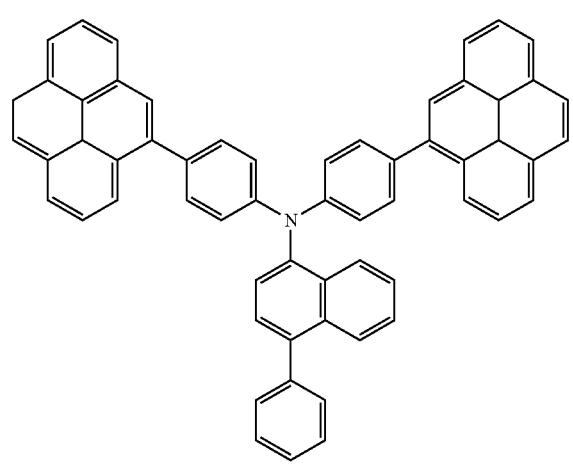
E13
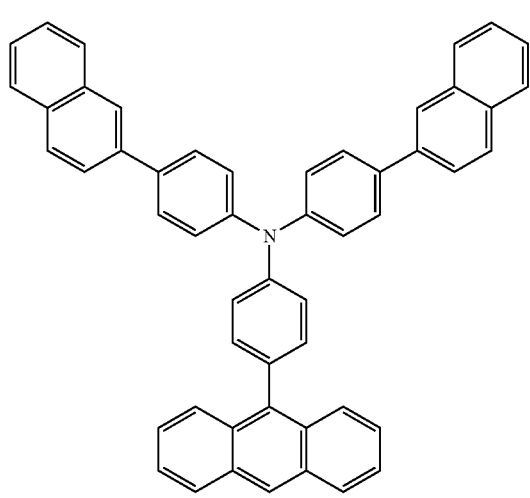
E16
Alternatively, the OLED D1 may further include the HBL 350 which prevents holes from transporting from the EML 340 to the second electrode 220. As an example, the HBL 350 may include an azine-based compound having the following structure of Formula 7 and/or a benzimidazole-based compound having the following structure of Formula 9:

[Formula 7]

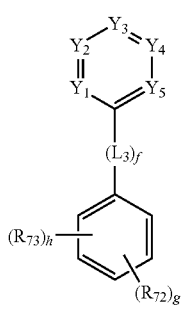

[Formula 8]

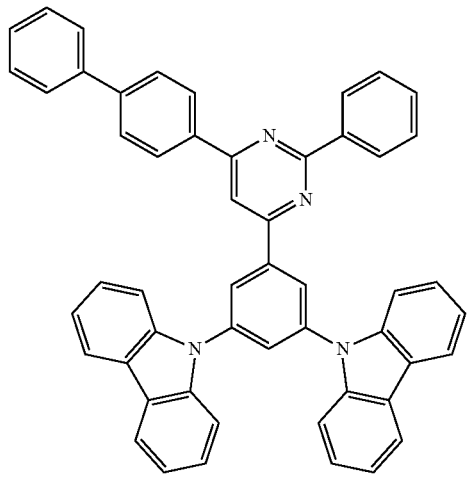

H1

In Formula 7, each of $Y_1$ to $Y_5$ is independently $CR_{71}$ or nitrogen (N) and one to three of $Y_1$ to $Y_5$ is N, wherein $R_{71}$ is $C_6$-$C_{30}$ aryl. $L_3$ is $C_6$-$C_{30}$ arylene; $R_{72}$ is $C_6$-$C_{30}$ aryl or $C_5$-$C_{30}$ hetero aryl, wherein the $C_6$-$C_{30}$ aryl is optionally substituted with another $C_6$-$C_{30}$ aryl or $C_5$-$C_{30}$ hetero aryl or forms a spiro structure with a $C_{10}$-$C_{30}$ fused aryl ring or a $C_{10}$-$C_{30}$ fused hetero aryl ring, wherein the another $C_6$-$C_{30}$ aryl is optionally further substituted with other $C_6$-$C_{30}$ aryl or $C_5$-$C_{30}$ hetero aryl or forms a spiro structure with a $C_{10}$-$C_{30}$ fused aryl ring; $R_{73}$ is hydrogen or adjacent two of $R_{73}$ form a fused aromatic ring; f is 0 or 1; g is 1 or 2; and h is an integer of 0 to 4.

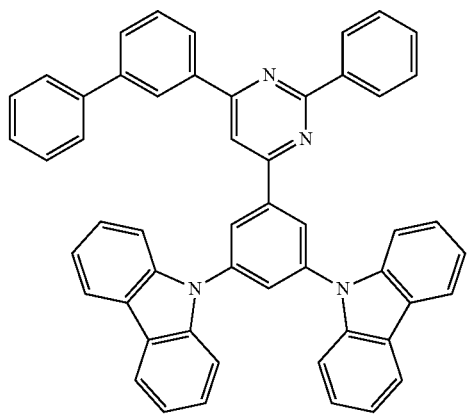

H2

[Formula 9]

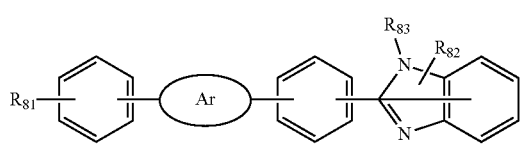

In Formula 9, Ar is $C_{10}$-$C_{30}$ arylene; $R_{81}$ is $C_6$-$C_{30}$ aryl or $C_5$-$C_{30}$ hetero aryl, each of the $C_6$-$C_{30}$ aryl and the $C_5$-$C_{30}$ hetero aryl is optionally substituted with $C_1$-$C_{10}$ alkyl; and each of $R_{82}$ and $R_{83}$ is independently hydrogen, $C_1$-$C_{10}$ alkyl or $C_6$-$C_{30}$ aryl.

In one exemplary embodiment, the aryl group constituting $R_{72}$ in Formula 7 may be unsubstituted or substituted further with another $C_6$-$C_{30}$ aryl group or $C_5$-$C_{30}$ hetero aryl group, or form a spiro structure with other fused aryl ring or fused hetero aryl ring. For example, the aryl or the hetero aryl group that may be substituted to $R_{72}$ may be a $C_{10}$-$C_{30}$ fused aryl group or a $C_{10}$-$C_{30}$ fused hetero aryl group. $R_{73}$ in Formula 7 may be fused to form a naphthyl group. In one exemplary embodiment, the HBL 350 may be selected from any azine-based compound having the following structure of Formula 8:

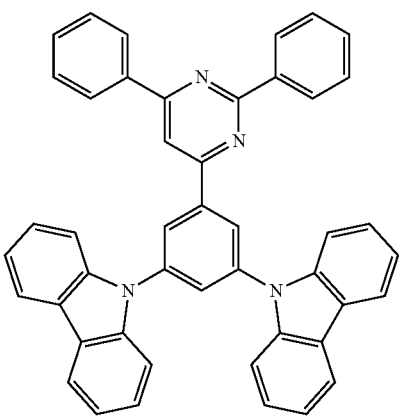

H3

51
-continued
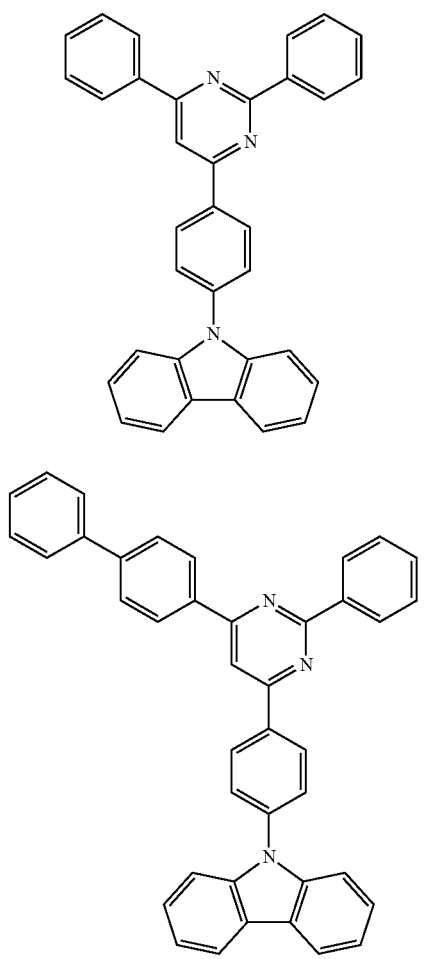
H4
H5
H6
52
-continued
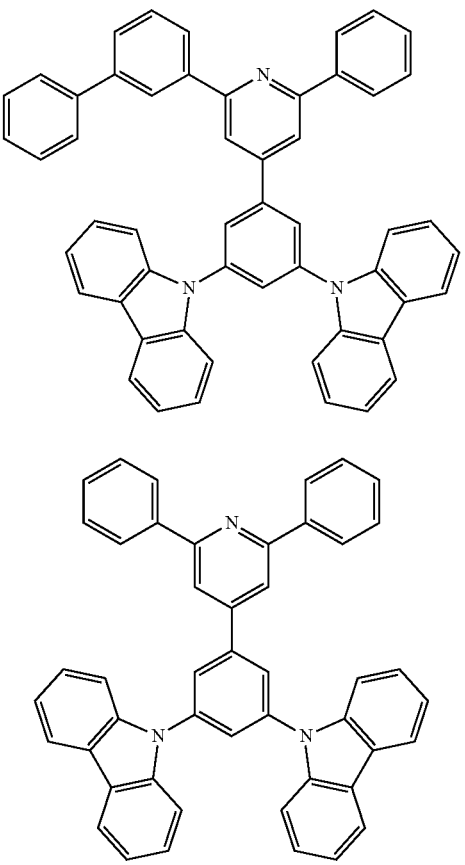
H7
H8
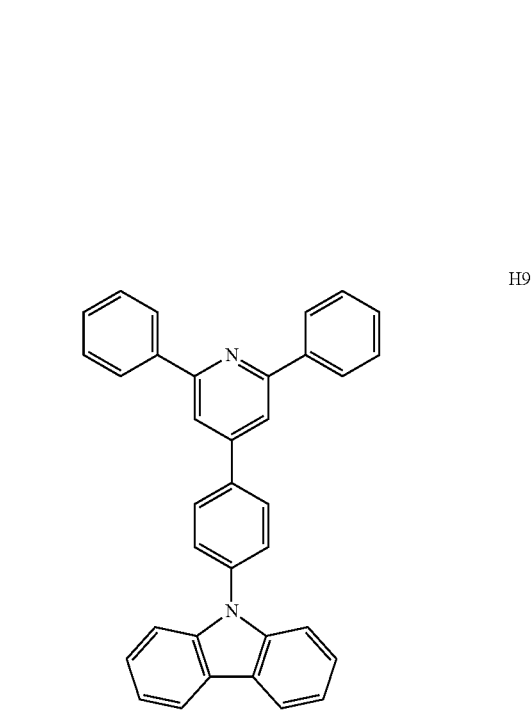
H9

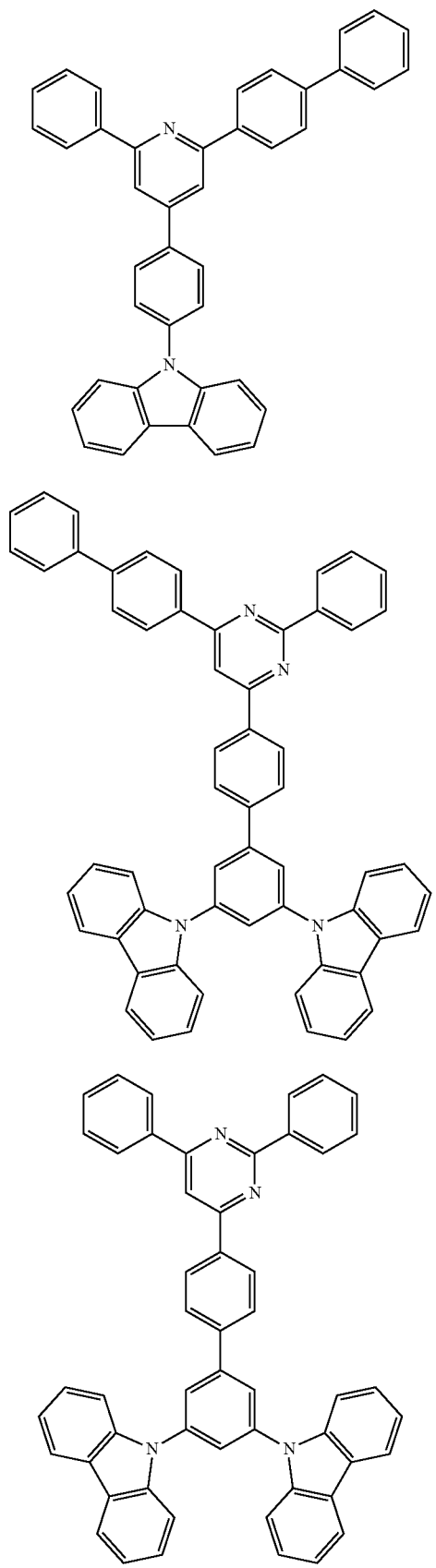
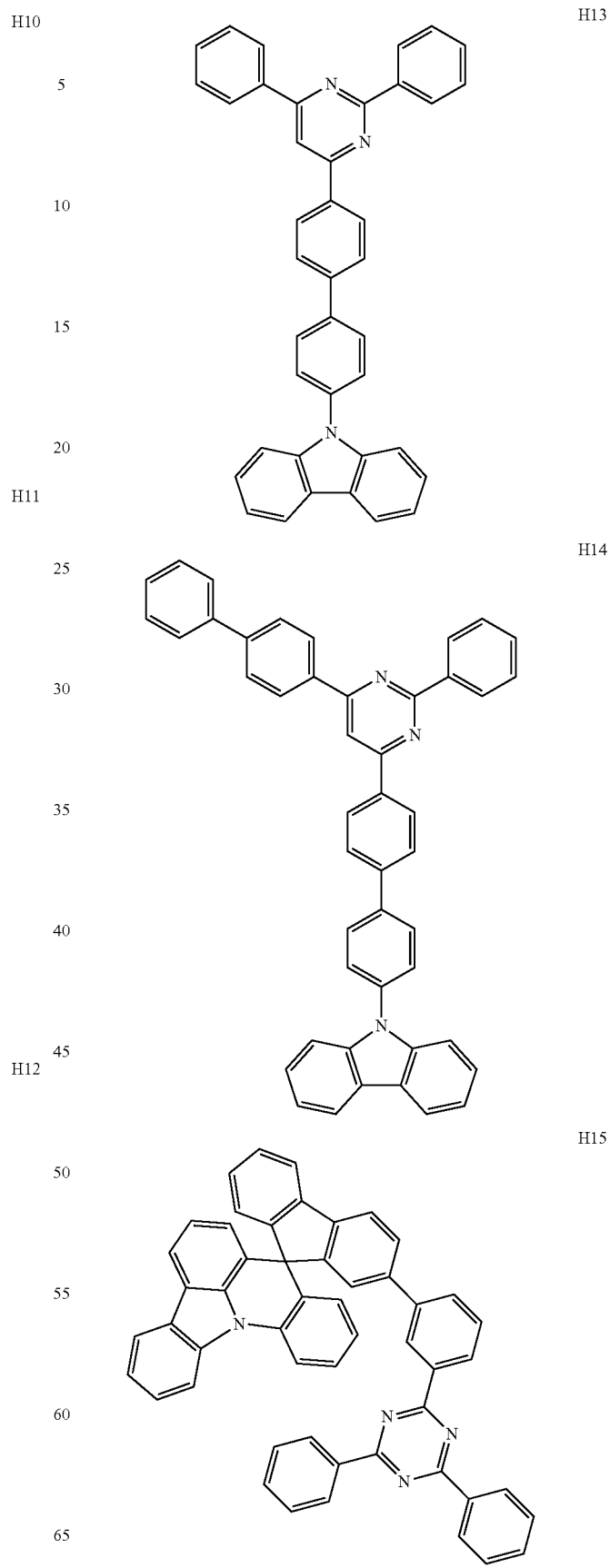

H16

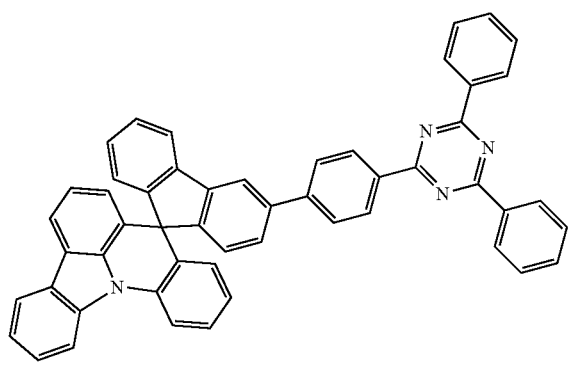

H17

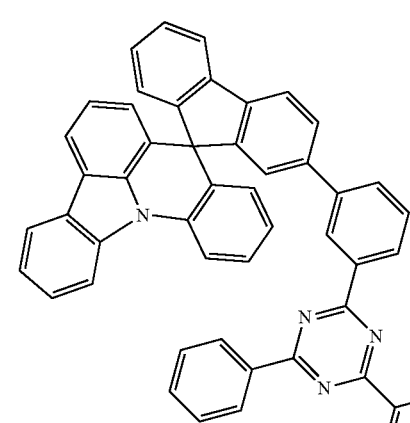

H18

H19

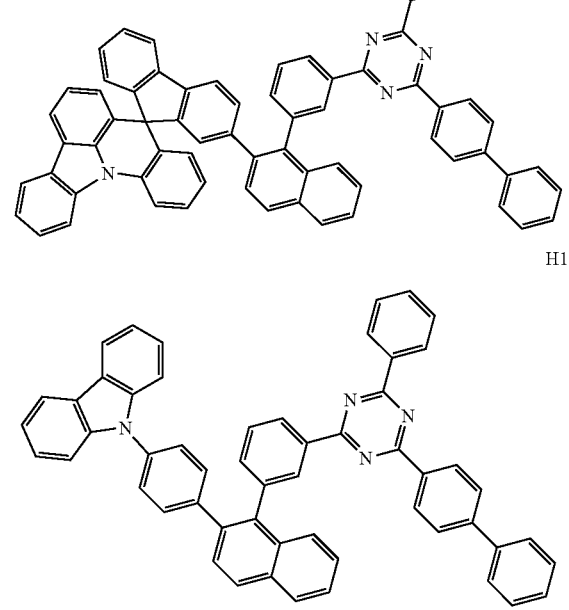

H20

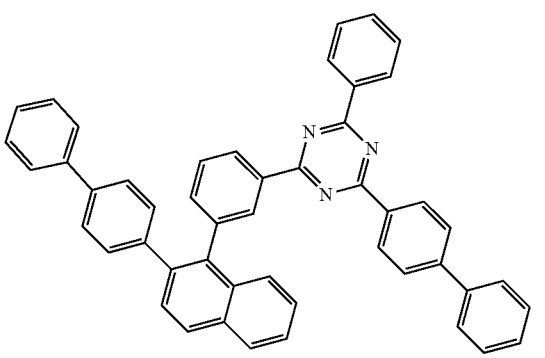

H21

H22

H23

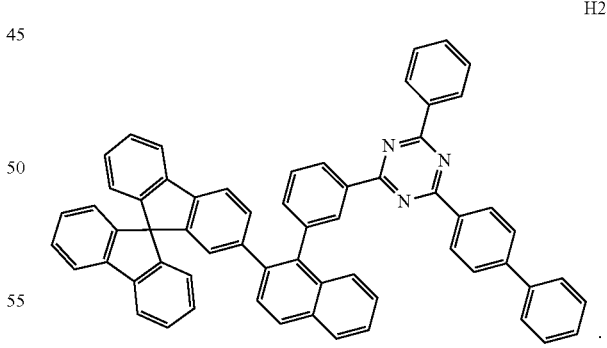

As an example, "Ar" in Formula 9 may be a naphthylene group or an anthracenylene group, $R_{51}$ in Formula 9 may be a phenyl group or a benzimidazole group, $R_{82}$ in Formula 9 may be a methyl group, an ethyl group or a phenyl group and $R_{83}$ in Formula 9 may be hydrogen, a methyl group or a phenyl group. In one exemplary embodiment, the benzimidazole compound that can be introduced into the HBL 350 may be selected from any benzimidazole-based compound having the following structure of Formula 10:

[Formula 10]

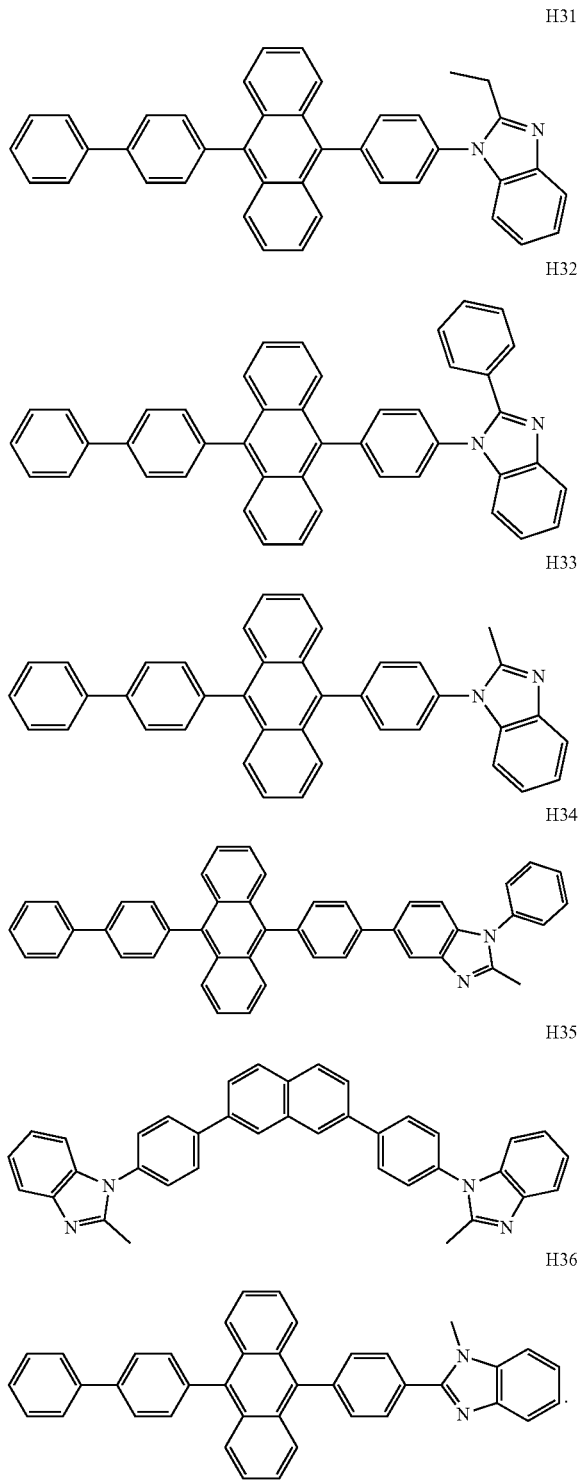

In an exemplary embodiment, each of the EBL 335 and the HBL 350 may be independently laminated with a thickness of, but is not limited to, about 5 nm to about 200 nm, for example, about 5 nm to about 100 nm.

The compound having the structure of Formulae 7 to 10 has good electron transport property as well as excellent hole blocking property. Accordingly, the HBL 350 including the compound having the structure of Formulae 7 to 10 may function as a hole blocking layer and an electron transport layer.

In an alternative embodiment, the OLED D1 may further include an electron transport layer (ETL) disposed between the HBL 350 and the EIL 360. In one exemplary embodiment, the ETL may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

Particularly, the ETL may include an electron transport material selected from, but is not limited to, the group consisting of tris-(8-hydroxyquinoline aluminum (Alq$_3$), 2-biphenyl-4-yl-5-(4-t-butylphenyl)-1,3,4-oxadiazole (PBD), spiro-PBD, lithium quinolate (Liq), 1,3,5-Tris(N-phenylbenzimidazol-2-yl)benzene (TPBi), Bis(2-methyl-8-quinolinolato-N1,O8)-(1,1'-biphenyl-4-olato)aluminum (BAlq), 4,7-diphenyl-1,10-phenanthroline (Bphen), 2,9-Bis (naphthalene-2-yl)4,7-diphenyl-1,10-phenanthroline (NB-phen), 2,9-Dimethyl-4,7-diphenyl-1,10-phenathroline (BCP), 3-(4-Biphenyl)-4-phenyl-5-tert-butylphenyl-1,2,4-triazole (TAZ), 4-(Naphthalen-1-yl)-3,5-diphenyl-4H-1,2,4-triazole (NTAZ), 1,3,5-Tri(p-pyrid-3-yl-phenyl)benzene (TpPyPB), 2,4,6-Tris(3'-(pyridin-3-yl)biphenyl-3-yl)1,3,5-triazine (TmPPPyTz), Poly[9,9-bis(3'-(N,N-dimethyl)-N-ethylammonium)-propyl)-2,7-fluorene]-alt-2,7-(9,9-dioctylfluorene)](PFNBr), tris(phenylquinoxaline) (TPQ), Diphenyl-4-triphenylsilyl-phenylphosphine oxide (TSPO1), 2-[4-(9,10-Di-2-naphthalenyl-2-anthracenyl)phenyl]-1-phenyl-1H-benzimdazole (ZADN), 1,3-bis(9-phenyl-1,10-phenathrolin-2-yl)benzene, 1,4-bis(2-phenyl-1,10-phenanthrolin-4-yl)benzene (p-bPPhenB) and/or 1,3-bis(2-phenyl-1,10-phenanthrolin-4-yl)benzene (m-bPPhenB).

The EIL 360 is disposed between the HBL 350 and the second electrode 220, and can improve physical properties of the second electrode 320 and therefore, can enhance the life span of the OLED D1. In one exemplary embodiment, the EIL 360 may include, but is not limited to, an alkali halide or alkaline earth halide such as LiF, CsF, NaF, BaF$_2$ and the like, and/or an organic metal compound such as lithium benzoate, sodium stearate, and the like.

In an alternative embodiment, the EIL 360 may be an organic layer doped with the alkali metal such as Li, Na, K and/or Cs and/or the alkaline earth metal such as Mg, Sr, Ba and/or Ra. An organic host used in the EIL 360 may be the electron transport material and the alkali metal or the alkaline earth metal may be doped with a ratio of, but is not limited to, about 1 to about 30% by weight. As an example, each of the ETL and the EIL 360 may be laminated with a thickness of, but is not limited to, about 10 nm to about 200 nm, for example, about 10 nm to 100 nm.

The OLED D1 can improve its luminous efficiency and can enhance its luminous lifespan by applying the host 342 of the anthracene-based compound having the structure of Formulae 1 to 2 and the dopant 344 of the boron-based compound having the structure of Formulae 3 to 4 into the EML 340, the aryl amine-based compound having the structure of Formulae 5 and 6 into the EBL 330, and optionally the azine-based compound having the structure of Formulae 7 to 8 and/or the benzimidazole-based compound having the structure of Formulae 9 to 10 into the HBL 350.

In the exemplary first embodiment, the OLED D1 may have single emitting part. An OLED in accordance with the present disclosure may have a tandem structure including multiple emitting parts. FIG. 4 is a schematic cross-sectional view illustrating an organic light emitting diode having two emitting parts in accordance with another exemplary embodiment of the present disclosure.

As illustrated in FIG. 4, the OLED D2 in accordance with the second embodiment of the present disclosure includes first and second electrodes 210 and 220 facing each other and an emissive layer 230A disposed between the first and second electrodes 210 and 220. The emissive layer 230A includes a first emitting part 400 disposed between the first electrode 210 and the second electrode 220, a second emitting part 500 disposed between the first emitting part 400 and the second electrode 220 and a charge generation layer (CGL) 470 disposed between the first and second emitting parts 400 and 500.

The first electrode 210 may be an anode and include conductive material having a relatively large work function values, for example, transparent conductive oxide (TCO) such as ITO, IZO, SnO, ZnO, ICO, AZO, and the like. The second electrode 220 may be a cathode and include a conductive material having a relatively small work function values such as Al, Mg, Ca, Ag, alloy thereof or combination thereof.

The first emitting part 400 includes a first emitting material layer (EML1) 440 disposed between the first electrode 210 and the CGL 470 and may further include a first electron blocking layer (EBL1) 430 disposed between the first electrode 210 and the EML1 440, and optionally a first hole blocking layer (HBL1) 450 disposed between the EML1 440 and CGL 470. In addition, the first emitting part 400 may further include a hole injection layer (HIL) 410 disposed between the first electrode 210 and the EBL1 430 and a first hole transport layer (HTL1) 420 disposed between the HIL 410 and the EBL1 430.

The second emitting part 500 includes a second emitting material layer (EML2) 540 disposed between the CGL 470 and the second electrode 220 and may further include a second electron blocking layer (EBL2) 530 disposed between the CGL 470 and the EML2 540, and optionally a secondhole blocking layer (HBL2) 550 disposed between the EML2 540 and the second electrode 220. In addition, the second emitting part 500 may further include a second hole transport layer (HTL2) 520 disposed between the CGL 470 and EBL2 530 and an electron injection layer (EIL) 560 disposed between the HBL2 550 and the second electrode 220.

As an example, each of the EML1 440 and the EML2 540 may independently comprise a host 442 or 542, which may be a first host, of the anthracene-based compound having the structure of Formulae 1 to 2 and a dopant 444 or 544, which may be a first dopant, of the boron-based compound having the structure of Formulae 3 to 4. While the anthracene core of the host 442 or 542 of the anthracene-based compound is partially or fully deuterated, the dopant 444 or 544 of the boron-based compound may not be deuterated or a part or all of the hydrogen may be deuterated. In this case, the OLED D2 emits blue light. The host 442 in the EML1 440 may be identical to or different from the host 542 in the EML2 540, and the dopant 444 in the EML1 440 may be identical to or different from the dopant 544 in the EML2 540.

The HIL 410 is disposed between the first electrode 210 and the HTL1 420 and improves an interface property between the inorganic first electrode 210 and the organic HTL1 420. In one exemplary embodiment, the HIL 410 include a hole injection material selected from, but is not limited to, the group consisting of MTDATA, NATA, 1T-NATA, 2T-NATA, CuPc, TCTA, NPB(NPD), HAT-CN, TDAPB, PEDOT/PSS, F4TCNQ, N-(biphenyl-4-yl)-9,9-dimethyl-N-(4-(9-phenyl-9H-carbazol-3-yl)phenyl)-9H-fluo-ren-2-amine and/or the compound having the structure of Formula 12. In an alternative embodiment, the HIL 410 may include a hole transport material doped with the hole injection material. The HIL 410 may be omitted in compliance with the OLED D2 properties.

Each of the HTL1 420 and the HTL2 520 may independently include a hole transport material selected from, but is not limited to, TPD, DNTPD, NBP(NPD), CBP, poly-TPD, TFB, TAPC, DCDPA, N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, N-([1,1'-Biphenyl]-4-yl)-9,9-dimethyl-N-(4-(9-phenyl-9H-carbazol-3-yl)phenyl)-9H-fluoren-2-amine, N4,N4,N4',N4'-tetrakis([1,1'-biphenyl]-4-yl)-[1,1'-biphenyl]-4,4'-diamine and/or the compound having the structure of Formula 11. Each of the HIL 410, the HTL1 420 and the HTL2 520 may be laminated with a thickness of, but is not limited to, about 5 nm to about 200 nm, for example, about 5 nm to about 100 nm.

Each of the EBL1 430 and the EBL2 530 prevents electrons from transporting from the EML1 440 or EML2 540 to the first electrode 210 or the CGL 470, respectively. As an example, each of the EBL1 430 and the EBL2 530 may independently include the aryl amine-based compound having the structure of Formulae 5 to 6.

Each of the HBL1 450 and the HBL2 550 prevents holes from transporting from the EML 1 440 or EML2 540 to the CGL 470 or the second electrode 220, respectively. As an example, each of the HBL1 450 and the HBL2 550 may independently include the azine-based compound having the structure of Formulae 7 to 8 and/or the benzimidazole-based compound having the structure of Formulae 9 to 10. Each of the EBL1 430, the EBL2 530, the HBL 1450 and the HBL2 550 may be laminated with a thickness of, but is not limited to, about 5 nm to about 200 nm, for example, about 5 nm to about 100 nm.

As described above, the compound having the structure of Formulae 7 to 10 has excellent electron transport property as well as excellent hole blocking property. Therefore, each of the HBL 1 450 and the HBL2 550 may function as a hole blocking layer and an electron transport layer.

In an alternative embodiment, the first emitting part 400 may further include a first electron transport layer (ETL1) disposed between the HBL1 450 and the CGL 470 and/or the second emitting part 500 may further include a second electron transport layer (ETL2) disposed between the HBL2 550 and the EIL 560. Each of the ETL1 and the ETL2 may independently include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like. 1981 In one exemplary embodiment, each of the ETL1 and the ETL2 may independently include an electron transport material selected from, but is not limited to, the group consisting of Alq$_3$, PDB, spiro-PBD, Liq, TPBi, BAlq, Bphen, NBphen, BCP, TAZ, NTAZ, TpPyPB, TmPPPyTz, PFNBr, TPQ, TSPO1, ZADN, p-bPPhenB and/or m-bPPhenB.

The EIL 560 is disposed between the HBL2 550 and the second electrode 220. In one exemplary embodiment, the EIL 560 may include, but is not limited to, an alkali halide or an alkaline earth halide such as LiF, CsF, NaF, BaF$_2$ and the like, and/or an organic metal compound such as lithium benzoate, sodium stearate, and the like. In an alternative embodiment, the EIL 560 may include an organic layer doped with an alkali metal such as Li, Na, K and/or Cs and/or an alkaline earth metal such as Mg, Sr, Ba and/or Ra.

The organic host used in the EIL 560 may be the electron transport material and the alkali metal or the alkaline earth metal may be doped with a ratio of, but is not limited to, about 1 to about 30% by weight. As an example, each of the ETL1, the ETL2 and the EIL 560 may be laminated with a thickness of, but is not limited to, about 10 nm to about 200 nm, for example, about 10 nm to 100 nm.

The CGL 470 is disposed between the first emitting part 400 and the second emitting part 500. The CGL 470 includes an N-type CGL 480 disposed adjacently to the first emitting part 400 and a P-type CGL 490 disposed adjacently to the second emitting part 500. The N-type CGL 480 injects electrons into the first emitting part 400 and the P-type CGL 490 injects holes into the second emitting part 500.

As an example, the N-type CGL 480 may be an organic layer doped with an alkali metal such as Li, Na, K and/or Cs and/or an alkaline earth metal such as Mg, Sr, Ba and/or Ra. For example, an organic host used in the N-type CGL 480 may include, but is not limited to, an organic compound such as Bphen or MTDATA. The alkali metal and/or the alkaline earth metal may be doped by about 0.01 to about 30% by weight in the N-type CGL 480.

The P-type CGL 490 may include, but is not limited to, an inorganic material selected from the group consisting of tungsten oxide ($WO_x$), molybdenum oxide ($MoO_x$), beryllium oxide ($Be_2O_3$), vanadium oxide ($V_2O_5$) and combination thereof, and/or an organic material selected from the group consisting of NPD, HAT-CN, F4TCNQ, TPD, N,N,N',N'-Tetranaphthalenyl-benzidine (TNB), TCTA, N,N'-dioctyl-3,4,9,10-perylenedicarboximide (PTCDI-C8) and combination thereof.

The OLED D2 in accordance with the second embodiment of the present disclosure can improve its luminous efficiency and can enhance its luminous lifespan by applying the anthracene-based compound having the structure of Formulae 1 to 2 as the first host and the boron-based compound having the structure of Formulae 3 to 4 as the first dopant into the EML1 440 and the EML2 540, the aryl amine-based compound having the structure of Formulae 5 and 6 into the EBL1 430 and the EBL2 530, and optionally the azine-based compound having the structure of Formulae 7 to 8 and/or the benzimidazole-based compound having the structure of Formulae 9 to 10 into the HBL1 450 and the HBL2 550. In addition, the organic light emitting display device 100 (See, FIG. 2) can implement an image having high color purity by laminating double stack structure of two emitting parts 400 and 500 each of which emits blue color light.

In the second embodiment, the OLED D2 has a tandem structure of two emitting parts. Alternatively, an OLED may include three emitting parts that further includes a second CGL and a third emitting part disposed on the second emitting parts 500 except the EIL 560 (See, FIG. 7).

Figure 5:
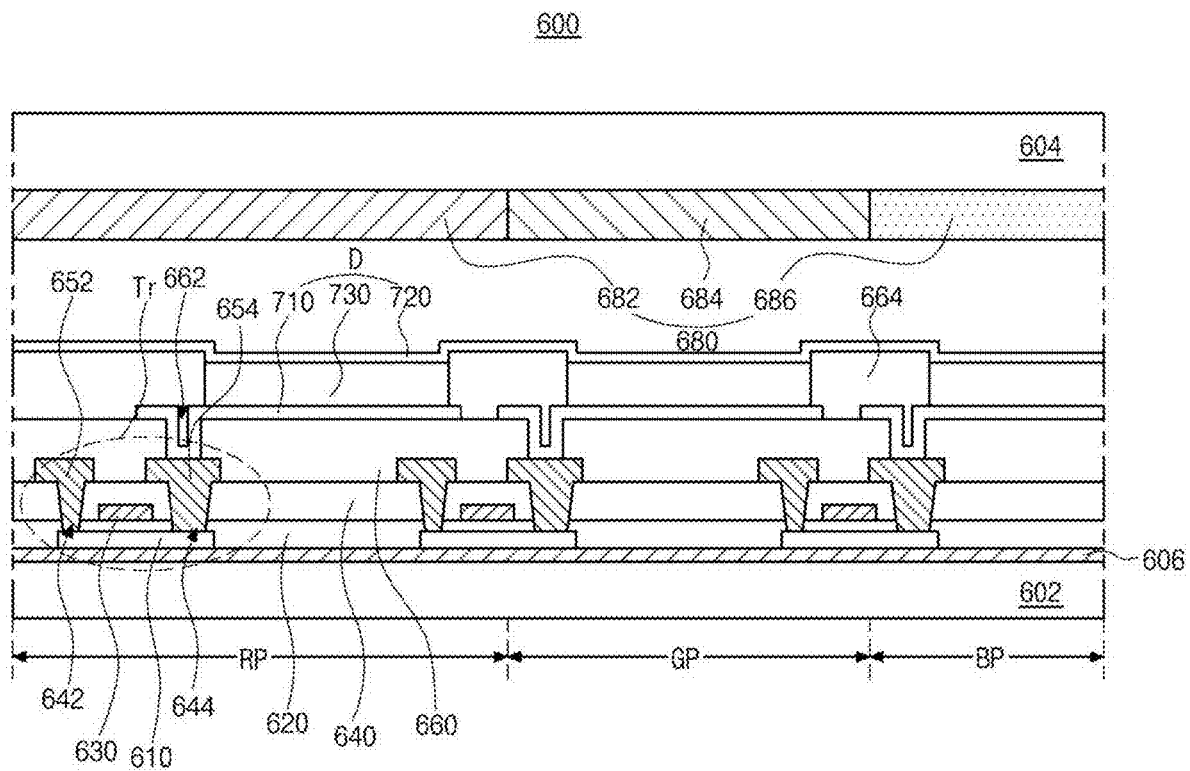
FIG. 5 is a cross-sectional view illustrating an organic light emitting display device in accordance with another exemplary aspect of the present disclosure.

In the above embodiment, the organic light emitting display device 100 and the OLEDs D1 and D2 implement blue (B) emission. Alternatively, an organic light emitting display device and an OLED can implement a full color display device including white (W) emission. FIG. 5 is a schematic cross-sectional view illustrating an organic light emitting display device in accordance with another exemplary embodiment of the present disclosure.

As illustrated in FIG. 5, the organic light emitting display device 600 comprises a first substrate 602 that defines each of a red pixel RP, a green pixel GP and a blue pixel BP, a second substrate 604 facing the first substrate 602, a thin film transistor Tr over the first substrate 602, an organic light emitting diode D disposed between the first and second substrates 602 and 604 and emitting white (W) light and a color filter layer 680 disposed between the organic light emitting diode D and the second substrate 604.

Each of the first and second substrates 602 and 604 may include, but is not limited to, glass, flexible material and/or polymer plastics. For example, each of the first and second substrates 602 and 604 may be made of PI, PES, PEN, PET, PC and combination thereof. The first substrate 602, over which a thin film transistor Tr and an organic light emitting diode D are arranged, forms an array substrate.

A buffer layer 606 may be disposed over the first substrate 602, and the thin film transistor Tr is disposed over the buffer layer 606 correspondingly to each of the red pixel RP, the green pixel GP and the blue pixel BP. The buffer layer 606 may be omitted.

A semiconductor layer 610 is disposed over the buffer layer 606. The semiconductor layer 610 may be made of oxide semiconductor material or polycrystalline silicon.

A gate insulating layer 620 including an insulating material, for example, inorganic insulating material such as silicon oxide ($SiO_x$) or silicon nitride ($SiN_x$) is disposed on the semiconductor layer 610.

A gate electrode 630 made of a conductive material such as a metal is disposed over the gate insulating layer 620 so as to correspond to a center of the semiconductor layer 610. An interlayer insulting layer 640 including an insulating material, for example, inorganic insulating material such as silicon oxide ($SiO_x$) or silicon nitride ($SiN_x$), or an organic insulating material such as benzocyclobutene or photo-acryl, is disposed on the gate electrode 630.

The interlayer insulating layer 640 has first and second semiconductor layer contact holes 642 and 644 that expose both sides of the semiconductor layer 610. The first and second semiconductor layer contact holes 642 and 644 are disposed over opposite sides of the gate electrode 630 with spacing apart from the gate electrode 630.

A source electrode 652 and a drain electrode 654, which are made of a conductive material such as a metal, are disposed on the interlayer insulating layer 640. The source electrode 652 and the drain electrode 654 are spaced apart from each other with respect to the gate electrode 630, and contact both sides of the semiconductor layer 610 through the first and second semiconductor layer contact holes 642 and 644, respectively.

The semiconductor layer 610, the gate electrode 630, the source electrode 652 and the drain electrode 654 constitute the thin film transistor Tr, which acts as a driving element.

Although not shown in FIG. 5, a gate line and a data line, which cross each other to define a pixel region, and a switching element, which is connected to the gate line and the data line, may be further formed in the pixel region. The switching element is connected to the thin film transistor Tr, which is a driving element. In addition, a power line is spaced apart in parallel from the gate line or the data line, and the thin film transistor Tr may further include a storage capacitor configured to constantly keep a voltage of the gate electrode for one frame.

A passivation layer 660 is disposed on the source and drain electrodes 652 and 654 with covering the thin film transistor Tr over the whole first substrate 602. The passivation layer 660 has a drain contact hole 662 that exposes the drain electrode 654 of the thin film transistor Tr.

The organic light emitting diode (OLED) D is located over the passivation layer 660. The OLED D includes a first electrode 710 that is connected to the drain electrode 654 of the thin film transistor Tr, a second electrode 720 facing from the first electrode 710 and an emissive layer 730 disposed between the first and second electrodes 710 and 720.

The first electrode 710 formed for each pixel region may be an anode and may include a conductive material having relatively high work function value. For example, the first electrode 710 may include, ITO, IZO, ITZO, SnO, ZnO, ICO, AZO, and the like. Alternatively, a reflective electrode or a reflective layer may be disposed under the first electrode 710. For example, the reflective electrode or the reflective layer may include, but is not limited to, APC alloy.

A bank layer 664 is disposed on the passivation layer 660 in order to cover edges of the first electrode 710. The bank layer 664 exposes a center of the first electrode 710 corresponding to each of the red pixel RP, the green pixel GP and the blue pixel BP. The bank layer 664 may be omitted.

Figure 6:
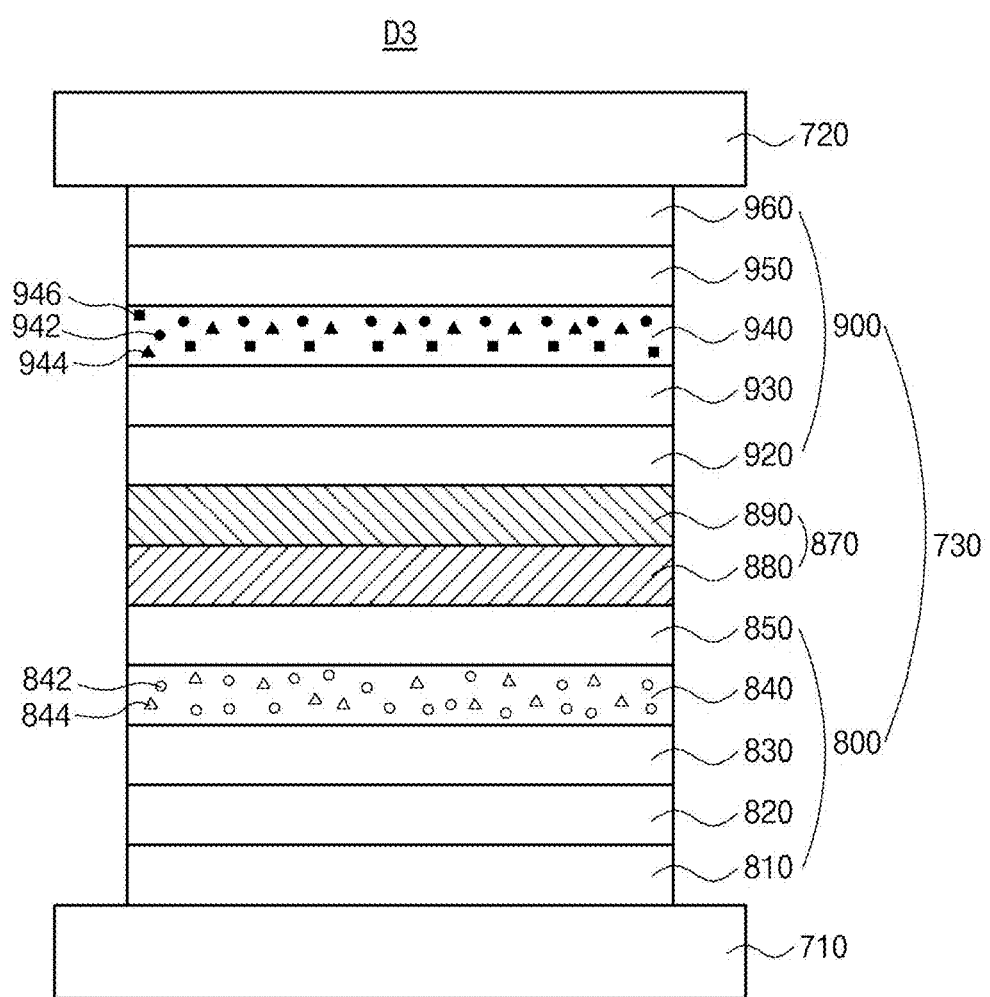
FIG. 6 is a cross-sectional view illustrating an organic light emitting diode having double stack structures in accordance with still another exemplary aspect of the present disclosure.
Figure 7:
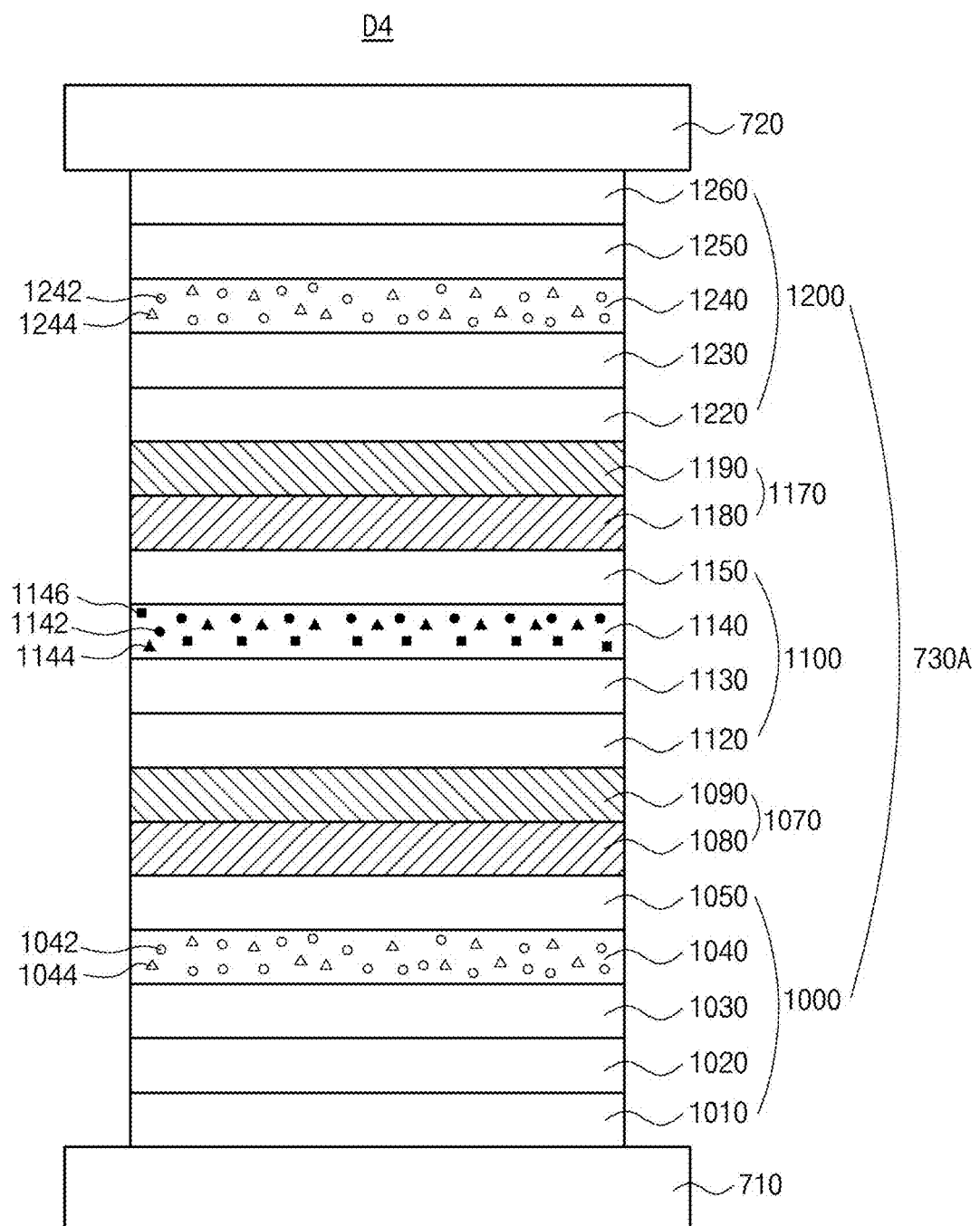
FIG. 7 is a cross-sectional view illustrating an organic light emitting diode having triple stack structures in accordance with still further another exemplary aspect of the present disclosure.

An emissive layer 730 including emitting parts are disposed on the first electrode 710. As illustrated in FIGS. 6 and 7, the emissive layer 730 may include multiple emitting parts 800, 900, 1000, 1100 and 1200 and multiple charge generation layers 870, 1070 and 1170. Each of the emitting parts 800, 900, 1000, 1100 and 1200 includes an emitting material layer and may further include a hole injection layer, a hole transport layer, an electron blocking layer, a hole blocking layer, an electron transport layer and/or an electron injection layer.

The second electrode 720 is disposed over the first substrate 602 above which the emissive layer 730 is disposed. The second electrode 720 may be disposed over a whole display area, and may include a conductive material with a relatively low work function value compared to the first electrode 710, and may be a cathode. For example, the second electrode 720 may include, but is not limited to, aluminum (Al), magnesium (Mg), calcium (Ca), silver (Ag), alloy thereof or combination thereof such as aluminum-magnesium alloy (Al-Mg).

Since the light emitted from the emissive layer 730 is incident to the color filter layer 680 through the second electrode 720 in the organic light emitting display device 600 in accordance with the second embodiment of the present disclosure, the second electrode 720 has a thin thickness so that the light can be transmitted.

The color filter layer 680 is disposed over the OLED D and includes a red color filter 682, a green color filter 684 and a blue color filter 686 each of which is disposed correspondingly to the red pixel RP, the green pixel GP and the blue pixel BP, respectively. Although not shown in FIG. 5, the color filter layer 680 may be attached to the OLED D through an adhesive layer. Alternatively, the color filter layer 680 may be disposed directly on the OLED D.

In addition, an encapsulation film may be disposed over the second electrode 720 in order to prevent outer moisture from penetrating into the OLED D. The encapsulation film may have, but is not limited to, a laminated structure of a first inorganic insulating film, an organic insulating film and a second inorganic insulating film (See, 170 in FIG. 2). In addition, a polarizing plate may be attached onto the second substrate 604 to reduce reflection of external light. For example, the polarizing plate may be a circular polarizing plate.

In FIG. 5, the light emitted from the OLED D is transmitted through the second electrode 720 and the color filter layer 680 is disposed over the OLED D. Alternatively, the light emitted from the OLED D is transmitted through the first electrode 710 and the color filter layer 680 may be disposed between the OLED D and the first substrate 602. In addition, a color conversion layer may be formed between the OLED D and the color filter layer 680. The color conversion layer may include a red color conversion layer, a green color conversion layer and a blue color conversion layer each of which is disposed correspondingly to each pixel (RP, GP and BP), respectively, so as to covert the white (W) color light to each of a red, green and blue color lights, respectively.

As described above, the white (W) color light emitted from the OLED D is transmitted through the red color filter 682, the green color filter 684 and the blue color filter 686 each of which is disposed correspondingly to the red pixel RP, the green pixel GP and the blue pixel BP, respectively, so that red, green and blue color lights are displayed in the red pixel RP, the green pixel GP and the blue pixel BP.

FIG. 6 is a schematic cross-sectional view illustrating an organic light emitting diode having a tandem structure of two emitting parts. As illustrated in FIG. 6, the organic light emitting diode (OLED) D3 in accordance with the exemplary embodiment includes first and second electrodes 710 and 720 and an emissive layer 730 disposed between the first and second electrodes 710 and 720. The emissive layer 730 includes a first emitting part 800 disposed between the first and second electrodes 710 and 720, a second emitting part 900 disposed between the first emitting part 800 and the second electrode 720 and a charge generation layer (CGL) 870 disposed between the first and second emitting parts 800 and 900.

The first emitting part 800 includes a first emitting material layer (EML 1) 840 disposed between the first electrode 710 and the CGL 870 and may further include a first electron blocking layer (EBL1) 830 disposed between the first electrode 710 and the EML1 840, and optionally a first hole blocking layer (HBL1) 850 disposed between the EML1 840 and the CGL 870. In addition, the first emitting part 800 may further include a hole injection layer (HIL) 810 disposed between the first electrode and the EBL1 830 and a first hole transport layer (HTL1) 820 disposed between the HIL 810 and the EBL1 830.

The EML1 840 includes a first host 842 of an anthracene-based compound and a first dopant 844 of a boron-based compound. While the anthracene-core in the first host 842 of the anthracene-based compound is partially or fully deuterated, the first dopant 844 of the boron-based compound may not be deuterated or a part or all of the hydrogen may be deuterated. The EML1 840 emits blue light.

The EBL1 830 may include the aryl amine-based compound having the structure of Formulae 5 to 6. The HBL1 850 may include the azine-based compound having the structure of Formulae 7 to 8 and/or the benzimidazole-based compound having the structure of Formulae 9 to 10. As described above, the compound having the structure of Formulae 7 to 10 has excellent electron transport property as well as excellent hole blocking property. Therefore, the HBL1 850 may function as a hole blocking layer and an electron transport layer.

In an alternative embodiment, the first emitting part 800 may further include a first electron transport layer (ETL1) disposed between the HBL1 850 and the CGL 870.

The second emitting part 900 includes a second emitting material layer (EML2) 940 disposed between the CGL 870 and the second electrode 720 and may further include a second hole transport layer (HTL2) 920 disposed between the CGL 870 and the EML2 940 and a second electron transport layer (ETL2) disposed between the EML2 940 and the second electrode 720. In addition, the second emitting part 900 may further include a second electron blocking layer (EBL2) 930 disposed between the HTL2 920 and the EML2 940, a second hole blocking layer (HBL2) 950 disposed between the EML2 940 and the ETL2 and an electron injection layer (EIL) 960 disposed between the ETL2 and the second electrode 720.

In one exemplary embodiment, the EML2 940 may emit redgreen (RG) light. In this case, the EML2 940 may include a second host 942, a second dopant 944 as green dopant and a third dopant 946 as red dopant. For example, each of the second dopant 944 and the third dopant 946 may be fluorescent material, phosphorescent material and/or delayed fluorescent material, respectively.

As an example, the second host 942 in the EML2 940 may include, but is not limited to, 9,9'-Diphenyl-9H,9'H-3,3'-bicarbazole (BCzPh), CBP, 1,3,5-Tris(carbazole-9-yl)benzene (TCP), TCTA, 4,4'-Bis(carbazole-9-yl)-2,2'-dimethyl-bipheyl (CDBP), 2,7-Bis(carbazole-9-yl)-9,9-dimethylfluorene (DMFL-CBP), 2,2',7,7'-Tetrakis(carbazole-9-yl)-9,9-spirofluorene (Spiro-CBP), Bis[2-(diphenylphosphine)phenyl]ether oxide (DPEPO), 4'-(9H-carbazol-9-yl)biphenyl-3,5-dicarbonitrile (PCzB-2CN), 3'-(9H-carbazol-9-yl)biphenyl-3,5-dicarbonitrile (mCzB-2CN), 3,6-Bis(carbazole-9-yl)-9-(2-ethyl-hexyl)-9H-carbazole (TCzl), Bis(2-hydroxylphenyl)-pyridine)beryllium (Bepp$_2$), Bis(10-hydroxylbenzo[h]quinolinato)beryllium (Bebg$_2$) and/or 1,3,5-Tris(1-pyrenyl)benzene (TPB3).

The second dopant 944 as the green dopant may include, but is not limited to, [Bis(2-phenylpyridine)](pyridyl-2-benzofuro[2,3-b]pyridine)iridium, fac-Tris(2-phenylpyridine)iridium(III) (fac-Ir(ppy)$_3$), Bis(2-phenylpyridine)(acetylacetonate)iridium(III) (Ir(ppy)$_2$(acac)), Tris[2-(p-tolyl)pyridine]iridium(III) (Ir(mppy)$_3$), Bis(2-(naphthalene-2-yl)pyridine)(acetylacetonate)iridium(III) (Ir(npy)$_2$acac), Tris(2-phenyl-3-methyl-pyridine)iridium (Ir(3mppy)$_3$) and/or fac-Tris(2-(3-p-xylyl)phenyl)pyridine iridium(III) (TEG).

The third dopant 946 as the red dopant may include, but is not limited to, [Bis(2-(4,6-dimethyl)phenylquinoline)](2,2,6,6-tetramethylheptane-3,5-dionate)iridium(III), Bis[2-(4-n-hexylphenyl)quinoline](acetylacetonate)iridium(III) (Hex-Ir(phq)$_2$(acac)), Tris[2-(4-n-hexylphenyl)quinoline]iridium(III) (Hex-Ir(phq)$_3$), Tris[2-phenyl-4-methylquinoline]iridium(III) (Ir(Mphq)$_3$), Bis(2-phenylquinoline)(2,2,6,6-tetramethylheptene-3,5-dionate)iridium(III) (Ir(dpm)PQ$_2$), Bis(phenylisoquinoline)(2,2,6,6-tetramethylheptene-3,5-dionate)iridium(III) (Ir(dpm)(piq)$_2$), Bis[(4-n-hexylphenyl)isoquinoline](acetylacetonate)iridium(III) (Hex-Ir(piq)$_2$(acac)), Tris[2-(4-n-hexylphenyl)quinoline]iridium(III) (Hex-Ir(piq)$_3$), Tris(2-(3-methylphenyl)-7-methyl-quinolato)iridium (Ir(dmpq)$_3$), Bis[2-(2-methylphenyl)-7-methyl-quinoline](acetylacetonate)iridium(III) (Ir(dmpq)$_2$(acac)) and/or Bis[2-(3,5-dimethylphenyl)-4-methyl-quinoline](acetylacetonate)iridium(III) (Ir(mphmq)$_2$(acac)).

In an alternative embodiment, the EML2 940 may emit yellow green (YG) light. In this case, the EML2 940 may include a second host, a second dopant as the green dopant and a third dopant as yellow dopant.

The second host and the second dopant as the green dopant for emitting yellow green may be the same as the host and the green dopant for emitting the red green (RG) light, respectively. The third dopant as the yellow dopant may include, but is not limited to, 5,6,11,12-Tetraphenylnaphthalene (Rubrene), 2,8-Di-tert-butyl-5,11-bis(4-tert-butylphenyl)-6,12-diphenyltetracene (TBRb), Bis(2-phenylbenzothiazolato)(acetonate)iridium(III) (Ir(BT)$_2$(acac)), Bis(2-(9,9-diethytl-fluoren-2-yl)-1-phenyl-1H-benzo[d]imdiazolato)(acetylacetonate)iridium(III) (Ir(fbi)$_2$(acac)), Bis(2-phenylpyridine)(3-(pyridine-2-yl)-2H-chromen-2-onate)iridium(III) (fac-Ir(ppy)$_2$Pc) and/or Bis(2-(2,4-difluorophenyl)quinoline)(picolinate)iridium(III) (FPQIrpic).

When the EML2 940 emits red green (RG) or yellow green (YG) light, each of the second and third dopants may be doped with a ratio of about 1 to about 50% by weight, for example, about 1 to about 30% by weight in the EML2 940.

The EBL2 930 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, 1,3-bis(carbazol-9-yl)benzene (mCP), 3,3-di(9H-carbazol-9-yl)biphenyl (mCBP), CuPc, DNTPD, TDAPB, DCDPA, 2,8-bis(9-phneyl-9H-carbazol-3-yl)dibenzo[b,d]thiophene, and/or 3,6-bis(N-carbazolyl)-N-phenyl-carbazole.

The HBL2 950 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like. For example, the HBL2 950 may include a compound having a relatively low HOMO energy level compared to the EML2 940. The HBL2 950 may include, but is not limited to, BCP, BAlq, Alq$_3$, PBD, spiro-PBD, Liq, Bis-4,5-(3,5-di-3-pyridylphenyl)-2-methylpyrimidine (B3PYMPM), DPEPO, TSPO1, 9-(6-(9H-carbazol-9-yl)pyridine-3-yl)-9H-3,9'-bicarbazole and combination thereof.

The CGL 870 is disposed between the first and second emitting parts 800 and 900. The CGL 870 may be a PN-junction charge generation layer which includes an N-CGL 880 and a P-CGL 890. Namely, the CGL 870 includes the N-CGL 880 disposed adjacently to the first emitting part 800 and the P-CGL 890 disposed adjacently to the second emitting part 900.

The OLED D3 in accordance with the third embodiment of the present disclosure can improve its luminous efficiency and can enhance its luminous lifespan by applying the first host 842 of the anthracene-based compound having the structure of Formulae 1 to 2 and the first dopant 844 of the boron-based compound having the structure of Formulae 3 to 4 into the EML 1 840, the aryl amine-based compound having the structure of Formulae 5 and 6 into the EBL1 830, optionally the azine-based compound having the structure of Formulae 7 to 8 and/or the benzimidazole-based compound having the structure of Formulae 9 to 10 into the HBL1 850, and applying red green or yellow green luminescent materials into the EML2 940. Particularly, the OLED D3 includes a double stack structure that laminates a first emitting part 800 emitting blue (B) light and a second emitting part 900 emitting red green (RG) or yellow green (YG) light so that the organic light emitting display device 600 (See, FIG. 5) can emit white light (W).

In an alternative embodiment, the EML1 840 disposed between the first electrode 710 and the CGL 870 may be red green or yellow green emitting material layer, and the EML2 940 disposed between the CGL 870 and the second electrode 720 may be blue emitting material layer including the first host of the anthracene-based compound and the first dopant of the boron-based compound.

Alternatively, an organic light emitting diode may have a triple-stack structure. FIG. 7 is a schematic cross-sectional view illustrating an organic light emitting diode in accordance with still another exemplary aspect of the present disclosure. As illustrated in FIG. 7, the organic light emitting diode (OLED) D4 includes first and second electrodes 710 and 720 facing each other and an emissive layer 730A disposed between the first and second electrodes 710 and 720. The emissive layer 730A includes a first emitting part 1000 disposed between the first and second electrodes 710 and 720, a second emitting part 1100 disposed between the first emitting part 1000 and the second electrode 720, a third emitting part 1200 disposed between the second emitting part 1100 and the second electrode 720, a first charge generation layer (CGL1) 1070 disposed between the first and second emitting parts 1000 and 1100, and a second charge generation layer (CGL2) 1170 disposed between the second and third emitting parts 1100 and 1200.

At least one of the first to third emitting parts 1000, 1100 and 1200 may emit blue (B) light and at least another of the first to third emitting parts 1000, 1100 and 1200 may emit red green (RG) or yellow green (YG) light. Hereinafter, the OLED D4, where the first and third emitting parts 1000 and 1200 emit blue (B) light and the second emitting part 1100 emits red green (RG) or yellow green (YG) light, will be explained.

The first electrode 710 may be an anode injecting holes and may include conductive material having a relatively large work function values, for example, transparent conductive oxide (TCO) such as ITO, IZO, SnO, ZnO, ICO, AZO, and the like. The second electrode 720 may be a cathode injecting electrons and may include conductive material having a relatively small work function values such as Al, Mg, Ca, Ag, alloy thereof or combination thereof.

The first emitting part 1000 includes a first emitting material layer (EML1) 1040 disposed between the first electrode 710 and the CGL1 1070, and may further a first electron blocking layer (EBL1) 1030 disposed between the first electrode 710 and the EML1 1040, and optionally a first hole blocking layer (HBL1) 1050 disposed between the EML1 1040 and the CGL1 1070. In addition, the first emitting part 1000 may further include a hole injection layer (HIL) 1010 disposed between the first electrode 710 and the EBL1 1030, a first hole transport layer (HTL1) 1020 disposed between the HIL 1010 and the EBL1 1030, and optionally a first electron transport layer (ETL1) disposed between the HBL1 1050 and the CGL1 1070.

The second emitting part 1100 includes a second emitting material layer (EML2) 1140 disposed between the CGL1 1070 and the CGL2 1170 and may further include a second hole transport layer (HTL2) 1120 disposed between the CGL1 1070 and the EML2 1140 and a second electron transport layer (ETL2) 1120 disposed between the EML2 1140 and the CGL2 1170. In addition, the second emitting part 1100 may further include a second electron blocking layer (EBL2) 1130 disposed between the HTL2 1120 and the EML2 1140 and/or a second hole blocking layer (HBL2) 1150 disposed between the EML2 1140 and the ETL2.

The third emitting part 1200 includes a third emitting material layer (EML3) 1240 disposed between the CGL2 1170 and the second electrode 720 and may further include a third electron blocking layer (EBL3) 1230 disposed between the CGL2 1170 and the EML3 1240, and optionally a third hole blocking layer (HBL3) 1250 disposed between the EML3 1240 and the second electrode 720. In addition, the third emitting part 1200 may further include a third hole transport layer (HTL3) 1220 disposed between the CGL2 1170 and the EBL3 1230, an electron injection layer (EIL) 1260 disposed between the HBL3 1250 and the second electrode 720, and optionally a third electron transport layer (ETL3) disposed between the HBL3 1250 and the EIL 1260.

Each of the EML1 1040 and the EML3 1240 may include a first host 1042 or 1242 which is the anthracene-based compound having the structure of Formulae 1 to 2 and a first dopant 1044 or 1244 which is the boron-based compound having the structure of Formulae 3 to 4. While the anthracene-core in each of the first hosts 1042 and 1242 of the anthracene-based compound is partially or fully deuterated, each of the first dopants 1044 and 1244 of the boron-based compound may not be deuterated or a part or all of the hydrogen in the boron-based compound may be deuterated. The first host 1042 in the EML1 1040 may be identical to or different from the first host 1242 in the EML3 1240 and the first dopant 1044 in the EML1 1040 may be identical to or different from the first dopant 1244 in the EML3 1240. Each of the EML1 1040 and the EML3 1240 emit blue (B) light.

Each of the EBL1 1030 and the EBL3 1230 may include the aryl amine-based compound having the structure of Formulae 5 to 6, respectively. Each of the HBL1 1050 and the HBL3 1250 may include the azine-based compound having the structure of Formulae 7 to 8 and/or the benzimidazole-based compound having the structure of Formulae 9 to 10, respectively. As described above, the compound having the structure of Formulae 7 to 10 has excellent electron transport property as well as excellent hole blocking property. Therefore, each of the HBL1 1050 and the HBL3 1250 may function as a hole blocking layer and an electron transport layer.

In one exemplary embodiment, the EML2 1140 may emit red green (RG) light. In this case, the EML2 1140 may include a second host 1142, a second dopant 1144 of green dopant and a third dopant 1146 of red dopant.

In an alternative embodiment, the EML2 1140 may emit yellow green (YG) light. In this case, the EML2 1140 may include a second host 1142, a second dopant 1144 as green dopant and a third dopant 1146 as yellow dopant. The second host 1142, the second dopant 1144 and the third dopant 1146 in the EML2 1140 which emits red green (RG) or yellow green (YG) color may be identical to the materials as described above.

When the EML2 1140 emits red green (RG) or yellow green (YG) light, the second dopant 1144 and the third dopant 1146 may be doped with a ratio of about 1 to about 50% by weight, for example about 1 to about 30% by weight in the EML2 1140.

The EBL2 1130 may include, but is not limited to, TCTA, Tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, TAPC, MTDATA, mCP, mCBP, CuPc, DNTPD, TDAPB, DCDPA, 2,8-bis(9-phneyl-9H-carbazol-3-yl)dibenzo[b,d]thiophene, and/or 3,6-bis(N-carbazolyl)-N-phenyl-carbazole.

The HBL2 1150 may include, but is not limited to, oxadiazole-based compounds, triazole-based compounds, phenanthroline-based compounds, benzoxazole-based compounds, benzothiazole-based compounds, benzimidazole-based compounds, triazine-based compounds, and the like.

The CGL1 1070 is disposed between the first emitting part 1000 and the second emitting part 1100, and the CGL2 1170 is disposed between the second emitting part 1100 and the third emitting part 1200. Each of the CGL1 1070 and the CGL2 1170 may be a PN-junction CGL which includes a first or second N-type CGL 1080 or 1180 and a first or second P-type CGL 1090 or 1190. The CGL1 1070 includes the first N-type CGL 1080 disposed adjacently to the first emitting part 1000 and the first P-type CGL 1090 disposed adjacently to the second emitting part 1100. The CGL2 1170 includes the second N-type CGL 1180 disposed adjacently to the second emitting part 1100 and the second P-type GCL 1190 disposed adjacently to the third emitting part 1200. Each of the first and second N-type CGLs 1080 and 1180 injects electrons to each of the first and second emitting parts 1000 and 1100, respectively, and each of the first and second P-type CGLs 1090 and 1190 injects holes to each of the second and third emitting parts 1100 and 1200, respectively.

The OLED D4 in accordance with the third embodiment of the present disclosure can improve its luminous efficiency and can enhance its luminous lifespan by applying each of the first hosts 1042 and 1242 of the anthracene-based compound having the structure of Formulae 1 to 2 and each of first dopants 1044 and 1244 of the boron-based compound having the structure of Formulae 3 to 4 into each of the EML1 1040 and the EML3 1240, respectively, the aryl amine-based compound having the structure of Formulae 5 and 6 into each of the EBL1 1030 and the EBL3 1230, respectively, optionally the azine-based compound having the structure of Formulae 7 to 8 and/or the benzimidazole-based compound having the structure of Formulae 9 to 10 into the HBL1 1050 and the HBL3 1250, respectively, and applying red green or yellow green luminescent materials into the EML2 1140. Particularly, the OLED D4 includes a triple stack structure laminating two emitting parts 1000 and 1200 each of which emits blue (B) light and one emitting part 1100 which emits red green (RG) or yellow green (YG) light so that the organic light emitting display device 600 (See, FIG. 5) can emit white light (W).

In FIG. 7, a tandem-structured OLED D4 laminating three emitting parts are illustrated. Alternatively, an OLED may further include at least one additional emitting parts and at least one additional charge generation layer.

Figure 8:
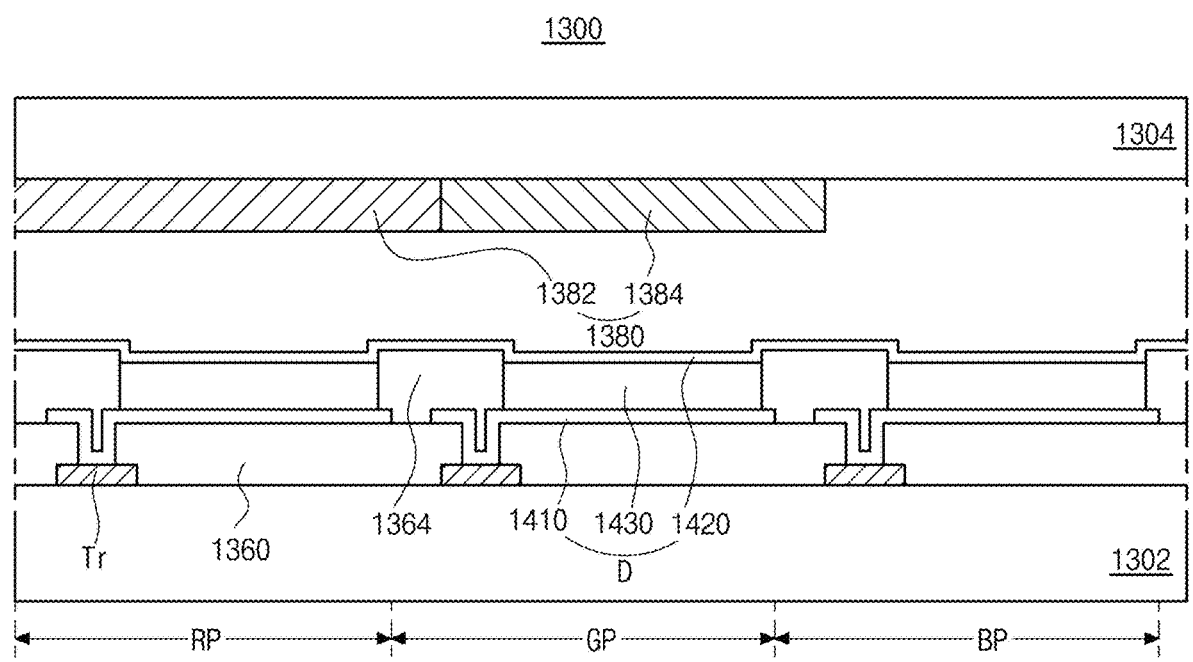
FIG. 8 is a cross-section view illustrating an organic light emitting display device in accordance with still another exemplary aspect of the present disclosure.

In addition, an organic light emitting device in accordance with the present disclosure may include a color conversion layer. FIG. 8 is a schematic cross-sectional view illustrating an organic light emitting display device in still another exemplary embodiment of the present disclosure.

As illustrated in FIG. 8, the organic light emitting display device 1300 comprises a first substrate 1302 that defines each of a red pixel RP, a green pixel GP and a blue pixel BP, a second substrate 1304 facing the first substrate 1302, a thin film transistor Tr over the first substrate 1302, an organic light emitting diode (OLED)D disposed between the first and second substrates 1302 and 1304 and emitting blue (B) light and a color conversion layer 1380 disposed between the OLED D and the second substrate 1304. Although not shown in FIG. 8, a color filter layer may be disposed between the second substrate 1304 and the respective color conversion layer 1380.

The thin film transistor Tr is disposed over the first substrate 1302 correspondingly to each of the red pixel RP, the green pixel GP and the blue pixel BP. A passivation layer 1360, which has a drain contact hole exposing one electrode, for example a drain electrode, constituting the thin film transistor Tr, is formed with covering the thin film transistor Tr over the whole first substrate 1302.

The OLED D, which includes a first electrode 1410, an emissive layer 1430 and the second electrode 1420, is disposed over the passivation layer 1360. The first electrode 1410 may be connected to the drain electrode of the thin film transistor Tr through the drain contact hole. In addition, a bank layer 1364 covering edges of the first electrode 1410 is formed at the boundary between the red pixel RP, the green pixel GP and the blue pixel BP. In this case, the OLED D may have a structure of FIG. 3 or FIG. 4 and can emit blue (B) light. The OLED D is disposed in each of the red pixel RP, the green pixel GP and the blue pixel BP to provide blue (B) light.

The color conversion layer 1380 may include a first color conversion layer 1382 corresponding to the red pixel RP and a second color conversion layer 1384 corresponding to the green pixel GP. As an example, the color conversion layer 1380 may include an inorganic luminescent material such as quantum dot (QD).

The blue (B) light emitted from the OLED D in the red pixel RP is converted into red (R) color light by the first color conversion layer 1382 and the blue (B) light emitted from the OLED D in the green pixel GP is converted into green (G) color light by the second color conversion layer 1384. Accordingly, the organic light emitting display device 1300 can implement a color image.

In addition, when the light emitted from the OLED D is displayed through the first substrate 1302, the color conversion layer 1380 may be disposed between the OLED D and the first substrate 1302.

Synthesis Example 1: Synthesis of Host 1

(1) Synthesis of Intermediate H-1

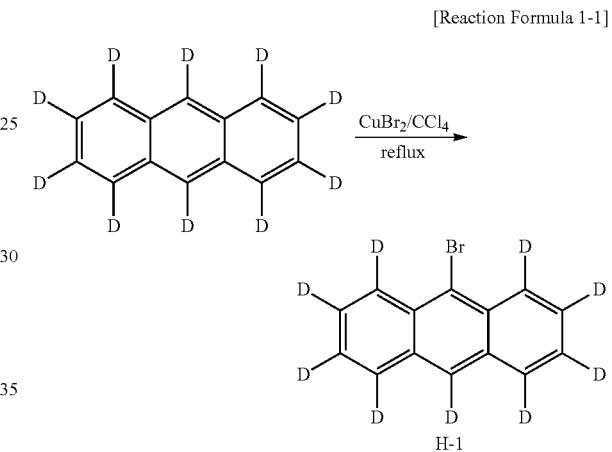

[Reaction Formula 1-1]

Anhydrous cupric bromide (45 g, 0.202 mol) was added into $CCl_4$ solutiondissolvinganthracene-D10 (18.8 g, 0.10 mol). The mixture was heated and stirred under a nitrogen atmosphere for 12 hrs. After completion of reaction, white CuBr(I) compound was filtered off, and the filtrate was purified through 35 nm Alumina column. Under vacuum condition, the solvent was removed from the reaction solution purified through the column to obtain the mixture including the intermediate H-1 (9-bromoanthracene-D9) .The mixture includes the intermediate H-1, the starting material (anthracene-D10) and dibromo-byproduct. The mixture without additional purification was used as the starting material in the reaction Formula 1-2.

(2) Synthesis of Intermediate H-2

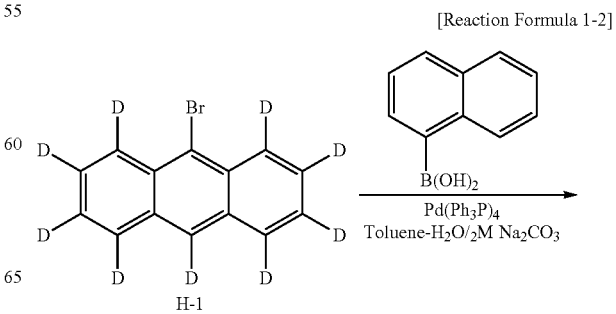

[Reaction Formula 1-2]

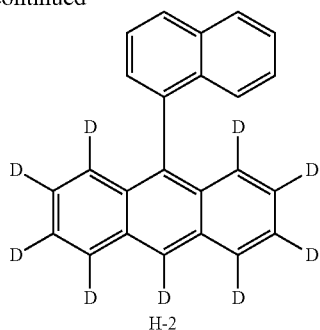

H-2

The intermediate H-1 (2.66 g, 0.01 mol) and naphtalene-1-boronic acid (1.72 g, 0.01 mol) was added into a rounded-bottom flask, and then toluene (30 ml) was added into the flask to form a mixture solution. Under a nitrogen atmosphere, the mixture solution was stirred with addition of Na₂CO₃ aqueous solution dissolving Na₂CO₃ (2.12 g) indistilled water (10 ml). Pd(PPh₃)₄ (0.25 g, 0.025 mmol) as catalyst was further added and stirred. After completion of reaction, the reaction solution was added into methanol solution to precipitate a product, and the precipitated product was filtered. In the reduce-pressure filter, the precipitated product was washed sequentially using water, hydrogen chloride aqueous solution (10% concentration), water and methanol. The precipitated product was purified to give an intermediate H-2 of white powder (2.6 g).

(3) Synthesis of Intermediate H-3

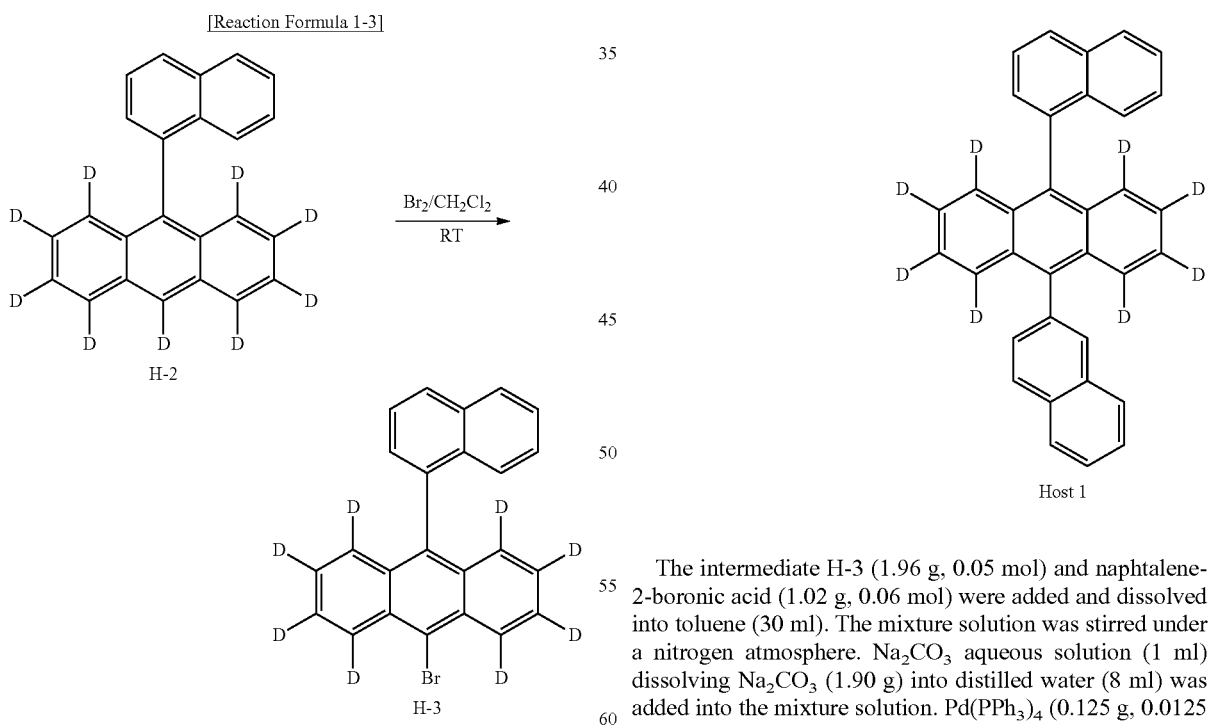

[Reaction Formula 1-3]

H-2

Br₂/CH₂Cl₂
RT

H-3

After dissolving the intermediate H-2 (2.8 g, 8.75 mmol) into dichloromethane (50 ml), Br₂ (1.4 g, 8.75 mmol) was added into the solution and then the solution was stirred under the room temperature (RT). After completion of reaction, 2M of Na₂S₂O₃ aqueous solution (10 ml) was added into the reactant and stirred. The organic layer was separated and washed using Na₂S₂O₃ aqueous solution (10% concentration, 10 ml) and distilled water. The organic layer was separated again, and water in the organic layer was removed by using MgSO₄. After the organic layer was concentrated, excessive methanol was added to obtain a product. The product was filtered to give the intermediate H-3 (3.3 g).

(4) Synthesis of Host 1

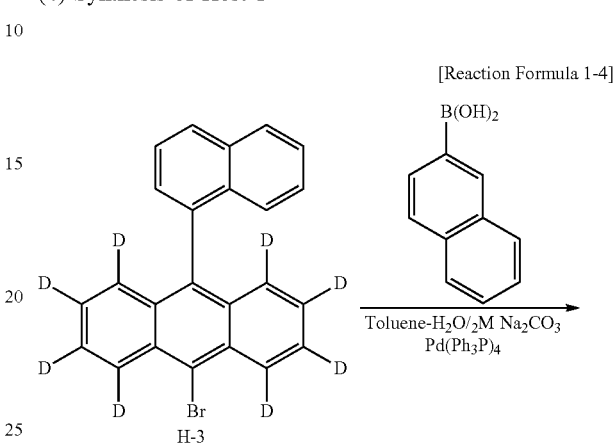

[Reaction Formula 1-4]

H-3

B(OH)₂

Toluene-H₂O/2M Na₂CO₃
Pd(Ph₃P)₄

Host 1

The intermediate H-3 (1.96 g, 0.05 mol) and naphtalene-2-boronic acid (1.02 g, 0.06 mol) were added and dissolved into toluene (30 ml). The mixture solution was stirred under a nitrogen atmosphere. Na₂CO₃ aqueous solution (1 ml) dissolving Na₂CO₃ (1.90 g) into distilled water (8 ml) was added into the mixture solution. Pd(PPh₃)₄ (0.125 g, 0.0125 mmol) was further added. The mixture solution was heated and stirred under a nitrogen atmosphere. After completion of reaction, the organic layer was separated, and methanol was added into the organic layer to precipitate a white solid mixture. The white solid mixture was purified by silica-gel column chromatography using the eluent of chloroform and hexane (volume ratio=1:3) to give the Host1 (2.30 g).

Synthesis Example 2: Synthesis of Host 2

[Reaction Formula 2]

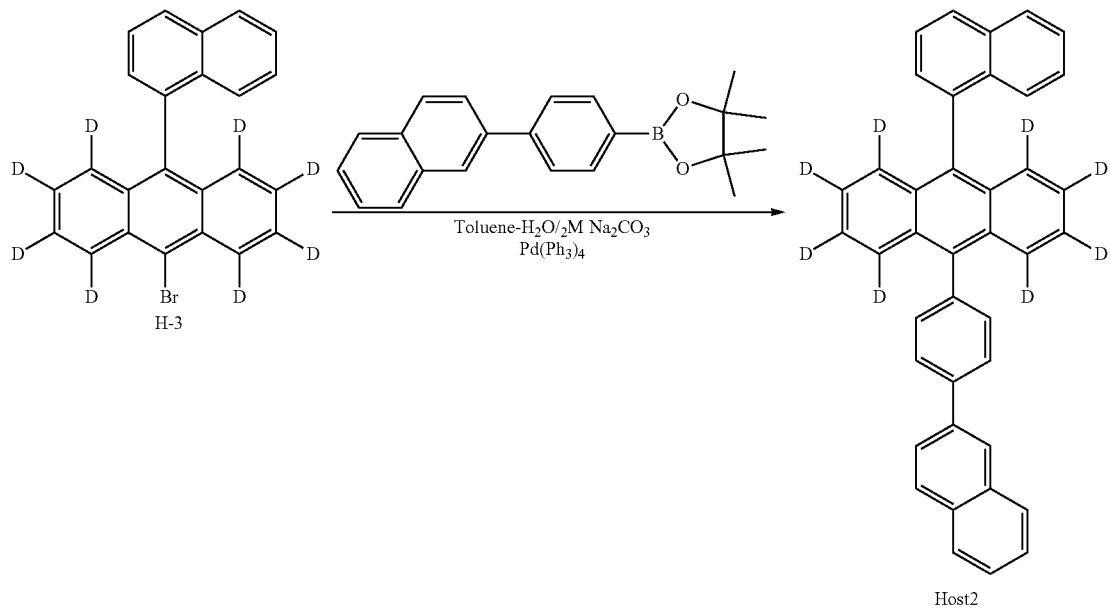

The intermediate H-3 (1.96 g, 0.05 mol) and 4-(naphtalene-2-yl)phenylboronic acid (1.49 g, 0.06 mol) were added and dissolved into toluene (30 ml). The mixture solution was stirred under a nitrogen atmosphere. Na$_2$CO$_3$ aqueous solution (1 ml) dissolving Na$_2$CO$_3$ (1.90 g) into distilled water (8 ml) was added into the mixture solution. Pd(PPh$_3$)$_4$ (0.125 g, 0.0125 mmol) was further added. The mixture solution was heated and stirred under a nitrogen atmosphere. After completion of reaction, the organic layer was separated, and methanol was added into the organic layer to precipitate a white solid mixture. The white solid mixture was purified by silica-gel column chromatography using the eluent of chloroform and hexane (volume ratio=1:3) to give the Host2 (2.30 g).

Synthesis Example 3: Synthesis of Dopant 11-2

(1) Synthesis of Intermediate I-P

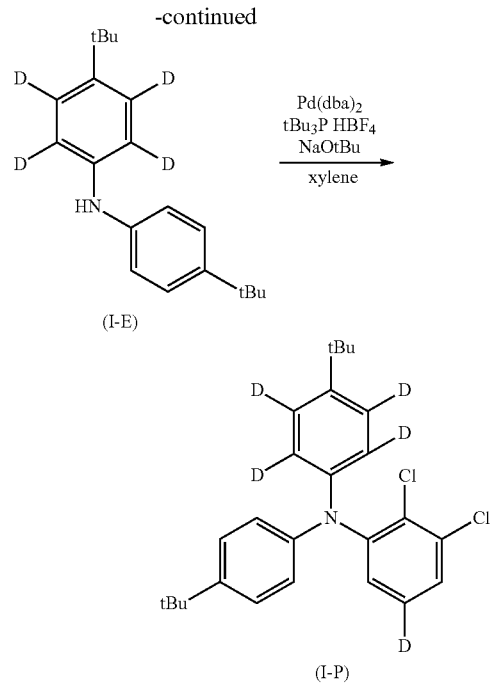

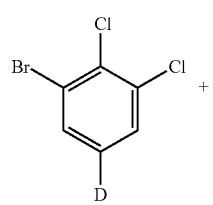

[Reaction Formula 3-1]

Under a nitrogen atmosphere, 2,3-dichlorobromobenzene-D (22.0 g), the compound (I-E) (26.6 g), bis(dibenzylideneacetone)palladium(0) (Pd(dba)$_2$, 2.68 g), NaOtBu (16.8 g), tri-t-butylphosphoniumtetrafluoroborate (tBu$_3$PHBF$_4$, 2.70 g) and xylene (300 ml) were put into a flask, and then the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene/heptane=1/1 (volume ratio)) to give the intermediate (I-P) (35.0 g).

(2) Synthesis of Intermediate I-Q

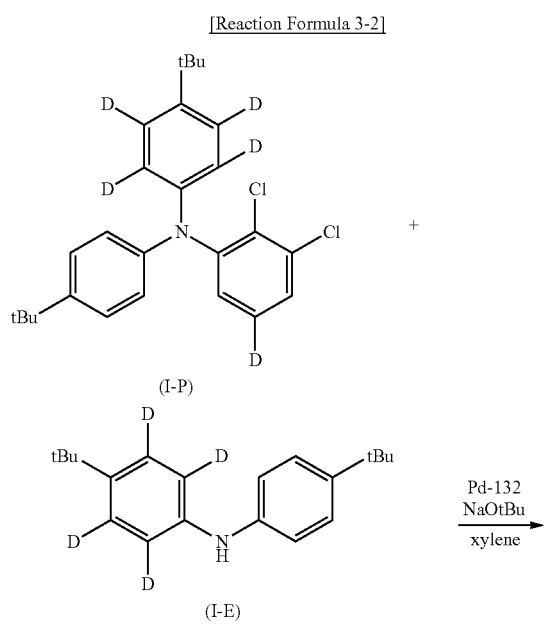

(3) Synthesis of Dopant 11-2

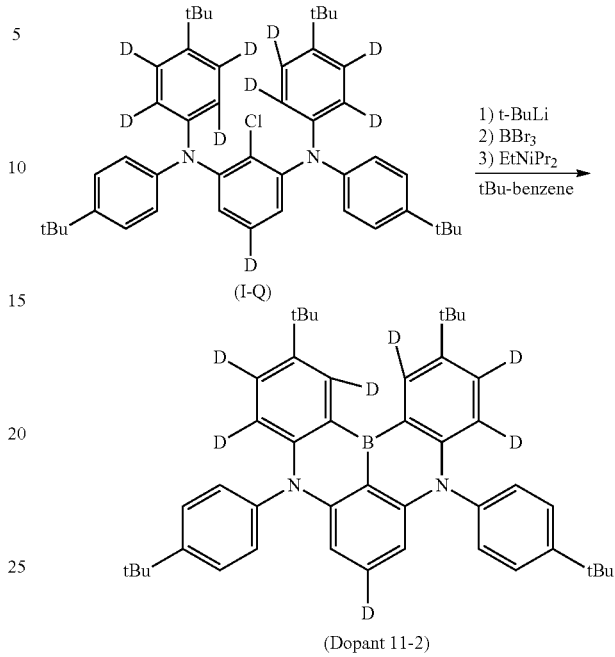

Under a nitrogen atmosphere, 1.56 M of t-butyllithium pentane solution (27.5 ml) was added dropwisely added into a flask containing the intermediate (I-Q) (14.6 g) and t-butylbenzene (120 ml) at 0° C. After the completion of the dropwise addition of t-butyllithium pentane solution, the temperature of the mixture was raised to 70° C., and then the mixture was stirred for 0.5 hour. The residue was cooled to −50° C., boron tribromide (10.7 g) was added thereto, the temperature of the mixture was raised to room temperature, and then the mixture was stirred for 0.5 hour. Thereafter, the mixture was cooled again to 0° C., N, N-diisopropylethylamine (EtNiPr$_2$, 5.5 g) was added thereto, and the mixture was stirred at room temperature until heat generation was settled. Subsequently, the temperature of the mixture was raised to 100° C., and stirred and heating for 1 hour. The reaction solution was cooled to room temperature, the cooled aqueous sodium acetate solution and then ethyl acetate were added thereto, and the mixture was partitioned. The organic layer was concentrated, and then purified with a silica gel short pass column (eluent:toluene). The obtained crude product was reprecipitated from heptane. Thus, the compound Dopant11-2 was obtained (0.5 g).

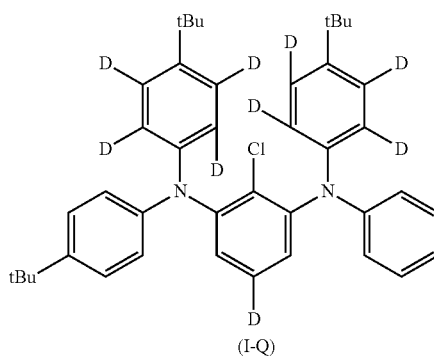

Under a nitrogen atmosphere, the intermediate (I-P) (15.0 g), the intermediate (1-E) (8.4 g), Pd-132 (dichlorobis[di-t-butyl(4-dimethylaminophenyl)phosphino]palladium, 0.21 g) as a palladium catalyst, NaOtBu (4.3 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene) to give the intermediate (I-Q) (14.6 g).

Synthesis Example 4: Synthesis of Dopant 11-3

(1) Synthesis of Intermediate I-F

[Reaction Formula 4-1]

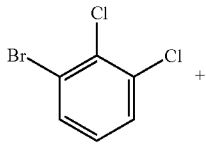

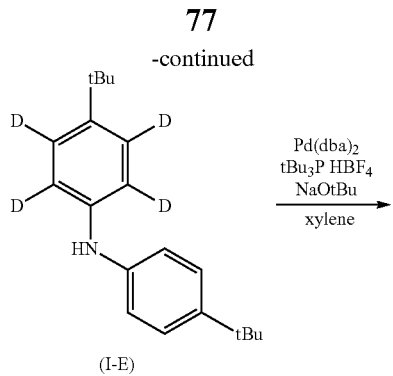

(I-E)

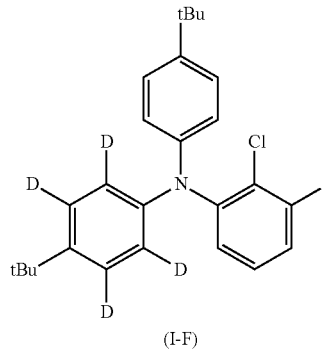

(I-F)

Under a nitrogen atmosphere, 2,3-dichlorobromobenzene (22.0 g), the compound (I-E) (26.6 g), Pd(dba)₂ (2.68 g), NaOtBu (16.8 g), tBu₃PHBF₄ (2.70 g) and xylene (300 ml) were put into a flask, and then the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene/heptane=1/1 (volume ratio)) to give the intermediate (I-F) (38.0 g).

(2) Synthesis of Intermediate I-G

[Reaction Formula 4-2]

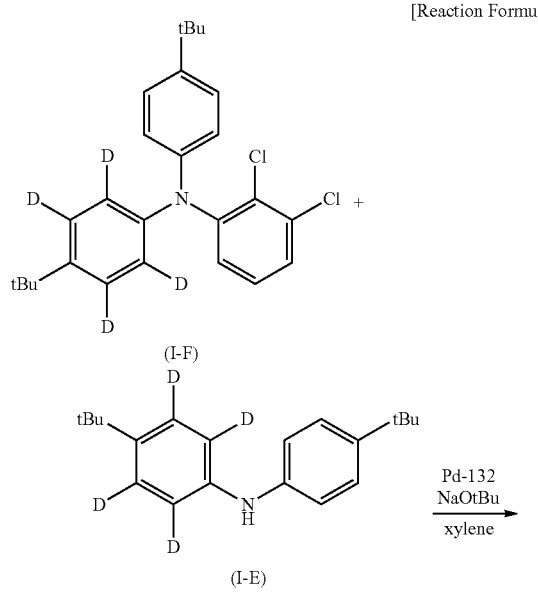

(I-F)

(I-E)

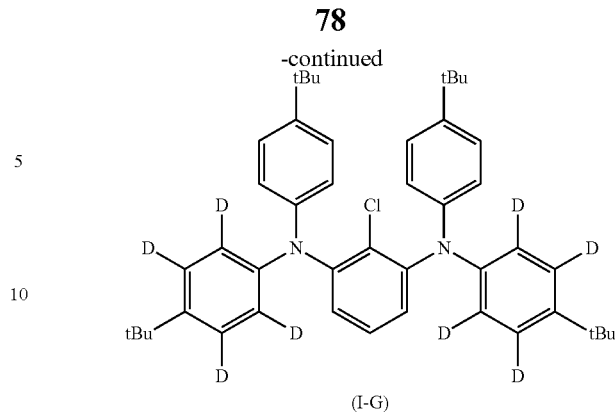

(I-G)

Under a nitrogen atmosphere, the intermediate (I-F) (15.0 g), the intermediate (1-E) (8.4 g), Pd-132 (0.21 g) as a palladium catalyst, NaOtBu (4.3 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene) to give the intermediate (I-G) (15.0 g).

(3) Synthesis of Dopant 11-3

[Reaction Formula 4-3]

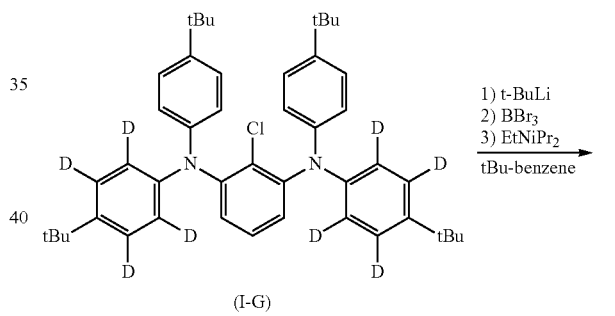

(I-G)

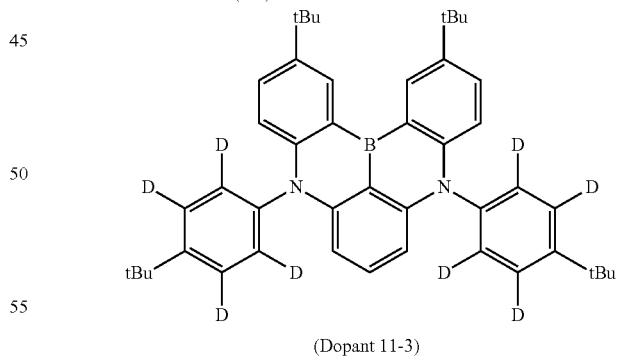

(Dopant 11-3)

Under a nitrogen atmosphere, 1.56 M of t-butyllithium pentane solution (27.5 ml) was added dropwisely added into a flask containing the intermediate (I-G) (15.0 g) and t-butylbenzene (120 ml) at 0° C. After the completion of the dropwise addition of t-butyllithium pentane solution, the temperature of the mixture was raised to 70° C., and then the mixture was stirred for 0.5 hour. The residue was cooled to −50° C., boron tribromide (10.7 g) was added thereto, the temperature of the mixture was raised to room temperature, and then the mixture was stirred for 0.5 hour. Thereafter, the mixture was cooled again to 0° C., EtNiPr$_2$ (5.5 g) was added thereto, and the mixture was stirred at room temperature until heat generation was settled. Subsequently, the temperature of the mixture was raised to 100° C., and stirred and heating for 1 hour. The reaction solution was cooled to room temperature, the cooled aqueous sodium acetate solution and then ethyl acetate were added thereto, and the mixture was partitioned. The organic layer was concentrated, and then purified with a silica gel short pass column (eluent:toluene). The obtained crude product was reprecipitated from heptane. Thus, the compound Dopant11-3 was obtained (6.5 g).

Synthesis Example 5: Synthesis of Dopant 11-4

(1) Synthesis of Intermediate I-S

[Reaction Formula 5-1]

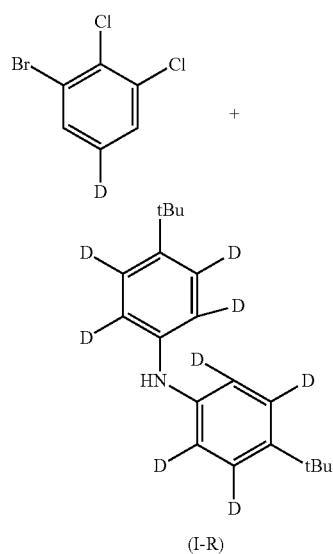

(2) Synthesis of Intermediate I-T

[Reaction Formula 5-2]

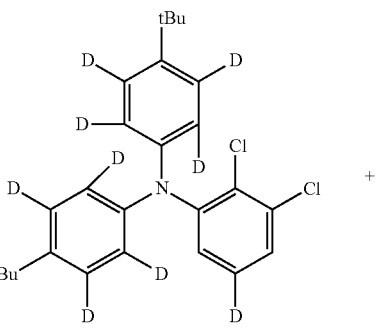

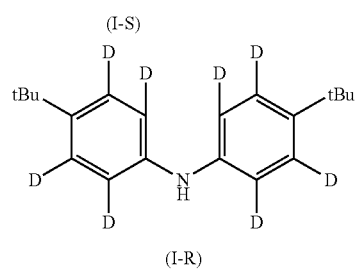

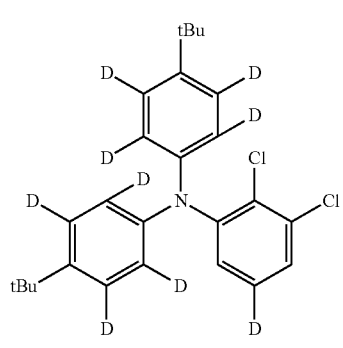

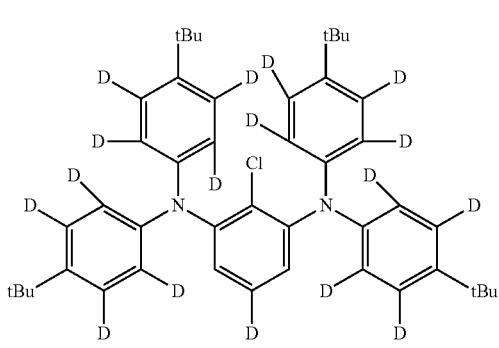

Under a nitrogen atmosphere, 2,3-dichlorobromobenzene-D (22.0 g), the compound (I-R) (26.6 g), Pd(dba)$_2$ (2.68 g), NaOtBu (16.8 g), tBu$_3$PHBF$_4$ (2.70 g) and xylene (300 ml) were put into a flask, and then the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent: toluene/heptane=1/1 (volume ratio)) to give the intermediate (I-S) (38.0 g).

Under a nitrogen atmosphere, the intermediate (I-S) (15.0 g), the intermediate (I-R) (8.4 g), Pd-132 (0.21 g) as a palladium catalyst, NaOtBu (4.3 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene) to give the intermediate (I-T) (15.0 g).

(3) Synthesis of Dopant 11-4

[Reaction Formula 5-3]

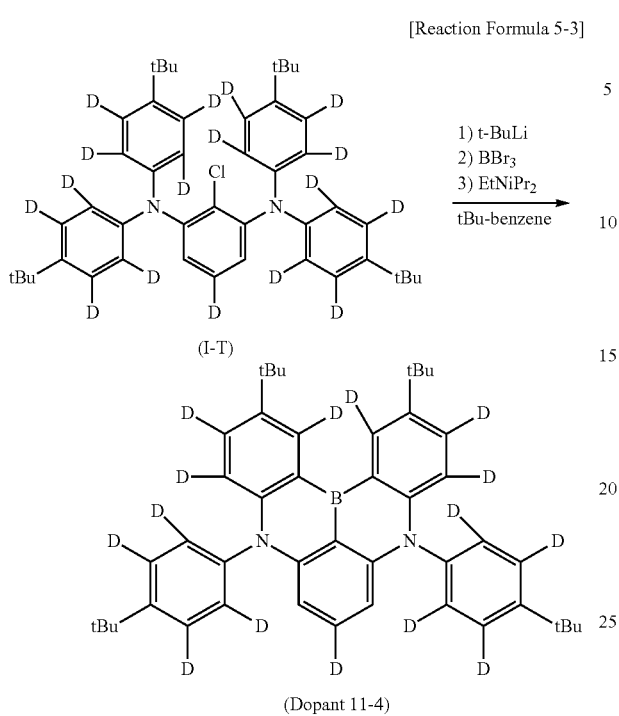

(I-T)

(Dopant 11-4)

Under a nitrogen atmosphere, 1.56 M of t-butyllithium pentane solution (27.5 ml) was added dropwisely added into a flask containing the intermediate (I-T) (15.0 g) and t-butylbenzene (120 ml) at 0° C. After the completion of the dropwise addition of t-butyllithium pentane solution, the temperature of the mixture was raised to 70° C., and then the mixture was stirred for 0.5 hour. The residue was cooled to −50° C., boron tribromide (10.7 g) was added thereto, the temperature of the mixture was raised to room temperature, and then the mixture was stirred for 0.5 hour. Thereafter, the mixture was cooled again to 0° C., EtNiPr$_2$ (5.5 g) was added thereto, and the mixture was stirred at room temperature until heat generation was settled. Subsequently, the temperature of the mixture was raised to 100° C., and stirred and heating for 1 hour. The reaction solution was cooled to room temperature, the cooled aqueous sodium acetate solution and then ethyl acetate were added thereto, and the mixture was partitioned. The organic layer was concentrated, and then purified with a silica gel short pass column (eluent:toluene). The obtained crude product was reprecipitated from heptane. Thus, the compound Dopant11-4 was obtained (8.0 g).

Synthesis Example 6: Synthesis of Dopant 11-1

(1) Synthesis of Intermediate I-5

[Reaction Formula 6-1]

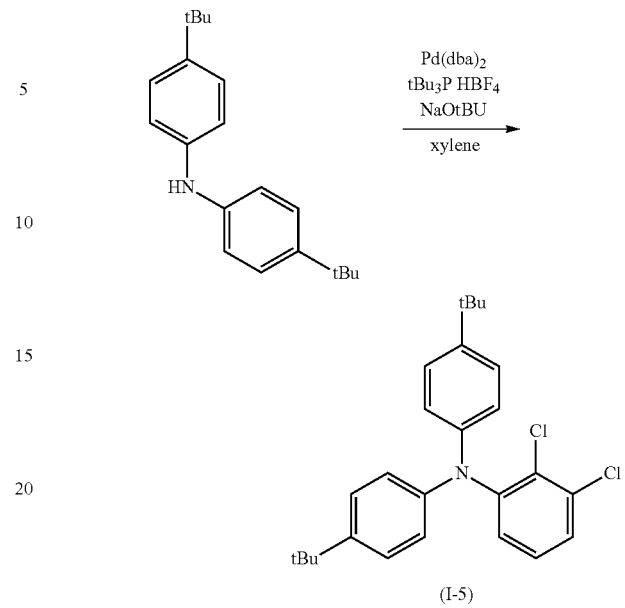

(I-5)

Under a nitrogen atmosphere, 2,3-dichlorobromobenzene (22.0 g), bis(4-tert-butylphenyl)amine (26.6 g), Pd(dba)$_2$ (2.68 g), NaOtBu (16.8 g), tBu$_3$PHBF$_4$ (2.70 g) and xylene (300 ml) were put into a flask, and then the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent: toluene/heptane=1/1 (volume ratio)) to give the intermediate (I-5) (38.0 g).

(2) Synthesis of Intermediate I-6

[Reaction Formula 6-2]

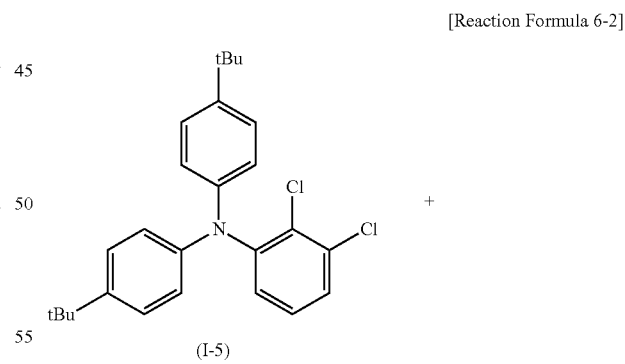

(I-5)

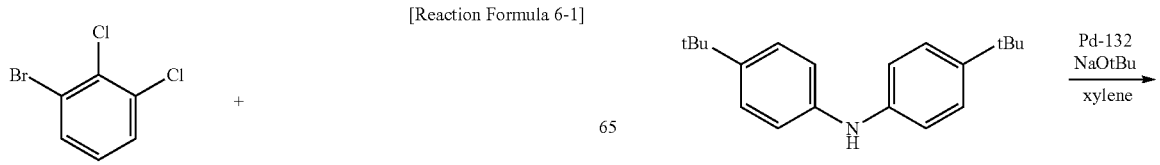

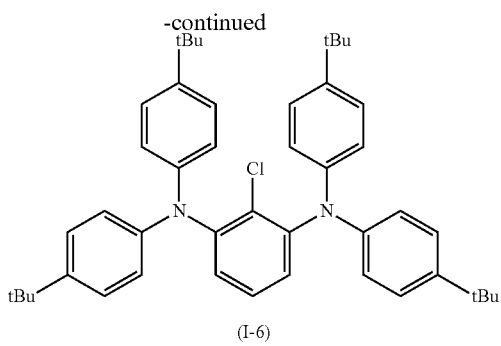

(I-6)

Under a nitrogen atmosphere, the intermediate (I-5) (15.0 g), bis(4-tert-butylphenyl)amine (8.4 g), Pd-132 (0.21 g) as a palladium catalyst, NaOtBu (4.3 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent:toluene) to give the intermediate (I-6) (15.0 g).

(3) Synthesis of Dopant 11-1

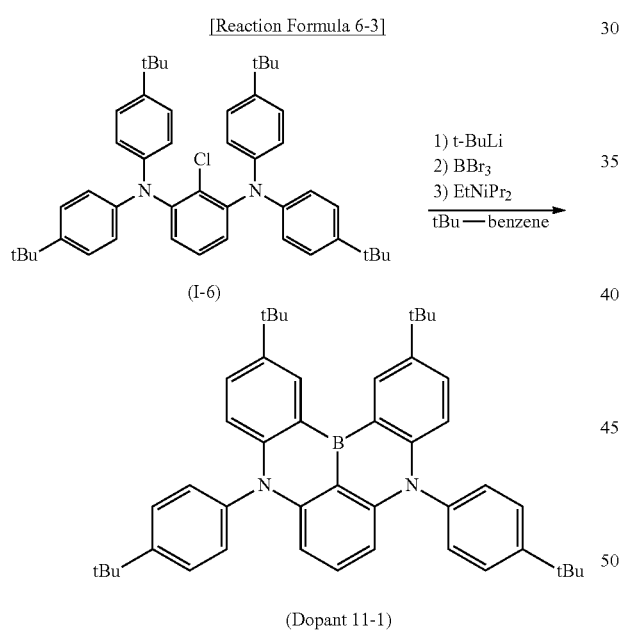

[Reaction Formula 6-3]

1) t-BuLi
2) BBr₃
3) EtNiPr₂
tBu—benzene (I-6)

(Dopant 11-1)

Under a nitrogen atmosphere, 1.56 M of t-butyllithium pentane solution (27.5 ml) was added dropwisely added into a flask containing the intermediate (I-6) (15.0 g) and t-butylbenzene (120 ml) at 0° C. After the completion of the dropwise addition of t-butyllithium pentane solution, the temperature of the mixture was raised to 70° C., and then the mixture was stirred for 0.5 hour. The residue was cooled to −50° C., boron tribromide (10.7 g) was added thereto, the temperature of the mixture was raised to room temperature, and then the mixture was stirred for 0.5 hour. Thereafter, the mixture was cooled again to 0° C., EtNiPr₂ (5.5 g) was added thereto, and the mixture was stirred at room temperature until heat generation was settled. Subsequently, the temperature of the mixture was raised to 100° C., and stirred and heating for 1 hour. The reaction solution was cooled to room temperature, the cooled aqueous sodium acetate solution and then ethyl acetate were added thereto, and the mixture was partitioned. The organic layer was concentrated, and then purified with a silica gel short pass column (eluent:toluene). The obtained crude product was reprecipitated from heptane. Thus, the compound Dopant11-1 was obtained (6.5 g).

Synthesis Example 7: Synthesis of Dopant 21-2

(1) Synthesis of Intermediate I-N

[Reaction Formula 7-1]

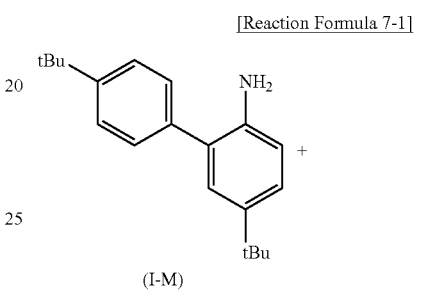

(I-M)

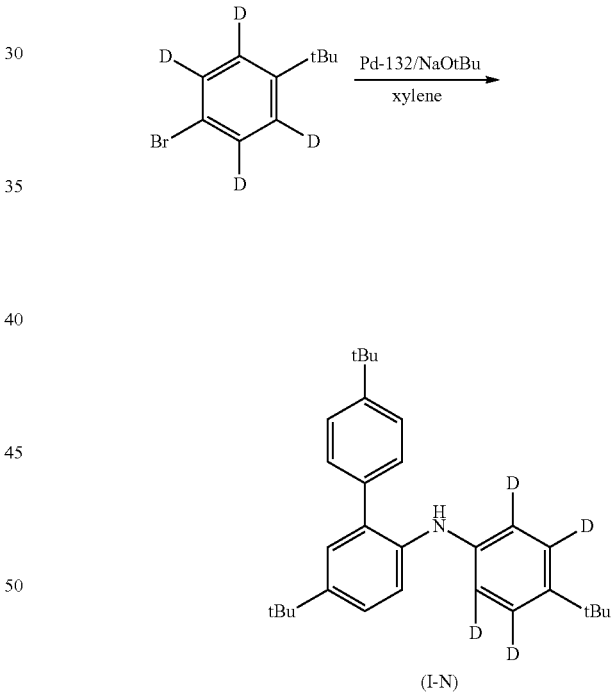

(I-N)

Under a nitrogen atmosphere, the intermediate (I-M) (22.5 g), 4-bromo-tert-butylbenzene-D4 (17.0 g), Pd-132 (0.57 g), NaOtBu (11.5 g) and xylene (150 ml) were put into a flask, and then the mixed solution was heated with stirring for 2 hours. After the reaction, water and ethyl acetate were added to the reaction solution, followed by stirring. Thereafter, the organic layer was separated and washed with water. Thereafter, the organic layer was concentrated to obtain a crude product. The crude product was purified with a silica gel short column (eluent: toluene/heptane=2/8 (volume ratio)) to give the intermediate (I-N) (30.0 g).

(2) Synthesis of Intermediate I-O

[Reaction Formula 7-2]

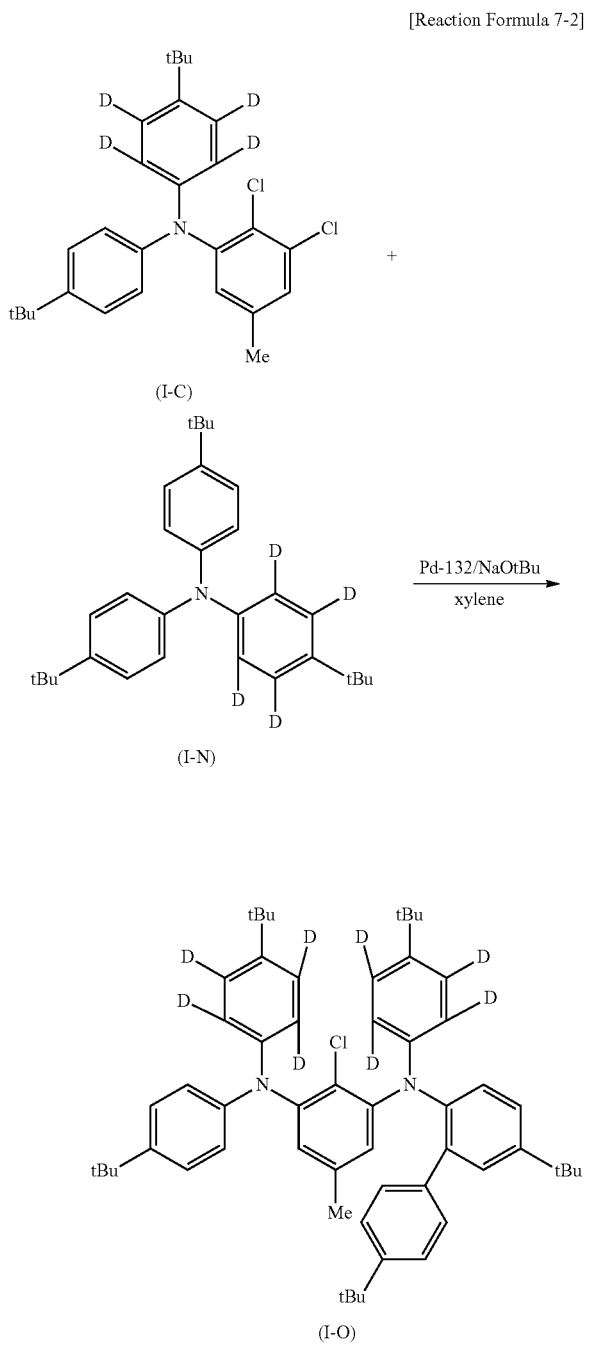

Under a nitrogen atmosphere, the intermediate (I-C) (12.0 g), the intermediate (I-N) (10.7 g), Pd-132 (0.19 g), NaOtBu (3.9 g), and xylene (60 ml) were put into a flask, and the mixed solution was heated at 120° C. for 1.5 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-O) (18.0 g).

(3) Synthesis of Dopant 21-2

[Reaction Formula 7-3]

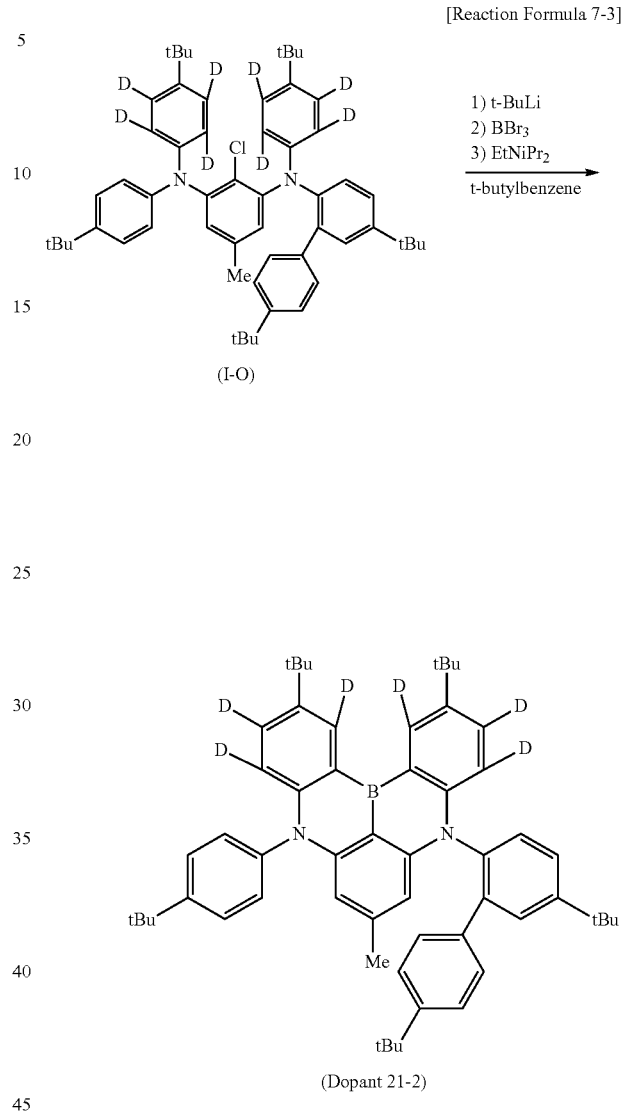

Under a nitrogen atmosphere, 1.62 M of t-butyllithium pentane solution (40.0 ml) was added dropwisely added into a flask containing the intermediate (I-O) (18.0 g) and t-butylbenzene (90 ml) at 0° C. After the completion of the dropwise addition of t-butyllithium pentane solution, the temperature of the mixture was raised to 60° C., and then the mixture was stirred for 1 hour. The residue was cooled to −50° C., boron tribromide (16.5 g) was added thereto, the temperature of the mixture was raised to room temperature, and then the mixture was stirred for 0.5 hour. Thereafter, the mixture was cooled again to 0° C., EtNiPr$_2$ (5.7 g) was added thereto, and the mixture was stirred at 100° C. for 1 hour. After the reaction, aqueous sodium acetate solution was added into the reaction solvent, the mixture was stirred, ethyl acetate was added into the mixture, and then the mixture was stirred again. The organic layer was separated to obtain a crude product, and then the crude product was purified with a silica gel column chromatography (eluent: toluene/heptane=3/7 (volume ratio)) to give the Dopant 21-2 (0.6 g).

Synthesis Example 8: Synthesis of Dopant 21-3

(1) Synthesis of Intermediate I-B

[Reaction Formula 8-1]

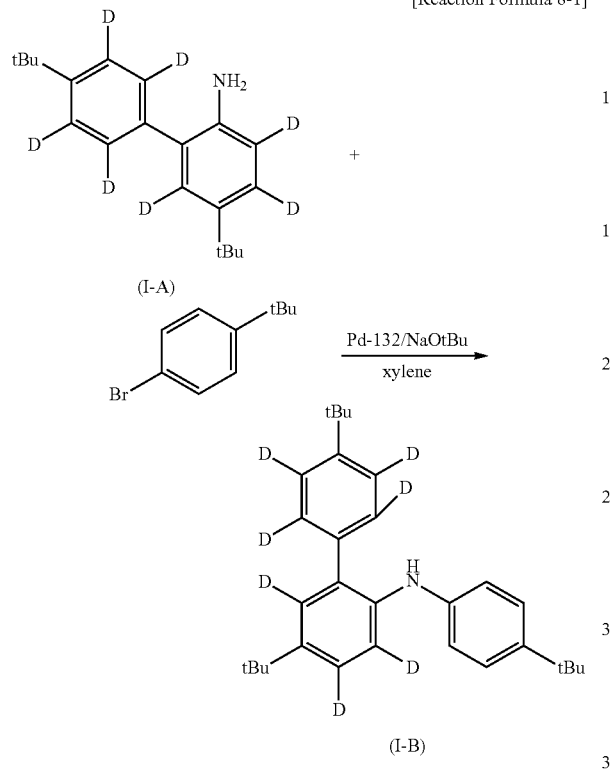

Under a nitrogen atmosphere, the intermediate (I-A) (22.5 g), 4-bromo-tert-butylbenzene (17.0 g), Pd-132 (0.57 g), NaOtBu (11.5 g) and xylene (150 ml) were put into a flask, and then the mixed solution was heated with stirring for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-B) (31.0 g).

(2) Synthesis of Intermediate I-D

[Reaction Formula 8-2]

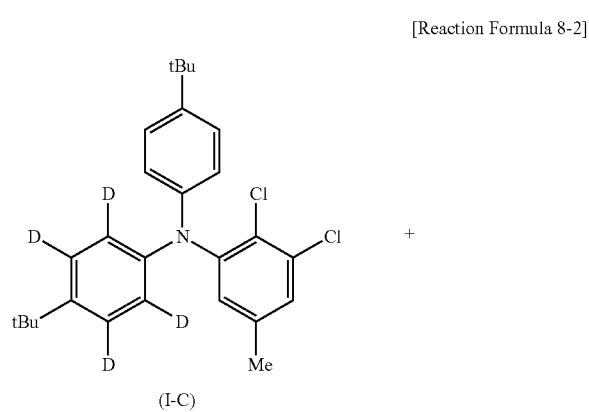

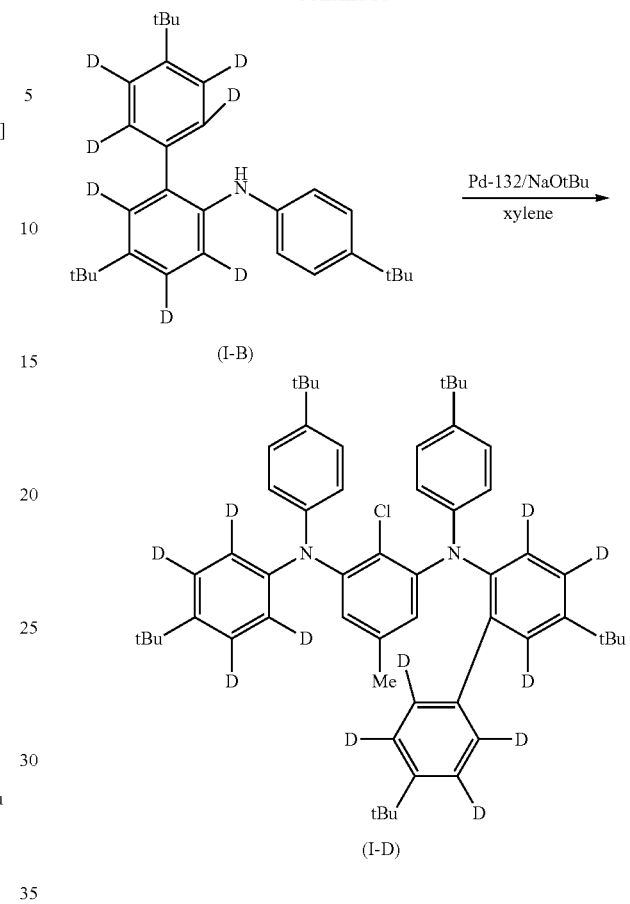

Under a nitrogen atmosphere, the intermediate (I-C) (12.0 g), the intermediate (I-B) (10.7 g), Pd-132 (0.19 g), NaOtBu (3.9 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-D) (19.9 g).

(3) Synthesis of Dopant 21-3

[Reaction Formula 8-3]

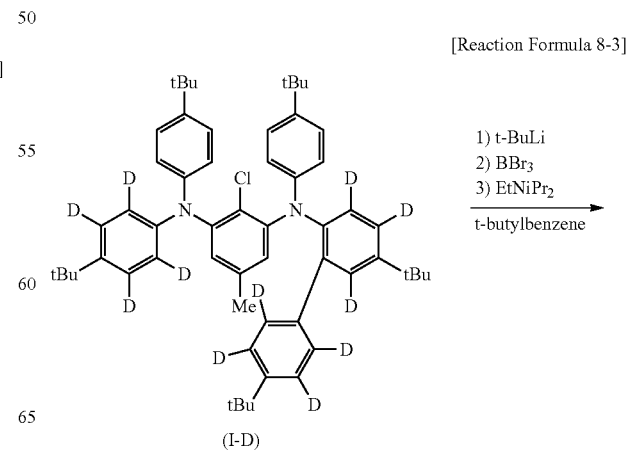

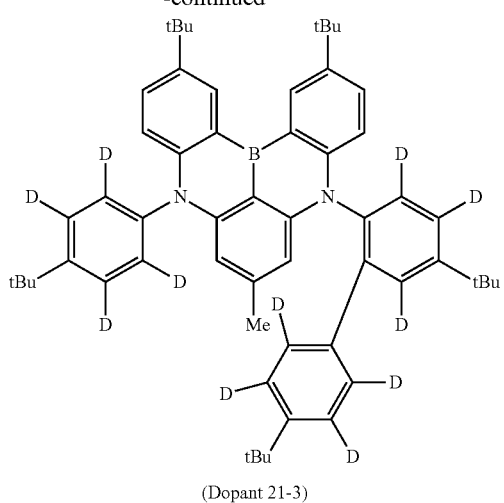

(Dopant 21-3)

Under a nitrogen atmosphere, 1.62 M of t-butyllithium pentane solution (40.0 ml) was added dropwisely added into a flask containing the intermediate (I-D) (18.0 g) and t-butylbenzene (90 ml) at 0° C. After the completion of the dropwise addition of t-butyllithium pentane solution, the temperature of the mixture was raised to 60° C., and then the mixture was stirred for 1 hour. The components having a boiling point lower than a boiling point of t-butylbenzene was distilled under reduced pressure. The residue was cooled to −50° C., boron tribromide (16.5 g) was added thereto, the temperature of the mixture was raised to room temperature, and then the mixture was stirred for 0.5 hour. Thereafter, the mixture was cooled again to 0° C., EtNiPr$_2$ (5.7 g) was added thereto, and the mixture was stirred at 100° C. for 1 hour. After the reaction, aqueous sodium acetate solution was added into the reaction solvent, the mixture was stirred, ethyl acetate was added into the mixture, and then the mixture was stirred again. The organic layer was separated to obtain a crude product, and then the crude product was purified with a silica gel column chromatography (eluent: toluene/heptane=3/7 (volume ratio)) to give the Dopant 21-3 (4.0 g).

Synthesis Example 9: Synthesis of Dopant 21-4

(1) Synthesis of Intermediate I-J

[Reaction Formula 9-1]

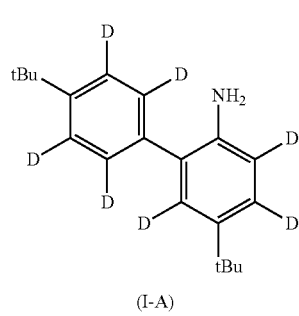

(I-A)

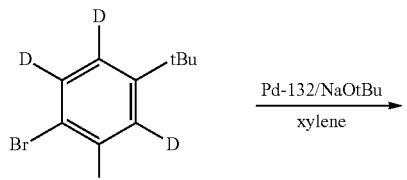

+

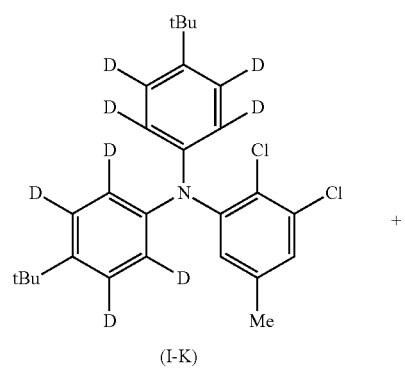

(I-J)

Under a nitrogen atmosphere, the intermediate (I-A) (22.5 g), 4-bromo-tert-butylbenzene-D4 (17.0 g), Pd-132 (0.57 g), NaOtBu (11.5 g) and xylene (150 ml) were put into a flask, and then the mixed solution was heated with stirring for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent: toluene/heptane=2/8 (volume ratio)) to give the intermediate (I-J) (31.0 g).

(2) Synthesis of Intermediate I-L

[Reaction Formula 9-2]

(I-K)

+

-continued

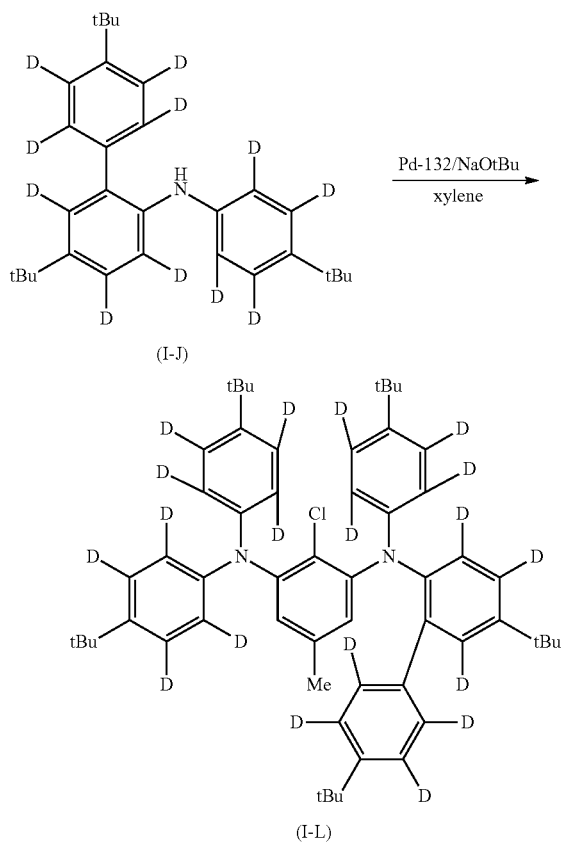

(I-J)

(I-L)

Under a nitrogen atmosphere, the intermediate (I-K) (12.0 g), the intermediate (I-J) (10.7 g), Pd-132 (0.19 g), NaOtBu (3.9 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-L) (19.9 g).

(3) Synthesis of Dopant 21-4

[Reaction Formula 9-3]

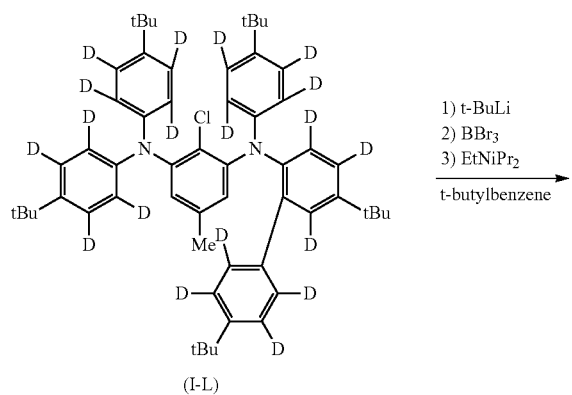

(I-L)

-continued

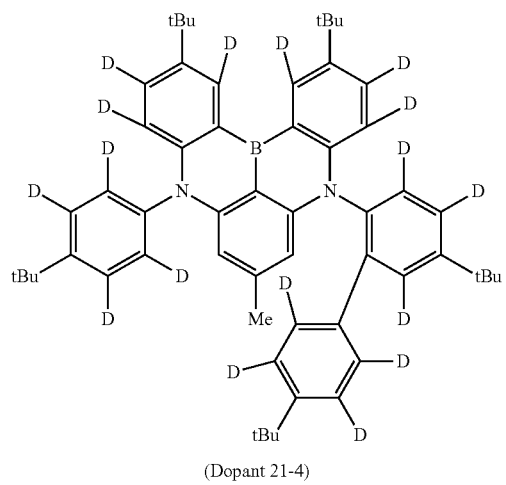

(Dopant 21-4)

Under a nitrogen atmosphere, 1.62 M of t-butyllithium pentane solution (40.0 ml) was added dropwisely added into a flask containing the intermediate (I-L) (18.0 g) and t-butylbenzene (90 ml) at 0° C. After the completion of the dropwise addition of t-butyllithium pentane solution, the temperature of the mixture was raised to 60° C., and then the mixture was stirred for 1 hour. The components having a boiling point lower than a boiling point of t-butylbenzene was distilled under reduced pressure. The residue was cooled to −50° C., boron tribromide (16.5 g) was added thereto, the temperature of the mixture was raised to room temperature, and then the mixture was stirred for 0.5 hour. Thereafter, the mixture was cooled again to 0° C., EtNiPr$_2$ (5.7 g) was added thereto, and the mixture was stirred at 100° C. for 1 hour. After the reaction, aqueous sodium acetate solution was added into the reaction solvent, the mixture was stirred, ethyl acetate was added into the mixture, and then the mixture was stirred again. The organic layer was separated to obtain a crude product, and then the crude product was purified with a silica gel column chromatography (eluent: toluene/heptane=3/7 (volume ratio)) to give the Dopant 21-4 (4.0 g).

Synthesis Example 10: Synthesis of Dopant 21-1

(1) Synthesis of Intermediate I-2

[Reaction Formula 10-1]

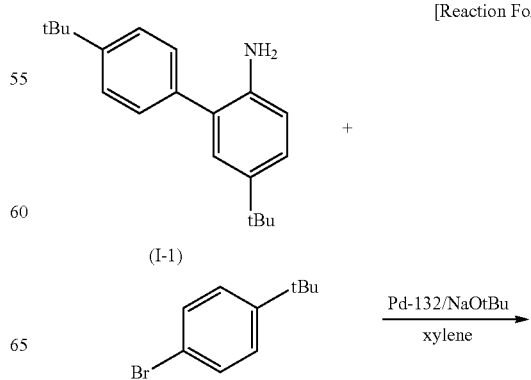

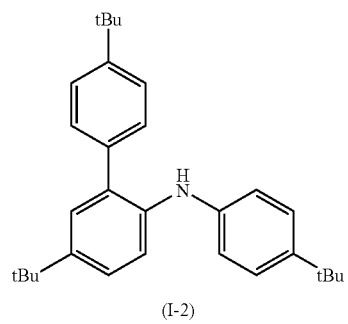

(I-2)

Under a nitrogen atmosphere, the intermediate (I-1) (22.5 g), 4-bromo-tert-butylbenzene (17.0 g), Pd-132 (0.57 g), NaOtBu (11.5 g) and xylene (150 ml) were put into a flask, and then the mixed solution was heated with stirring for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-2) (31.0 g).

(2) Synthesis of Intermediate I-4

[Reaction Formula 10-2]

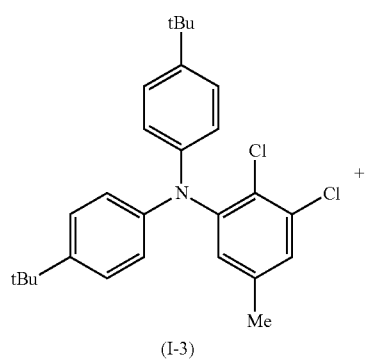

(I-3)

+

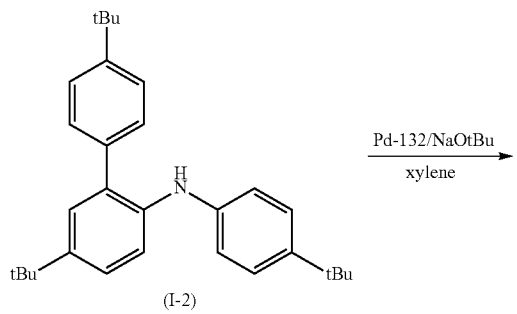

(I-2)

Pd-132/NaOtBu
xylene
→

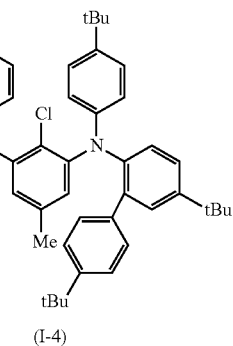

(I-4)

Under a nitrogen atmosphere, the intermediate (I-3) (12.0 g), the intermediate (I-2) (10.7 g), Pd-132 (0.19 g), NaOtBu (3.9 g), and xylene (60 ml) were put into a flask, and the mixed solution was heated at 120° C. for 1 hour. After the reaction, water and ethyl acetate were added to the reaction solution, followed by stirring. Thereafter, the organic layer was separated and washed with water twice. Thereafter, the organic layer was concentrated to obtain a crude product. The crude product was purified with a silica gel short column (eluent:toluene/heptane=2/8 (volume ratio)) to give the intermediate (I-4) (19.9 g).

(3) Synthesis of Dopant 21-1

[Reaction Formula 10-3]

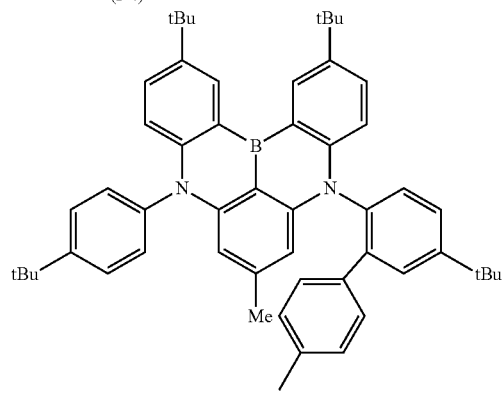

(I-4)

1) t-BuLi
2) BBr₃
3) EtNiPr₂
t-butylbenzene
→

(Dopant 21-1)

Under a nitrogen atmosphere, 1.62 M of t-butyllithium pentane solution (40.0 ml) was added dropwisely added into a flask containing the intermediate (I-4) (18.0 g) and t-butylbenzene (90 ml) at 0° C. After the completion of the dropwise addition of t-butyllithium pentane solution, the temperature of the mixture was raised to 60° C., and then the mixture was stirred for 1 hour. The components having a boiling point lower than a boiling point of t-butylbenzene was distilled under reduced pressure. The residue was cooled to −50° C., boron tribromide (16.5 g) was added thereto, the temperature of the mixture was raised to room temperature, and then the mixture was stirred for 0.5 hour. Thereafter, the mixture was cooled again to 0° C., EtNiPr$_2$ (5.7 g) was added thereto, and the mixture was stirred at 100° C. for 1 hour. After the reaction, aqueous sodium acetate solution was added into the reaction solvent, the mixture was stirred, ethyl acetate was added into the mixture, and then the mixture was stirred again. The organic layer was separated to obtain a crude product, and then the crude product was purified with a silica gel column chromatography (eluent: toluene/heptane=3/7 (volume ratio)) to give the Dopant 21-1 (4.0 g).

Example 1 (Ex.1): Fabrication of Organic Light Emitting Diode (OLED)

An organic light emitting diode was fabricated by applying Host 1 synthesized in the Synthesis Example 1 as a host and Dopant 21-2 synthesized in the Synthesis Example 7 as a dopant into an emitting material layer (EML), E5 in Formula 6 into an electron blocking layer (EBL) and 2-phneyl-9,10-bis(2,2'-bipyridin-5-yl)anthracene into a a hole blocking layer (HBL). A glass substrate (40 mm×40 mm×40 mm) onto which ITO was coated as a thin film was washed and ultrasonically cleaned by solvent such as isopropyl alcohol, acetone and distilled water for 5 minutes and dried at 100° C. oven. After cleaning the substrate, the substrate was treated with 02 plasma under vacuum for 2 minutes and then transferred to a vacuum chamber for depositing emission layer. Subsequently, an emissive layer and a cathode were deposited by evaporation from a heating boat under about 10-7 Torr as the following order:

A hole injection layer (HIL) (Formula 11 (97 wt %) and Formula 12 (3 wt %), 100 Å); a hole transport layer (HTL) (Formula 12, 100 Å), an EBL (E5 in Formula 6, 100 Å); an EML (Host 1 (98 wt %) and Dopant 21-2 (2 wt %), 200 Å); a HBL (2-phenyl-9,10-bis(2,2'-bipyridin-5-yl)anthracene, 100 Å); an electron injection layer (EIL) (1,3-bis(9-phenyl-1,10-phenanthroline-2-yl)benzene (98 wt %) and Li (2 wt %), 200 Å); and a cathode (Al, 500 Å).

And then, cappling layer (CPL) was deposited over the cathode and the device was encapsualted by glass. After deposition of emissive layer and the cathode, the OLED was transferred from the deposition chamber to a dry box for film formation, followed by encapsulation using UV-curable epoxy and moisture getter.

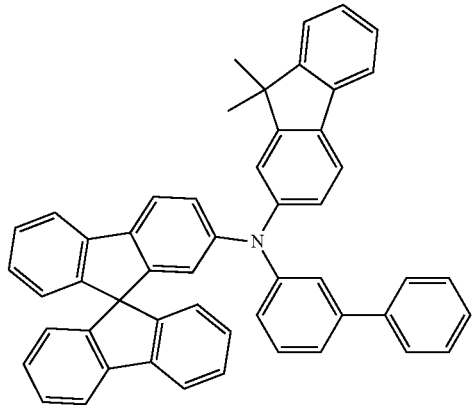

[Formula 11]

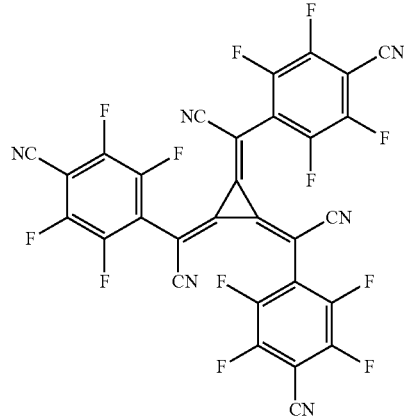

[Formula 12]

Examples 2-3 (Ex. 2-3): Fabrication of OLEDs

An OLED was fabricated using the same procedure and the same material as in Example 1, except that H1 in Formula8 (Example 2) or H31 in Formula10 (Example 3) was used as the material in the HBL.

Comparative Examples 1-3 (Ref. 1-3): Fabrication of OLEDs

An OLED was fabricated using the same procedure and the same material as in each of Examples 1-3, except that Host 1-1 in the following Formula 13 as the host in the EML and NPB (N,N'-di(1-naphthyl)-N,N'-diphenyl-(1,1'-biphenyl)-4,4'-diamine) as the material in the EBL, respectively, were used.

Comparative Examples 4-6 (Ref. 4-6): Fabrication of OLEDs

An OLED was fabricated using the same procedure and the same material as in each of Examples 1-3, except that Host 1-2 in the following Formula 13 as the host in the EML and NPB as the material in the EBL, respectively, were used.

Comparative Examples 7-9 (Ref. 7-9): Fabrication of OLEDs

An OLED was fabricated using the same procedure and the same material as in each of Examples 1-3, except that NPB as the material in the EBL, respectively, was used.

Comparative Examples 10-12 (Ref. 10-12): Fabrication of OLEDs

An OLED was fabricated using the same procedure and the same material as in each of Examples 1-3, except that Host 1-3 in the following Formula 13 as the host in the EML and NPB as the material in the EBL, respectively, were used.

Comparative Examples 13-15 (Ref. 13-15): Fabrication of OLEDs

An OLED was fabricated using the same procedure and the same material as in each of Examples 1-3, except that Host 1-4 in the following Formula 13 as the host in the EML and NPB as the material in the EBL, respectively, were used.

[Formula 13]

Host 1-1

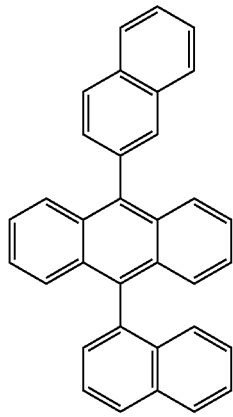

Host 1-2

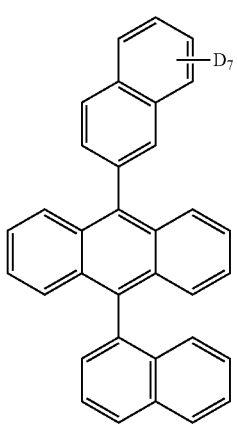

Host 1-3

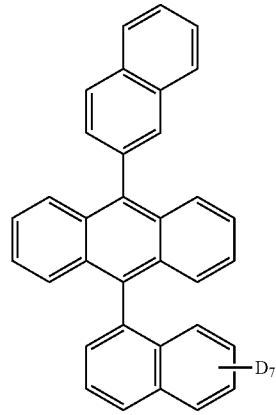

Host 1-4

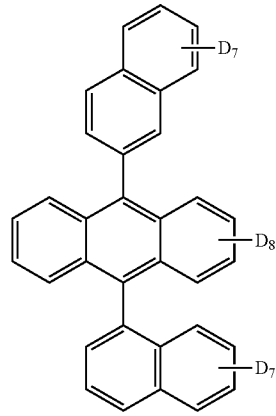

Experimental Example 1: Measurement of Luminous Properties of OLEDs

Each of the OLEDs, having 9 mm² of emission area, fabricated in Examples 1 to 3 and Comparative Examples 1 to 15 was connected to an external power source and then luminous properties for all the OLEDs were evaluated using a constant current source (KEITHLEY) and a photometer PR650 at room temperature. In particular, driving voltage (V), current efficiency (Cd/A) and color coordinates at a current density of 10 mA/cm² and time period ($T_{95}$) at which the luminance was reduced to 95% from initial luminance at 3000 nit at 40° C. and at a current density of 22.5 mA/in². The measurement results are indicated in the following Table 1.

TABLE 1

| Sample | Host | V | cd/A | (CIE x, y) | | ($T_{95}$, hr) |
|---|---|---|---|---|---|---|
| Ref. 1[a] | Host 1-1 | 3.76 | 2.32 | 0.134 | 0.077 | 44 |
| Ref. 2[b] | Host 1-1 | 3.71 | 2.55 | 0.135 | 0.078 | 50 |
| Ref. 3[c] | Host 1-1 | 3.76 | 2.44 | 0.135 | 0.077 | 54 |
| Ref. 4[a] | Host 1-2 | 3.77 | 2.35 | 0.135 | 0.076 | 48 |
| Ref. 5[b] | Host 1-2 | 3.70 | 2.61 | 0.134 | 0.077 | 49 |
| Ref. 6[c] | Host 1-2 | 3.77 | 2.41 | 0.135 | 0.076 | 60 |
| Ref. 7[a] | Host 1 | 3.78 | 2.44 | 0.136 | 0.077 | 75 |
| Ref. 8[b] | Host 1 | 3.74 | 2.69 | 0.135 | 0.076 | 82 |
| Ref. 9[c] | Host 1 | 3.76 | 2.38 | 0.135 | 0.077 | 85 |
| Ref. 10[a] | Host 1-3 | 3.77 | 2.13 | 0.136 | 0.077 | 49 |
| Ref. 11[b] | Host 1-3 | 3.72 | 2.24 | 0.135 | 0.076 | 51 |

TABLE 1-continued

Luminous Properties of OLED

| Sample | Host | V | cd/A | (CIE x, y) | | ($T_{95}$, hr) |
|---|---|---|---|---|---|---|
| Ref. 12[c] | Host 1-3 | 3.76 | 2.19 | 0.135 | 0.077 | 53 |
| Ref. 13[a] | Host 1-4 | 3.77 | 2.11 | 0.134 | 0.077 | 65 |
| Ref. 14[b] | Host 1-4 | 3.73 | 2.35 | 0.135 | 0.078 | 75 |
| Ref. 15[c] | Host 1-4 | 3.77 | 2.19 | 0.135 | 0.077 | 80 |
| Ex. 1[d] | Host 1 | 3.78 | 4.43 | 0.136 | 0.077 | 157 |
| Ex. 2[e] | Host 1 | 3.73 | 4.59 | 0.135 | 0.076 | 206 |
| Ex. 3[f] | Host 1 | 3.76 | 4.42 | 0.135 | 0.0771 | 252 |

In all Examples and Comparative Examples, Dopant 21-2 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 1, the OLEDs fabricated in Comparative Examples 7-9 using the Host 1, the anthracene core of which is deuterated, in the EML showed significantly increased luminous lifespan, compared to the OLEDs in Comparative Examples 1-3 using the Host 1-1, which is not deuterated, in the EML or the OLEDs in Comparative Examples 4-6 and 10-12 using the Host 1-2 or Host 1-3, the substituent of anthracene is deuterated, in the EML. In addition, compared to the OLEDs fabricated in Comparative Examples 13-15 using the Host 1-4, both the anthracene core and the substituent are deuterated, in the EML, the OLEDs fabricated in Comparative Examples 7-9 using the Host 1 in the EML showed improved current efficiency and luminous lifespan. Such results indicate that sufficient luminous efficiency and increased lifespan can be implemented with less expensive deuterium.

In addition, compared to the OLEDs fabricated in Comparative Examples 7-9 using NPB in the EBL, the OLEDs fabricated in Examples 1-3 using E5 of Formula 6 in the EBL enhanced their current efficiency and luminous lifespan up to 85.7% and 196.5%, respectively. Particularly, when the OLED includes H1 of Formula 8 or H31 of Formula 10 in the HBL, its current efficiency and luminous lifespan were significantly enhanced.

Example 4 (Ex.4): Fabrication of OLED

An OLED was fabricated using the same procedure and the same material as in Example 1, except that Dopant 21-2 was used as the dopant in the EML.

Examples 5-6 (Ex. 5-6): Fabrication of OLEDs

An OLED was fabricated using the same procedure and the same material as in Example 4, except that H1 in Formula 8 (Example 5) or H31 in Formula 10 (Example 6) was used as the material in the HBL.

Comparative Examples 16-18 (Ref. 16-18): Fabrication of OLEDs

An OLED was fabricated using the same procedure and the same material as in each of Examples 4-6, except that Host 1-1 in Formula 13 as the host in the EML and NPB as the material in the EBL, respectively, were used.

Comparative Examples 19-21 (Ref. 19-21): Fabrication of OLEDs

An OLED was fabricated using the same procedure and the same material as in each of Examples 4-6, except that Host 1-2 in Formula 13 as the host in the EML and NPB as the material in the EBL, respectively, were used.

Comparative Examples 22-24 (Ref. 22-24): Fabrication of OLEDs

An OLED was fabricated using the same procedure and the same material as in each of Examples 4-6, except that NPB as the material in the EBL, respectively, was used.

Comparative Examples 25-27 (Ref. 25-27): Fabrication of OLEDs

An OLED was fabricated using the same procedure and the same material as in each of Examples 4-6, except that Host 1-3 in Formula 13 as the host in the EML and NPB as the material in the EBL, respectively, were used.

Comparative Examples 28-30 (Ref. 28-30): Fabrication of OLEDs

An OLED was fabricated using the same procedure and the same material as in each of Examples 4-6, except that Host 1-4 in Formula 13 as the host in the EML and NPB as the material in the EBL, respectively, were used Experimental Example 2: Measurement of Luminous Properties of OLEDs Luminous properties for each of the OLEDs fabricated in Examples 4-6 and Comparative Examples 16-30 were measured using the same procedure as in Experimental Example 1. The measurement results are indicated in the following Table 2.

TABLE 2

Luminous Properties of OLEDs

| Sample | Host | V | cd/A | (CIE x, y) | | ($T_{95}$, hr) |
|---|---|---|---|---|---|---|
| Ref. 16[a] | Host 1-1 | 3.76 | 2.09 | 0.135 | 0.076 | 44 |
| Ref. 17[b] | Host 1-1 | 3.74 | 2.22 | 0.134 | 0.077 | 48 |
| Ref. 18[c] | Host 1-1 | 3.76 | 2.08 | 0.135 | 0.076 | 57 |
| Ref. 19[a] | Host 1-2 | 3.77 | 1.82 | 0.134 | 0.077 | 45 |
| Ref. 20[b] | Host 1-2 | 3.72 | 2.07 | 0.135 | 0.078 | 49 |
| Ref. 21[c] | Host 1-2 | 3.77 | 1.84 | 0.135 | 0.077 | 54 |
| Ref. 22[a] | Host 1 | 3.76 | 2.04 | 0.134 | 0.077 | 60 |
| Ref. 23[b] | Host 1 | 3.74 | 2.19 | 0.135 | 0.078 | 65 |
| Ref. 24[c] | Host 1 | 3.76 | 2.06 | 0.135 | 0.077 | 71 |
| Ref. 25[a] | Host 1-3 | 3.77 | 2.13 | 0.135 | 0.076 | 44 |
| Ref. 26[b] | Host 1-3 | 3.73 | 2.22 | 0.134 | 0.077 | 46 |
| Ref. 27[c] | Host 1-3 | 3.77 | 2.16 | 0.135 | 0.076 | 53 |
| Ref. 28[a] | Host 1-4 | 3.76 | 2.09 | 0.136 | 0.077 | 67 |
| Ref. 29[b] | Host 1-4 | 3.70 | 2.25 | 0.135 | 0.076 | 69 |
| Ref. 30[c] | Host 1-4 | 3.76 | 2.11 | 0.135 | 0.077 | 79 |
| Ex. 4[d] | Host 1 | 3.76 | 4.42 | 0.135 | 0.077 | 156 |
| Ex. 5[e] | Host 1 | 3.73 | 4.52 | 0.135 | 0.076 | 216 |
| Ex. 6[f] | Host 1 | 3.76 | 4.43 | 0.134 | 0.077 | 255 |

In all Examples and Comparative Examples, Dopant 21-2 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 2, the OLEDs fabricated in Comparative Examples 22-24 using the Host 1, the anthracene core of which is deuterated, in the EML showed significantly increased luminous lifespan, compared to the OLEDs in Comparative Examples 16-18 using the Host 1-1, which is not deuterated, in the EML or the OLEDs in Comparative Examples 19-21 and 25-27 using the Host 1-2 or Host 1-3, the substituent of anthracene is deuterated, in the EML. In addition, compared to the OLEDs fabricated in Comparative Examples 28-30 using the Host 1-4, both the anthracene core and the substituent are deuterated, in the EML, the OLEDs fabricated in Comparative Examples 22-24 using the Host 1 in the EML showed equivalent or a little bit reduced current efficiency and luminous lifespan. Such results indicate that sufficient luminous efficiency and increased lifespan can be implemented with less expensive deuterium.

In addition, compared to the OLEDs fabricated in Comparative Examples 22-24 using NPB in the EBL, the OLEDs fabricated in Examples 4-6 using E5 of Formula 6 in the EBL enhanced their current efficiency and luminous lifespan up to 116.7% and 256.3%, respectively. Particularly, when the OLED includes H1 of Formula 8 or H31 of Formula 10 in the HBL, its current efficiency and luminous lifespan were significantly enhanced.

Example 7 (Ex.7): Fabrication of OLED

An OLED was fabricated using the same procedure and the same material as in Example 1, except that Dopant 21-3 was used as the dopant in the EML.

Examples 8-9 (Ex. 8-9): Fabrication of OLEDs

An OLED was fabricated using the same procedure and the same material as in Example 7, except that H1 in Formula 8 (Example 8) or H31 in Formula 10 (Example 9) was used as the material in the HBL.

Comparative Examples 31-33 (Ref. 31-33): Fabrication of OLEDs

An OLED was fabricated using the same procedure and the same material as in each of Examples 7-9, except that Host 1-1 in Formula 13 as the host in the EML and NPB as the material in the EBL, respectively, were used.

Comparative Examples 34-36 (Ref. 34-36): Fabrication of OLEDs

An OLED was fabricated using the same procedure and the same material as in each of Examples 7-9, except that Host 1-2 in Formula 13 as the host in the EML and NPB as the material in the EBL, respectively, were used.

Comparative Examples 37-39 (Ref.37-39): Fabrication of OLEDs

An OLED was fabricated using the same procedure and the same material as in each of Examples 7-9, except that NPB as the material in the EBL, respectively, was used.

Comparative Examples 40-42 (Ref. 40-42): Fabrication of OLEDs

An OLED was fabricated using the same procedure and the same material as in each of Examples 7-9, except that Host 1-3 in Formula 13 as the host in the EML and NPB as the material in the EBL, respectively, were used.

Comparative Examples 43-45 (Ref. 43-45): Fabrication of OLEDs

An OLED was fabricated using the same procedure and the same material as in each of Examples 7-9, except that Host 1-4 in Formula 13 as the host in the EML and NPB as the material in the EBL, respectively, were used Experimental Example 3: Measurement of Luminous Properties of OLEDs Luminous properties for each of the OLEDs fabricated in Examples 7-9 and Comparative Examples 31-45 were measured using the same procedure as in Experimental Example 1. The measurement results are indicated in the following Table 3.

TABLE 3

Luminous Properties of OLEDs

| Sample | Host | V | cd/A | (CIE x, y) | | ($T_{95}$, hr) |
|---|---|---|---|---|---|---|
| Ref. 31[a] | Host 1-1 | 3.76 | 2.18 | 0.134 | 0.077 | 48 |
| Ref. 32[b] | Host 1-1 | 3.69 | 2.38 | 0.135 | 0.078 | 49 |
| Ref. 33[c] | Host 1-1 | 3.76 | 2.20 | 0.135 | 0.077 | 57 |
| Ref. 34[a] | Host 1-2 | 3.77 | 2.09 | 0.135 | 0.076 | 44 |
| Ref. 35[b] | Host 1-2 | 3.70 | 2.31 | 0.135 | 0.077 | 47 |
| Ref. 36[c] | Host 1-2 | 3.77 | 2.14 | 0.135 | 0.077 | 57 |
| Ref. 37[a] | Host 1 | 3.77 | 2.17 | 0.135 | 0.077 | 59 |
| Ref .38[b] | Host 1 | 3.73 | 2.34 | 0.135 | 0.077 | 65 |
| Ref. 39[c] | Host 1 | 3.77 | 2.22 | 0.135 | 0.076 | 74 |
| Ref. 40[a] | Host 1-3 | 3.76 | 2.14 | 0.135 | 0.076 | 48 |
| Ref. 41[b] | Host 1-3 | 3.71 | 2.30 | 0.135 | 0.077 | 50 |
| Ref. 42[c] | Host 1-3 | 3.76 | 2.16 | 0.135 | 0.077 | 59 |
| Ref. 43[a] | Host 1-4 | 3.79 | 2.15 | 0.135 | 0.077 | 70 |
| Ref. 44[b] | Host 1-4 | 3.69 | 2.27 | 0.136 | 0.077 | 71 |
| Ref. 45[c] | Host 1-4 | 3.74 | 2.17 | 0.135 | 0.076 | 83 |
| Ex. 7[d] | Host 1 | 3.78 | 4.44 | 0.134 | 0.077 | 129 |
| Ex. 8[e] | Host 1 | 3.74 | 4.54 | 0.135 | 0.076 | 210 |
| Ex. 9[f] | Host 1 | 3.77 | 4.42 | 0.134 | 0.077 | 259 |

In all Examples and Comparative Examples, Dopant 21-3 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 3, the OLEDs fabricated in Comparative Examples 37-39 using the Host 1, the anthracene core of which is deuterated, in the EML showed significantly increased luminous lifespan, compared to the OLEDs in Comparative Examples 31-33 using the Host 1-1, which is not deuterated, in the EML or the OLEDs in Comparative Examples 34-36 and 40-42 using the Host 1-2 or Host 1-3, the substituent of anthracene is deuterated, in the EML. In addition, compared to the OLEDs fabricated in Comparative Examples 43-45 using the Host 1-4, both the anthracene core and the substituent are deuterated, in the EML, the OLEDs fabricated in Comparative Examples 37-39 using the Host 1 in the EML showed a little bit improved current efficiency and a little bit reduced luminous lifespan. Such results indicate that sufficient luminous efficiency and increased lifespan can be implemented with less expensive deuterium.

In addition, compared to the OLEDs fabricated in Comparative Examples 37-39 using NPB in the EBL, the OLEDs fabricated in Examples 7-9 using E5 of Formula 6 in the EBL enhanced their current efficiency and luminous lifespan up to 104.6% and 250%, respectively. Particularly, when the OLED includes H1 of Formula 8 or H31 of Formula 10 in the HBL, its current efficiency and luminous lifespan were significantly enhanced.

Example 10 (Ex.10): Fabrication of OLED

An OLED was fabricated using the same procedure and the same material as in Example 1, except that Dopant 21-4 was used as the dopant in the EML.

Examples 11-12 (Ex. 11-12): Fabrication of OLEDs

An OLED was fabricated using the same procedure and the same material as in Example 10, except that H1 in Formula 8 (Example 11) or H31 in Formula 10 (Example 12) was used as the material in the HBL.

Comparative Examples 46-48 (Ref. 46-48): Fabrication of OLEDs

An OLED was fabricated using the same procedure and the same material as in each of Examples 10-12, except that Host 1-1 in Formula 13 as the host in the EML and NPB as the material in the EBL, respectively, were used.

Comparative Examples 49-51 (Ref. 49-51): Fabrication of OLEDs

An OLED was fabricated using the same procedure and the same material as in each of Examples 10-12, except that Host 1-2 in Formula 13 as the host in the EML and NPB as the material in the EBL, respectively, were used.

Comparative Examples 52-54 (Ref.52-54): Fabrication of OLEDs

An OLED was fabricated using the same procedure and the same material as in each of Examples 10-12, except that NPB as the material in the EBL, respectively, was used.

Comparative Examples 55-57 (Ref. 55-57): Fabrication of OLEDs

An OLED was fabricated using the same procedure and the same material as in each of Examples 10-12, except that Host 1-3 in Formula 13 as the host in the EML and NPB as the material in the EBL, respectively, were used.

Comparative Examples 58-60 (Ref. 58-60): Fabrication of OLEDs

An OLED was fabricated using the same procedure and the same material as in each of Examples 10-12, except that Host 1-4 in Formula 13 as the host in the EML and NPB as the material in the EBL, respectively, were used Experimental Example 4: Measurement of Luminous Properties of OLEDs Luminous properties for each of the OLEDs fabricated in Examples 10-12 and Comparative Examples 46-60 were measured using the same procedure as in Experimental Example 1. The measurement results are indicated in the following Table 4.

TABLE 4

Luminous Properties of OLEDs

| Sample | Host | V | cd/A | (CIE x, y) | | ($T_{95}$, hr) |
|---|---|---|---|---|---|---|
| Ref. 46[a] | Host 1-1 | 3.79 | 2.18 | 0.135 | 0.077 | 73 |
| Ref. 47[b] | Host 1-1 | 3.73 | 2.29 | 0.136 | 0.077 | 77 |
| Ref. 48[c] | Host 1-1 | 3.77 | 2.22 | 0.135 | 0.076 | 90 |
| Ref. 49[a] | Host 1-2 | 3.78 | 2.16 | 0.135 | 0.077 | 73 |
| Ref. 50[b] | Host 1-2 | 3.74 | 2.31 | 0.135 | 0.077 | 74 |
| Ref. 51[c] | Host 1-2 | 3.77 | 2.17 | 0.135 | 0.076 | 90 |
| Ref. 52[a] | Host 1 | 3.78 | 2.16 | 0.134 | 0.077 | 95 |
| Ref. 53[b] | Host 1 | 3.73 | 2.32 | 0.135 | 0.076 | 97 |
| Ref. 54[c] | Host 1 | 3.78 | 2.19 | 0.135 | 0.077 | 120 |
| Ref. 55[a] | Host 1-3 | 3.78 | 2.14 | 0.135 | 0.078 | 71 |
| Ref. 56[b] | Host 1-3 | 3.73 | 2.27 | 0.135 | 0.077 | 71 |
| Ref. 57[c] | Host 1-3 | 3.76 | 2.16 | 0.135 | 0.077 | 90 |
| Ref. 58[a] | Host 1-4 | 3.79 | 2.15 | 0.134 | 0.077 | 111 |
| Ref. 59[b] | Host 1-4 | 3.73 | 2.29 | 0.135 | 0.076 | 113 |
| Ref. 60[c] | Host 1-4 | 3.78 | 2.17 | 0.135 | 0.077 | 130 |
| Ex. 10[d] | Host 1 | 3.77 | 4.48 | 0.135 | 0.077 | 206 |
| Ex. 11[e] | Host 1 | 3.74 | 4.59 | 0.135 | 0.077 | 346 |
| Ex. 12[f] | Host 1 | 3.76 | 4.46 | 0.134 | 0.077 | 393 |

In all Examples and Comparative Examples, Dopant 21-4 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 4, the OLEDs fabricated in Comparative Examples 52-54 using the Host 1, the anthracene core of which is deuterated, in the EML showed significantly increased luminous lifespan, compared to the OLEDs in Comparative Examples 46-48 using the Host 1-1, which is not deuterated, in the EML or the OLEDs in Comparative Examples 49-51 and 55-57 using the Host 1-2 or Host 1-3, the substituent of anthracene is deuterated, in the EML. In addition, compared to the OLEDs fabricated in Comparative Examples 58-60 using the Host 1-4, both the anthracene core and the substituent are deuterated, in the EML, the OLEDs fabricated in Comparative Examples 52-54 using the Host 1 in the EML showed equivalent or a little bit reduced current efficiency and luminous lifespan. Such results indicate that sufficient luminous efficiency and increased lifespan can be implemented with less expensive deuterium.

In addition, compared to the OLEDs fabricated in Comparative Examples 52-54 using NPB in the EBL, the OLEDs fabricated in Examples 10-12 using E5 of Formula 6 in the EBL enhanced their current efficiency and luminous lifespan up to 107.4% and 256.7%, respectively. Particularly, when the OLED includes H1 of Formula 8 or H31 of Formula 10 in the HBL, its current efficiency and luminous lifespan were significantly enhanced.

Example 13 (Ex.13): Fabrication of OLED

An OLED was fabricated using the same procedure and the same material as in Example 1, except that Host 2 was used as the host in the EML.

Examples 14-15 (Ex. 14-15): Fabrication of OLEDs

An OLED was fabricated using the same procedure and the same material as in Example 13, except that H1 in Formula 8 (Example 14) or H31 in Formula 10 (Example 15) was used as the material in the HBL.

Comparative Examples 61-63 (Ref. 61-63):
Fabrication of OLEDs

An OLED was fabricated using the same procedure and the same material as in each of Examples 13-15, except that Host 2-1 in the following Formula 14 as the host in the EML and NPB as the material in the EBL, respectively, were used.

Comparative Examples 64-66 (Ref. 64-66):
Fabrication of OLEDs

An OLED was fabricated using the same procedure and the same material as in each of Examples 13-15, except that Host 2-2 in the following Formula 14 as the host in the EML and NPB as the material in the EBL, respectively, were used.

Comparative Examples 67-69 (Ref.67-69):
Fabrication of OLEDs

An OLED was fabricated using the same procedure and the same material as in each of Examples 13-15, except that NPB as the material in the EBL, respectively, was used.

Comparative Examples 70-72 (Ref. 70-72):
Fabrication of OLEDs

An OLED was fabricated using the same procedure and the same material as in each of Examples 13-15, except that Host 2-3 in the following Formula 14 as the host in the EML and NPB as the material in the EBL, respectively, were used.

Comparative Examples 73-75 (Ref. 73-75):
Fabrication of OLEDs

An OLED was fabricated using the same procedure and the same material as in each of Examples 13-15, except that Host 2-4 in the following Formula 14 as the host in the EML and NPB as the material in the EBL, respectively, were used.

[Formula 14]

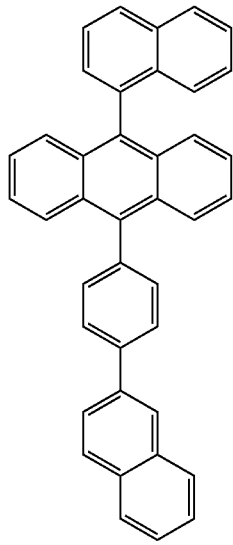

Host 2-1

-continued

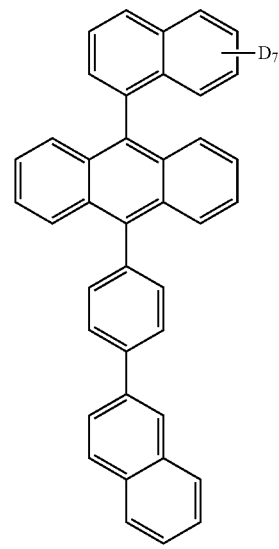

Host 2-2

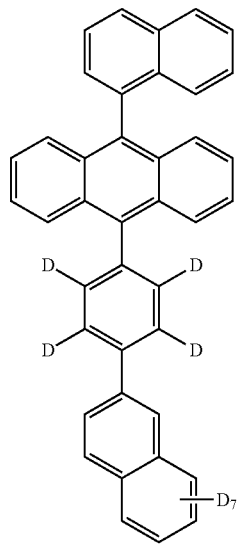

Host 2-3

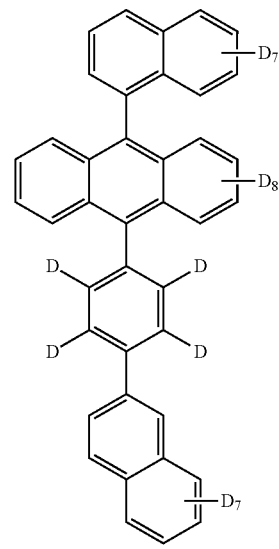

Host 2-4

Experimental Example 5: Measurement of Luminous Properties of OLEDs

Luminous properties for each of the OLEDs fabricated in Examples 13-15 and Comparative Examples 61-75 were measured using the same procedure as in Experimental Example 1. The measurement results are indicated in the following Table 5.

TABLE 5

Luminous Properties of OLEDs

| Sample | Host | V | cd/A | (CIE x, y) | | ($T_{95}$, hr) |
|---|---|---|---|---|---|---|
| Ref. 61[a] | Host 2-1 | 3.79 | 2.20 | 0.136 | 0.077 | 44 |
| Ref. 62[b] | Host 2-1 | 3.71 | 2.15 | 0.135 | 0.076 | 47 |
| Ref. 63[c] | Host 2-1 | 3.77 | 2.02 | 0.135 | 0.077 | 53 |
| Ref. 64[a] | Host 2-2 | 3.78 | 2.17 | 0.134 | 0.077 | 51 |
| Ref. 65[b] | Host 2-2 | 3.72 | 2.34 | 0.135 | 0.078 | 51 |
| Ref. 66[c] | Host 2-2 | 3.76 | 2.18 | 0.135 | 0.077 | 63 |
| Ref. 67[a] | Host 2 | 3.80 | 2.16 | 0.135 | 0.076 | 70 |
| Ref. 68[b] | Host 2 | 3.73 | 2.35 | 0.134 | 0.077 | 74 |
| Ref. 69[c] | Host 2 | 3.77 | 2.17 | 0.135 | 0.076 | 86 |
| Ref. 70[a] | Host 2-3 | 3.76 | 2.18 | 0.134 | 0.077 | 49 |
| Ref. 71[b] | Host 2-3 | 3.73 | 2.30 | 0.135 | 0.078 | 49 |
| Ref. 72[c] | Host 2-3 | 3.75 | 2.19 | 0.135 | 0.077 | 63 |
| Ref. 73[a] | Host 2-4 | 3.80 | 2.17 | 0.135 | 0.076 | 67 |
| Ref. 74[b] | Host 2-4 | 3.74 | 2.35 | 0.134 | 0.077 | 69 |
| Ref. 75[c] | Host 2-4 | 3.78 | 2.19 | 0.135 | 0.076 | 83 |
| Ex. 13[d] | Host 2 | 3.78 | 4.48 | 0.135 | 0.077 | 161 |
| Ex. 14[e] | Host 2 | 3.74 | 4.56 | 0.135 | 0.077 | 211 |
| Ex. 15[f] | Host 2 | 3.76 | 4.46 | 0.135 | 0.077 | 259 |

In all Examples and Comparative Examples, Dopant 21-1 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 5, the OLEDs fabricated in Comparative Examples 67-69 using the Host 2, the anthracene core of which is deuterated, in the EML showed significantly increased luminous lifespan, compared to the OLEDs in Comparative Examples 61-63 using the Host 2-1, which is not deuterated, in the EML or the OLEDs in Comparative Examples 64-66 and 70-72 using the Host 2-2 or Host 2-3, the substituent of anthracene is deuterated, in the EML. In addition, compared to the OLEDs fabricated in Comparative Examples 73-75 using the Host 2-4, both the anthracene core and the substituent are deuterated, in the EML, the OLEDs fabricated in Comparative Examples 67-69 using the Host 2 in the EML showed equivalent or a little bit improved current efficiency and luminous lifespan. Such results indicate that sufficient luminous efficiency and increased lifespan can be implemented with less expensive deuterium.

In addition, compared to the OLEDs fabricated in Comparative Examples 67-69 using NPB in the EBL, the OLEDs fabricated in Examples 13-15 using E5 of Formula 6 in the EBL enhanced their current efficiency and luminous lifespan up to 107.4% and 201.2%, respectively. Particularly, when the OLED includes H1 of Formula 8 or H31 of Formula 10 in the HBL, its current efficiency and luminous lifespan were significantly enhanced.

Example 16 (Ex.16): Fabrication of OLED

An OLED was fabricated using the same procedure and the same material as in Example 13, except that Dopant 21-2 was used as the dopant in the EML.

Examples 17-18 (Ex. 17-18): Fabrication of OLEDs

An OLED was fabricated using the same procedure and the same material as in Example 16, except that H1 in Formula 8 (Example 17) or H31 in Formula 10 (Example 18) was used as the material in the HBL.

Comparative Examples 76-78 (Ref. 76-78): Fabrication of OLEDs

An OLED was fabricated using the same procedure and the same material as in each of Examples 16-18, except that Host 2-1 in Formula 14 as the host in the EML and NPB as the material in the EBL, respectively, were used.

Comparative Examples 79-81 (Ref. 79-81): Fabrication of OLEDs

An OLED was fabricated using the same procedure and the same material as in each of Examples 16-18, except that Host 2-2 in Formula 14 as the host in the EML and NPB as the material in the EBL, respectively, were used.

Comparative Examples 82-84 (Ref. 82-84): Fabrication of OLEDs

An OLED was fabricated using the same procedure and the same material as in each of Examples 16-18, except that NPB as the material in the EBL, respectively, was used.

Comparative Examples 85-87 (Ref. 85-87): Fabrication of OLEDs

An OLED was fabricated using the same procedure and the same material as in each of Examples 16-18, except that Host 2-3 in Formula 14 as the host in the EML and NPB as the material in the EBL, respectively, were used.

Comparative Examples 88-90 (Ref. 88-90): Fabrication of OLEDs

An OLED was fabricated using the same procedure and the same material as in each of Examples 16-18, except that Host 2-4 in Formula 14 as the host in the EML and NPB as the material in the EBL, respectively, were used Experimental Example 6: Measurement of Luminous Properties of OLEDs Luminous properties for each of the OLEDs fabricated in Examples 16-18 and Comparative Examples 76-90 were measured using the same procedure as in Experimental Example 1. The measurement results are indicated in the following Table 6.

TABLE 6

Luminous Properties of OLEDs

| Sample | Host | V | cd/A | (CIE x, y) | | ($T_{95}$, hr) |
|---|---|---|---|---|---|---|
| Ref. 76[a] | Host 2-1 | 3.79 | 2.21 | 0.136 | 0.077 | 43 |
| Ref. 77[b] | Host 2-1 | 3.73 | 2.24 | 0.135 | 0.076 | 45 |
| Ref. 78[c] | Host 2-1 | 3.78 | 2.17 | 0.135 | 0.077 | 60 |
| Ref. 79[a] | Host 2-2 | 3.76 | 2.18 | 0.134 | 0.077 | 45 |
| Ref. 80[b] | Host 2-2 | 3.72 | 2.30 | 0.135 | 0.078 | 49 |
| Ref. 81[c] | Host 2-2 | 3.77 | 2.16 | 0.135 | 0.077 | 53 |
| Ref. 82[a] | Host 2 | 3.79 | 2.18 | 0.135 | 0.076 | 62 |

TABLE 6-continued

Luminous Properties of OLEDs

| Sample | Host | V | cd/A | (CIE x, y) | | (T$_{95}$, hr) |
|---|---|---|---|---|---|---|
| Ref. 83[b] | Host 2 | 3.73 | 2.28 | 0.134 | 0.077 | 63 |
| Ref. 84[c] | Host 2 | 3.79 | 2.19 | 0.135 | 0.076 | 74 |
| Ref. 85[a] | Host 2-3 | 3.78 | 2.18 | 0.136 | 0.077 | 42 |
| Ref. 86[b] | Host 2-3 | 3.75 | 2.36 | 0.135 | 0.076 | 44 |
| Ref. 87[c] | Host 2-3 | 3.76 | 2.17 | 0.135 | 0.077 | 51 |
| Ref. 88[a] | Host 2-4 | 3.79 | 2.20 | 0.136 | 0.077 | 68 |
| Ref. 89[b] | Host 2-4 | 3.74 | 2.34 | 0.135 | 0.076 | 68 |
| Ref. 90[c] | Host 2-4 | 3.76 | 2.22 | 0.135 | 0.077 | 77 |
| Ex. 16[d] | Host 2 | 3.78 | 4.44 | 0.135 | 0.077 | 155 |
| Ex. 17[e] | Host 2 | 3.72 | 4.53 | 0.135 | 0.077 | 213 |
| Ex. 18[f] | Host 2 | 3.77 | 4.44 | 0.135 | 0.077 | 259 |

In all Examples and Comparative Examples, Dopant 21-2 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 6, the OLEDs fabricated in Comparative Examples 82-84 using the Host 2, the anthracene core of which is deuterated, in the EML showed significantly increased luminous lifespan, compared to the OLEDs in Comparative Examples 76-78 using the Host 2-1, which is not deuterated, in the EML or the OLEDs in Comparative Examples 79-81 and 85-87 using the Host 2-2 or Host 2-3, the substituent of anthracene is deuterated, in the EML. In addition, compared to the OLEDs fabricated in Comparative Examples 88-90 using the Host 2-4, both the anthracene core and the substituent are deuterated, in the EML, the OLEDs fabricated in Comparative Examples 82-84 using the Host 2 in the EML showed equivalent or a little bit reduced current efficiency and luminous lifespan. Such results indicate that sufficient luminous efficiency and increased lifespan can be implemented with less expensive deuterium.

In addition, compared to the OLEDs fabricated in Comparative Examples 82-84 using NPB in the EBL, the OLEDs fabricated in Examples 16-18 using E5 of Formula 6 in the EBL enhanced their current efficiency and luminous lifespan up to 103.7% and 250%, respectively. Particularly, when the OLED includes H1 of Formula 8 or H31 of Formula 10 in the HBL, its current efficiency and luminous lifespan were significantly enhanced.

Example 19 (Ex.19): Fabrication of OLED

An OLED was fabricated using the same procedure and the same material as in Example 13, except that Dopant 21-3 was used as the dopant in the EML.

Examples 20-21 (Ex. 20-21): Fabrication of OLEDs

An OLED was fabricated using the same procedure and the same material as in Example 19, except that H1 in Formula 8 (Example 20) or H31 in Formula 10 (Example 21) was used as the material in the HBL.

Comparative Examples 91-93 (Ref. 91-93): Fabrication of OLEDs

An OLED was fabricated using the same procedure and the same material as in each of Examples 19-21, except that Host 2-1 in Formula 14 as the host in the EML and NPB as the material in the EBL, respectively, were used.

Comparative Examples 94-96 (Ref. 94-96): Fabrication of OLEDs

An OLED was fabricated using the same procedure and the same material as in each of Examples 19-21, except that Host 2-2 in Formula 14 as the host in the EML and NPB as the material in the EBL, respectively, were used.

Comparative Examples 97-99 (Ref.97-99): Fabrication of OLEDs

An OLED was fabricated using the same procedure and the same material as in each of Examples 19-21, except that NPB as the material in the EBL, respectively, was used.

Comparative Examples 100-102 (Ref. 100-102): Fabrication of OLEDs

An OLED was fabricated using the same procedure and the same material as in each of Examples 19-21, except that Host 2-3 in Formula 14 as the host in the EML and NPB as the material in the EBL, respectively, were used.

Comparative Examples 103-105 (Ref. 103-105): Fabrication of OLEDs

An OLED was fabricated using the same procedure and the same material as in each of Examples 19-21, except that Host 2-4 in Formula 14 as the host in the EML and NPB as the material in the EBL, respectively, were used Experimental Example 7: Measurement of Luminous Properties of OLEDs Luminous properties for each of the OLEDs fabricated in Examples 19-21 and Comparative Examples 91-105 were measured using the same procedure as in Experimental Example 1. The measurement results are indicated in the following Table 7.

TABLE 7

Luminous Properties of OLEDs

| Sample | Host | V | cd/A | (CIE x, y) | | (T$_{95}$, hr) |
|---|---|---|---|---|---|---|
| Ref. 91[a] | Host 2-1 | 3.79 | 2.19 | 0.136 | 0.077 | 48 |
| Ref. 92[b] | Host 2-1 | 3.74 | 2.37 | 0.135 | 0.076 | 48 |
| Ref. 93[c] | Host 2-1 | 3.77 | 2.20 | 0.135 | 0.077 | 60 |
| Ref. 94[a] | Host 2-2 | 3.76 | 2.15 | 0.134 | 0.077 | 45 |
| Ref. 95[b] | Host 2-2 | 3.74 | 2.34 | 0.135 | 0.078 | 47 |
| Ref. 96[c] | Host 2-2 | 3.77 | 2.19 | 0.135 | 0.077 | 53 |
| Ref. 97[a] | Host 2 | 3.78 | 2.14 | 0.135 | 0.076 | 62 |
| Ref. 98[b] | Host 2 | 3.70 | 2.29 | 0.135 | 0.076 | 65 |
| Ref. 99[c] | Host 2 | 3.76 | 2.15 | 0.134 | 0.077 | 79 |
| Ref. 100[a] | Host 2-3 | 3.78 | 2.17 | 0.135 | 0.077 | 50 |
| Ref. 101[b] | Host 2-3 | 3.72 | 2.30 | 0.136 | 0.077 | 53 |
| Ref. 102[c] | Host 2-3 | 3.77 | 2.19 | 0.135 | 0.076 | 62 |
| Ref. 103[a] | Host 2-4 | 3.78 | 2.18 | 0.135 | 0.077 | 68 |
| Ref. 104[b] | Host 2-4 | 3.74 | 2.35 | 0.134 | 0.077 | 73 |
| Ref. 105[c] | Host 2-4 | 3.77 | 2.19 | 0.135 | 0.078 | 90 |
| Ex. 19[d] | Host 2 | 3.75 | 4.41 | 0.135 | 0.076 | 135 |
| Ex. 20[e] | Host 2 | 3.69 | 4.52 | 0.135 | 0.077 | 213 |
| Ex. 21[f] | Host 2 | 3.74 | 4.43 | 0.135 | 0.077 | 260 |

In all Examples and Comparative Examples, Dopant 21-3 was used as the dopant in the EML;
[a]EBL (NPB), HBL (2-phenyl-9,10-bis(2,2'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 7, the OLEDs fabricated in Comparative Examples 97-99 using the Host 2, the anthracene core of which is deuterated, in the EML showed significantly increased luminous lifespan, compared to the OLEDs in Comparative Examples 91-93 using the Host 2-1, which is not deuterated, in the EML or the OLEDs in Comparative Examples 94-96 and 100-102 using the Host 2-2 or Host 2-3, the substituent of anthracene is deuterated, in the EML. In addition, compared to the OLEDs fabricated in Comparative Examples 103-105 using the Host 2-4, both the anthracene core and the substituent are deuterated, in the EML, the OLEDs fabricated in Comparative Examples 97-99 using the Host 2 in the EML showed equivalent current efficiency and a little bit reduced luminous lifespan. Such results indicate that sufficient luminous efficiency and increased lifespan can be implemented with less expensive deuterium.

In addition, compared to the OLEDs fabricated in Comparative Examples 97-99 using NPB in the EBL, the OLEDs fabricated in Examples 19-21 using E5 of Formula 6 in the EBL enhanced their current efficiency and luminous lifespan up to 106.1% and 229.1%, respectively. Particularly, when the OLED includes H1 of Formula 8 or H31 of Formula 10 in the HBL, its current efficiency and luminous lifespan were significantly enhanced.

Example 22 (Ex.22): Fabrication of OLED

An OLED was fabricated using the same procedure and the same material as in Example 13, except that Dopant 21-4 was used as the dopant in the EML.

Examples 23-24 (Ex. 23-24): Fabrication of OLEDs

An OLED was fabricated using the same procedure and the same material as in Example 22, except that H1 in Formula 8 (Example 23) or H31 in Formula 10 (Example 24) was used as the material in the HBL.

Comparative Examples 106-108 (Ref. 106-108): Fabrication of OLEDs

An OLED was fabricated using the same procedure and the same material as in each of Examples 22-24, except that Host 2-1 in Formula 14 as the host in the EML and NPB as the material in the EBL, respectively, were used.

Comparative Examples 109-111 (Ref. 109-111): Fabrication of OLEDs

An OLED was fabricated using the same procedure and the same material as in each of Examples 22-24, except that Host 2-2 in Formula 14 as the host in the EML and NPB as the material in the EBL, respectively, were used.

Comparative Examples 112-114 (Ref. 112-114): Fabrication of OLEDs

An OLED was fabricated using the same procedure and the same material as in each of Examples 22-24, except that NPB as the material in the EBL, respectively, was used.

Comparative Examples 115-117 (Ref. 115-117): Fabrication of OLEDs

An OLED was fabricated using the same procedure and the same material as in each of Examples 22-24, except that Host 2-3 in Formula 14 as the host in the EML and NPB as the material in the EBL, respectively, were used.

Comparative Examples 118-120 (Ref. 118-120): Fabrication of OLEDs

An OLED was fabricated using the same procedure and the same material as in each of Examples 22-42, except that Host 2-4 in Formula 14 as the host in the EML and NPB as the material in the EBL, respectively, were used Experimental Example 8: Measurement of Luminous Properties of OLEDs Luminous properties for each of the OLEDs fabricated in Examples 22-24 and Comparative Examples 106-120 were measured using the same procedure as in Experimental Example 1. The measurement results are indicated in the following Table 8.

TABLE 8

Luminous Properties of OLEDs

| Sample | Host | V | cd/A | (CIE x, y) | | ($T_{95}$, hr) |
|---|---|---|---|---|---|---|
| Ref. 106[a] | Host 2-1 | 3.78 | 2.17 | 0.134 | 0.077 | 70 |
| Ref. 107[b] | Host 2-1 | 3.74 | 2.32 | 0.134 | 0.077 | 74 |
| Ref. 108[c] | Host 2-1 | 3.77 | 2.19 | 0.135 | 0.078 | 93 |
| Ref. 109[a] | Host 2-2 | 3.79 | 2.15 | 0.134 | 0.077 | 73 |
| Ref. 110[b] | Host 2-2 | 3.74 | 2.34 | 0.135 | 0.076 | 73 |
| Ref. 111[c] | Host 2-2 | 3.78 | 2.18 | 0.135 | 0.077 | 86 |
| Ref. 112[a] | Host 2 | 3.79 | 2.17 | 0.135 | 0.076 | 97 |
| Ref. 113[b] | Host 2 | 3.74 | 2.32 | 0.135 | 0.077 | 101 |
| Ref. 114[c] | Host 2 | 3.78 | 2.19 | 0.136 | 0.077 | 124 |
| Ref. 115[a] | Host 2-3 | 3.77 | 2.17 | 0.135 | 0.076 | 73 |
| Ref. 116[b] | Host 2-3 | 3.73 | 2.31 | 0.135 | 0.077 | 74 |
| Ref. 117[c] | Host 2-3 | 3.76 | 2.18 | 0.136 | 0.077 | 94 |
| Ref. 118[a] | Host 2-4 | 3.77 | 2.14 | 0.135 | 0.078 | 112 |
| Ref. 119[b] | Host 2-4 | 3.72 | 2.30 | 0.135 | 0.077 | 116 |
| Ref. 120[c] | Host 2-4 | 3.75 | 2.17 | 0.135 | 0.077 | 136 |
| Ex. 22[d] | Host 2 | 3.77 | 4.43 | 0.135 | 0.076 | 231 |
| Ex. 23[e] | Host 2 | 3.72 | 4.56 | 0.135 | 0.077 | 352 |
| Ex. 24[f] | Host 2 | 3.76 | 4.44 | 0.136 | 0.077 | 395 |

In all Examples and Comparative Examples, Dopant 21-4 was used as the dopant in the EML;
[a]EBL (NPB), HBL (2-phenyl-9,10-bis(2,'-bipyridin-5-yl)anthracene);
[b]EBL (NPB), HBL (H1);
[c]EBL (NPB), HBL (H31);
[d]EBL (E5), HBL (2-phenyl-9,10-bis(2,2'-bipyridin-5-yl)anthracene);
[e]EBL (E5), HBL (H1);
[f]EBL (E5), HBL (H31)

As indicated in Table 8, the OLEDs fabricated in Comparative Examples 112-114 using the Host 2, the anthracene core of which is deuterated, in the EML showed significantly increased luminous lifespan, compared to the OLEDs in Comparative Examples 106-108 using the Host 2-1, which is not deuterated, in the EML or the OLEDs in Comparative Examples 109-111 and 115-117 using the Host 2-2 or Host 2-3, the substituent of anthracene is deuterated, in the EML. In addition, compared to the OLEDs fabricated in Comparative Examples 118-120 using the Host 2-4, both the anthracene core and the substituent are deuterated, in the EML, the OLEDs fabricated in Comparative Examples 112-114 using the Host 2 in the EML showed equivalent or a little bit reduced current efficiency and luminous lifespan. Such results indicate that sufficient luminous efficiency and increased lifespan can be implemented with less expensive deuterium.

In addition, compared to the OLEDs fabricated in Comparative Examples 112-114 using NPB in the EBL, the OLEDs fabricated in Examples 22-24 using E5 of Formula 6 in the EBL enhanced their current efficiency and luminous lifespan up to 104.1% and 248.5%, respectively. Particularly, when the OLED includes H1 of Formula 8 or H31 of Formula 10 in the HBL, its current efficiency and luminous lifespan were significantly enhanced.

Example 25 (Ex. 25): Fabrication of OLED

An OLED was fabricated using the same procedure and the same material as in Example 1, except that Host 2 was used as the host in the EML and E9 in Formula 6 as the material in the EBL.

Examples 26-27 (Ex. 26-27): Fabrication of OLEDs

An OLED was fabricated using the same procedure and the same material as in Example 25, except that Hi in Formula 8 (Example 26) or H31 in Formula 10 (Example 27) was used as the material in the HBL.

Example 28 (Ex. 28): Fabrication of OLED

An OLED was fabricated using the same procedure and the same material as in Example 25, except that Dopant 21-2 was used as the dopant in the EML.

Examples 29-30 (Ex. 29-30): Fabrication of OLEDs

An OLED was fabricated using the same procedure and the same material as in Example 28, except that 111 in Formula 8 (Example 29) or H31 in Formula 10 (Example 30) was used as the material in the HBL.

Example 31 (Ex. 31): Fabrication of OLED

An OLED was fabricated using the same procedure and the same material as in Example 25, except that Dopant 21-3 was used as the dopant in the EML.

Examples 32-33 (Ex. 32-33): Fabrication of OLEDs

An OLED was fabricated using the same procedure and the same material as in Example 31, except that HI in Formula 8 (Example 32) or H31 in Formula 10 (Example 33) was used as the material in the HBL.

Example 34 (Ex. 34): Fabrication of OLED

An OLED was fabricated using the same procedure and the same material as in Example 25, except that Dopant 21-4 was used as the dopant in the EML.

Examples 35-36 (Ex. 35-36): Fabrication of OLEDs

An OLED was fabricated using the same procedure and the same material as in Example 34, except that H1 in Formula 8 (Example 35) or H31 in Formula 10 (Example 36) was used as the material in the HBL.

Experimental Example 9: Measurement of Luminous Properties of OLEDs

Luminous properties for each of the OLEDs fabricated in Examples 25-36 and Comparative Examples 68-69, 83-84, 98-99 and 113-114 were measured using the same procedure as in Experimental Example 1. The measurement results are indicated in the following Table 9.

TABLE 9

Luminous Properties of OLEDs

| Sample | Dopant | V | cd/A | (CIE x, y) | ($T_{95}$, hr) | |
|---|---|---|---|---|---|---|
| Ref. 68[a] | 21-1 | 3.73 | 2.35 | 0.134 | 0.077 | 74 |
| Ref. 69[b] | 21-1 | 3.77 | 2.17 | 0.135 | 0.076 | 86 |
| Ex. 25[c] | 21-1 | 3.73 | 4.71 | 0.135 | 0.077 | 148 |
| Ex. 26[d] | 21-1 | 3.69 | 5.02 | 0.135 | 0.077 | 205 |
| Ex. 27[e] | 21-1 | 3.66 | 4.82 | 0.135 | 0.077 | 246 |
| Ref. 83[a] | 21-2 | 3.73 | 2.28 | 0.134 | 0.077 | 63 |
| Ref. 84[b] | 21-2 | 3.79 | 2.19 | 0.135 | 0.076 | 74 |
| Ex. 28[c] | 21-2 | 3.73 | 4.66 | 0.135 | 0.077 | 142 |
| Ex. 29[d] | 21-2 | 3.67 | 4.98 | 0.135 | 0.077 | 207 |
| Ex. 30[e] | 21-2 | 3.67 | 4.79 | 0.135 | 0.077 | 246 |
| Ref. 98[a] | 21-3 | 3.70 | 2.29 | 0.135 | 0.076 | 65 |
| Ref. 99[b] | 21-3 | 3.76 | 2.15 | 0.134 | 0.077 | 79 |
| Ex. 31[c] | 21-3 | 3.70 | 4.63 | 0.135 | 0.076 | 124 |
| Ex. 32[d] | 21-3 | 3.64 | 4.97 | 0.135 | 0.077 | 207 |
| Ex. 33[e] | 21-3 | 3.64 | 4.78 | 0.135 | 0.077 | 247 |
| Ref. 113[a] | 21-4 | 3.74 | 2.32 | 0.135 | 0.077 | 101 |
| Ref. 114[b] | 21-4 | 3.78 | 2.19 | 0.136 | 0.077 | 124 |
| Ex. 34[c] | 21-4 | 3.72 | 4.65 | 0.135 | 0.076 | 212 |
| Ex. 35[d] | 21-4 | 3.67 | 5.02 | 0.135 | 0.0771 | 342 |
| Ex. 36[e] | 21-4 | 3.66 | 4.79 | 0.136 | 0.077 | 375 |

In all Examples and Comparative Examples, Host 2 was used as the host in the EML;
[a]EBL (NPB), HBL (H1);
[b]EBL (NPB), HBL (H31);
[c]EBL (E9), HBL (2-phenyl-9,10-bis(2,2'-bipyridin-5-yl)anthracene);
[d]EBL (E9), HBL (H1);
[e]EBL (E9), HBL (H31)

As indicated in Table 9, compared to the OLEDs fabricated in Comparative Examples 68-69, 83-84, 98-99 and 113-114 using NPB in the EBL, the OLEDs fabricated in Examples 25-36 using E9 of Formula 6 in the EBL enhanced their current efficiency and luminous lifespan up to 122.3% and 238.6%, respectively. Particularly, when the OLED includes Hi of Formula 8 or H31 of Formula 10 in the HBL, its current efficiency and luminous lifespan were significantly enhanced.

Example 37 (Ex. 37): Fabrication of OLED

An OLED was fabricated using the same procedure and the same material as in Example 1, except that Host 2 was used as the host in the EML and Dopant 11-1 was used as the dopant in the EML.

Examples 38-39 (Ex. 38-39): Fabrication of OLEDs

An OLED was fabricated using the same procedure and the same material as in Example 37, except that H1 in Formula 8 (Example 38) or H31 in Formula 10 (Example 39) was used as the material in the HBL.

Comparative Examples 121-122 (Ref. 121-122): Fabrication of OLEDs

An OLED was fabricated using the same procedure and the same material as in each of Examples 38-39, except that NPB as the material in the EBL, respectively, was used.
Example 40 (Ex. 40): Fabrication of OLED
An OLED was fabricated using the same procedure and the same material as in Example 37, except that Dopant 11-2 was used as the dopant in the EML.

Examples 41-42 (Ex. 41-42): Fabrication of OLEDs

An OLED was fabricated using the same procedure and the same material as in Example 40, except that H11 in Formula 8 (Example 41) or H31 in Formula 10 (Example 42) was used as the material in the HBL.

Comparative Examples 123-124 (Ref. 123-124): Fabrication of OLEDs

An OLED was fabricated using the same procedure and the same material as in each of Examples 41-42, except that NPB as the material in the EBL, respectively, was used.

Example 43 (Ex. 43): Fabrication of OLED

An OLED was fabricated using the same procedure and the same material as in Example 37, except that Dopant 11-3 was used as the dopant in the EML.

Examples 44-45 (Ex. 44-45): Fabrication of OLEDs

An OLED was fabricated using the same procedure and the same material as in Example 43, except that H1 in Formula 8 (Example 44) or H31 in Formula 10 (Example 45) was used as the material in the HBL.

Comparative Examples 125-126 (Ref. 125-126): Fabrication of OLEDs

An OLED was fabricated using the same procedure and the same material as in each of Examples 44-45, except that NPB as the material in the EBL, respectively, was used.

Example 46 (Ex. 46): Fabrication of OLED

An OLED was fabricated using the same procedure and the same material as in Example 37, except that Dopant 11-4 was used as the dopant in the EML.

Examples 47-48 (Ex. 47-48): Fabrication of OLEDs

An OLED was fabricated using the same procedure and the same material as in Example 46, except that H1 in Formula 8 (Example 47) or 1131 in Formula 10 (Example 48) was used as the material in the HBL.

Comparative Examples 127-128 (Ref. 127-128): Fabrication of OLEDs

An OLED was fabricated using the same procedure and the same material as in each of Examples 47-48, except that NPB as the material in the EBL, respectively, was used.

Experimental Example 10: Measurement of Luminous Properties of OLEDs

Luminous properties for each of the OLEDs fabricated in Examples 37-48 and Comparative Examples 121-128 were measured using the same procedure as in Experimental Example 1. The measurement results are indicated in the following Table 10.

TABLE 10

Luminous Properties of OLEDs

| Sample | Dopant | V | cd/A | (CIE x, y) | ($T_{95}$, hr) | |
|---|---|---|---|---|---|---|
| Ref. 121[a] | 11-1 | 3.73 | 2.11 | 0.134 | 0.077 | 59 |
| Ref. 122[b] | 11-1 | 3.77 | 1.95 | 0.135 | 0.076 | 69 |
| Ex. 37[c] | 11-1 | 3.78 | 4.03 | 0.135 | 0.077 | 128 |
| Ex. 38[d] | 11-1 | 3.74 | 4.10 | 0.135 | 0.077 | 169 |
| Ex. 39[e] | 11-1 | 3.76 | 4.01 | 0.135 | 0.077 | 208 |
| Ref. 123[a] | 11-2 | 3.73 | 2.05 | 0.134 | 0.077 | 51 |
| Ref. 124[b] | 11-2 | 3.79 | 1.97 | 0.135 | 0.076 | 59 |
| Ex. 40[c] | 11-2 | 3.78 | 3.99 | 0.135 | 0.077 | 124 |
| Ex. 41[d] | 11-2 | 3.72 | 4.07 | 0.135 | 0.077 | 170 |
| Ex. 42[e] | 11-2 | 3.77 | 3.99 | 0.135 | 0.077 | 207 |
| Ref. 125[a] | 11-3 | 3.70 | 2.06 | 0.135 | 0.076 | 52 |
| Ref. 126[b] | 11-3 | 3.76 | 1.93 | 0.134 | 0.077 | 63 |
| Ex. 43[c] | 11-3 | 3.75 | 3.96 | 0.135 | 0.076 | 108 |
| Ex. 44[d] | 11-3 | 3.69 | 4.06 | 0.135 | 0.077 | 170 |
| Ex. 45[e] | 11-3 | 3.74 | 3.98 | 0.135 | 0.077 | 208 |
| Ref. 127[a] | 11-4 | 3.74 | 2.09 | 0.135 | 0.077 | 81 |
| Ref. 128[b] | 11-4 | 3.78 | 1.97 | 0.136 | 0.077 | 99 |
| Ex. 46[c] | 11-4 | 3.77 | 3.98 | 0.135 | 0.076 | 185 |
| Ex. 47[d] | 11-4 | 3.72 | 4.10 | 0.135 | 0.0771 | 282 |
| Ex. 48[e] | 11-4 | 3.76 | 3.99 | 0.136 | 0.077 | 316 |

In all Examples and Comparative Examples, Host 2 was used as the host in the EML;
[a]EBL (NPB), HBL (H1)
[b]EBL (NPB), HBL (H31);
[c]EBL (E5), HBL (2-phenyl-9,10-bis(2,2'-bipyridin-5-yl)anthracene);
[d]EBL (E5), HBL (H1);
[e]EBL (E5), HBL (H31)

As indicated in Table 10, compared to the OLEDs fabricated in Comparative Examples 121-128 using NPB in the EBL, the OLEDs fabricated in Examples 37-48 using E5 of Formula 6 in the EBL enhanced their current efficiency and luminous lifespan up to 105.6% and 250.8%, respectively. Particularly, when the OLED includes H1 of Formula 8 or H31 of Formula 10 in the HBL, its current efficiency and luminous lifespan were significantly enhanced.

Example 49 (Ex. 49): Fabrication of OLED

An OLED was fabricated using the same procedure and the same material as in Example 1, except that Host 2 was used as the host in the EML, Dopant 11-1 was used as the dopant in the EML and E9 was used as the material in the EBL.

Examples 50-51 (Ex. 50-51): Fabrication of OLEDs

An OLED was fabricated using the same procedure and the same material as in Example 49, except that H1 in Formula 8 (Example 50) or H31 in Formula 10 (Example 51) was used as the material in the HBL.

Comparative Examples 129-130 (Ref. 129-130): Fabrication of OLEDs

An OLED was fabricated using the same procedure and the same material as in each of Examples 50-51, except that NPB as the material in the EBL, respectively, was used.

Example 52 (Ex. 52): Fabrication of OLED

An OLED was fabricated using the same procedure and the same material as in Example 49, except that Dopant 11-2 was used as the dopant in the EML.

Examples 53-54 (Ex. 53-54): Fabrication of OLEDs

An OLED was fabricated using the same procedure and the same material as in Example 52, except that H1 in Formula 8 (Example 53) or H31 in Formula 10 (Example 54) was used as the material in the HBL.

Comparative Examples 131-132 (Ref. 131-132): Fabrication of OLEDs

An OLED was fabricated using the same procedure and the same material as in each of Examples 53-54, except that NPB as the material in the EBL, respectively, was used.

Example 55 (Ex. 55): Fabrication of OLED

An OLED was fabricated using the same procedure and the same material as in Example 49, except that Dopant 11-3 was used as the dopant in the EML.

Examples 56-57 (Ex. 56-57): Fabrication of OLEDs

An OLED was fabricated using the same procedure and the same material as in Example 55, except that H1 in Formula 8 (Example 56) or H31 in Formula 10 (Example 57) was used as the material in the HBL.

Comparative Examples 133-134 (Ref. 133-134): Fabrication of OLEDs

An OLED was fabricated using the same procedure and the same material as in each of Examples 56-57, except that NPB as the material in the EBL, respectively, was used.

Example 58 (Ex. 58): Fabrication of OLED

An OLED was fabricated using the same procedure and the same material as in Example 49, except that Dopant 11-4 was used as the dopant in the EML.

Examples 59-60 (Ex. 59-60): Fabrication of OLEDs

An OLED was fabricated using the same procedure and the same material as in Example 58, except that H1 in Formula 8 (Example 59) or H31 in Formula 10 (Example 60) was used as the material in the HBL.

Comparative Examples 135-136 (Ref. 135-136): Fabrication of OLEDs

An OLED was fabricated using the same procedure and the same material as in each of Examples 59-60, except that NPB as the material in the EBL, respectively, was used.

Experimental Example 11: Measurement of Luminous Properties of OLEDs

Luminous properties for each of the OLEDs fabricated in Examples 49-60 and Comparative Examples 129-136 were measured using the same procedure as in Experimental Example 1. The measurement results are indicated in the following Table 11.

TABLE 11

Luminous Properties of OLEDs

| Sample | Dopant | V | cd/A | (CIE x, y) | ($T_{95}$, hr) | |
|---|---|---|---|---|---|---|
| Ref. 129[a] | 11-1 | 3.73 | 2.11 | 0.134 | 0.077 | 59 |
| Ref. 130[b] | 11-1 | 3.77 | 1.95 | 0.135 | 0.076 | 69 |
| Ex. 49[c] | 11-1 | 3.73 | 4.24 | 0.135 | 0.077 | 118 |
| Ex. 50[d] | 11-1 | 3.69 | 4.51 | 0.135 | 0.077 | 164 |
| Ex. 51[e] | 11-1 | 3.66 | 4.34 | 0.135 | 0.077 | 197 |
| Ref. 131[a] | 11-2 | 3.73 | 2.05 | 0.134 | 0.077 | 51 |
| Ref. 132[b] | 11-2 | 3.79 | 1.97 | 0.135 | 0.076 | 59 |
| Ex. 52[c] | 11-2 | 3.73 | 4.19 | 0.135 | 0.077 | 114 |
| Ex. 53[d] | 11-2 | 3.67 | 4.48 | 0.135 | 0.077 | 165 |
| Ex. 54[e] | 11-2 | 3.67 | 4.31 | 0.135 | 0.077 | 197 |
| Ref. 133[a] | 11-3 | 3.70 | 2.06 | 0.135 | 0.076 | 52 |
| Ref. 134[b] | 11-3 | 3.76 | 1.93 | 0.134 | 0.077 | 63 |
| Ex. 55[c] | 11-3 | 3.70 | 4.16 | 0.135 | 0.076 | 99 |
| Ex. 56[d] | 11-3 | 3.64 | 4.47 | 0.135 | 0.077 | 165 |
| Ex. 57[e] | 11-3 | 3.64 | 4.30 | 0.135 | 0.077 | 198 |
| Ref. 135[a] | 11-4 | 3.74 | 2.09 | 0.135 | 0.077 | 81 |
| Ref. 136[b] | 11-4 | 3.78 | 1.97 | 0.136 | 0.077 | 99 |
| Ex. 58[c] | 11-4 | 3.72 | 4.18 | 0.135 | 0.076 | 170 |
| Ex. 59[d] | 11-4 | 3.67 | 4.51 | 0.135 | 0.0771 | 273 |
| Ex. 60[e] | 11-4 | 3.66 | 4.31 | 0.136 | 0.077 | 300 |

In all Examples and Comparative Examples, Host 2 was used as the host in the EML;
[a]EBL (NPB), HBL (H1)
[b]EBL (NPB), HBL (H31);
[c]EBL (E9), HBL (2-phenyl-9,10-bis(2,2'-bipyridin-5-yl)anthracene);
[d]EBL (E9), HBL (H1);
[e]EBL (E9), HBL (H31)

As indicated in Table 11, compared to the OLEDs fabricated in Comparative Examples 129-136 using NPB in the EBL, the OLEDs fabricated in Examples 49-60 using E9 of Formula 6 in the EBL enhanced their current efficiency and luminous lifespan up to 122.8% and 237.0%, respectively. Particularly, when the OLED includes H 1 of Formula 8 or H3 I of Formula 10 in the HBL, its current efficiency and luminous lifespan were significantly enhanced.

It will be apparent to those skilled in the art that various modifications and variations can be made in the present disclosure without departing from the scope of the disclosure. Thus, it is intended that the present disclosure cover the modifications and variations of the present disclosure provided they come within the scope of the appended claims.

What is claimed is:

1. An organic light emitting device comprising:
   a substrate; and
   an organic light emitting diode over the substrate, the organic light emitting diode including a first electrode, a second electrode facing the first electrode and an emissive layer disposed between the first electrode and the second electrode,
   wherein the emissive layer comprises at least one emitting material layer disposed between the first electrode and the second electrode and at least one electron blocking layer disposed between the first electrode and the at least one emitting material layer,
   wherein the at least one emitting material layer includes a first host of an anthracene-based compound and a first dopant of a boron-based compound,
   wherein an anthracene core of the first host is deuterated, and
   wherein the at least one electron blocking layer includes an amine-based compound having the following structure of Formula 5:

[Formula 5]
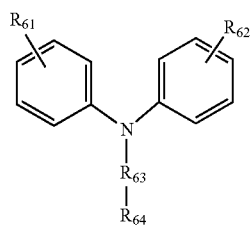
wherein each of $R_{61}$ to $R_{62}$ and $R_{64}$ is independently monocyclic aryl or polycyclic aryl, $R_{63}$ is monocyclic arylene or polycyclic arylene, wherein at least one of $R_{61}$ to $R_{64}$ is polycyclic, and
wherein the first dopant is selected from the following compounds:
Dopant 1-2
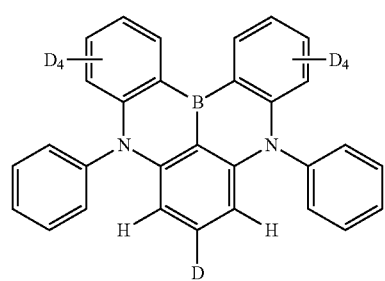
Dopant 1-3
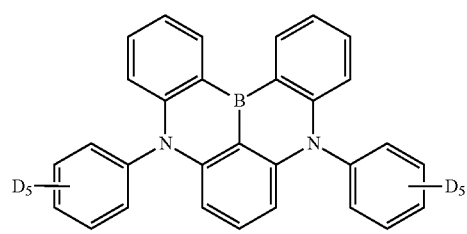
Dopant 1-4
Dopant 2-2
Dopant 2-3
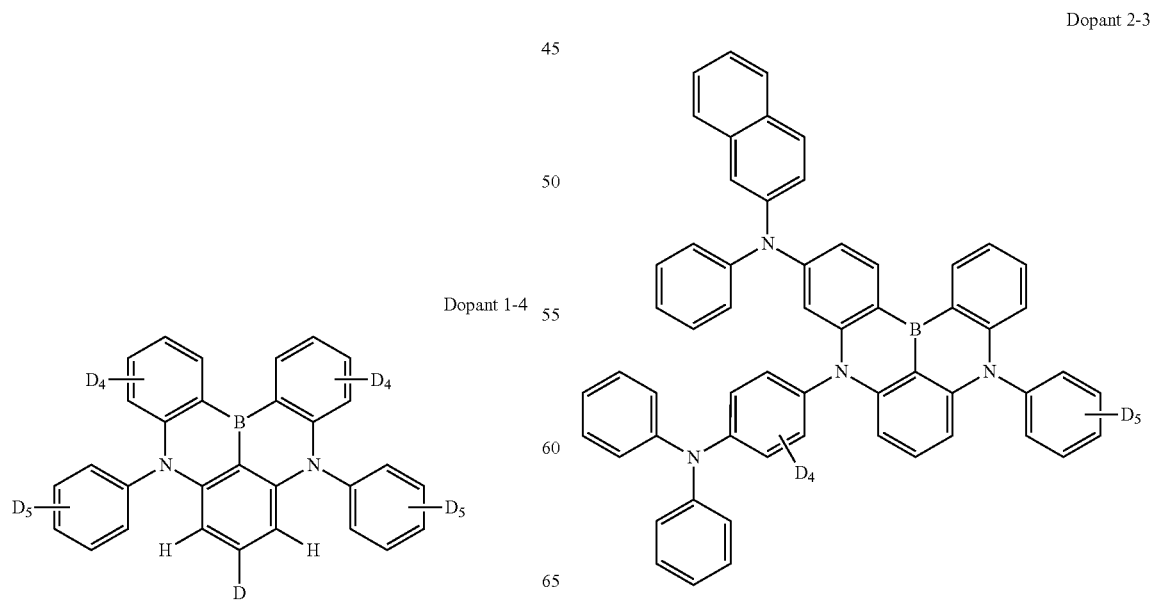
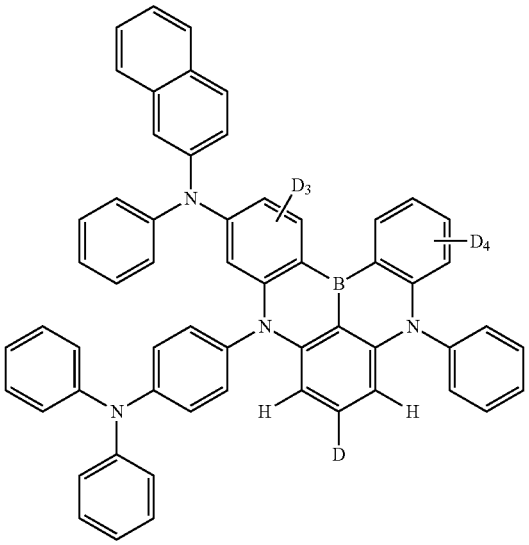

Dopant 2-4
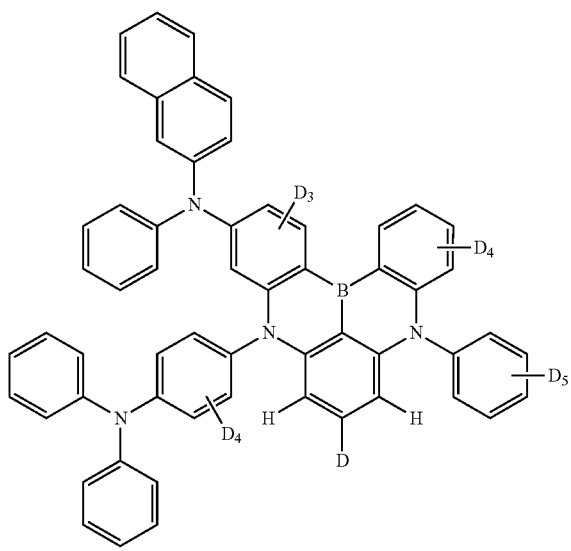
Dopant 3-2
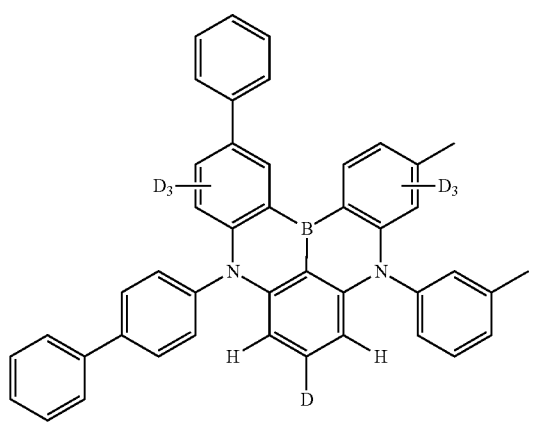
Dopant 3-3
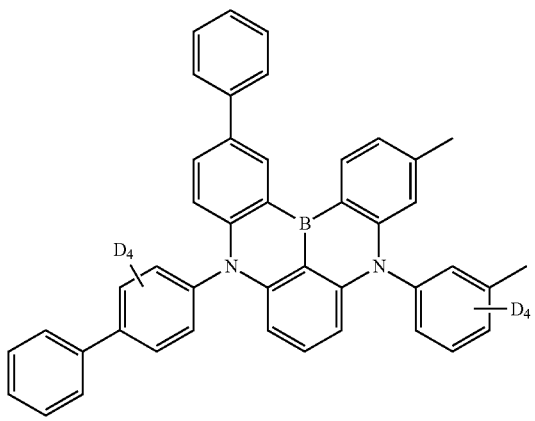
Dopant 3-4
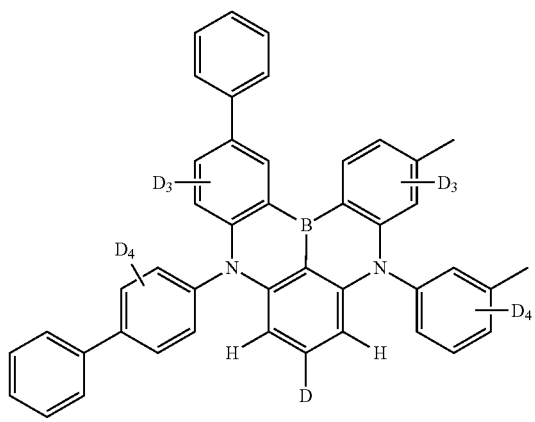
Dopant 4-2
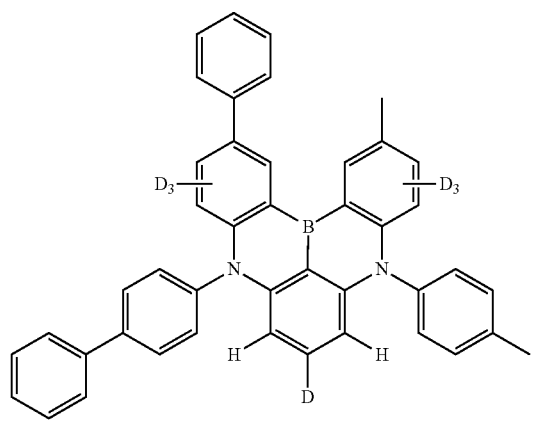
Dopnat 4-3
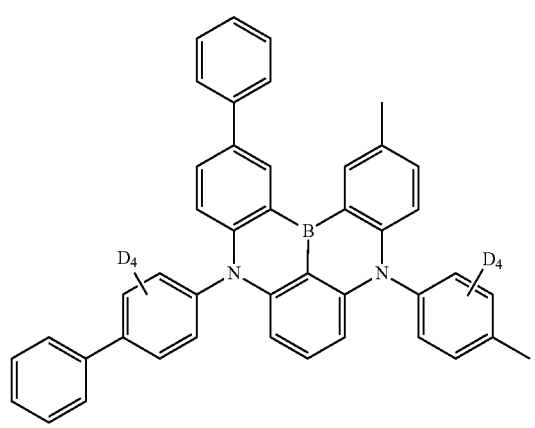

Dopant 4-4
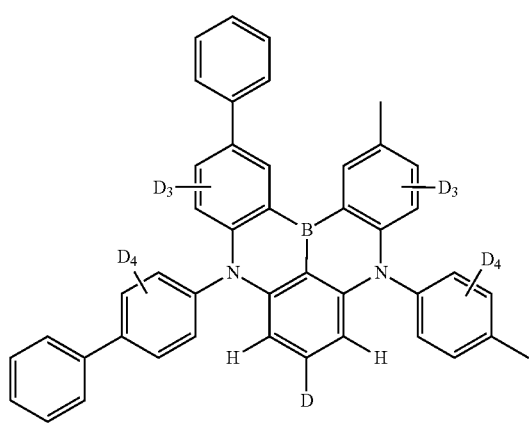
Dopant 5-2
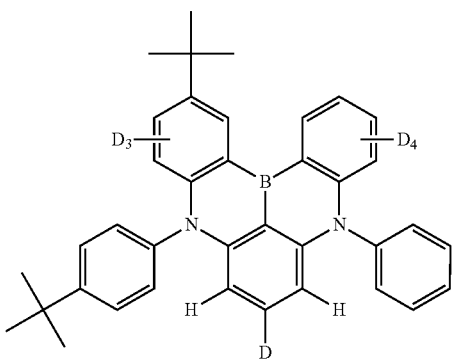
Dopant 5-3
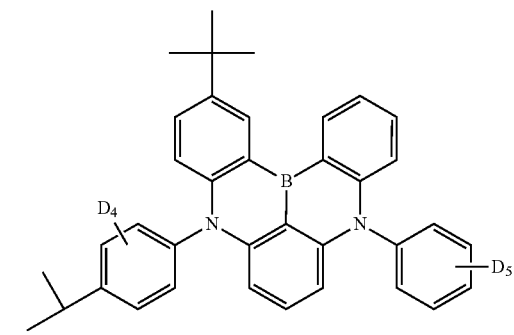
Dopant 5-4
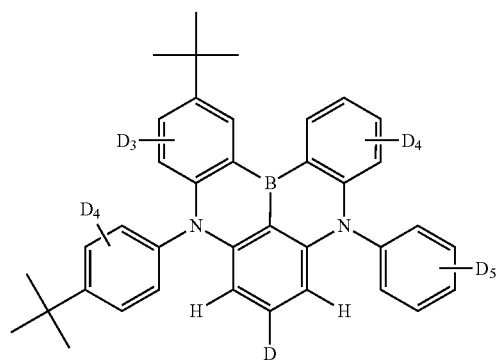
Dopant 6-2
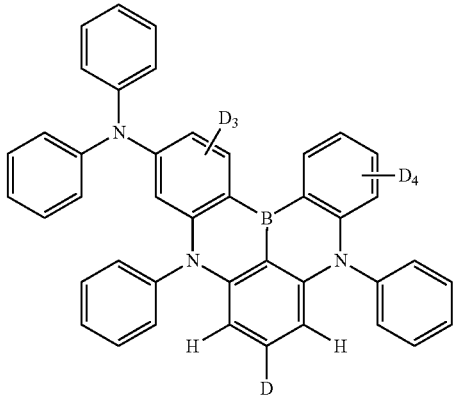
Dopant 6-3
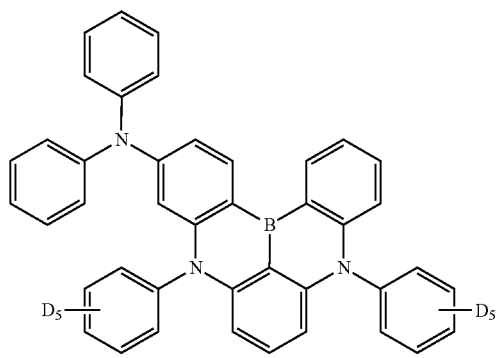
Dopant 6-4
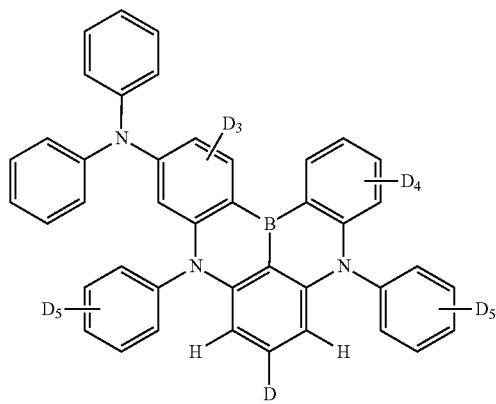
Dopant 7-2
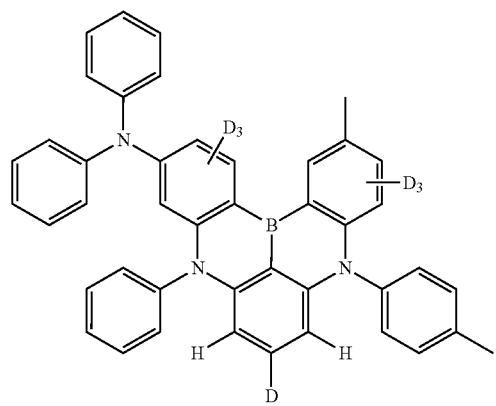

-continued
Dopant 7-3
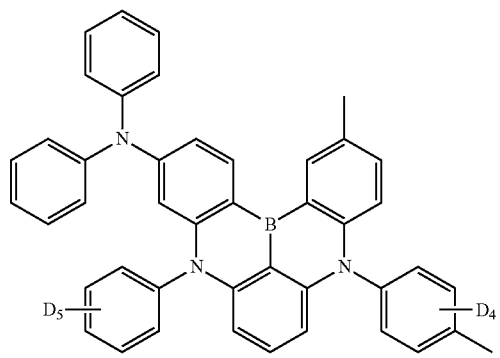
Dopant 7-4
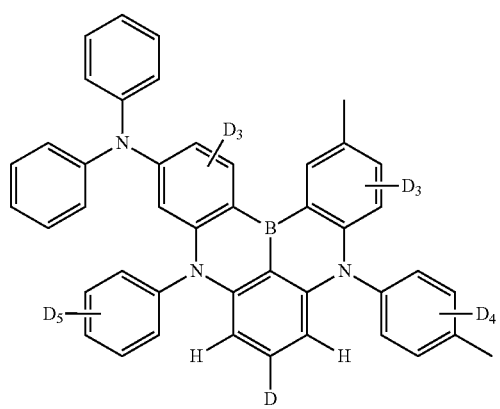
Dopant 8-2
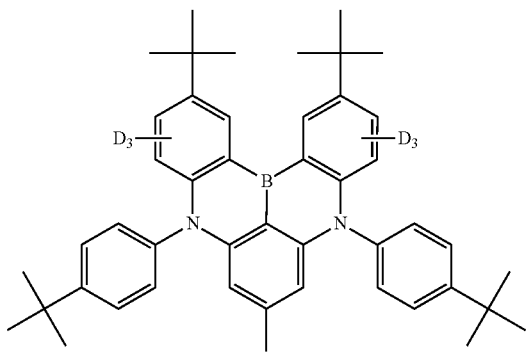
Dopant 8-3
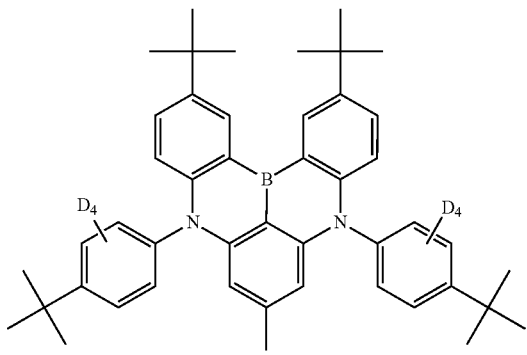
-continued
Dopant 8-4
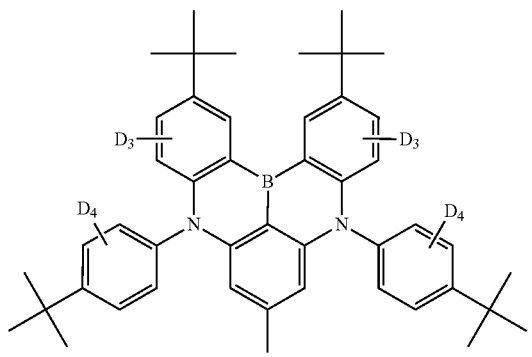
Dopant 9-2
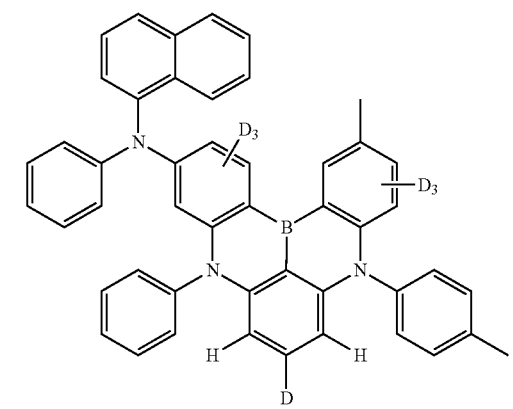
Dopant 9-3
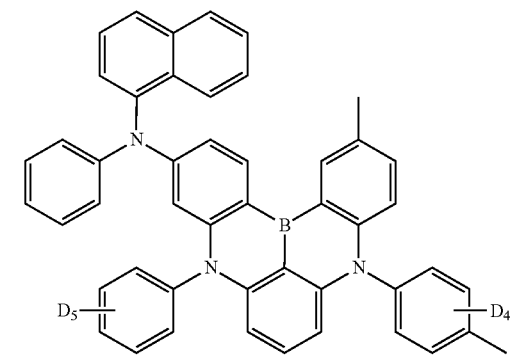
Dopant 9-4
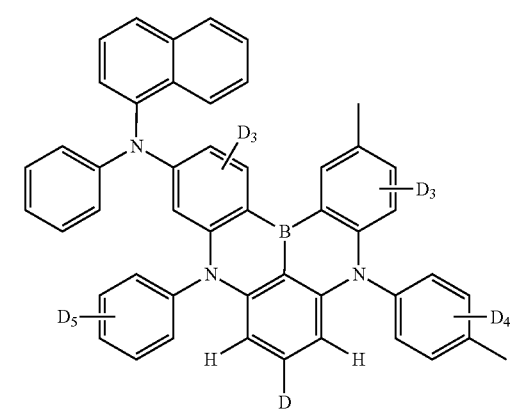

Dopant 10-2
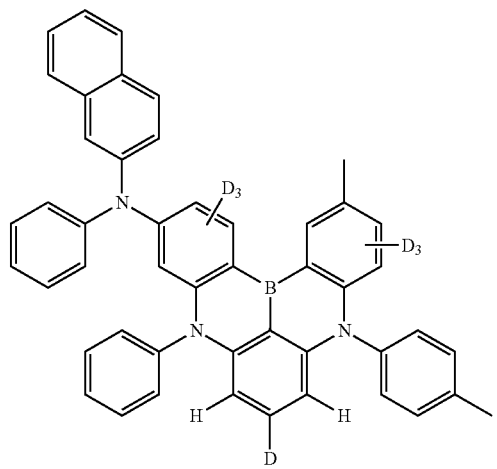
Dopant 10-3
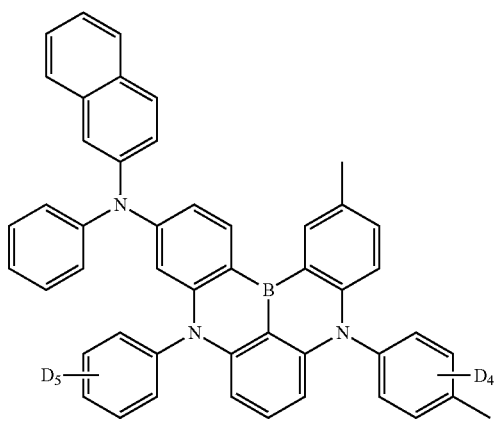
Dopant 10-4
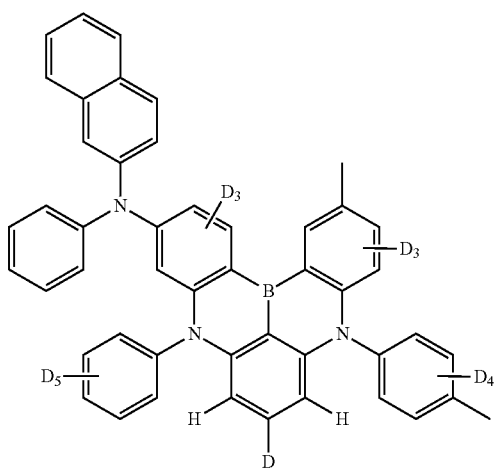
Dopant 11-2
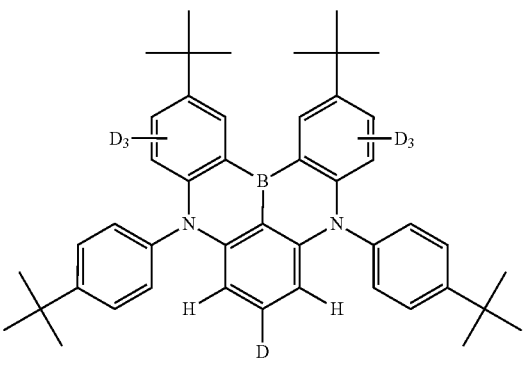
Dopant 11-3
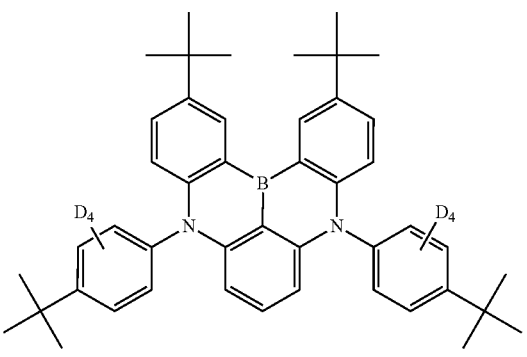
Dopant 11-4
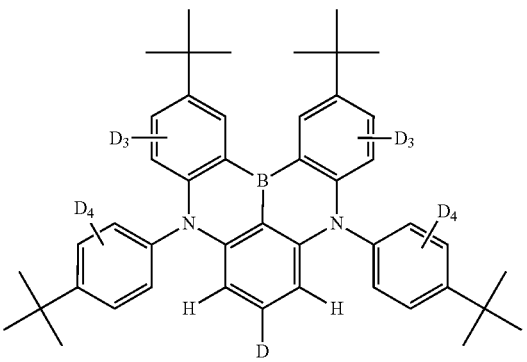
Dopant 12-2
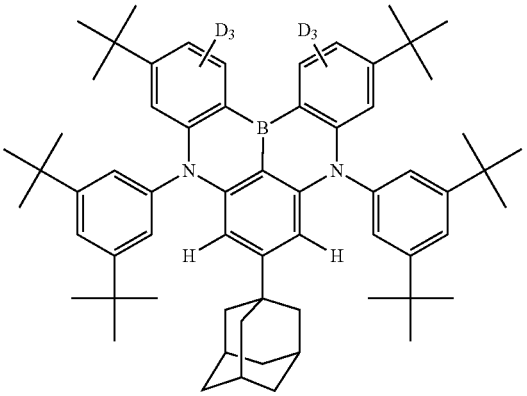

Dopant 12-3
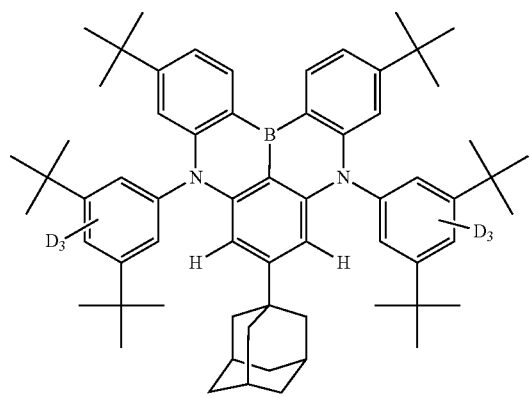
Dopant 12-4
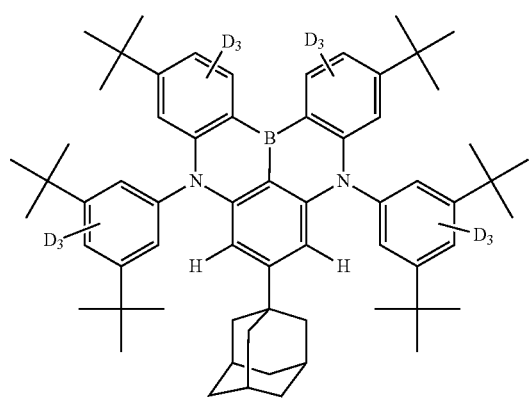
Dopant 13-2
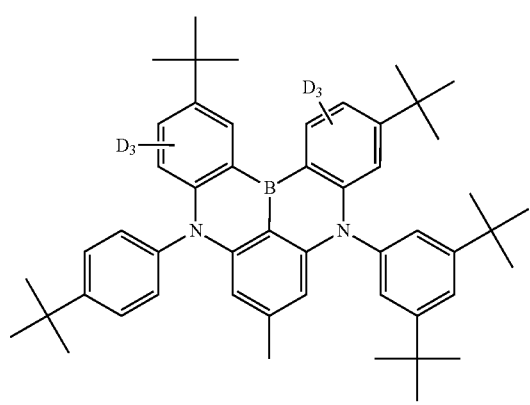
Dopant 13-3
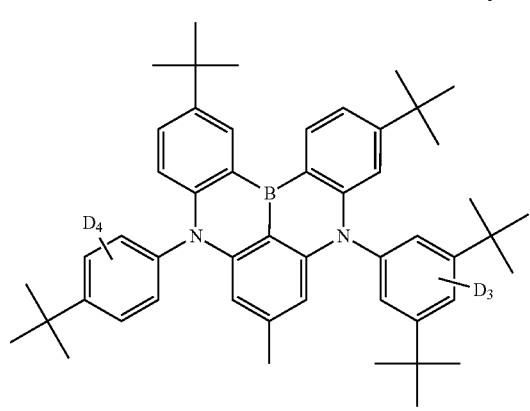
Dopant 13-4
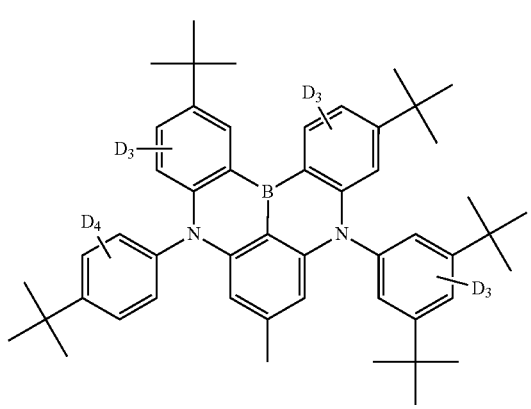
Dopant 14-2
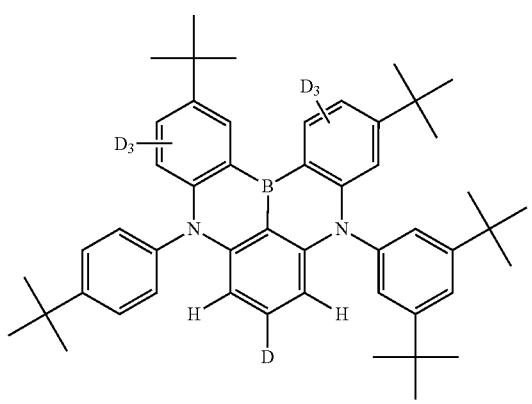
Dopant 14-3
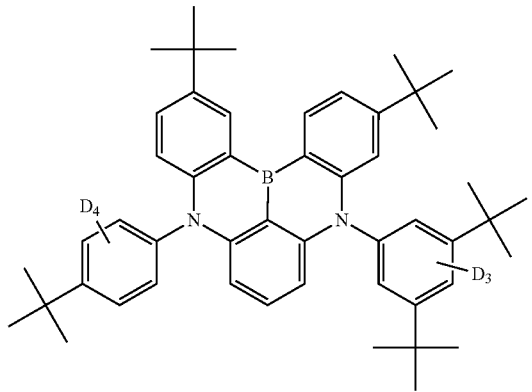

Dopant 14-4
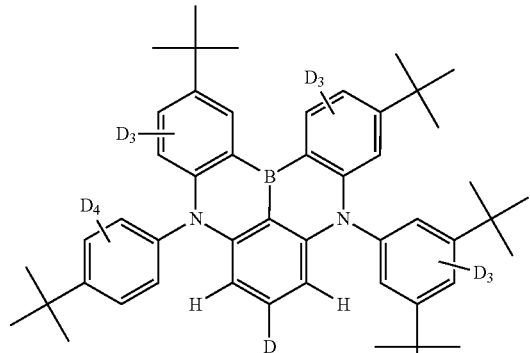
Dopant 15-2
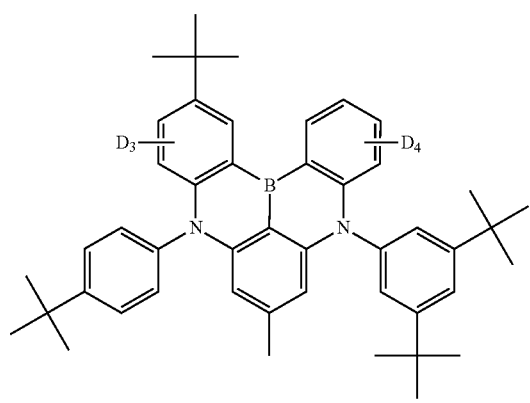
Dopant 15-3
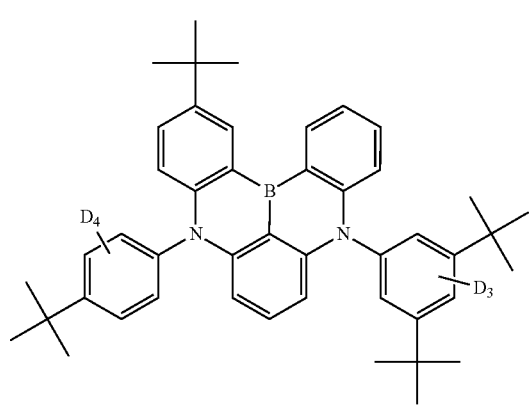
Dopant 15-4
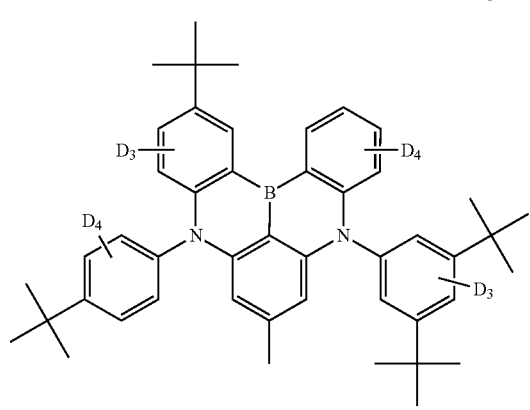
Dopant 16-2
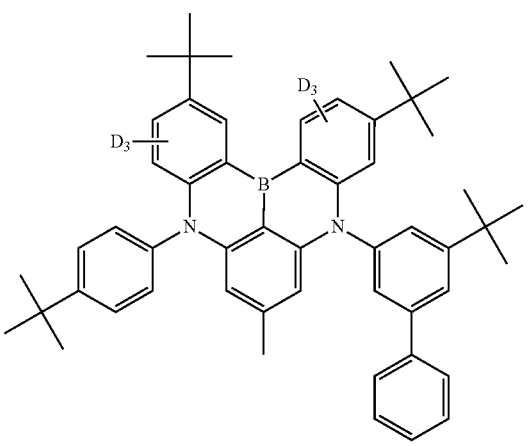
Dopant 16-3
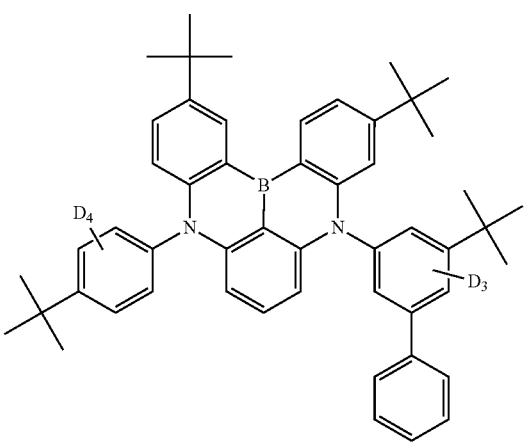
Dopant 16-4
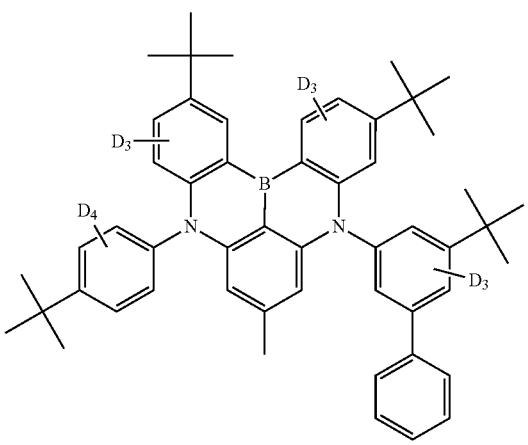

Dopant 17-2
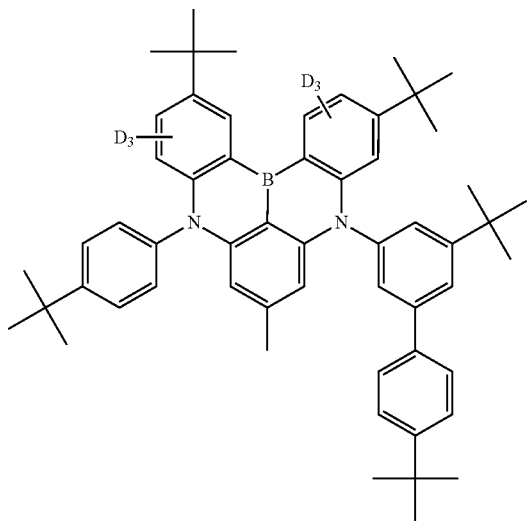
Dopant 17-3
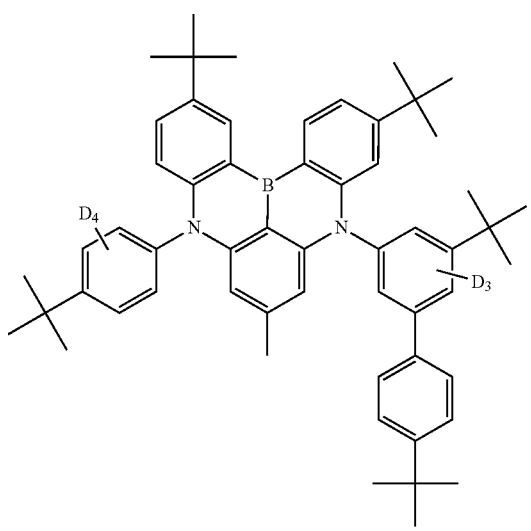
Dopant 17-4
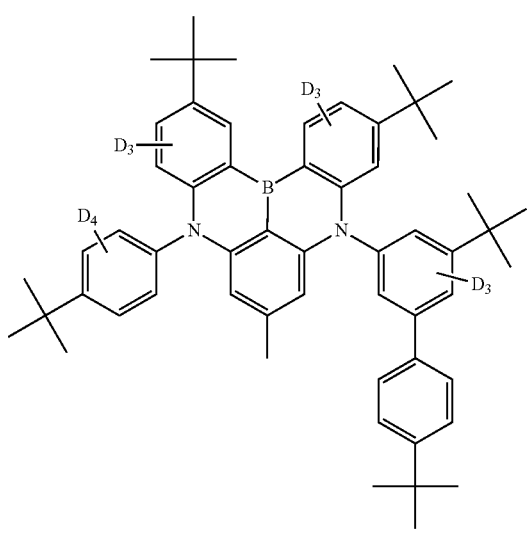
Dopant 18-2
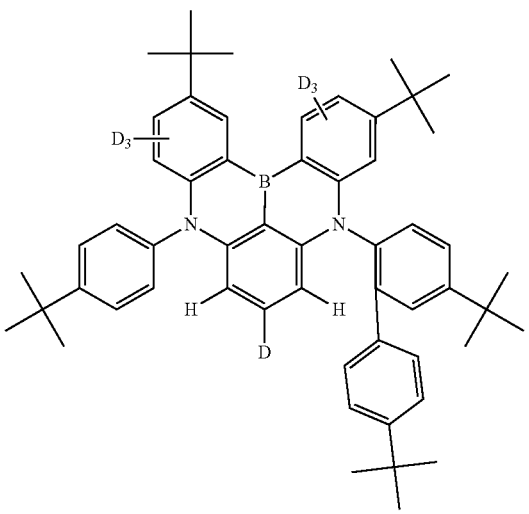
Dopant 18-3
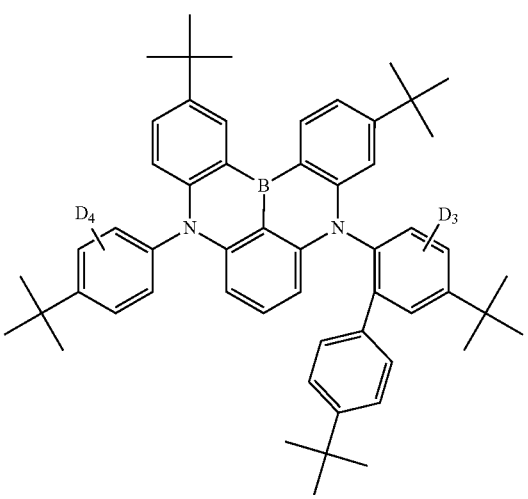
Dopant 18-4
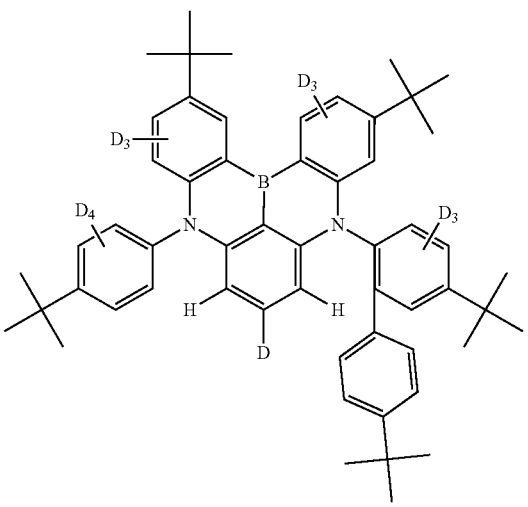

Dopant 19-2
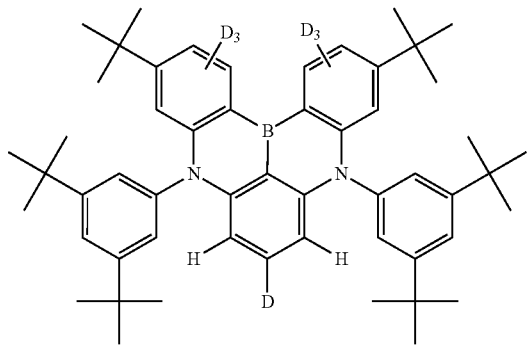
Dopant 19-3
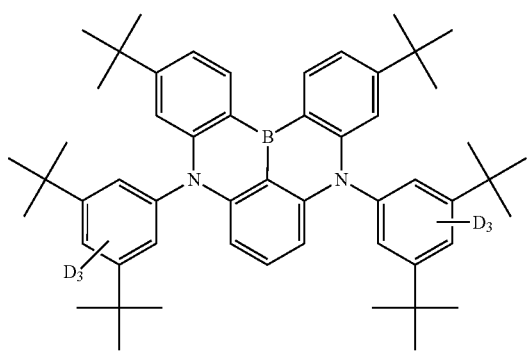
Dopant 19-4
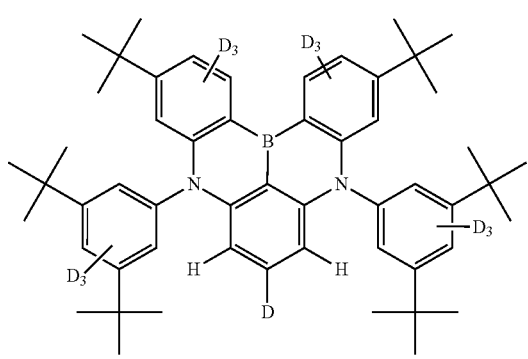
Dopant 20-2
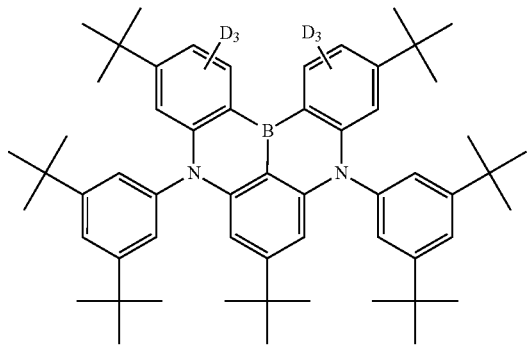
Dopant 20-3
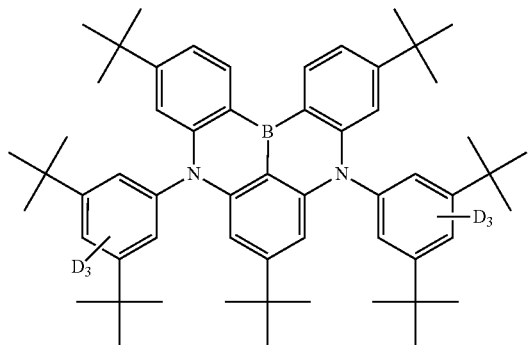
Dopant 20-4
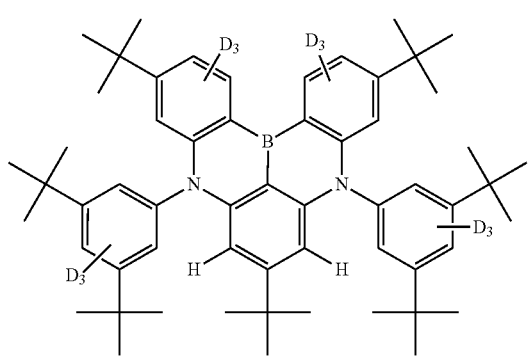
Dopant 21-2
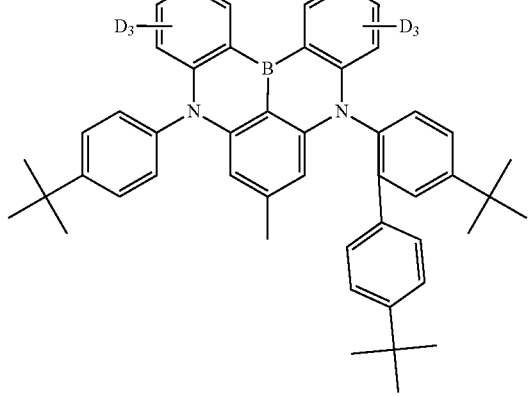

Dopant 21-3
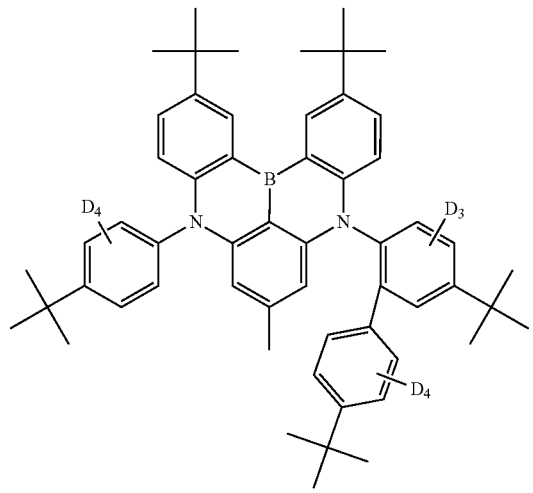
Dopant 21-4
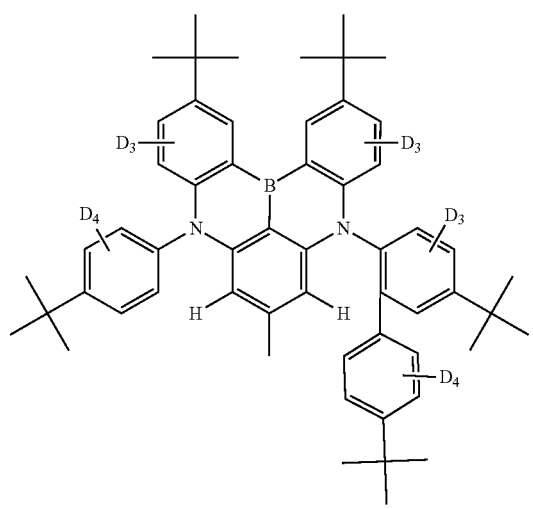
Dopant 22-2
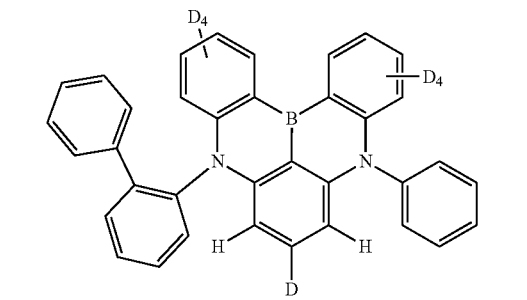
Dopant 22-3
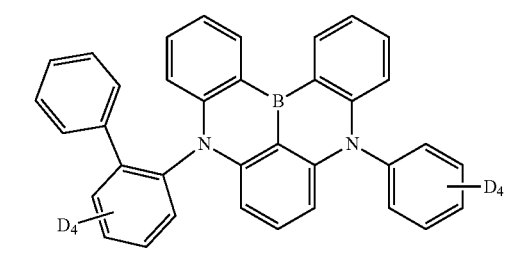
Dopant 22-4
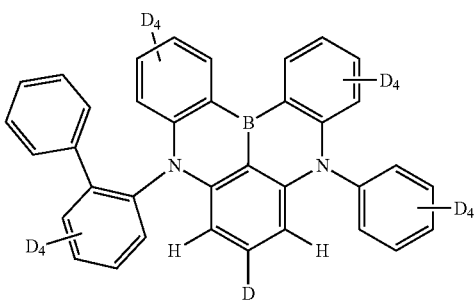
Dopant 23-2
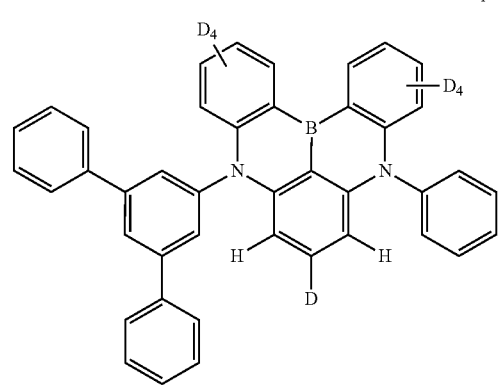
Dopant 23-3
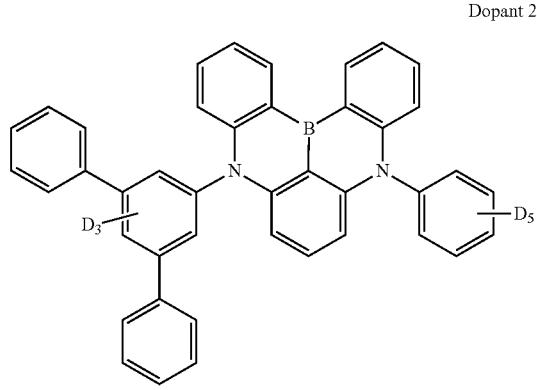
Dopant 23-4
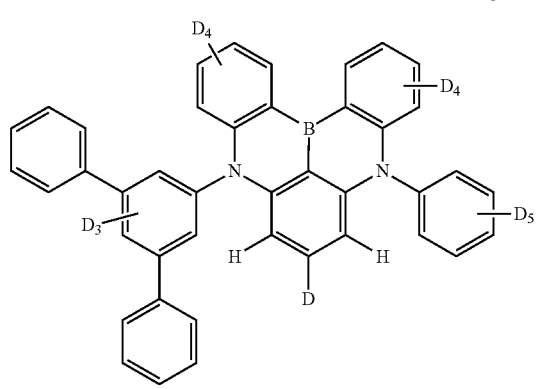

Dopant 24-2
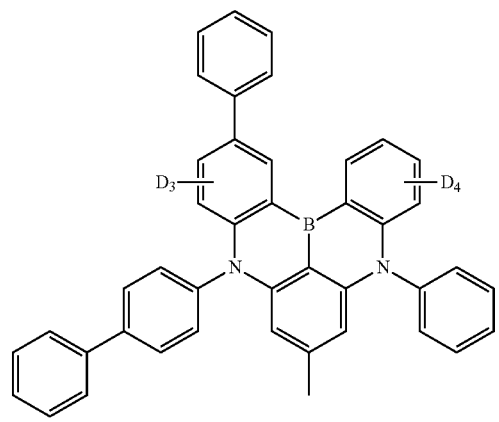
Dopant 25-2
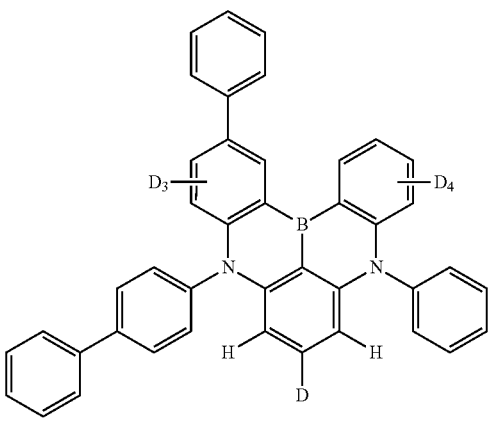
Dopant 24-3
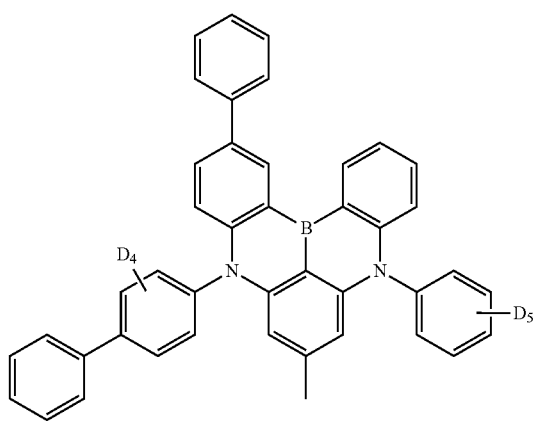
Dopant 25-3
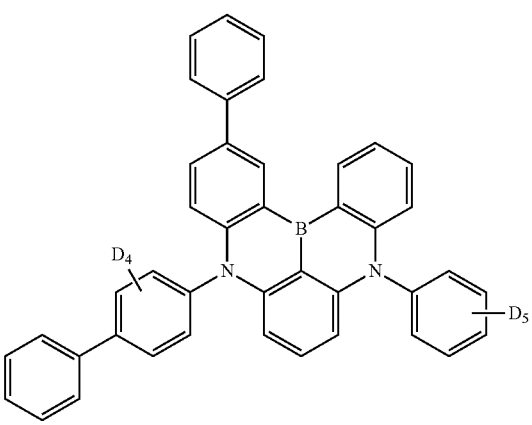
Dopant 24-4
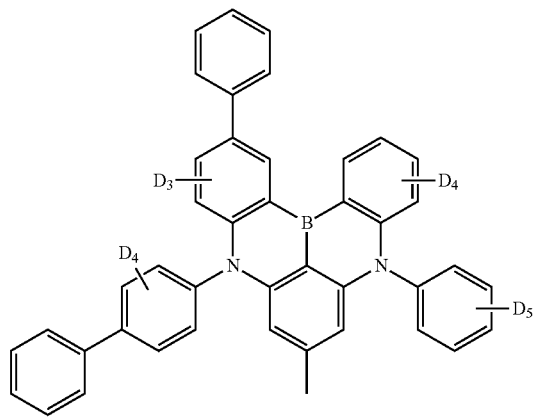
Dopant 25-4
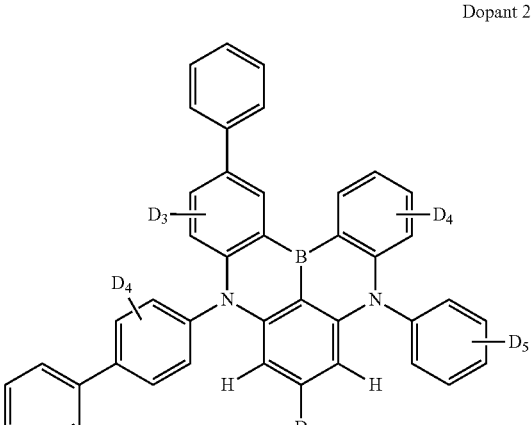

-continued

Dopant 26-2
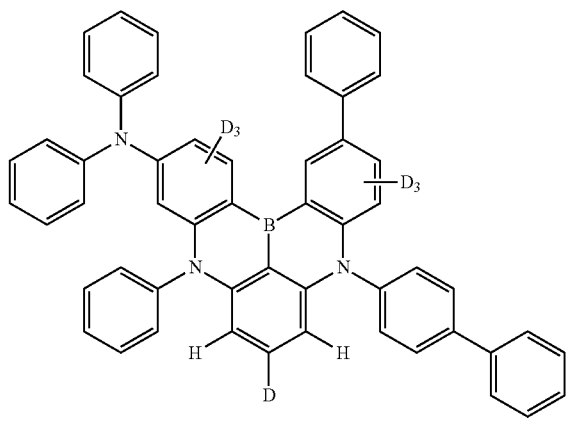

Dopant 26-3
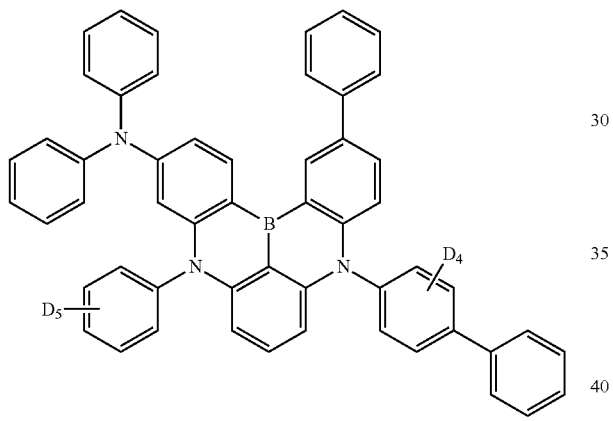

Dopant 26-4
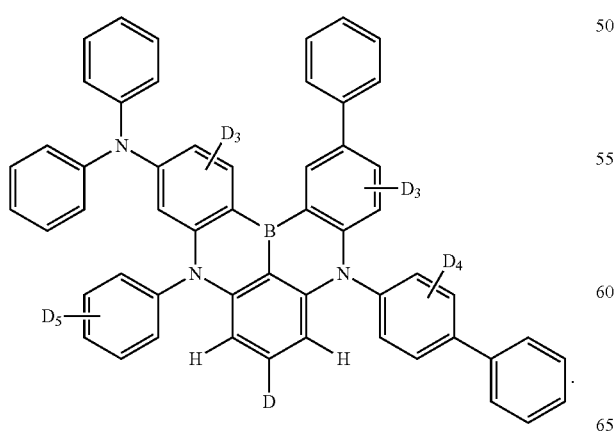

2. The organic light emitting device of claim 1, wherein the anthracene-based compound has the following Formula 1:

[Formula 1]
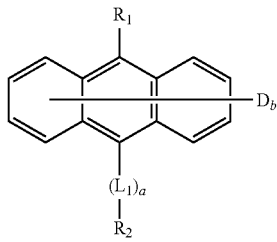

wherein each of $R_1$ and $R_2$ is independently $C_6$-$C_{30}$ aryl or $C_5$-$C_{30}$ hetero aryl; $L_1$ is $C_6$-$C_{30}$ arylene; a is 0 or 1; and b is an integer of 1 to 8.

3. The organic light emitting device of claim 1, wherein the first host is selected from the following compounds:

Host 1
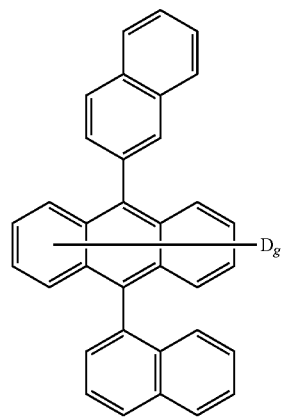

Host 2
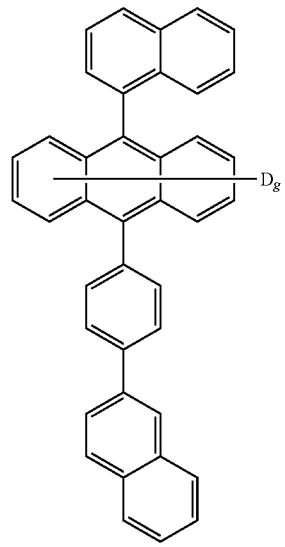

Host 3
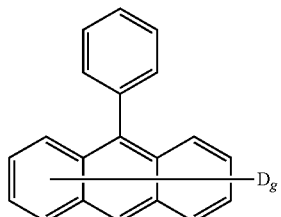
Host 4
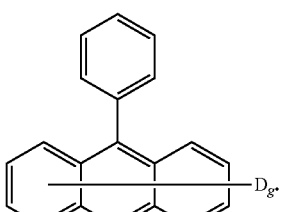
4. The organic light emitting device of claim 1, wherein the amine-based compound is selected from the following compounds:
E1
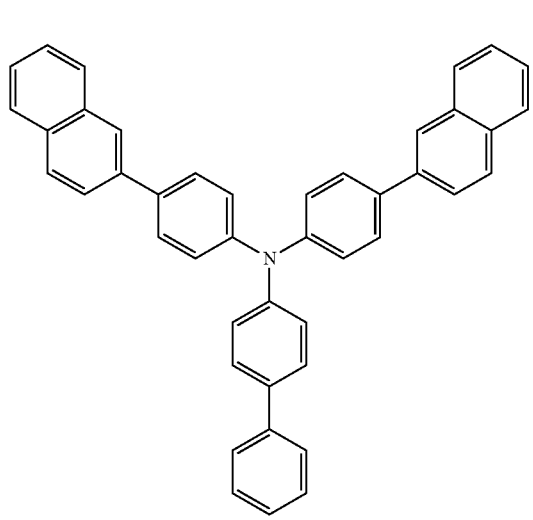
E2
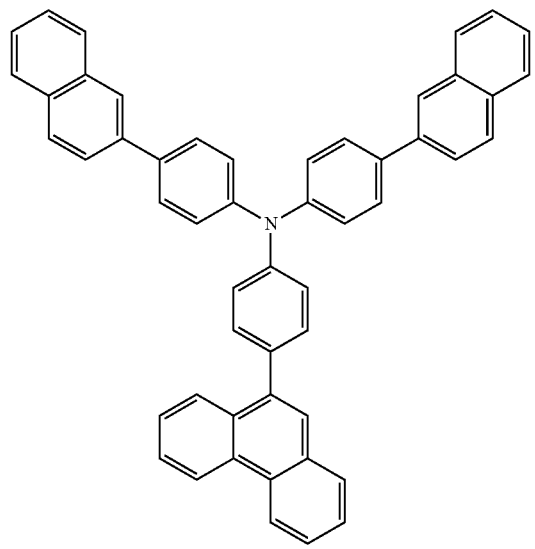
E3
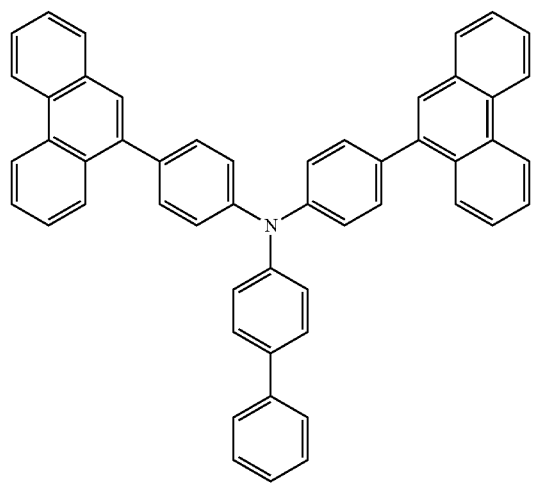
E4
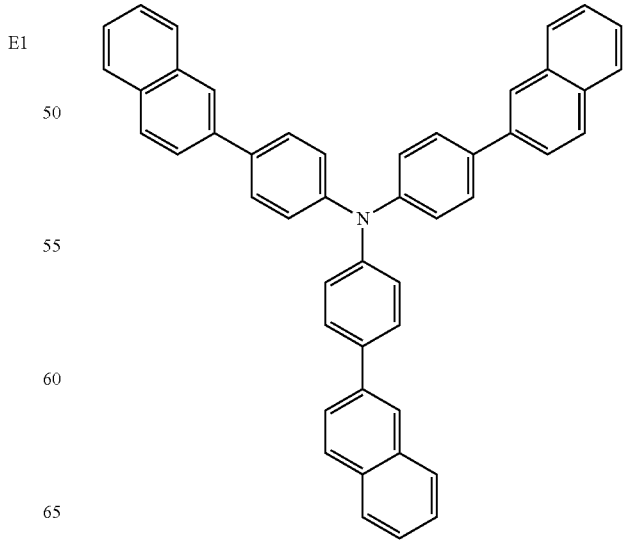

E5
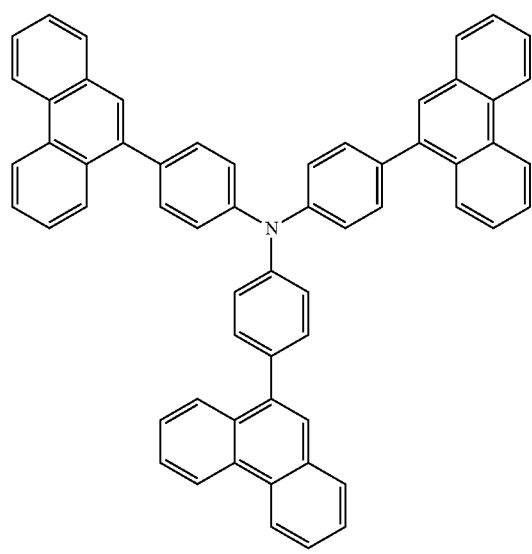
E6
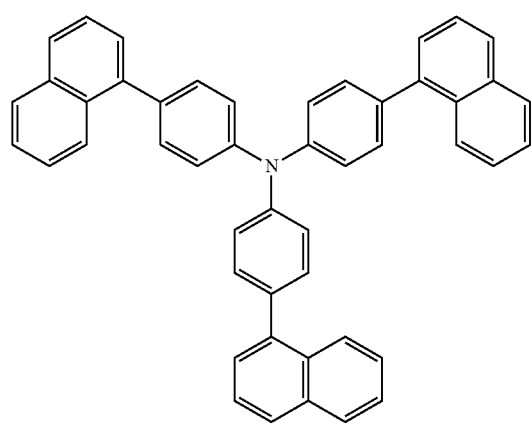
E7
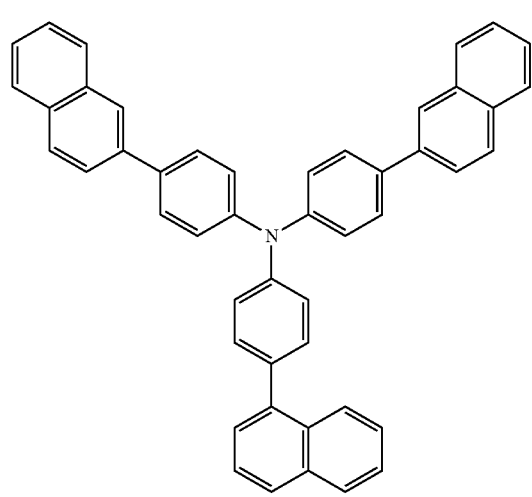
E8
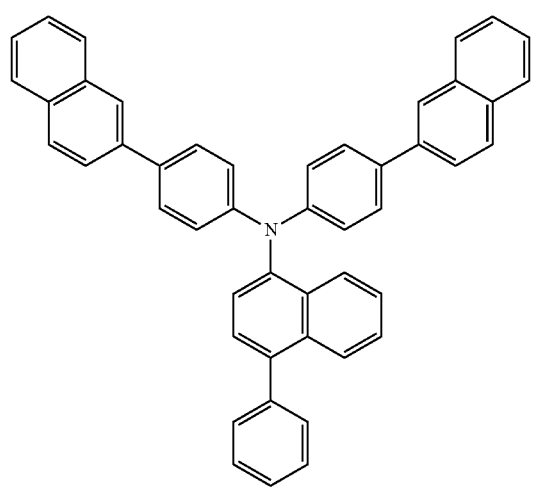
E9
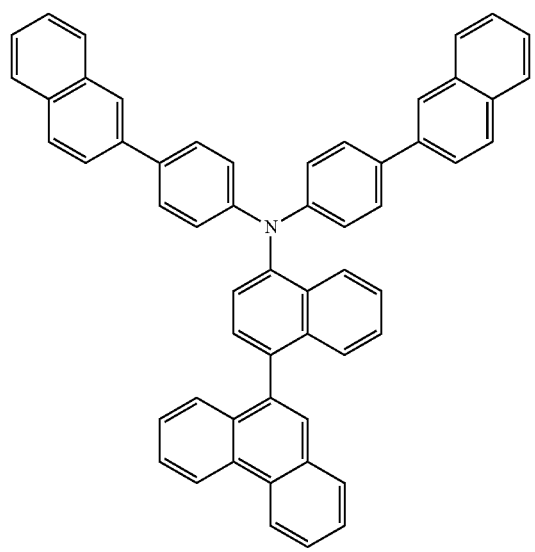
E10
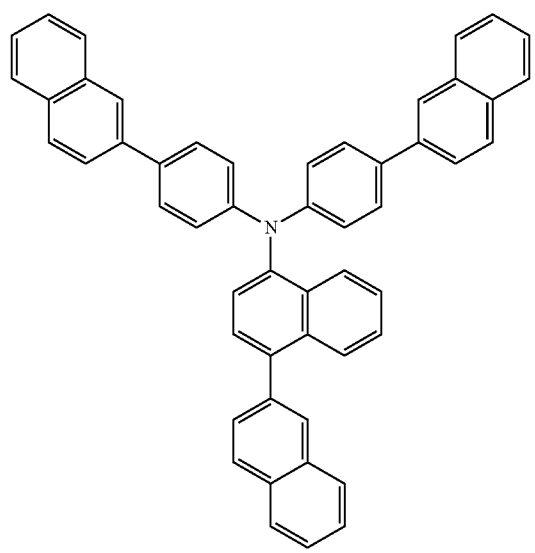

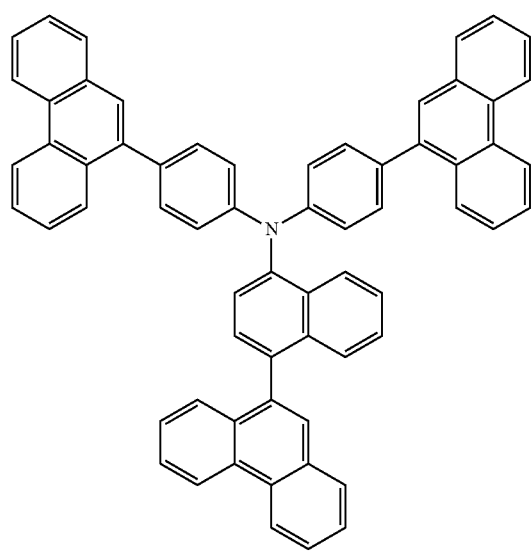
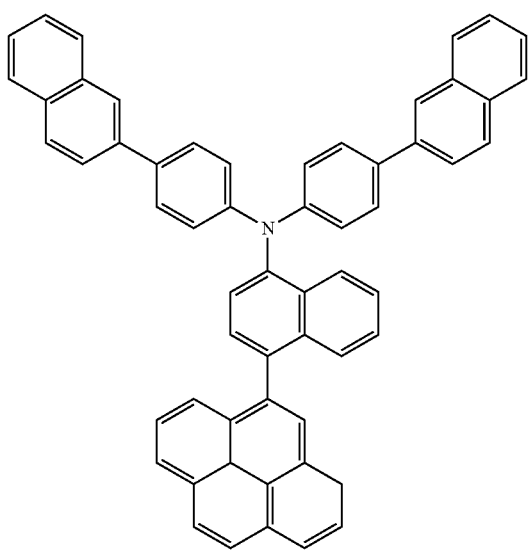

5. The organic light emitting device of claim 1, the emissive layer further comprises at least one hole blocking layer disposed between the at least one emitting material layer and the second electrode.

6. The organic light emitting deice of claim 5, wherein the at least one hole blocking layer includes at least one of an azine-based compound having the following structure of Formula 7 and a benzimidazole-based compound having the following structure of Formula 9:

[Formula 7]

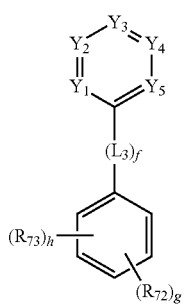

wherein each of $Y_1$ to $Y_5$ is independently $CR_{71}$ or N, one to three of $Y_1$ to $Y_5$ is N, and $R_{71}$ is $C_6$-$C_{30}$ aryl; $L_3$ is $C_6$-$C_{30}$ arylene; $R_{72}$ is $C_6$-$C_{30}$ aryl or $C_5$-$C_{30}$ hetero aryl, wherein the $C_6$-$C_{30}$ aryl is optionally substituted with another $C_6$-$C_{30}$ aryl or $C_5$-$C_{30}$ hetero aryl or forms a spiro structure with a $C_{10}$-$C_{30}$ fused aryl ring or a $C_{10}$-$C_{30}$ fused hetero aryl ring, wherein the another $C_6$-$C_{30}$ aryl is optionally further substituted with other $C_6$-$C_{30}$ aryl or $C_5$-$C_{30}$ hetero aryl or forms a spiro structure with a $C_{10}$-$C_{30}$ fused aryl ring; $R_{73}$ is hydrogen or adjacent two of $R_{73}$ form a fused aromatic ring; f is 0 or 1; g is 1 or 2; and h is an integer of 0 to 4;

[Formula 9]

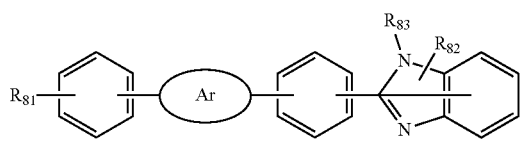

wherein Ar is $C_{10}$-$C_{30}$ arylene; $R_{81}$ is $C_6$-$C_{30}$ aryl or $C_5$-$C_{30}$ hetero aryl, each of the $C_6$-$C_{30}$ aryl and the $C_5$-$C_{30}$ hetero aryl is optionally substituted with $C_1$-$C_{10}$ alkyl; and each of $R_{82}$ and $R_{83}$ is independently hydrogen, $C_1$-$C_{10}$ alkyl or $C_6$-$C_{30}$ aryl.

7. The organic light emitting device of claim 6, wherein the azine-based compound is selected from the following compounds:

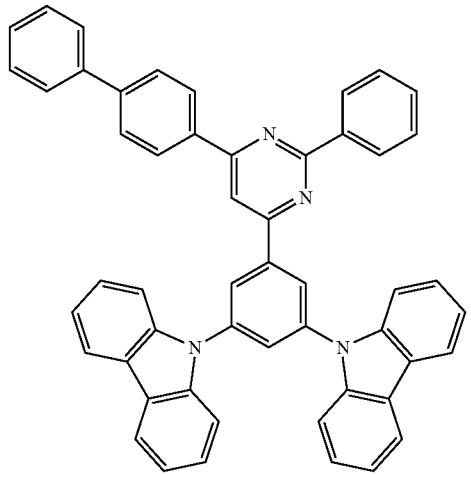

H1

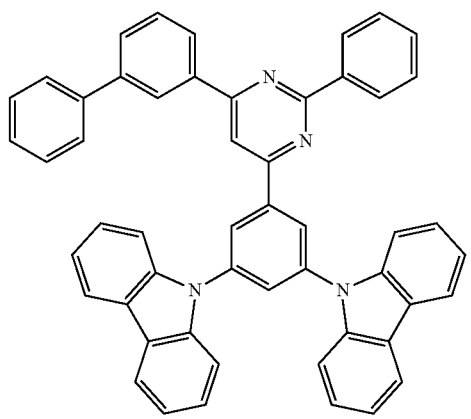

H2

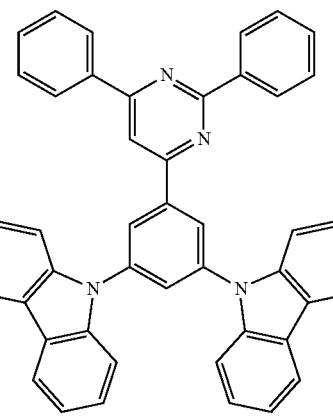

H3

151
-continued
152
-continued
H4
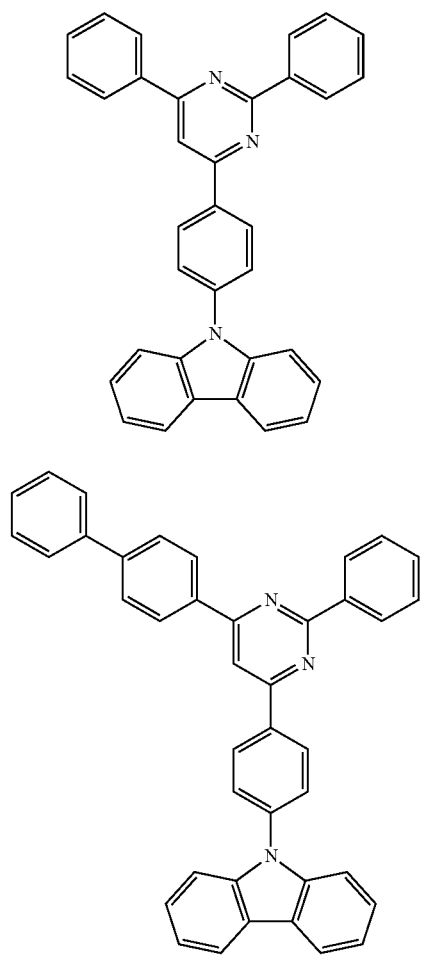
H7
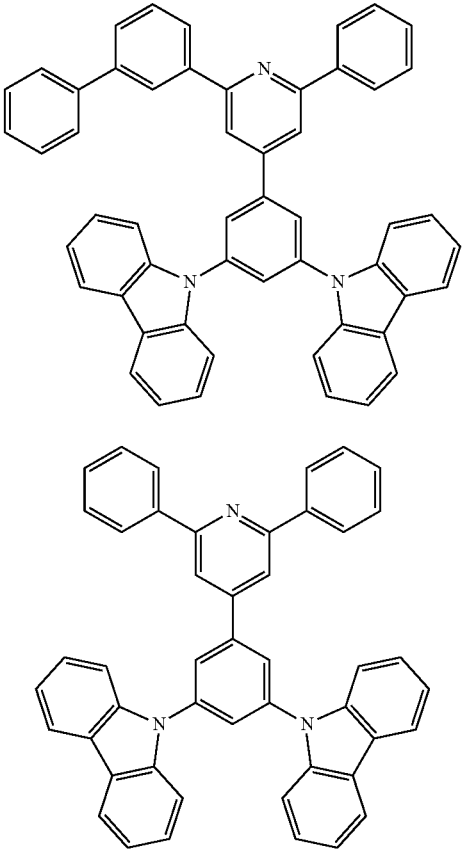
H5
H8
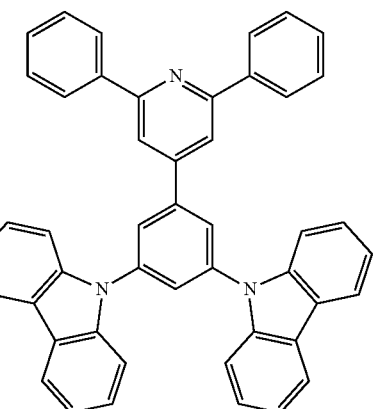
H6
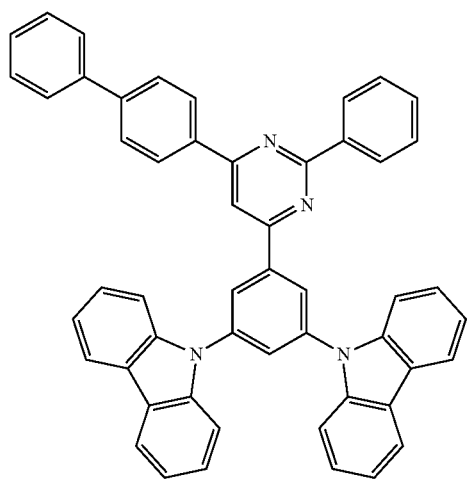
H9

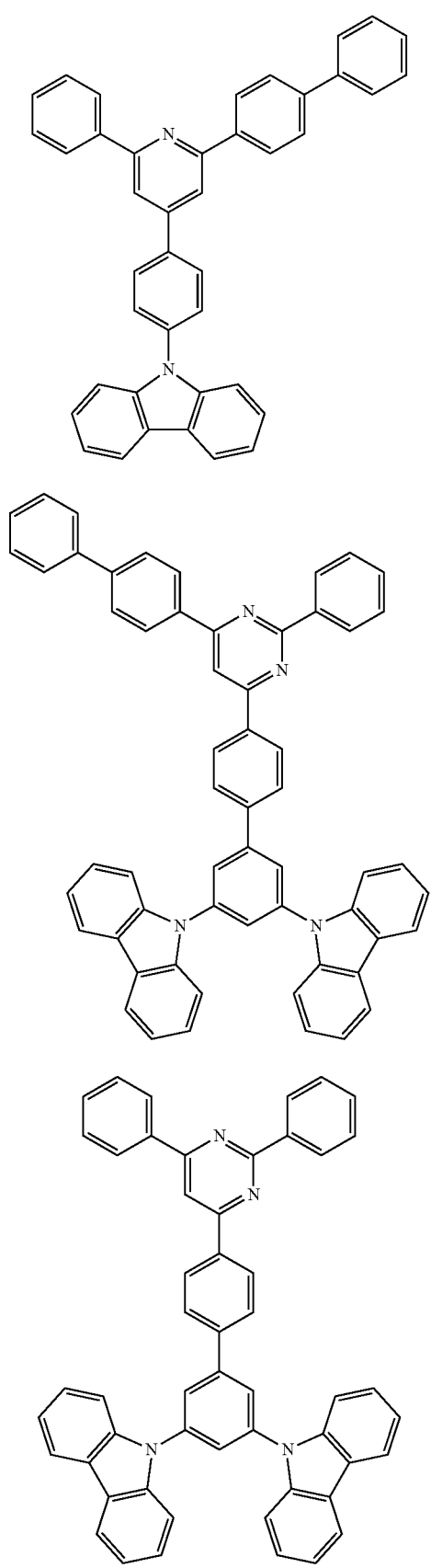
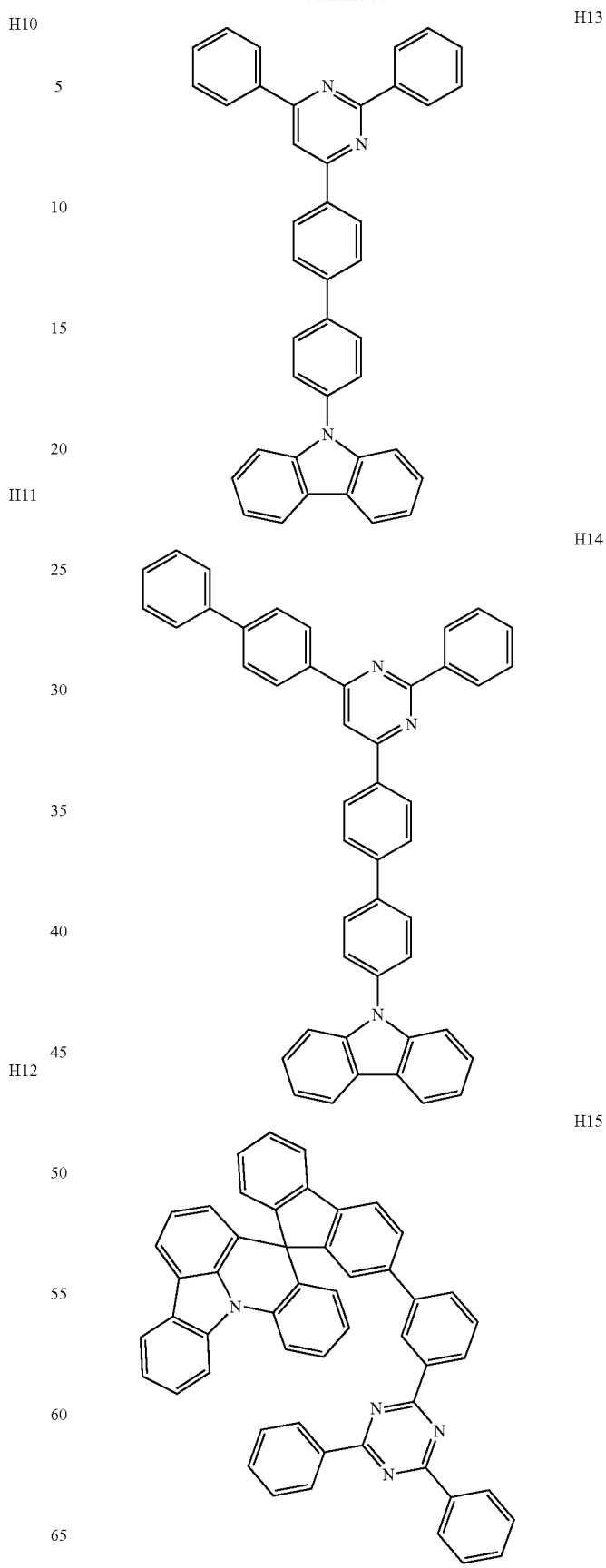

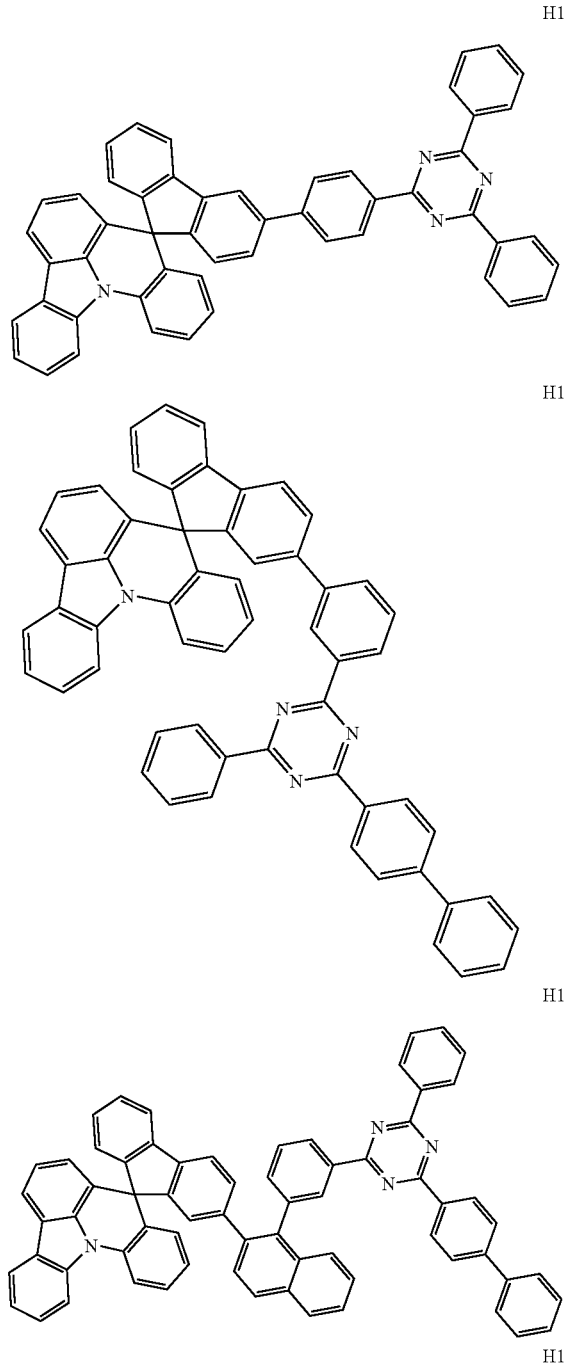
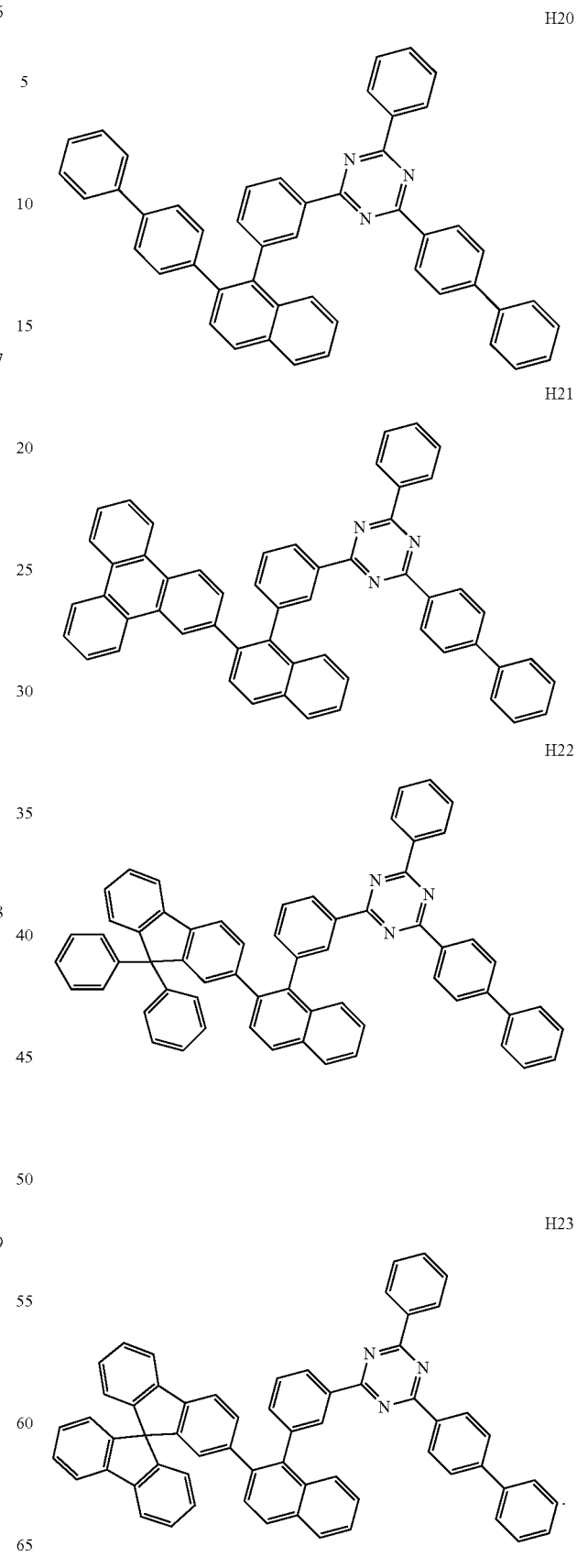

8. The organic light emitting device of claim 6, wherein the benzimidazole-based compound is selected from the following compounds:

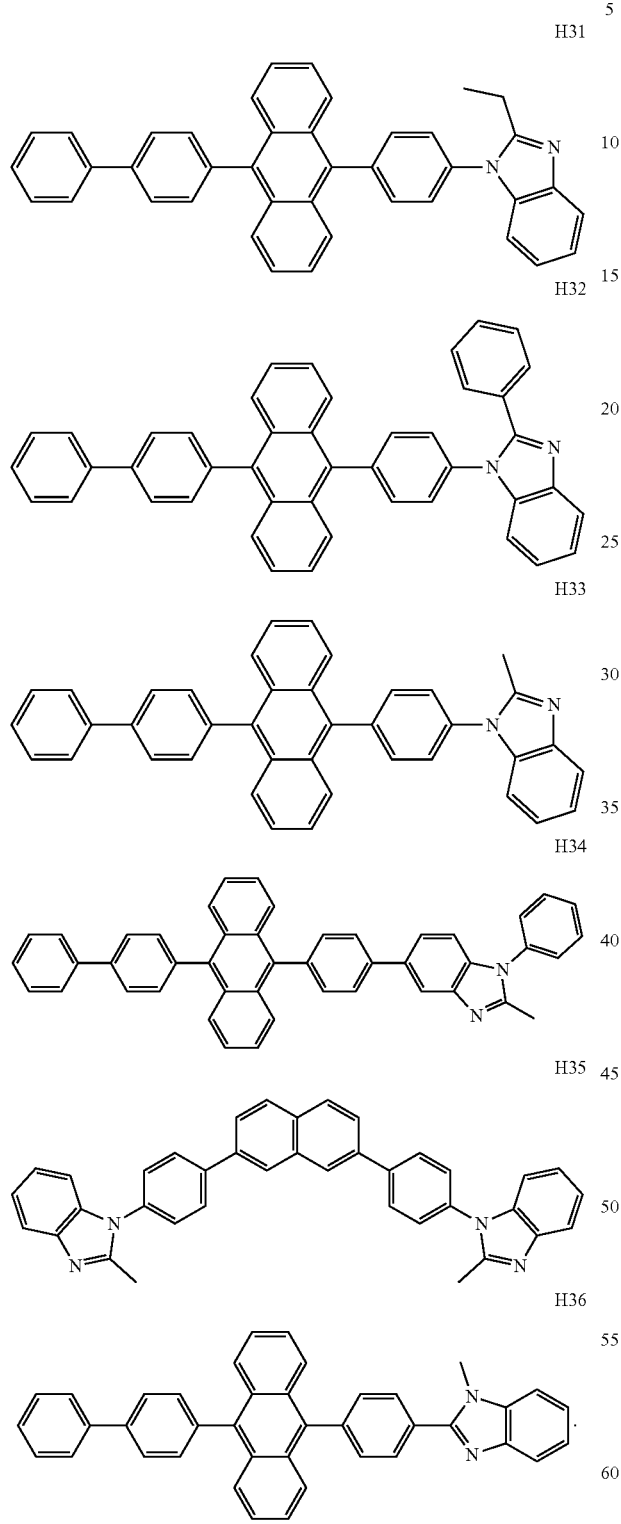

9. The organic light emitting device of claim 1, wherein the emissive layer further comprises a first emitting part disposed between the first and second electrodes, a second emitting part disposed between the first emitting part and the second electrode and a first charge generation layer disposed between the first emitting part and the second emitting part,
wherein the first emitting part includes a first emitting material layer and a first electron blocking layer disposed between the first electrode and the first emitting material layer,
wherein the second emitting part includes a second emitting material layer, and
wherein at least one of the first emitting material layer and the second emitting material layer includes the first host and the first dopant.

10. The organic light emitting device of claim 9, the second emitting part further comprises a second electron blocking layer disposed between the first charge generation layer and the second emitting material layer, and wherein at least one of the first electron blocking layer and the second electron blocking layer includes the amine-based compound having the structure of Formula 5.

11. The organic light emitting device of claim 10, the emissive layer further comprises at least one of a first hole blocking layer disposed between the first emitting material layer and the first charge generation layer and a second hole blocking layer disposed between the second emitting material layer and the second electrode.

12. The organic light emitting device of claim 11, wherein the at least one of the first hole blocking layer and the second hole blocking layer includes at least one of an azine-based compound having the following structure of Formula 7 and a benzimidazole-based compound having the following structure of Formula 9:

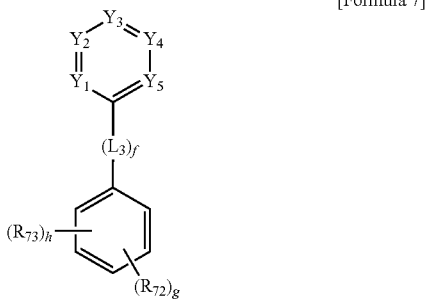

[Formula 7]

wherein each of $Y_1$ to $Y_5$ is independently $CR_{71}$ or N, one to three of $Y_1$ to $Y_5$ is N, and $R_{71}$ is $C_6$-$C_{30}$ aryl; $L_3$ is $C_6$-$C_{30}$ arylene; $R_{72}$ is $C_6$-$C_{30}$ aryl or $C_5$-$C_{30}$ hetero aryl, wherein the $C_6$-$C_{30}$ aryl is optionally substituted with another $C_6$-$C_{30}$ aryl or $C_5$-$C_{30}$ hetero aryl or forms a spiro structure with a $C_{10}$-$C_{30}$ fused aryl ring or a $C_{10}$-$C_{30}$ fused hetero aryl ring, wherein the another $C_6$-$C_{30}$ aryl is optionally further substituted with other $C_6$-$C_{30}$ aryl or $C_5$-$C_{30}$ hetero aryl or forms a spiro structure with a $C_{10}$-$C_{30}$ fused aryl ring; $R_{73}$ is hydrogen or adjacent two of $R_{73}$ form a fused aromatic ring; f is 0 or 1; g is 1 or 2; and h is an integer of 0 to 4;

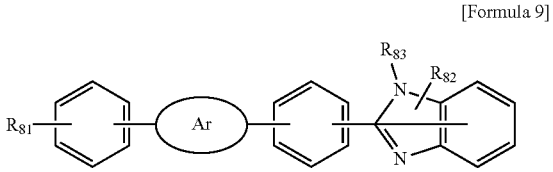

[Formula 9]

wherein Ar is $C_{10}$-$C_{30}$ arylene; $R_{81}$ is $C_6$-$C_{30}$ aryl or $C_5$-$C_{30}$ hetero aryl, each of the $C_6$-$C_{30}$ aryl and the $C_5$-$C_{30}$ hetero aryl is optionally substituted with $C_1$-$C_{10}$ alkyl; and each of $R_{82}$ and $R_{83}$ is independently hydrogen, $C_1$-$C_{10}$ alkyl or $C_6$-$C_{30}$ aryl.

13. The organic light emitting device of claim 9, wherein the second emitting material layer emits yellow green or red green light.

14. The organic light emitting device of claim 13, the emissive layer further comprises a third emitting part disposed between the second emitting part and the second electrode and a second charge generation layer disposed between the second emitting part and the third emitting part,
wherein the third emitting part includes a third emitting material layer, and
wherein the at least one of the first emitting material layer and the third emitting material layer includes the first host and the first dopant.

15. The organic light emitting device of claim 14, the third emitting part further comprises a third electron blocking layer disposed between the second charge generation layer and the third emitting material layer, and wherein at least one of the first electron blocking layer and the third electron blocking layer includes the amine-based compound having the structure of Formula 5.

16. The organic light emitting device of claim 15, the emissive layer further comprises at least one of a first hole blocking layer disposed between the first emitting material layer and the first charge generation layer, a second hole blocking layer disposed between the second emitting material layer and the second charge generation layer, and a third hole blocking layer disposed between the third emitting material layer and the second electrode.

17. The organic light emitting device of claim 16, wherein at least one of the first, second and third hole blocking layers includes at least one of an azine-based compound having the following structure of Formula 7 and a benzimidazole-based compound having the following structure of Formula 9:

[Formula 7]

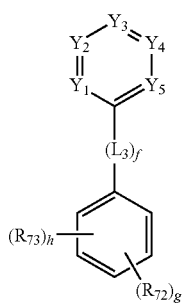

wherein each of $Y_1$ to $Y_5$ is independently $CR_{71}$ or N, one to three of $Y_1$ to $Y_5$ is N, and $R_{71}$ is $C_6$-$C_{30}$ aryl; $L_3$ is $C_6$-$C_{30}$ arylene; $R_{72}$ is $C_6$-$C_{30}$ aryl or $C_5$-$C_{30}$ hetero aryl, wherein the $C_6$-$C_{30}$ aryl is optionally substituted with another $C_6$-$C_{30}$ aryl or $C_5$-$C_{30}$ hetero aryl or forms a spiro structure with a $C_{10}$-$C_{30}$ fused aryl ring or a $C_{10}$-$C_{30}$ fused hetero aryl ring, wherein the another $C_6$-$C_{30}$ aryl is optionally further substituted with other $C_6$-$C_{30}$ aryl or $C_5$-$C_{30}$ hetero aryl or forms a spiro structure with a $C_{10}$-$C_{30}$ fused aryl ring; $R_{73}$ is hydrogen or adjacent two of $R_{73}$ form a fused aromatic ring; f is 0 or 1; g is 1 or 2; and h is an integer of 0 to 4;

[Formula 9]

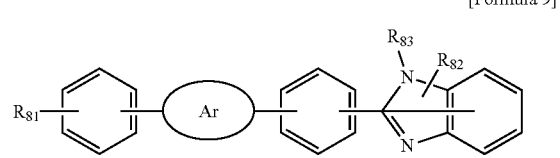

wherein Ar is $C_{10}$-$C_{30}$ arylene; $R_{81}$ is $C_6$-$C_{30}$ aryl or $C_5$-$C_{30}$ hetero aryl, each of the $C_6$-$C_{30}$ aryl and the $C_5$-$C_{30}$ hetero aryl is optionally substituted with $C_1$-$C_{10}$ alkyl; and each of $R_{82}$ and $R_{83}$ is independently hydrogen, $C_1$-$C_{10}$ alkyl or $C_6$-$C_{30}$ aryl.

18. The organic light emitting device of claim 1, wherein the substrate defines a red pixel, a green pixel and a blue pixel and the organic light emitting diode is located correspondingly to the red pixel, the green pixel and the blue pixel, and the organic light emitting device further comprises a color conversion layer disposed between the substrate and the organic light emitting diode or over the organic light emitting diode correspondingly to the red pixel and the green pixel.

19. The organic light emitting device of claim 1, wherein the substrate defines a red pixel, a green pixel and a blue pixel and the organic light emitting diode is located correspondingly to the red pixel, the green pixel and the blue pixel, and the organic light emitting device further comprises a color filter layer disposed between the substrate and the organic light emitting diode or over the organic light emitting diode correspondingly to the red pixel, the green pixel and the blue pixel.

\* \* \* \* \*